(12) United States Patent
Aoki et al.

(10) Patent No.: US 8,179,169 B2
(45) Date of Patent: May 15, 2012

(54) DRIVING CIRCUIT WITH VARIABLE RESISTOR FOR TRANSISTOR

(75) Inventors: Takaaki Aoki, Okazaki (JP); Shoji Mizuno, Okazaki (JP); Shigeki Takahashi, Okazaki (JP); Takashi Nakano, Nukata-gun (JP); Nozomu Akagi, Nukata-gun (JP); Yoshiyuki Hattori, Aichi-gun (JP); Makoto Kuwahara, Nagoya (JP); Kyoko Okada, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/105,021

(22) Filed: May 11, 2011

(65) Prior Publication Data

US 2011/0210766 A1 Sep. 1, 2011

Related U.S. Application Data

(62) Division of application No. 12/654,323, filed on Dec. 17, 2009, now Pat. No. 7,982,508, which is a division of application No. 11/723,967, filed on Mar. 22, 2007, now Pat. No. 7,671,636.

(30) Foreign Application Priority Data

| Mar. 22, 2006 | (JP) | ................................ 2006-79382 |
| Mar. 27, 2006 | (JP) | ................................ 2006-86225 |
| Jul. 27, 2006 | (JP) | ............................. 2006-204769 |
| Jul. 27, 2006 | (JP) | ............................. 2006-204770 |
| Sep. 8, 2006 | (JP) | ............................. 2006-243832 |
| Mar. 20, 2007 | (JP) | ............................. 2007-73381 |
| Mar. 20, 2007 | (JP) | ............................. 2007-73382 |
| Mar. 22, 2007 | (JP) | ............................. 2007-74030 |

(51) Int. Cl.
*H03K 3/00* (2006.01)

(52) U.S. Cl. ........................................ 327/108; 327/112

(58) Field of Classification Search ........... 327/108–112
See application file for complete search history.

(56) References Cited

U.S. PATENT DOCUMENTS

| 4,384,287 A | 5/1983 | Sakuma |
| 4,399,500 A | 8/1983 | Clarke et al. |
| 4,551,643 A | 11/1985 | Russel et al. |
| 4,656,365 A | 4/1987 | Billings |
| 4,725,813 A * | 2/1988 | Miyada ........................ 327/374 |

(Continued)

FOREIGN PATENT DOCUMENTS

DE 1183945 12/1964

(Continued)

OTHER PUBLICATIONS

Office Action dated Oct. 14, 2008 from German Patent Office in corresponding German Application No. 10 2007 013 824.7-31 (with English translation).

(Continued)

*Primary Examiner* — Kenneth B. Wells
(74) *Attorney, Agent, or Firm* — Posz Law Group, PLC

(57) ABSTRACT

A switching circuit includes: a transistor having a first electrode, a second electrode and a control electrode; a zener diode; and a capacitor. A connection between the first electrode and the second electrode is capable of temporally switching between a conduction state and a non-conduction state by switching a control voltage of the transistor. The zener diode and the capacitor are coupled in series between the first electrode and the control electrode of the transistor. The first electrode is a drain or a collector.

9 Claims, 54 Drawing Sheets

U.S. PATENT DOCUMENTS

| | | | |
|---|---|---|---|
| 4,803,535 A | 2/1989 | Taguchi | |
| 4,831,280 A | 5/1989 | Caya et al. | |
| 4,898,839 A | 2/1990 | Fujinuma et al. | |
| 5,025,298 A | 6/1991 | Fay et al. | |
| 5,055,721 A * | 10/1991 | Majumdar et al. | 327/434 |
| 5,173,755 A | 12/1992 | Co et al. | |
| 5,635,867 A | 6/1997 | Timm | |
| 5,724,218 A * | 3/1998 | Tihanyi | 361/79 |
| 5,789,951 A * | 8/1998 | Shen et al. | 327/110 |
| 5,994,744 A * | 11/1999 | Katayama et al. | 257/370 |
| 6,091,274 A | 7/2000 | Preslar | |
| 6,348,716 B1 | 2/2002 | Yun | |
| 6,429,701 B2 | 8/2002 | Karaki et al. | |
| 6,617,906 B1 | 9/2003 | Hastings | |
| 6,700,156 B2 | 3/2004 | Saitoh et al. | |
| 6,849,880 B1 | 2/2005 | Saito et al. | |
| 6,906,574 B2 | 6/2005 | Ohi et al. | |
| 6,930,352 B2 | 8/2005 | Saito et al. | |
| 7,053,678 B2 | 5/2006 | Scollo et al. | |
| 7,158,359 B2 * | 1/2007 | Bertele et al. | 361/93.9 |
| 7,223,652 B2 | 5/2007 | Ooi et al. | |
| 7,235,838 B2 | 6/2007 | Lin et al. | |
| 7,291,538 B2 | 11/2007 | Hirose et al. | |
| 7,294,562 B2 | 11/2007 | Nagano et al. | |
| 7,297,558 B2 | 11/2007 | Ozaki et al. | |
| 7,492,208 B2 | 2/2009 | Tihanyi | |
| 7,498,627 B2 | 3/2009 | Amo et al. | |
| 7,602,161 B2 * | 10/2009 | McLeod | 323/273 |
| 7,675,116 B2 * | 3/2010 | Fukuda | 257/355 |
| 2003/0067339 A1 | 4/2003 | Yamamoto | |
| 2003/0210087 A1 | 11/2003 | Yamamoto | |
| 2003/0210088 A1 | 11/2003 | Yamamoto | |
| 2004/0027762 A1 | 2/2004 | Ohi et al. | |

FOREIGN PATENT DOCUMENTS

| | | |
|---|---|---|
| DE | 3936544 | 6/1990 |
| DE | 197 40 540 | 3/1999 |
| JP | A-01-183214 | 7/1989 |
| JP | A-2-25107 | 1/1990 |
| JP | U-02-103927 | 8/1990 |
| JP | A-5-235722 | 9/1993 |
| JP | A-06-291631 | 10/1994 |
| JP | A-06-326579 | 11/1994 |
| JP | A-08-70572 | 3/1996 |
| JP | A-2003-189592 | 7/2003 |
| JP | A-2008-070572 | 3/2008 |

OTHER PUBLICATIONS

Office Action dated Aug. 19, 2009 from German Patent Office in corresponding German Application No. 10 2007 063 687.5-31 (with English translation).

Office Action dated Feb. 5, 2010 from German Patent Office in corresponding German Application No. 10 2007 063 687.5 (with English translation).

Office Action dated Feb. 8, 2011 from German Patent Office in corresponding German Application No. 10 2007 013 824.7-31 (with English translation).

Office Action dated Mar. 24, 2011 from German Patent Office in corresponding German Application No. 10 2007 063 721.9 (with English translation).

Office Action mailed on Apr. 19, 2011 issued from the Japanese Patent Office in the corresponding Japanese patent application No. 2006-204769 (English translation enclosed).

Office Action mailed Aug. 2, 2011 in corresponding JP application No. 2007-073382 (and English translation).

Office Action mailed Oct. 4, 2011 in corresponding JP application No. 2007-074030 (and English translation).

* cited by examiner

Vds=0

Vds=20

Vds=75

DRIVING CIRCUIT WITH VARIABLE RESISTOR FOR TRANSISTOR

CROSS REFERENCE TO RELATED APPLICATIONS

This application is a divisional of U.S. patent application Ser. No. 12/654,323 filed on Dec. 17, 2009 now issued as U.S. Pat. No. 7,982,508 and entitled SWITCHING CIRCUIT AND DRIVING CIRCUIT FOR TRANSISTOR, which is a divisional U.S patent application Ser. No. 11/723,967 filed on Mar. 22, 2007, now issued as U.S. Pat. No. 7,671,636 and entitled SWITCHING CIRCUIT AND DRIVING CIRCUIT FOR TRANSISTOR, and is based on Japanese Patent Applications No. 2006-79382 filed on Mar. 22, 2006, No. 2006-86225 filed on Mar. 27, 2006, No. 2006-204769 filed on Jul. 27, 2006, No. 2006-204770 filed on Jul. 27, 2006, No. 2006-243832 filed on Sep. 8, 2006, No. 2007-73381 filed on Mar. 20, 2007, No. 2007-73382 filed on Mar. 20, 2007, and No. 2007-74030 filed on Mar. 22, 2007, the disclosures of which are incorporated herein by reference.

FIELD OF THE INVENTION

The present invention relates to a switching circuit and a driving circuit for a transistor.

BACKGROUND OF THE INVENTION

Switching circuits have been widely utilized in DC-DC converters, inverters, or the like. There are many possibilities that typical switching circuits utilize transistors such as MOSFETs, IGBTs, or the like. In switching circuits, since voltages applied to gates of transistors are switched, signal paths between major electrodes (namely, sources and drains in case of unipolar transistors such as MOSFET etc., collectors and emitters in case of bipolar transistors such as IGBT etc.) of the transistors are switched in a temporal manner between a conducting state and a non-conducting state.

Various sorts of requirements have been made with respect to switching circuits, namely, these switching circuits are required to be made compact, and are required to be arranged by employing a small number of circuit components; ON-resistances of the switching circuits must be low, and switching losses thereof must be low; and surge voltages of the switching circuits must be suppressed to low surge voltages.

In order to make the switching circuits compact, there is a merit if frequencies at which gate voltages are changed are increased. This reason is given that since the frequencies are made high, inductances and capacitances required by the switching circuits can be suppressed to small values.

If operating frequencies of switching circuits are increased, then switching losses of transistors may cause serious problems. In order to suppress these switching losses to small values, there is a merit if switching speeds of the transistors are increased. Since researching/developing operations of these transistors are progressed, the switching speeds thereof are increased.

However, even in the present stage, it is practically difficult to suppress both the switching losses and the surge voltages at the same time. In order to suppress the switching losses to small values, it is advantage to increase the switching speeds of the transistors. However, if the switching speeds are increased, then the surge voltages are increased. In order to suppress the surge voltages to low voltages, it is advantage to decrease the switching speeds of the transistors. However, if the switching speeds are decreased, then the switching losses are increased. A trade-off relationship is present between the switching losses and the surge voltages. If the switching losses are suppressed to the small values, then the surge voltages are increased, whereas if the surge voltages are suppressed to the low voltages, then the switching losses are increased. It is practically difficult that both the switching losses and the surge voltages are suppressed to the low values at the same time.

In order to suppress both a surge voltage and a switching loss to a low surge voltage and a low switching loss, such a gate driving circuit for switching gate resistors in a stepwise manner in connection with a time elapse has been proposed. However, this technical idea has problems. That is, the gate driving circuit becomes complex, and a total number of electronic components required to manufacture a switching circuit is necessarily increased.

Under such a circumstance, the transistor described in JP-A-2004-6598 (corresponding to U.S. Pat. No. 6,700,156) has been developed. This transistor is a MOSFET in which a p layer containing a p type impurity in low concentration has been formed at a position located adjusted to a p base layer.

In the case of a normal MOSFET, the higher a voltage between the source and the drain of the normal MOSFET becomes, the lower a capacitance between the drain and the gate thereof is decreased. When the capacitance between the drain and the gate is small, a voltage change speed between the drain and the source becomes high, which is generated when the transistor is turned OFF. In the normal MOSFET, the higher the voltage between the drain and the source is increased when the MOSFET is turned OFF, the higher the voltage change speed between the drain and the source becomes, so that a surge voltage is increased.

As described in JP-A-2004-6598, if the p layer containing the p type impurity in the low concentration is added to the position located adjacent to the p base layer, then the following characteristic can be obtained. That is, the higher the voltage between the drain and the source becomes, the larger the capacitance between the gate and the drain is increased. When this MOSFET is employed, if the transistor is turned OFF so that the voltage between the drain and the source is increased, then the capacitance between the gate and the drain is increased. As a result, the voltage change speed between the drain and the source is decreased, so that the surge voltage can be suppressed to the low surge voltage.

However, in the above-described MOSFET, the below-mentioned problem occurs. That is, the current flows through the p layer containing the p type impurity in the low concentration, so that the ON resistance thereof is increased. Also, the stronger the surge voltage is suppressed, the higher the ON resistance of the transistor is increased. Furthermore, in order to effectively suppress the surge voltage, the p layer containing the p type impurity in the low concentration must be made large. If the p layer is made large, then the cell pitch of the transistor becomes large, so that the ON resistance of the transistor is increased. In other words, in accordance with the measure manner for improving the internal structure of the transistor, it is practically difficult to suppress the ON resistance, the surge voltage, and the switching loss to the lower values.

As a consequence, it is desirable to accomplish switching circuits capable of suppressing ON resistances to lower ON resistance values, capable of suppressing switching losses to lower switching losses, and also capable of suppressing surge voltages to lower surge voltages, while the switching circuits can be constructed by employing small numbers of structural components.

Also, other switching circuits are known in the field. In the switching circuits, power supplies and loads are series-connected between one pair of major electrodes of transistors; and since the transistors are turned ON/OFF, conditions under which electric power is supplied to the loads, and conditions under which the electric power is not supplied are selectively switched. For instance, while an inverter circuit contains a switching circuit, a transistor of the switching circuit is turned ON/OFF in order that DC power is converted into AC power, and then, the converted AC power is supplied to a motor (one example of load).

One example as to this sort of switching circuits has been disclosed in JP-A-6-326579. The switching circuit has been equipped with a series circuit connected between a gate electrode and a drain electrode of a transistor, in which a zener diode has been series-connected to a diode. The zener diode has been set in such a manner that when a surge voltage is generated on a wiring line on the drain electrode side of the transistor, the zener diode may break down in response to the generated surge voltage. The function of the diode is to avoid that a gate current flowing to the gate electrode of the transistor when the transistor is turned ON flows via the series circuit to the wiring line on the drain electrode side of the transistor.

In the above-described switching circuit, when such a surge voltage is generated on the wiring line on the drain electrode side of the transistor, the zener diode breaks down. This surge voltage is higher than a total voltage ($V_{ZD}+V_F$) of a breakdown voltage "$V_{ZD}$" of the zener voltage and a forward direction voltage "$V_F$" of the diode. When the zener diode breaks down, the current flows from the wiring line of the drain electrode side of the transistor via the series circuit to the gate electrode of the transistor, so that the voltage of the gate electrode is increased, and thus, the transistor is turned ON. This switching circuit can be operated in such a manner that when the surge voltage is generated, since the transistor is instantaneously turned ON, the surge energy may be discharged via the transistor to the external circuit.

However, the breakdown voltage $V_{ZD}$ of the zener diode contains fluctuations of approximately of ±10% due to manufacturing tolerance. As a consequence, in this switching circuit, depending upon zener diodes to be employed, timing when these zener diodes break down is fluctuated. As a result, the above-described switching circuit has such a problem that the timing at which the surge voltage is discharged outside the own switching circuit cannot be set in higher precision.

Another type of switching circuit is desirable. That is, not only timing for slowing a changing speed of a voltage at a control electrode of a transistor is made stable, but also the changing speed of the voltage at the control electrode of the transistor is slowed at earlier timing than such a timing when a voltage at a major electrode of the transistor on the high voltage side exceeds a power supply voltage, so that the suppression capability for the surge voltage can be improved.

Also, in a switching circuit equipped with a transistor (MOSFET), an adverse influence caused by a surge voltage in the case that the MOSFET is brought into a turn-OFF state is required to be reduced.

As indicated in FIG. 34, a load driving circuit capable of protecting a MOSFET 5 from a surge voltage by the circuit itself is disclosed in JP-A-6-326579. A diode 9a and a zener diode 9 have been series-connected to a branch line 310 under such a condition that the diode 9a is located opposite to the zener diode 9. The diode 9a plays a role of suppressing that a current flows through the branch line 310 when the MOSFET 5 is turned ON in response to an ON signal outputted from an output terminal 318 of a control circuit 3. The zener diode 9 plays a role of increasing a voltage at a gate G of the MOSFET 5 in such a case that a positive surge voltage is applied to a power supply line 322 when the MOSFET 5 is turned OFF. The positive surge voltage is higher than, or equal to the zener voltage "$V_{ZD}$" plus the diode forward direction threshold voltage "$V_F$." As a result, the MOSFET 5 is brought into an ON state, so that a signal path between the source and the drain of the MOSFET 5 becomes conductive, and thus, the surge voltage can be discharged.

However, normally, a zener voltage "$V_{ZD}$" of a zener diode is fluctuated by approximately ±10%. Accordingly, in such a case that the zener diode is employed as explained in the above-described conventional technique, it is practically difficult that the reference voltage ($V_{ZD}+V_F$) for suppressing the serge voltage is correctly set to a predetermined value.

FIG. 35 represents a result obtained by simulating a temporal change of a drain voltage VD when a MOSFET is turned OFF in such a case that a voltage of a power supply PS is set to 100V. FIG. 35 shows a simulation result in the case that no surge voltage suppression measure is performed in the switching circuit (indicated by line "XXXVA"); a simulation result in the case that the serve voltage suppression measure using the zener diode 9 is performed as explained in the above-described conventional load driving circuit, and then, "$V_{ZD}+V_F$" is set to 100 V (represented by line "XXXVB"); and a simulation result in the case that although the serve voltage suppression measure using the zener diode 9 is performed as explained in the above-described conventional load driving circuit, "$V_{ZD}+V_F$" is varied to 90 V and 110 V due to fluctuations of the zener diode "$V_{ZD}$" (indicated by lines "XXXVC" and "XXXVD").

Assuming now that a surge voltage is defined as a difference from a peak value of the drain voltage VD up to a value under steady condition, when the surge voltage suppression measure is not taken, the surge voltage is 22V; and when "$V_{ZD}+V_F$" is set to 100 V, the surge voltage is 3 V, so that the suppression effect of the surge voltage may become achieved. However, if ($V_{ZD}+V_F$) becomes 110V, then the surge voltage becomes 13 V, so that the suppression effect of the surge voltage is considerably lowered. Also, when ($V_{ZD}+V_F$) becomes 90 V, the drain voltage VD cannot be recovered to 100 V corresponding to the power supply voltage.

As previously described, in the surge voltage suppressing circuits using the zener diodes, when $V_{ZD}+V_F$ can be correctly controlled to the predetermined value, the surge voltage suppressing effect can be achieved. However, as explained above, since the zener voltage $V_{ZD}$ is fluctuated, the suppression effect of the surge voltage may not be sufficiently achieved, or the drain voltage VD may not be recovered up to the power supply voltage.

As a consequence, such a switching circuit capable of suppressing a surge voltage under stable condition is required, and another switching circuit capable of reducing both a switching loss and noise of a transistor is required.

Also, another switching circuit is known in the field. In the switching circuit, since a transistor connected to a load is turned ON/OFF, a condition under which electric power is supplied to the load, and another condition under which the electric power is not supplied are selectively switched. For instance, in an inverter circuit, a transistor is turned ON/OFF in order that DC power is converted into AC power, and then, the converted AC power is supplied to a motor. The turn-ON/OFF operations of the transistor of this sort of circuit are controlled by a driving circuit connected to the gate electrode (otherwise, base electrode) of this transistor.

FIG. 65A to FIG. 65E show an example of operating waveform diagrams as the related art in such a case that a field-effect type transistor is employed as this sort of transistor. A driving circuit switches ON/OFF operations of the field-effect transistor by applying a driving voltage "Vin" to a gate electrode of the field-effect transistor.

A first description is made of a transition time period during which the field-effect transistor is turned ON. When the driving voltage Vin becomes a high level from a low level, a positive gate current "Ig" flows toward the gate electrode of the transistor, so that electron charges are stored in the gate electrode. When the electron charges are stored in the gate electrode, a gate-to-source voltage "Vgs" of the transistor is increased. When the gate-to-source voltage "Vgs" of the transistor is increased, a drain current "Id" starts to flow from the drain of the transistor to the source thereof, so that a drain-to-source voltage Vds is decreased. The turn-OFF operation of the transistor is transferred to the turn-ON operation via these operation stages.

Next, a description is made of a transition time period T100 during which the field-effect transistor is turned OFF. When the driving voltage Vin becomes a low level from a high level, the electron charges stored in the gate electrode are discharged, and a negative gate current "Ig" flows from the gate electrode toward the driving circuit, so that the gate-to-source voltage "Vgs" of the transistor is decreased. When the gate-to-source voltage "Vgs" of the transistor is decreased, the drain current "Id" is also decreased, so that the drain-to-source voltage Vds is increased. The turn-ON operation of the transistor is transferred to the turn-OFF operation via these operation stages.

As shown in FIG. 65A to FIG. 65E, in a final stage of the transition time period T100 during which the transistor is turned OFF, a surge voltage is generated in the drain-to-source voltage Vds. This surge voltage is induced by the drain current Id which is steeply varied, and an inductance staying on the wiring line of the drain electrode side within the circuit.

In order to suppress the increase of this surge voltage, the drain current Id may be gently varied. For instance, if the gate resistance of the transistor is increased, then the speed at which the electron charges stored in the gate electrode are discharged is decreased, so that the negative gate current Ig flows in a gentle manner. As a result, the drain current Id is also gently decreased, so that increasing of the surge voltage can be suppressed. However, if the drain current Id of the transistor is gently decreased, then a time period required until the transistor is turned OFF is increased, so that a turn-OFF loss is increased. That is to say, this sort of transistors have a trade-off relationship between the surge voltage and the turn-OFF loss during the transition time period T100 of the turn-OFF operation of the transistor.

In order to overcome this trade-off relationship, it is desirable to steeply vary the drain current Id in the beginning stage of the transition time period T100 of the turn-OFF operation, and also, it is desirable to gently vary the drain current Id in the final stage of the transition time period T100 of the turn-OFF operation. If the drain current Id is steeply varied in the beginning stage of the transition time period T100, then the time required for turning OFF the transistor can be shortened. As a result, the turn-OFF loss can be suppressed to a small loss. If the drain current Id is gently varied in the final stage of the transition time period T100, then increasing of the surge voltage can be suppressed.

JP-A-6-291631 discloses such a technical idea capable of adjusting a resistance value of a gate resistor of a transistor based upon voltages between major electrodes of the transistor. As the voltages between the major electrodes, there are a voltage between a drain electrode and a source electrode, a voltage between a collector electrode and an emitter electrode, and so on. In this technical idea, the following adjustment is carried out: That is, when the voltage between the major electrodes of the transistor is high, the resistance value of the gate is increased, whereas when the voltage between the major electrodes of the transistor is low, the resistance value of the gate is decreased. Concretely speaking, this driving circuit has been equipped with a resistance variable means connected to the gate electrode of the transistor. The resistance variable means has been arranged by a semiconductor switching element and a fixed resistor which is parallel-connected to the semiconductor switching element. When the voltage between the major electrodes of the transistor is higher than a predetermined value, the semiconductor switching element is turned OFF, whereas when the voltage between the major electrodes of the transistor is lower than the predetermined value, the semiconductor switching element is turned ON. In other words, when the voltage between the major electrodes of the transistor is high, the semiconductor switching element is turned OFF, so that the gate resistance is adjusted to be increased in response to a resistance value of a fixed resistor. When the voltage between the major electrodes of the transistor is low, the semiconductor switching element is turned ON, so that the gate resistance is adjusted to be decreased in response to an internal resistance value of the semiconductor switching element.

When the above-described driving circuit is utilized, in the beginning stage (when voltage between major electrodes is low) of the transition time period for the turning-OFF operation of the semiconductor switching element, the semiconductor switching element is turned ON, so that the resistance value of the gate resistor is adjusted to become small, and thus, the gate current is steeply varied. As a result, the drain current of the transistor is steeply varied, so that the time required for turning OFF the semiconductor switching element can be shortened. Furthermore, in the final stage (when voltage between major electrodes is high) of the transition time period for the turning-OFF operation, the semiconductor switching element is turned OFF, so that the resistance value of the gate resistor is adjusted to become large, and thus, the gate current is gently varied. As a result, the drain current of the transistor is gently varied, so that increasing of surge voltage can be suppressed.

As a consequence, in the above-described driving circuit, the high resistance state of the gate resistor is realized by utilizing the fixed resistor having the high resistance value. In order to suppress increasing of the surge voltage, it is desirable that the resistance value of the fixed resistor is set to be large. However, the fixed resistor having the higher resistance value may increase the turn-OFF loss. As a consequence, in order to suppress increasing of the turn-OFF loss, such a timing when the resistor is switched to the fixed resistor having the high resistance value by turning ON/OFF the semiconductor switching element must be correctly set to the final stage of the transition time period for turning ON/OFF the semiconductor switch element. In the final stage of the transition time period for turning ON/OFF the semiconductor switching element, the voltage between the major electrodes of the transistor has been reached to the higher voltage state. In the above-described driving circuit, the turn ON/OFF operations of the semiconductor switching element must be controlled by correctly changing the voltage between the major electrodes of this transistor up to the threshold value as to the turn-ON/OFF operations of the semiconductor switching element. As a consequence, in order to realize such a circuit, a total number of necessary circuit components is increased, so that cost of this circuit is necessarily increased.

Another technical idea is required which may adjust the resistance value of the gate resistor of the transistor based upon the voltage between the major electrodes of the transistor in accordance with another manner different from the above-described manner. It should also be noted that the problems have been described by mainly considering the transition time period for turning OFF the transistor in the above-mentioned descriptions. However, even in a transition time period for turning ON the transistor, there are many possibilities that the resistance value of the gate resistor of the transistor is wanted to be adjusted based upon the voltage between the major electrodes of the transistor. In other words, such a technical idea capable of achieving useful results is required even in any transition time periods for turning ON and turning OFF the transistor.

Also, JP-A-1-183214 discloses a circuit for diving a bipolar type transistor. It should also be noted that the technical idea related to this driving circuit may also be utilized in such a case that a field-effect type transistor is driven.

The above-described driving circuit has been equipped with two resistors connected to a gate electrode of a unipolar type transistor. In accordance with this driving circuit, in a beginning stage of a transition time period for turning OFF the transistor, a negative gate current from the gate electrode flows through the two resistors. On the other hand, in a final stage of the transition time period for turning OFF the transistor, a negative gate current from the gate electrode flows only through the other resistor, while one resistor is cut off.

If the above-described driving circuit is utilized, then the negative gate current is steeply varied in the beginning stage of the transition time period for turning OFF the transistor, so that the drain current is steeply varied, and thus, the time required for turning OFF the transistor can be shortened. Moreover, if the above-described driving circuit is utilized, then the negative gate current is gently varied in the final stage of the transition time period for turning OFF the transistor, so that the drain current is gently varied, and thus, increasing of the surge voltage can be suppressed.

In the above-described driving circuit, timing for cutting off one resistor has been previously set based upon a time constant as to both a capacitor and a resistor assembled in the driving circuit. As a consequence, when the turn-OFF operation is repeatedly carried out, such an event may occur. That is, the timing for cutting off one resistor is deviated from such a timing for determining both the beginning stage and the final stage of the turn-OFF operation. The manner for controlling the cut-off timing which has been previously set cannot be synchronized with the operation of the transistor. As a consequence, increasing of the surge voltage and increasing of the turn-OFF loss cannot be firmly suppressed.

As a consequence, the below-mentioned technical idea is desired. That is, while monitoring such a condition that a transistor is operated, a resistance value of a gate resistor of the transistor is adjusted. It should also be understood that the problems have been described by mainly considering the transition time period for turning OFF the transistor in the above-mentioned descriptions. However, even in a transition time period for turning ON the transistor, there are many possibilities that the below-mentioned technical idea is required. That is, while monitoring such a condition that the transistor is operated, the resistance value of the gate resistor of the transistor is adjusted, even in the transition time period for turning ON the transistor. As a consequence, such a technical idea capable of achieving useful results is required even in any of the transition time periods for turning OFF and turning ON the transistor.

SUMMARY OF THE INVENTION

In view of the above-described problem, it is an object of the present invention to provide a switching circuit having a small switching loss and a small surge voltage. It is another object of the present invention to provide a driving circuit for a transistor.

According to a first aspect of the present disclosure, a switching circuit includes: a transistor having a first electrode, a second electrode and a control electrode; a zener diode; and a capacitor. A connection between the first electrode and the second electrode is capable of temporally switching between a conduction state and a non-conduction state by switching a control voltage of the transistor. The zener diode and the capacitor are coupled in series between the first electrode and the control electrode of the transistor. The first electrode is a drain or a collector.

In the above switching circuit, the switching loss can be reduced. Further, the surge voltage also can be reduced. Accordingly, both of the switching loss and the surge voltage are limited to be small. Furthermore, the transistor has a low on-state resistance (or, a low on-state voltage), and the number of parts for providing the circuit is small.

According to a second aspect of the present disclosure, a switching circuit includes: a transistor having a first electrode, a second electrode and a control electrode; a zener diode; and a capacitor. A connection between the first electrode and the second electrode is capable of temporally switching between a conduction state and a non-conduction state by switching a control electrode voltage of the transistor. The zener diode and the capacitor are coupled in series between the first electrode and the second electrode of the transistor. The first electrode is a drain or a collector. The second electrode is a source or an emitter.

In the above switching circuit, both of the switching loss and the surge voltage are limited to be small. Furthermore, the transistor has a low on-state resistance (or, a low on-state voltage), and the number of parts for providing the circuit is small.

According to a third aspect of the present disclosure, a switching circuit includes: a transistor having a high voltage side main electrode, a low voltage side main electrode and a control electrode, wherein a power source and a load are coupled in series between the high voltage side main electrode and the low voltage side main electrode; a control circuit for outputting a voltage, which provides to switch the transistor on and off, wherein the control circuit is coupled with the control electrode of the transistor; a series circuit having a first capacitor and a first diode, wherein the series circuit is coupled between the control electrode and the high voltage side main electrode of the transistor, wherein the first capacitor and the first diode are coupled in series with each other, wherein a cathode of the first diode is coupled with a control electrode side, and wherein an anode of the first diode is coupled with a high voltage side main electrode side; and a voltage control circuit. The voltage control circuit is coupled with a connection portion between the first capacitor and the first diode. The voltage control circuit controls a voltage of the connection portion.

In the above circuit, by utilizing the voltage control circuit, a timing for slowing a changing speed of a voltage generated in the control electrode of the transistor is controlled when the transistor is turned off. When this timing is adjusted earlier, the surge voltage can be reduced. Further, in the above circuit, since the changing speed of the voltage generated in the control electrode of the transistor is slowed during the transistor is turning off, both of the turn-off loss and the surge voltage are reduced.

According to a fourth aspect of the present disclosure, a switching circuit includes: a transistor having a first electrode, a second electrode and a control electrode, wherein the transistor controls a first electrode current flowing through the first electrode in accordance with a signal inputted in the control electrode; a capacitor; and a diode having an anode terminal and a cathode terminal. The first electrode of the transistor is coupled with the anode terminal of the diode through the capacitor therebetween. The control electrode of the transistor is coupled with the cathode terminal of the diode. The control electrode is a gate or a base. The first electrode is a drain or a collector.

In the above circuit, the surge voltage of the switching circuit including the transistor is accurately and stably reduced.

According to a fifth aspect of the present disclosure, a switching circuit includes: a transistor having a first electrode, a second electrode and a control electrode, wherein the transistor controls a first electrode current flowing through the first electrode in accordance with a signal inputted in the control electrode; a capacitor; and a diode having an anode terminal and a cathode terminal. The first electrode of the transistor is coupled with the anode terminal of the diode. The control electrode of the transistor is coupled with the cathode terminal of the diode through the capacitor. The control electrode is a gate or a base. The first electrode is a drain or a collector.

In the above circuit, the surge voltage of the switching circuit including the transistor is accurately and stably reduced.

According to a sixth aspect of the present disclosure, a driving circuit for driving a transistor includes a variable resistor. The transistor includes a control electrode, a first electrode and a second electrode. The variable resistor is coupled with the control electrode of the transistor. The variable resistor includes a depletion layer, which is expandable in accordance with a voltage between the first electrode and the second electrode of the transistor. The depletion layer is capable of controlling a current path of the variable resistor.

In the above driving circuit, there is no need to have a circuit for setting a threshold accurately, similar to on/off operation of a semiconductor switching element. Accordingly, the construction of the above driving circuit is simplified. In the above driving circuit, a width of the current path of the variable resistor is controlled by utilizing the depletion layer, which is expandable in accordance with the voltage between the main electrodes of the transistor. Further, the construction of the circuit is simplified, and a manufacturing cost of the circuit is also reduced.

According to a seventh aspect of the present disclosure, a driving circuit for driving a transistor includes a control circuit. The transistor includes a control electrode, an output electrode and an input electrode, and the control circuit controls a control electrode resistance of the transistor based on a control current flowing through the control electrode of the transistor.

In the above driving circuit, the resistance of the gate resistor in the transistor is controlled based on the gate current sufficiently corresponding to the state of operation of the transistor. Accordingly, the above driving circuit can control the resistance of the gate resistor in synchronous with the operation of the transistor.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
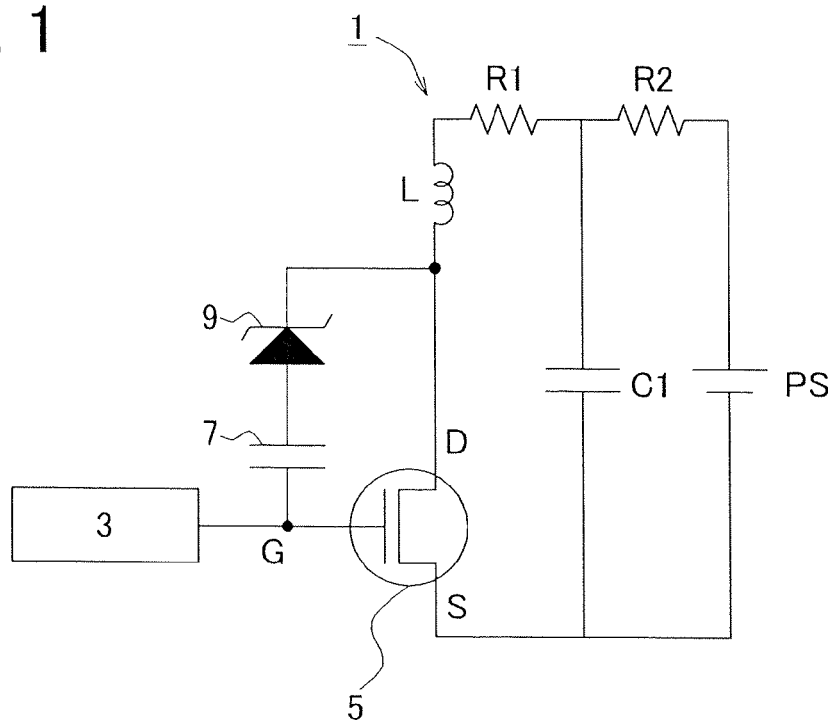
FIG. 1 is a circuit diagram for showing a switching circuit of a first embodiment of the present invention.

FIG. 1 shows a major portion of a switching circuit 1 according to a first embodiment of the present disclosure. The switching circuit 1 has been equipped with a DC power supply PS, a load resistor R1, and a transistor (namely, MOSFET) 5, while these circuit elements has been series-connected to each other. The switching circuit 1 has also be equipped with a capacitance component C1, a resistance component R2, and a stray inductance component L which is caused by a wiring line, and the like. When a current flowing between main electrodes (namely, drain D and source S) of the transistor 5 is rapidly changed by the stray inductance component L, a large surge voltage is generated between the major electrodes of the transistor 5, and thus, there are some possibilities that this large surge voltage may damage the transistor 5, or may become noise which may give an adverse influence to other appliances.

The transistor 5 is a unipolar type transistor, while a drain D thereof has been connected to the high potential side and a source S thereof has been connected to the low potential side. A gate voltage control circuit 3 has been connected to a gate G of the transistor 5. The gate voltage control circuit 3 outputs such a gate voltage. This gate voltage is inverted at a high frequency between a potential which causes the transistor 5 to become conductive, and another potential which causes the transistor 5 to become non-conductive.

A signal path between the drain D and the gate G of the transistor 5 has been connected by a series circuit constructed of a zener diode 9 and a capacitor 7. A cathode of the zener diode 9 has been connected to the drain D of the transistor 5, and an anode of the zener diode 9 has been connected via a capacitor 7 to the gate G of the transistor 5. While the transistor 5 is turned OFF, a potential of the drain D is higher than a potential of the gate G, so that a reverse bias voltage is applied to the zener diode 9.

Figure 2:
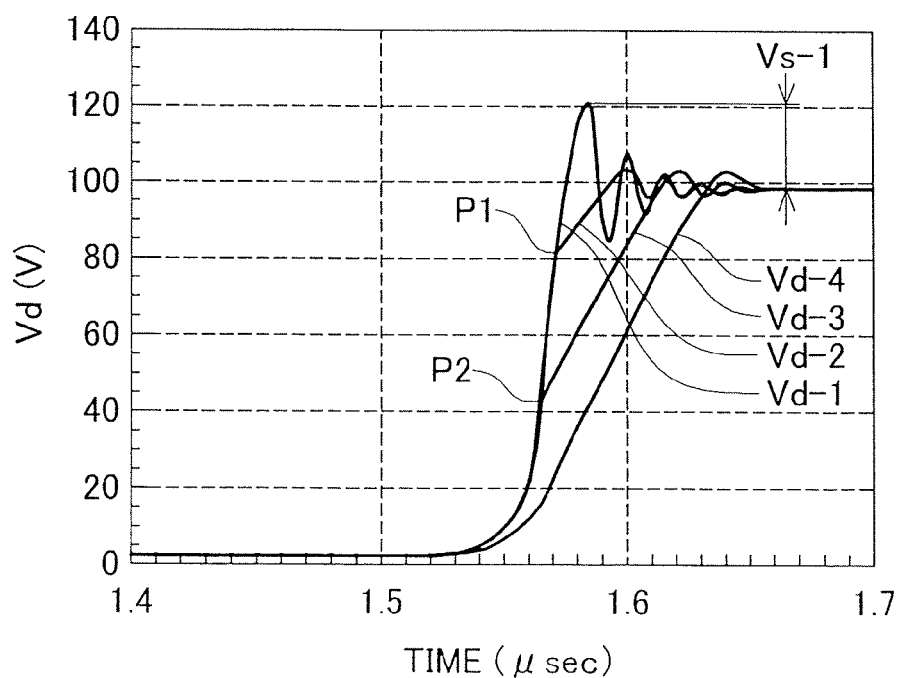
FIG. 2 is a graph for representing temporal changes of drain voltages, which occur before and after when transistors of the first embodiment and of a comparison example are turned OFF.

FIG. 2 shows a temporal change of a drain voltage "Vd" generated before and after the transistor 5 of FIG. 1 is turned OFF. In this example, a drain voltage "Vd" implies a voltage between the drain D and the source S of the transistor 5 (namely, drain-to-source voltage). Since the source voltage is defined as a reference voltage (zero volt) in the below-mentioned specification, a drain-to-source voltage will be referred to as a drain voltage "Vd." An abscissa of FIG. 2 indicates a time ($\mu$ second), and an ordinate thereof represents a voltage. In FIG. 2, at a time instant of 1.53$\mu$ seconds, the transistor 5 has been turned OFF. When the transistor 5 is turned ON, the drain voltage Vd is increased toward a power supply voltage (in this case, 100 V).

Figure 3:
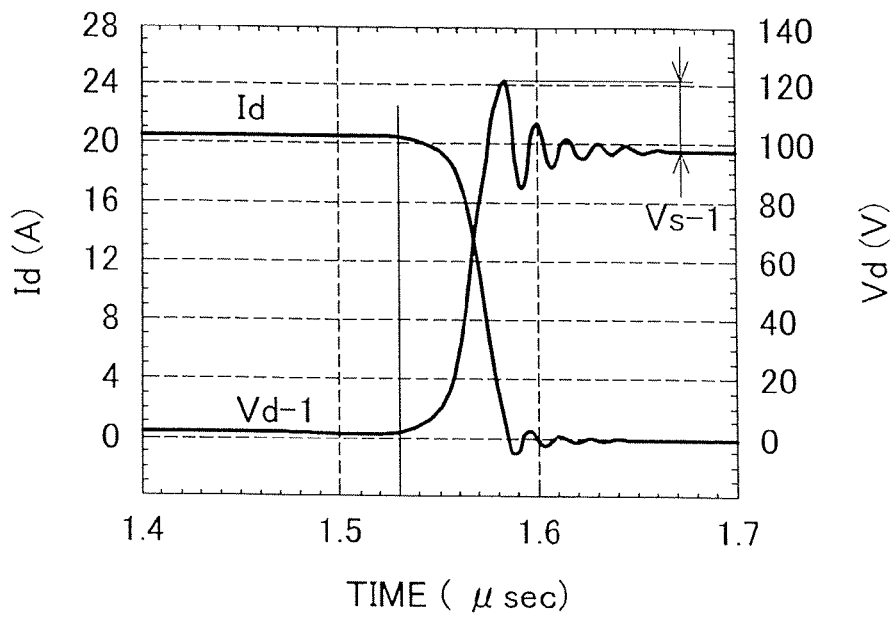
FIG. 3 is a graph for indicating temporal changes in a drain current and a drain voltages, which occur before and after when the transistor is turned OFF under such a condition that a signal path between a drain and a gate of the transistor are opened.
Figure 4:
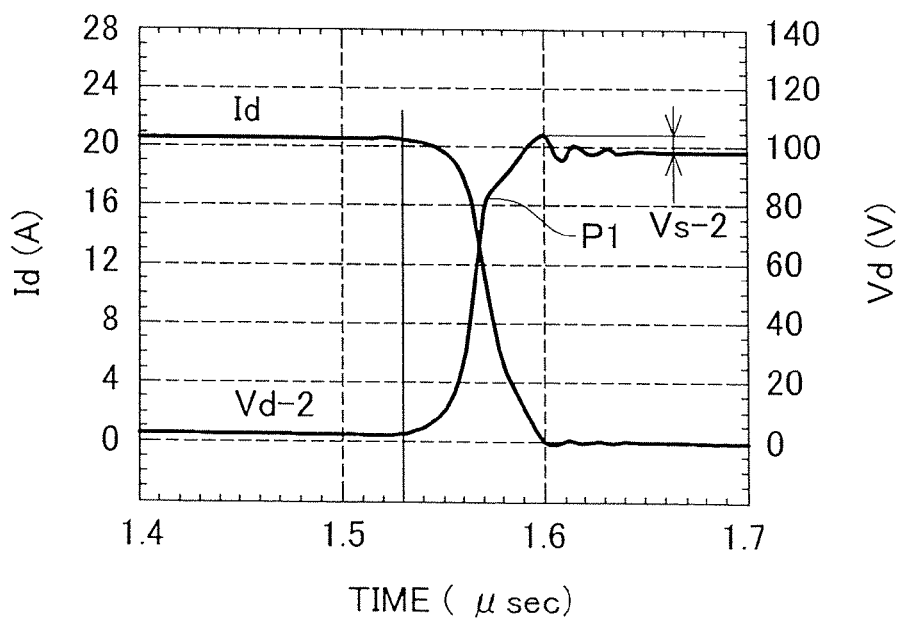
FIG. 4 is a graph for representing temporal changes of a drain current and a drain voltage, which occur before and after the transistor is turned OFF under such a condition that the signal path between the drain and the gate is connected by a series circuit constructed of a zener diode and a capacitor.
Figure 5:
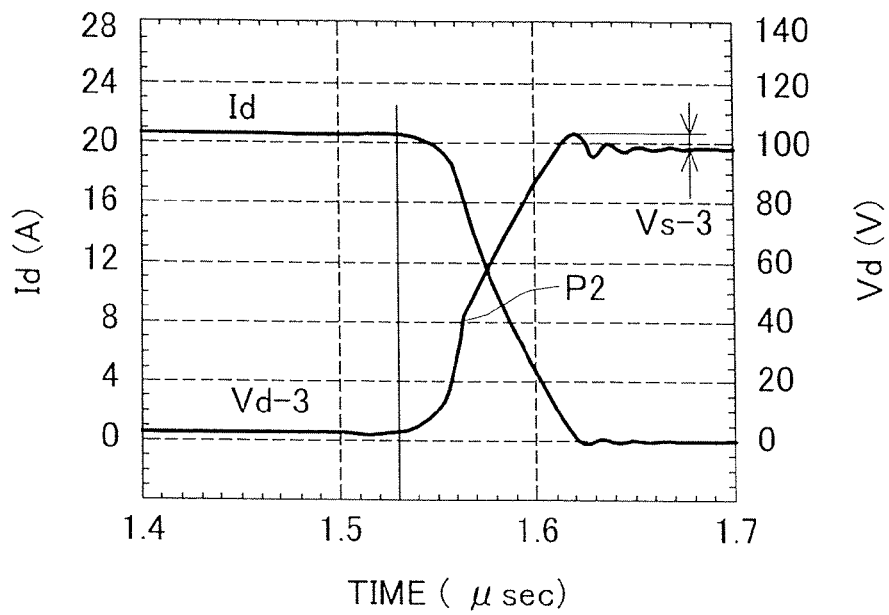
FIG. 5 is a graph for representing temporal changes of a drain current and a drain voltage, which occur before and after the transistor is turned OFF under such a condition that the signal path between the drain and the gate is connected by the series circuit constructed of the zener diode and the capacitor, while a zener voltage of the zener diode is different from that of FIG. 4.

FIG. 3 to FIG. 5 indicate temporal changes of drain voltages "Vd" and drain currents "Id", which are produced before and after the transistor 5 of FIG. 1 is turned OFF. In this case, a drain current "id" implies a current flowing between the drain D and the source S of the transistor 5 (drain-to-source current). Abscissas of FIG. 3 to FIG. 5 show a time ($\mu$ second), left ordinates indicate currents, and right ordinates represent voltages. Even in FIG. 3 to FIG. 5, at a time instant of 1.53$\mu$ seconds, the transistor 5 has been turned OFF. When the transistor 5 is turned OFF, the drain current Id is decreased toward zero.

A curve of "Vd-1" of FIG. 2 indicates a temporal change of a drain voltage Vd of a comparison example in order to be compared with that of the first embodiment. The switching circuit of the comparison example corresponds to such a case that the series circuit constructed of the zener diode 9 and the capacitor 7 is not present between the drain D and the gate G of the transistor 5. In the switching circuit of the comparison example, the drain voltage Vd exceeds the power supply voltage (100 volt.) and is largely increased, and thereafter, is converged to the power supply voltage while the drain voltage is oscillating. A surge voltage Vs may be defined by a difference between a maximum value of such a drain voltage Vd gene rated after the transistor 5 is turned OFF and a drain voltage Vd which becomes stable after the transistor 5 is turned OFF. In the switching circuit of the comparison example, as shown in the curve of Vd-1 of FIG. 2, a large surge voltage "Vs-1" is generated.

In FIG. 3, a temporal change of the drain current Id of the switching circuit of the comparison example has been described in combination with the temporal change of the drain voltage.

A switching loss is equal to such a value obtained by integrating absolute values of drain voltages "Vd" X drain currents "Id" as to a time period after the transistor 5 has been turned OFF until the drain current Id is stabilized at a stationary value.

In the switching circuit of the comparison example, since both the drain voltage Vd and the drain current Id are rapidly changed, a switching loss is small.

Figure 6:
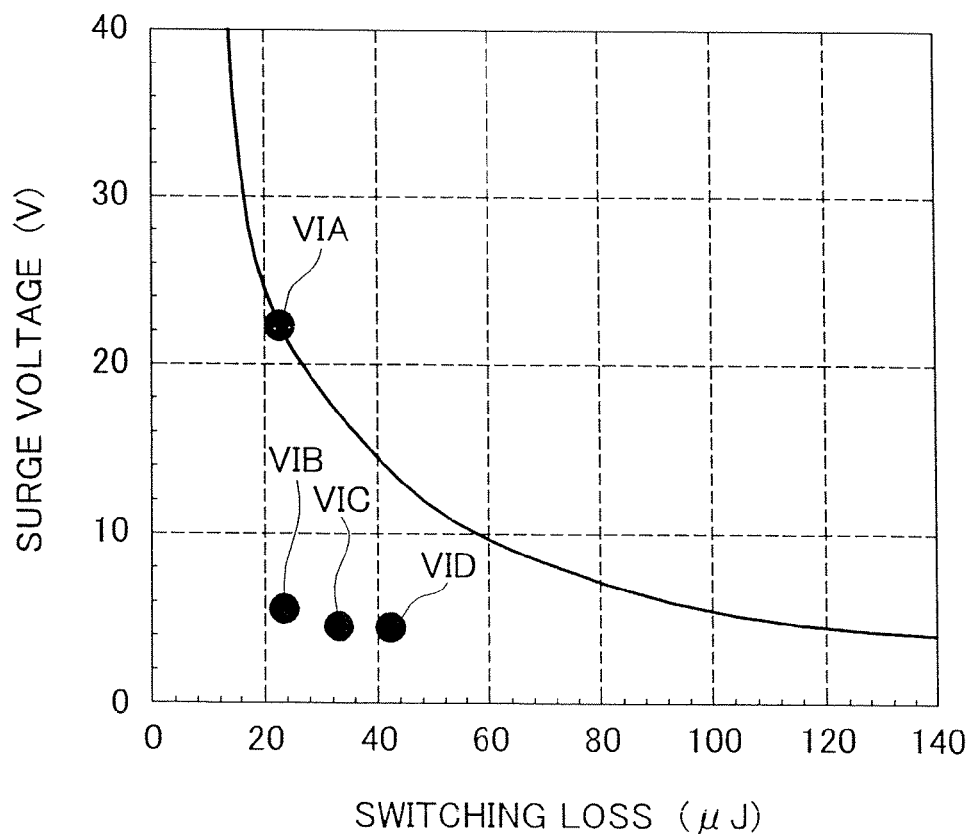
FIG. 6 is a graph for showing a relationship between switching losses and surge voltages of the first embodiment and of the comparison example.

FIG. 6 represents a simulation result of a switching loss (abscissa) and a surge voltage (ordinate). A point "VIA" of FIG. 6 indicates a simulation result in the case where a signal path between a drain D and a gate G of a MOSFET is opened, and indicates such a fact that a surge voltage is high, as compared with results 2 and 3 of this first embodiment (will be explained later).

A hyperbolic curve shown in FIG. 6 represents a simulation result as to switching losses and surge voltages in the case that various sorts of MOSFETs are employed, while these MOSFETs are commercially available at the present stage. A clear trade-off relationship between the switching losses and the surge voltages is present.

The point "VIA" is located on the trade-off curve.

A curve of "Vd-2" shown in FIG. 2 represents a temporal change of a drain voltage Vd in such a case that the signal path between the drain D and the gate G of the transistor 5 is connected by a series circuit constituted by a zener diode 9 having a zener voltage of 90 V and a capacitor 7 having a capacitance of 1 nF. As apparent from this curve, a changing speed of the drain voltage Vd is changed before and after a point "P1." Before this point "P1", the drain voltage Vd is rapidly changed, whereas the change of the drain voltage Vd is slowed after the point P1. In this case, the point "P1" corresponds to such a point that the drain-to-gate voltage becomes 90 V, so that the zener diode 9 breaks down.

When the zener diode 9 breaks down at the point P1, a gate voltage (correctly speaking, although this voltage is gate-to-source voltage, since source voltage constitutes reference voltage, this voltage is simply referred to as "gate voltage") receives the influence caused by the drain voltage, so that this voltage is increased. The increasing gate voltage may alternatively delay the turn-OFF speed of the transistor 5, and may alternatively slow the increasing speed of the drain voltage Vd and the decreasing speed of the drain current Id so as to suppress the surge voltage to a lower surge voltage.

After the point P1, the change of the drain voltage Vd is slowed, so that a surge voltage "Vs-2" (refer to FIG. 4) may be suppressed.

In FIG. 4, the below-mentioned temporal change is also described in combination with the temporal change of the drain voltage Vd, namely the temporal change of the drain current "Id" in the case that the series circuit is employed which is constituted by the zener diode 9 having the zener voltage of 90 V, and the capacitor 7 having the capacitance of 1 nF is also described.

In such a case that the signal path between the drain D and the gate G of the transistor 5 is connected by the series circuit constituted by the zener diode 9 having the zener voltage of 90 V and the capacitor 7 having the capacitance of 1 nF, both a change of the drain voltage Vd and a change of the drain current Id are slowed after the point P1. As a result, a switching loss is slightly increased. However, before the point P1, an influence of the capacitor 7 does not appear, but both the drain voltage Vd and the drain current Id are rapidly changed. As a consequence, an increased amount of the switching loss may be maintained within a small amount range.

A point "VIB" of FIG. 6 shows a simulation result in such a case that the signal path between the drain D and the gate G of the transistor 5 is connected by the series circuit constituted of the zener diode 9 having the zener voltage of 90 V and the capacitor 7 having the capacitance of 1 nF.

Although a switching loss of this point VIB is slightly increased, as compared with that of the point VIA, a surge voltage is remarkably suppressed. While comparing with the conventional circuit in which the signal paths between the drains and the gates of the various sorts of presently available MOSFETs are opened, when the serge voltage Vs is equivalently maintained, the switching loss can be suppressed to a smaller switching loss than the conventional switching loss, whereas when the switching loss is equivalently maintained, the surge voltage Vs can be suppressed to a lower surge voltage than the conventional surge voltage.

A curve of "Vd-3" shown in FIG. 2 represents a temporal change of a drain voltage Vd in such a case that the signal path between the drain D and the gate G of the transistor 5 is connected by a series circuit constituted by a zener diode 9 having a zener voltage of 50 V and a capacitor 7 having a capacitance of 1 nF. As apparent from this curve, a changing speed of the drain voltage Vd is changed before and after a point "P2." Before this point "P2", the drain voltage Vd is rapidly changed, whereas the change of the drain voltage Vd is slowed after the point P2. In this case, the point "P2" corresponds to such a point that the drain-to-gate voltage becomes 50 V, so that the zener diode 9 breaks down.

After the point P2, the change of the drain voltage Vd is slowed, so that a surge voltage "Vs-3" (refer to FIG. 5) may be suppressed.

In FIG. 5, the below-mentioned temporal change is also described in combination with the temporal change of the drain voltage, namely the temporal change of the drain current "Id" in the case that the series current is employed which is constituted by the zener diode 9 having the zener voltage of 50 V, and the capacitor 7 having the capacitance of 1 nF is also described.

In such a case that the signal path between the drain D and the gate G of the transistor 5 is connected by the series circuit constituted by the zener diode 9 having the zener voltage of 50 V and the capacitor 7 having the capacitance of 1 nF, both a change of the drain voltage Vd and a change of the drain current Id are slowed after the point P2. As a result, a switching loss is increased. However, before the point P2, an influence of the capacitor 7 does not appear, but both the drain voltage Vd and the drain current Id are rapidly changed. As a consequence, an increased amount of the switching loss is maintained within a small amount range.

A point "VIC" of FIG. 6 shows a simulation result in such a case that the signal path between the drain D and the gate G of the transistor 5 is connected by the series circuit constituted by the zener diode 9 having the zener voltage of 50 V and the capacitor 7 having the capacitance of 1 nF.

As compared with the point "VIB", although a switching loss of this point "VIC" is slightly increased, a surge voltage is furthermore suppressed.

In the case that such a zener is employed whose zener voltage is approximately 0.5 to 1.0 times higher than a voltage applied between a drain and a source of a transistor when the transistor is turned OFF (implies that transistor is stabilized under OFF state), the following fact can be revealed. That is, both a surge voltage and a switching loss can be suppressed under better balance condition. In the case that the surge voltage is strongly suppressed, it is preferable to utilize a zener diode having a lower zener voltage. In the case that an increase of the switching loss is strongly suppressed, it is desirable to employ a zener diode having a higher zener voltage.

A curve of "Vd-4" shown in FIG. 2 represents a temporal change of a drain voltage Vd in such a case that the signal path between the drain D and the gate G of the transistor 5 is connected by a capacitor 7 having a capacitance of 1 nF. In this case, the zener diode 9 is not used. As apparent from the curve, during a time period from a commencement of turning-OFF of the transistor 5 until the transistor 5 is stabilized under OFF state, the change of the drain voltage Vd is slow. As a result, although the surge voltage Vs is suppressed, the switching loss is largely increased.

A point "VID" of FIG. 6 shows a simulation result in such a case that the signal path between the drain D and the gate G of the transistor 5 is connected by the capacitor 7 having the capacitance of 1 nF.

A switching loss of this point VID is increased, as compared with the switching losses of the points VIB and VIC. It can be understood that the utilization of the zener diode 9 becomes effective.

It should also be noted that it is preferable that the stray capacitance of the zener diode 9 is small. If the stray capacitance of the zener diode 9 is small, then both a voltage change and a current change just after the transistor 5 is turned OFF can be kept at high speeds. If such a zener diode 9 having a small stray capacitance is employed, then it is possible to suppress a switching loss to a small value.

Second Embodiment

Figure 7:
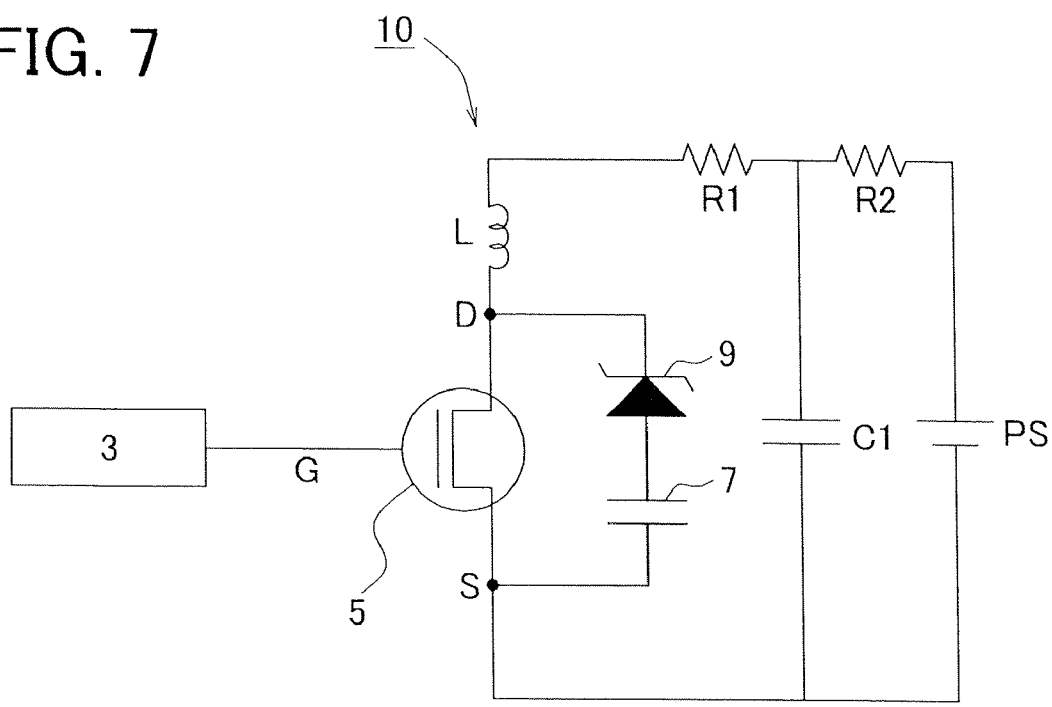
FIG. 7 is a circuit diagram for showing a switching circuit of a second embodiment of the present invention.

FIG. 7 shows a major portion of a switching circuit 10 according to a second embodiment of the present disclosure. The switching circuit 10 has been equipped with a DC power supply PS, a load resistor R1, and a transistor (namely, MOSFET) 5, while these circuit elements has been series-connected to each other. The switching circuit 10 has also be equipped with a capacitance component C1, a resistance component R2, and a stray inductance component L which is caused by a wiring line, and the like. When a current flowing between main electrodes (namely, drain D and source S) of the transistor 5 is rapidly changed by the stray inductance component L, a large surge voltage is generated between the major electrodes of the transistor 5, and thus, there are some possibilities that this large surge voltage may damage the transistor 5, or may become noise which may give an adverse influence to other appliances.

The transistor 5 is a unipolar type transistor, while a drain D thereof has been connected to the high potential side and a source S thereof has been connected to the low potential side. A gate voltage control circuit 3 has been connected to a gate G of the transistor 5. The gate voltage control circuit 3 outputs such a gate voltage. This gate voltage is inverted at a high frequency between a potential which causes the transistor 5 to become conductive, and another potential which causes the transistor 5 to become non-conductive.

A signal path between the drain D and the source S of the transistor 5 has been connected by a series circuit constructed of a zener diode 9 and a capacitor 7. A cathode of the zener diode 9 has been connected to the drain D of the transistor 5, and an anode of the zener diode 9 has been connected via a capacitor 7 to the source S of the transistor 5. While the transistor 5 is turned OFF, a potential of the drain D is higher than a potential of the source S, so that a reverse bias voltage is applied to the zener diode 9.

Figure 8:
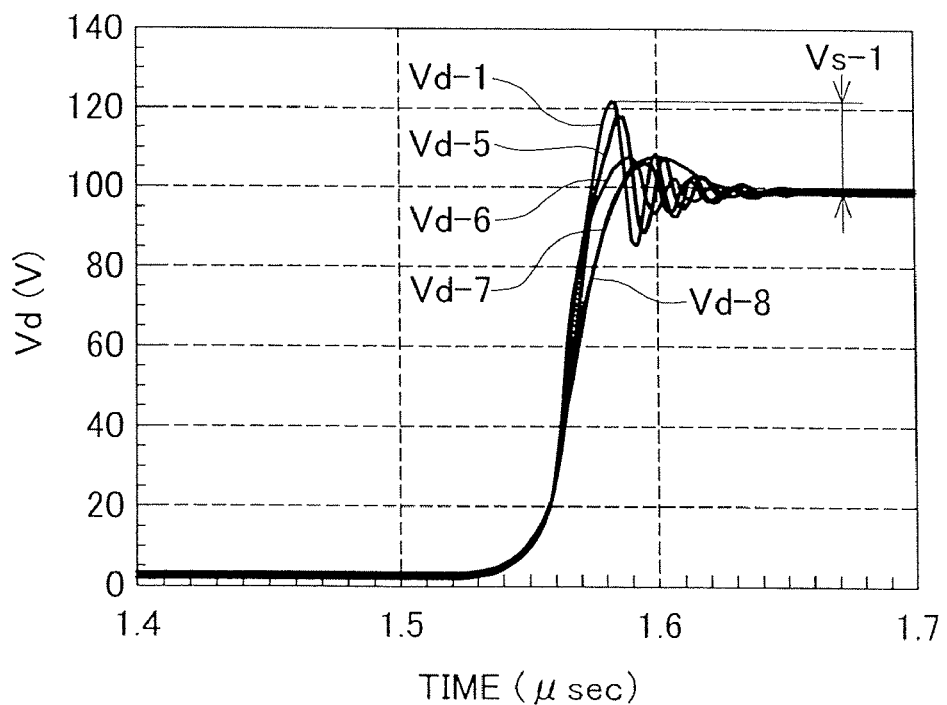
FIG. 8 is a graph for representing temporal changes of drain voltages, which occur before and after when transistors of the second embodiment and of the comparison example are turned OFF.

FIG. 8 shows a temporal change of a drain voltage "Vd" generated before and after the transistor 5 of FIG. 7 is turned OFF. In this example, a drain voltage "Vd" implies a voltage between the drain D and the source S of the transistor 5 (namely, drain-to-source voltage). An abscissa of FIG. 8 indicates a time (μ second), and an ordinate thereof represents a voltage. In FIG. 8, at a time instant of 1.53μ seconds, the transistor 5 has been turned OFF. When the transistor 5 is turned ON, the drain voltage Vd is increased toward a power supply voltage (in this case, 100 V).

Figure 9:
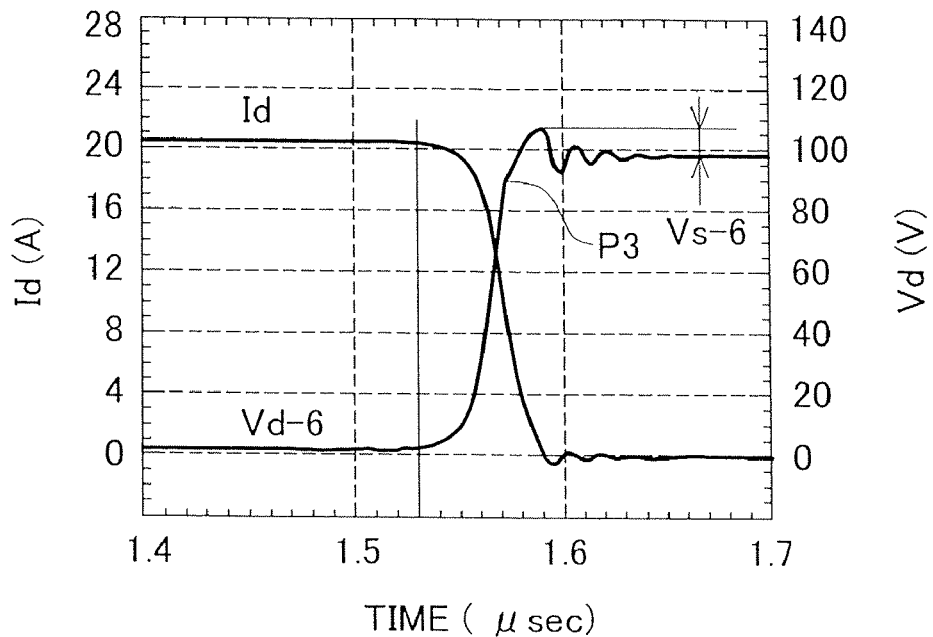
FIG. 9 is a graph for representing temporal changes of a drain current and a drain voltage, which occur before and after the transistor is turned OFF under such a condition that a signal path between a drain and a gate is connected by a series circuit constructed of a zener diode and a capacitor.
Figure 10:
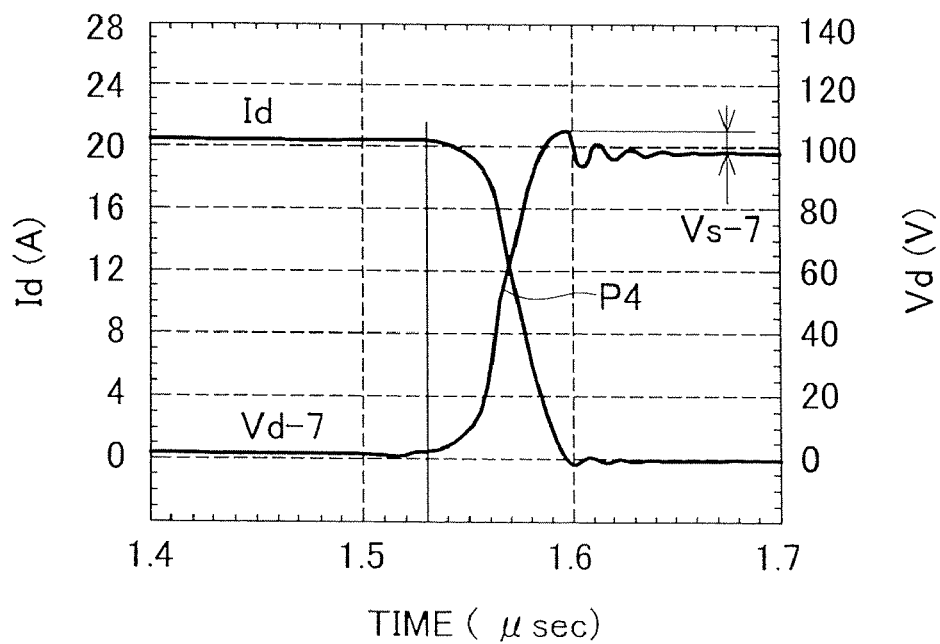
FIG. 10 is a graph for representing temporal changes of a drain current and a drain voltage, which occur before and after the transistor is turned OFF under such a condition that the path between the drain and the gate is connected by the series circuit constructed of the zener diode and the capacitor, while a zener voltage of the zener diode is different from that of FIG. 9.

FIG. 9 to FIG. 10 indicate temporal changes of drain voltages "Vd" and drain currents "Id", which are produced before and after the transistor 5 of FIG. 7 is turned OFF. In this case, a drain current "id" implies a current flowing between the drain D and the source S of the transistor 5 (drain-to-source current). Abscissas of FIG. 9 to FIG. 10 show a time (μ second), left ordinates indicate currents, and right ordinates represent voltages. Even in FIG. 9 to FIG. 10, at a time instant of 1.53μ seconds, the transistor 5 has been turned OFF. When the transistor 5 is turned OFF, the drain current Id is decreased toward zero.

A curve of "Vd-1" of FIG. 8 indicates a temporal change of a drain voltage Vd of a comparison example in order to be compared with that of the second embodiment. The switching circuit of the comparison example corresponds to such a case that the series circuit constructed of the zener diode 9 and the capacitor 7 is not present between the drain D and the source S of the transistor 5. In the switching circuit of the comparison example, the drain voltage Vd exceeds the power supply voltage (100 volt.) and is largely increased, and thereafter, is converged to the power supply voltage while the drain voltage is oscillating. A surge voltage Vs may be defined by a difference between a maximum value of such a drain voltage Vd generated after the transistor 5 is turned OFF and a drain voltage Vd which becomes stable after the transistor 5 is turned OFF. In the switching circuit of the comparison example, as shown in the curve of Vd-1 of FIG. 8, a large surge voltage "Vs-1" is generated.

In the switching circuit of the comparison example, since both the drain voltage Vd and the drain current Id are rapidly changed, a switching loss is small.

Figure 11:
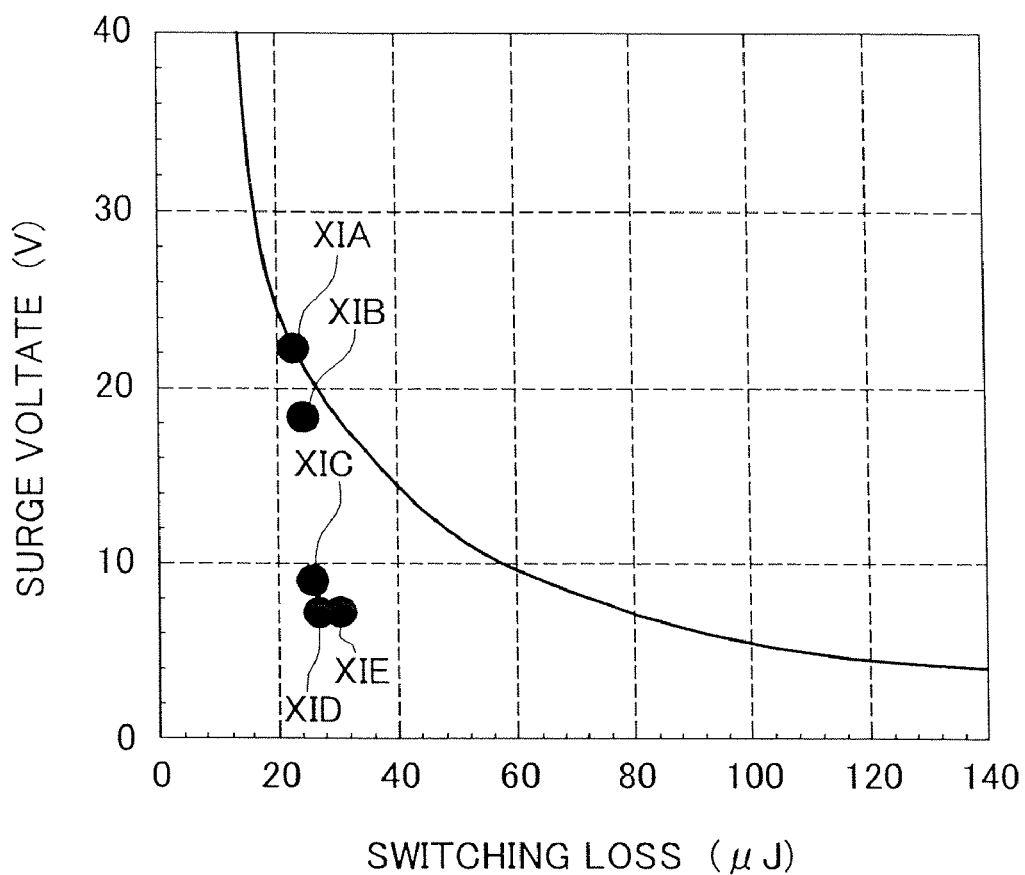
FIG. 11 is a graph for showing a relationship between switching losses and surge voltages of the second embodiment and of the comparison example.

FIG. 11 represents a simulation result of a switching loss (abscissa) and a surge voltage (ordinate). A point "XIA" of FIG. 11 indicates a simulation result in the case where a signal path between a drain D and a source S of a MOSFET is opened, and indicates such a fact that a surge voltage is high, as compared with results 5 to 7 of this second embodiment (will be explained later).

A hyperbolic curve shown in FIG. 11 corresponds to a trade-off curve shown in FIG. 6.

A curve of "Vd-5" shown in FIG. 8 represents a temporal change of a drain voltage Vd in such a case that the signal path between the drain D and the source S of the transistor 5 is connected by a series circuit constituted by a zener diode 9 having a zener voltage of 90 V and a capacitor 7 having a capacitance of 1 nF. As apparent from this curve, a changing speed of the drain voltage Vd is changed at a stage when the drain voltage Vd is increased to the power supply voltage. The drain voltage Vd is rapidly changed just after the transistor 5 is turned OFF, whereas the changing speed of the drain voltage Vd is slowed after such a timing when the drain voltage Vd is approximated to the power supply voltage. At timing when the changing speed of the drain voltage Vd is changed corresponds to such a time instant that the drain-to-source voltage becomes 90 V, so that the zener diode 9 breaks down. When the zener diode 9 breaks down, the changing speed of the drain voltage Vd is slowed. As a result, the surge voltage Vs is suppressed.

A point "XIB" of FIG. 11 shows a simulation result in such a case that the signal path between the drain D and the source S of the transistor 5 is connected by the series circuit constituted by the zener diode 9 having the zener voltage of 90 V and the capacitor 7 having the capacitance of 1 nF.

Although a switching loss of this point VIB is slightly increased, as compared with that of the point XIA, a surge voltage is suppressed. While comparing with the conventional circuit in which the signal paths between the drains and the sources of the various sorts of presently available MOSFETs are opened, when the surge voltage Vs is equivalently maintained, the switching loss can be suppressed to a smaller switching loss than the conventional switching loss, whereas when the switching loss is equivalently maintained, the surge voltage Vs can be suppressed to a lower surge voltage than the conventional surge voltage. However, in such a case that the capacitor 7 is arranged between the source S and the drain D, the following fact can be revealed: That is, if the capacitance of this capacitor 7 is approximately 1 nF, then the suppression effect of the surge voltage cannot become conspicuous.

A curve of "Vd-6" shown in FIG. 8 represents a temporal change of a drain voltage Vd in such a case that a signal path between the drain D and the source S of the transistor 5 is connected by a series circuit constituted by a zener diode 9 having a zener voltage of 90 V and a capacitor 7 having a capacitance of 3 nF. As apparent from this curve, a changing speed of the drain voltage Vd is changed at a stage when the drain voltage Vd is increased to the power supply voltage. The drain voltage Vd is rapidly changed just after the transistor 5 is turned OFF, whereas the changing speed of the drain voltage Vd is slowed after such a timing when the drain voltage Vd is approximated to the power supply voltage. At timing when the changing speed of the drain voltage Vd is changed corresponds to such a time instant that the drain-to-source voltage becomes 90 V, so that the zener diode 9 breaks down. When the zener diode 9 breaks down, the changing speed of the drain voltage Vd is slowed. As a result, a surge voltage "Vs-6" (refer to FIG. 9) is suppressed. If a capacitance of a capacitor connected between the drain D and the source S is increased from 1 nF to 3 nF, then the changing speed of the drain voltage Vd after the time instant when the zener diode 9 breaks down is furthermore slowed. The surge voltage "V3-6" (refer to FIG. 9) may be furthermore suppressed to a low surge voltage.

In FIG. 9, the below-mentioned temporal change is also described in combination with the temporal change of the drain voltage, namely the temporal change of the drain current "Id" in the case that the series current is employed which is constituted by the zener diode 9 having the zener voltage of 90 V, and the capacitor 7 having the capacitance of 3 nF is also described.

In such a case that the signal path between the drain D and the source S of the transistor 5 is connected by the series circuit constituted by the zener diode 9 having the zener voltage of 90 V and the capacitor 7 having the capacitance of 3 nF, both a change of the drain voltage Vd and a change of the drain current Id are slowed after a point P3 where the zener diode 9 breaks down. As a result, a switching loss is increased. However, before the point P3, an influence of the capacitor 7 does not appear, but both the drain voltage Vd and the drain current Id are rapidly changed. As a consequence, an increased amount of the switching loss is maintained within a small amount range.

A point "XIC" of FIG. 11 shows a simulation result in such a case that the signal path between the drain D and the source S of the transistor 5 is connected by the series circuit constituted by the zener diode 9 having the zener voltage of 90 V and the capacitor 7 having the capacitance of 3 nF.

As compared with the point "XIA", although a switching loss of this point "XIC" is slightly increased, a surge voltage is conspicuously suppressed.

A curve of "Vd-7" shown in FIG. 8 represents a temporal change of a drain voltage Vd in such a case that the signal path between the drain D and the gate G of the transistor 5 is connected by a series circuit constituted by a zener diode 9 having a zener voltage of 50 V and a capacitor 7 having a capacitance of 3 nF. As apparent from this curve, a changing speed of the drain voltage Vd is changed in a half way when the drain voltage Vd is changed. The drain voltage Vd is rapidly changed just after the transistor 5 is turned OFF, whereas the changing speed of the drain voltage Vd is slowed in a half way when the drain voltage Vd is increased toward the power supply voltage. At timing when the changing speed of the drain voltage Vd is changed corresponds to such a time instant that the drain-to-source voltage becomes 50V, so that the zener diode 9 breaks down. When the zener diode 9 breaks down, the changing speed of the drain voltage Vd is slowed. As a result, a surge voltage "Vs-7" (refer to FIG. 10) is suppressed to a low surge voltage.

In FIG. 10, the below-mentioned temporal change is also described in combination with the temporal change of the drain voltage, namely the temporal change of the drain current "Id" in the case that the series current is employed which is constituted by the zener diode 9 having the zener voltage of 50 V, and the capacitor 7 having the capacitance of 3 nF is also described.

In such a case that the signal path between the drain D and the source S of the transistor 5 is connected by the series circuit constituted by the zener diode 9 having the zener voltage of 50 V and the capacitor 7 having the capacitance of 3 nF, both a change of the drain voltage Vd and a change of the drain current Id are slowed after a point P4 when the zener diode 9 breaks down. As a result, a switching loss is increased. However, before the point P4, an influence of the capacitor 7 does not appear, but both the drain voltage Vd and the drain current Id are rapidly changed. As a consequence, an increased amount of the switching loss is maintained within a small amount range.

A point "XID" of FIG. 11 shows a simulation result in such a case that the signal path between the drain D and the source S of the transistor 5 is connected by the series circuit constituted by the zener diode 9 having the zener voltage of 50 V and the capacitor 7 having the capacitance of 3 nF.

As compared with the point "XIC", although a switching loss of this point "XID" is slightly increased, a surge voltage "Vs-7" (refer to FIG. 10) is furthermore suppressed.

Also, when the series circuit is employed between the source S and the drain D of the transistor 5, in the case that such a zener is employed whose zener voltage is approximately 0.5 to 1.0 times higher than a voltage applied between a drain and a source of a transistor when the transistor is turned OFF (implies that transistor is stabilized under OFF state), the following fact can be revealed. That is, both a surge voltage and a switching loss can be suppressed under better balance condition. In the case that the surge voltage is strongly suppressed, it is preferable to utilize a zener diode having a lower zener voltage. In the case that an increase of the switching loss is strongly suppressed, it is desirable to employ a zener diode having a higher zener voltage. Also, when the surge voltage is strongly suppressed, it is preferable to utilize a capacitor having a large capacitance. When the switching loss is strongly suppressed, it is preferable to utilize a capacitor having a small capacitance.

A curve of "Vd-8" shown in FIG. 8 represents a temporal change of a drain voltage Vd in such a case that the signal path between the drain D and the source S of the transistor 5 is connected by a capacitor 7 having a capacitance of 3 nF. In this case, the zener diode 9 is not used. As apparent from the curve, during a time period from a commencement of turning-OFF of the transistor 5 until the transistor 5 is stabilized under OFF state, the change of the drain voltage Vd becomes slow. As a result, although the surge voltage Vs is suppressed, the switching loss is largely increased.

A point "XIE" of FIG. 11 shows a simulation result in such a case that the signal path between the drain D and the source S of the transistor 5 is connected by the capacitor 7 having the capacitance of 3 nF.

A switching loss of this point XIE is increased, as compared with the switching losses of the points XIB to XID. It can be understood that the utilization of the zener diode 9 becomes effective.

It should also be noted that it is preferable that even when the capacitor 7 is employed between the drain D and the source S of the transistor 5, the stray capacitance of the zener diode 9 is small. If the stray capacitance of the zener diode 9 is small, then both a voltage change and a current change just after the transistor 5 is turned OFF can be kept at high speeds. If such a zener diode 9 having a small stray capacitance is employed, then it is possible to suppress a switching loss to a small value.

Also, in any of the first embodiment and the second embodiment, the arranging order of the zener diode 9 and the capacitor 7 is changed, equivalent circuits may be obtained and the same effect may be achieved.

Alternatively, the first embodiment and the second embodiment may be carried out at the same time.

Also, the above-described embodiments are not limited only to a unipolar transistor such as a MOSFET, but may alternatively employ a bipolar transistor such as an IGBT by which a similar effect may be achieved. Since the circuit of the present disclosure is additionally provided, both the surge voltage and the switching loss may be suppressed at the same time.

A transistor, and a series circuit made of a zener diode and a capacitor, which connects a signal path between a drain (or collector) and a gate of the transistor, or another signal path between the drain (or collector) and a source (or emitter) thereof, may be alternatively formed in an integral body on the same semiconductor substrate. A concrete semiconductor mode will be described in a third embodiment and a fourth embodiment. In this case, an extra component is no longer required, and both a surge voltage and a switching loss may be suppressed by one chip.

In accordance with the present disclosure, even when the conventional transistor is directly employed, since such low cost general-purpose components as a zener diode and a capacitor are utilized, both a surge voltage and a switching loss may be suppressed. Also, a capacitance of a capacitor and a zener voltage of a zener diode are changed, so that various sorts of tuning can be realized. For instance, it is possible to realize such a characteristic capable of suppressing a switching loss to the minimum switching loss within an allowable surge voltage.

Third Embodiment

FIG. 12A to FIG. 16B indicate examples in which transistors, zener diodes 9, and capacitors 7, which have been employed in switching circuits, have been formed on the same semiconductor substrate 20. Any of the examples shown in FIG. 12A to FIG. 16B are to embody the portions of the transistor, the zener diode 9, and the capacitor 7 employed in the switching circuit 1 of the first embodiment. Any of these examples shown in FIG. 12A to FIG. 16B corresponds to such a semiconductor mode that while the transistor and the capacitor 7 have been formed in the semiconductor substrate 20, the zener diode 9 has been provided on the semiconductor substrate 20. The transistor, the zener diode 9, and the capacitor 7 have been formed in an integral body by utilizing the semiconductor substrate 20, and have been constituted in a single chip. It should also be understood that single crystal silicon has been employed in the semiconductor substrate 20.

Figures 12A, 12B:
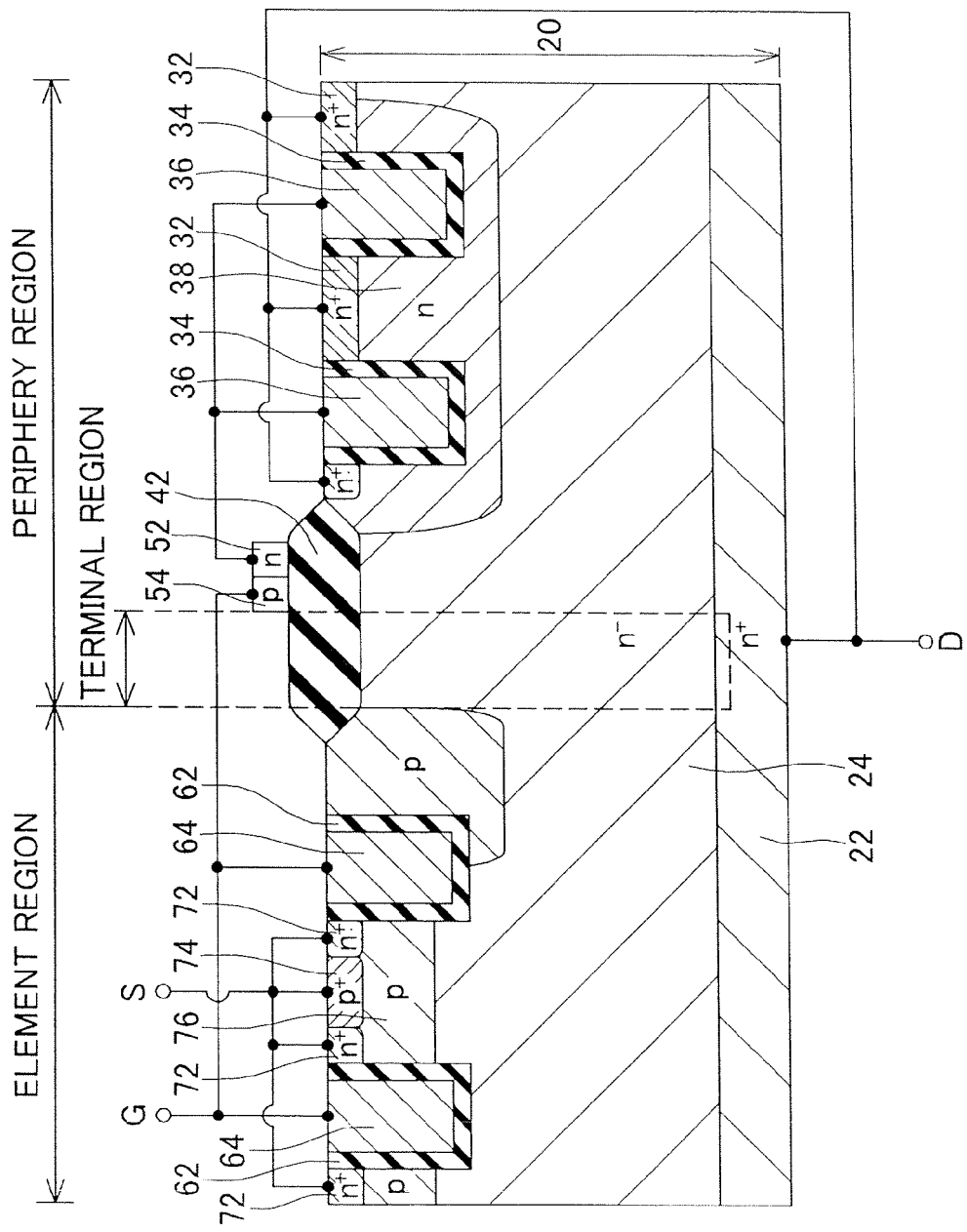
FIG. 12A is a sectional view for indicating a semiconductor substrate where a transistor, a zener diode, and a capacitor of a switching circuit of a third embodiment of the present invention have been formed.
FIG. 12B is a circuit diagram for indicating an equivalent circuit of the structure of FIG. 12A.

The semiconductor mode shown in FIG. 12A and FIG. 12B indicate such an example that the series circuit constructed of the zener diode 9 and the capacitor 7 has been connected between a drain D and a gate G of the transistor, and also, the capacitor 7 has been inserted between the drain D of the transistor and the zener diode 9. FIG. 12A schematically indicates a sectional view of a major portion of the semiconductor substrate 20. FIG. 12B shows an equivalent circuit of the structure shown in FIG. 12A.

FIG. 12A indicates a vicinity of a boundary between an element region and a periphery region. The element region corresponds to such a region that a semiconductor region group has been formed which is required in order to temporally switch a signal path between the major electrodes (namely, drain D and source S) under conductive state and under non-conductive state. The element region has been arranged at a center side of the semiconductor substrate 20. The periphery region has been arranged around a central region in a circular manner. A terminal region has been formed in the periphery region. The terminal region has been arranged around the central region in the circular manner. The terminal region corresponds to such a region that when the transistor is under OFF state, a voltage applied to the transistor is loaded along a lateral direction by expanding a depletion layer from the element region toward a side direction. Although a detailed description will be made later, a dimension ratio of widths of the terminal region along the lateral direction indicated in FIG. 12A is represented in a compression mode for the sake of clear illustrations.

The semiconductor substrate 20 has been provided with an $n^+$ type drain region 22 and an $n^-$ type drift region 24. The $n^+$ type drain region 22 has been formed on a rear surface of the semiconductor substrate 20, whereas the $n^-$ type drift region 24 has been provided on the drain region 22. Both the drain region 22 and the drift region 24 have been continuously provided along the lateral direction from the element region to the periphery region within the semiconductor substrate 20.

A p type body region 76, an $n^+$ type source region 72, and a $p^+$ type body contact region 74 have been provided on a front surface of the semiconductor substrate 20 of the element region. A body region 76 has been continuously provided on the front surface of the semiconductor substrate 20 of the element region along the lateral direction. The source region 72 and the body contact region 74 have been selectively provided on the front surface of the semiconductor substrate 20. The source region 72 has been isolated from the drift region 24 by the body region 76. The body contact region 74 contains an impurity in higher concentration than that of the body region 76. Both the source region 72 and the body contact region 74 have been electrically connected to the source S provided on the semiconductor substrate 20.

A trench gate electrode 64 and a gate insulating film 62 have been further formed on the front surface of the semiconductor substrate 20 of the element region. The trench electrode 64 has been extended from the front surface of the semiconductor substrate 20 toward the rear surface thereof, and has penetrated through the body region 76 and then has reached the drift region 24. The gate insulating film 62 has covered the trench gate electrode 64 so as to electrically insulate the trench gate electrode 64 from the semiconductor substrate 20. The trench gate electrode 64 is located opposite to the body region 76 via the gate insulating film 62, while the body region 76 has isolated the source region 72 from the drift region 24. Poly crystalline silicon has been employed in the trench gate electrode 64. A silicon oxide has been employed in the gate insulating film 62.

A selective oxide film 42 (one example of insulating film) has been provided on the front surface of the semiconductor substrate 20 of the periphery region. A silicon oxide has been employed in the selective oxide film 42. The selective oxide film 42 can relax an electric field of the front surface of the semiconductor substrate 20 of the terminal region. Generally speaking, there are many possibilities that such structures as, for example, a RESURF layer and a guard ring have been provided within the semiconductor substrate 20 located under the selective oxide film 42. These structures have been provided in order to relax electric field concentration occurred in the peripheral portion of the element region, and thus, so as to improve a withstanding voltage of the transistor. In this third embodiment, for the sake of clear illustration, these structures have been omitted.

An n type diffusion semiconductor region 38 and an $n^+$ type surface diffusion semiconductor region 32 have been provided on a front surface of the semiconductor substrate 20 which is located in a further side direction than the terminal region. Both the n type diffusion semiconductor region 38 and the $n^+$ type surface diffusion semiconductor 32 have been provided on at least a portion of the front surface of the semiconductor substrate 20 located in the further side direction than the terminal region. In other words, the n type diffusion semiconductor region 38 and the $n^+$ type surface diffusion semiconductor region 32 need not be provided along the periphery portion of the terminal region in a circular manner.

An embedded conductive region 36 and a coating insulation region 34 have been furthermore provided in a portion of the front surface of the semiconductor substrate 20 which is located in a further side direction than the terminal region. The embedded conductive region 36 has been extended from the front surface of the semiconductor substrate 20 to the rear surface thereof, and then has been stayed within the n type diffusion semiconductor region 38. The coating insulation region 34 has covered the embedded conductive region 36 so as to electrically insulate the embedded conductive region 36 from the semiconductor substrate 20. Poly crystalline silicon has been employed in the embedded conductive region 36. A silicon oxide has been employed in the coating insulation region 34.

The embedded conductive region 36 has been located opposite to the n type diffusion semiconductor region 38 via the coating insulation region 34. As a consequence, the capacitor 7 has been constituted by the embedded conductive region 36, the coating insulation region 34, and the n type diffusion semiconductor region 38. It should also be noted that the n type diffusion semiconductor region 38 has been formed in order to suppress that a depletion layer is produced in a boundary between the coating insulation region 34 and the n type diffusion semiconductor region 38, and thus, so as to stabilize the capacitance of the capacitor 7.

The embedded conductive region 36 has the same depth as that of the trench gate electrode 64 of the element region. The coating insulation region 34 has the same thickness as that of the gate insulating film 62 of the element region. As a consequence, both the embedded conductive region 36 and the coating insulation region 34 can be formed at the same time by utilizing the process for manufacturing the trench gate electrode 64 of the element region and the gate insulating film 62.

The zener diode 9 has been formed on the front surface of the selective region 42. The zener diode 9 has been provided with an anode semiconductor region 54 containing a p type impurity, and a cathode semiconductor region 52 containing an n type impurity. While the anode semiconductor region 54 and the cathode semiconductor region 52 have been provided on the front surface of the selective oxide film 42, the anode semiconductor region 54 and the cathode semiconductor region 52 are directly contacted thereto. As materials of the anode semiconductor region 54 and the cathode semiconductor region 52, poly crystalline silicon has been employed.

As represented in FIG. 12A, the anode semiconductor region 54 of the zener diode 9 has been electrically connected to the trench gate electrode 64 of the transistor. The cathode semiconductor region 52 of the zener diode 9 has been electrically connected to the embedded conductive region 36 of the capacitor 7. In other words, the cathode semiconductor region 52 of the zener diode 9 has been electrically connected to one end of the capacitor 7. The n type diffusion semiconductor region 38 has been electrically connected via the $n^+$ type surface diffusion semiconductor region 32 to the drain D. Also, the n type diffusion semiconductor region 38 has been electrically connected via the drift region 24 and the drain region 22 to the drain D. As a consequence, the other end of the capacitor 7 has been electrically connected to the drain D of the transistor. A switching circuit-purpose chip for embodying an equivalent circuit shown in FIG. 12B has been arranged by electrically connecting these electronic elements. It should also be understood that these electric connections may be constituted by, for example, aluminum wiring lines.

As previously described, if the zener diode 9 and the capacitor 7 are constructed in the integral body on the same semiconductor substrate 20 as the transistor, then the zener diode 9 and the capacitor 7 need not be separately prepared. As a consequence, the switching circuit-purpose chip disclosed in the specification of can be constructed without increasing a total number of these components. If the transistor, the zener diode 9, and the capacitor 7 have been provided on the same semiconductor substrate 20, then the switching circuit can be arranged by employing a small number of the components. Thus, the switching circuit can be furthermore made compact, and can be manufactured with superior practical characteristics.

Figure 13:
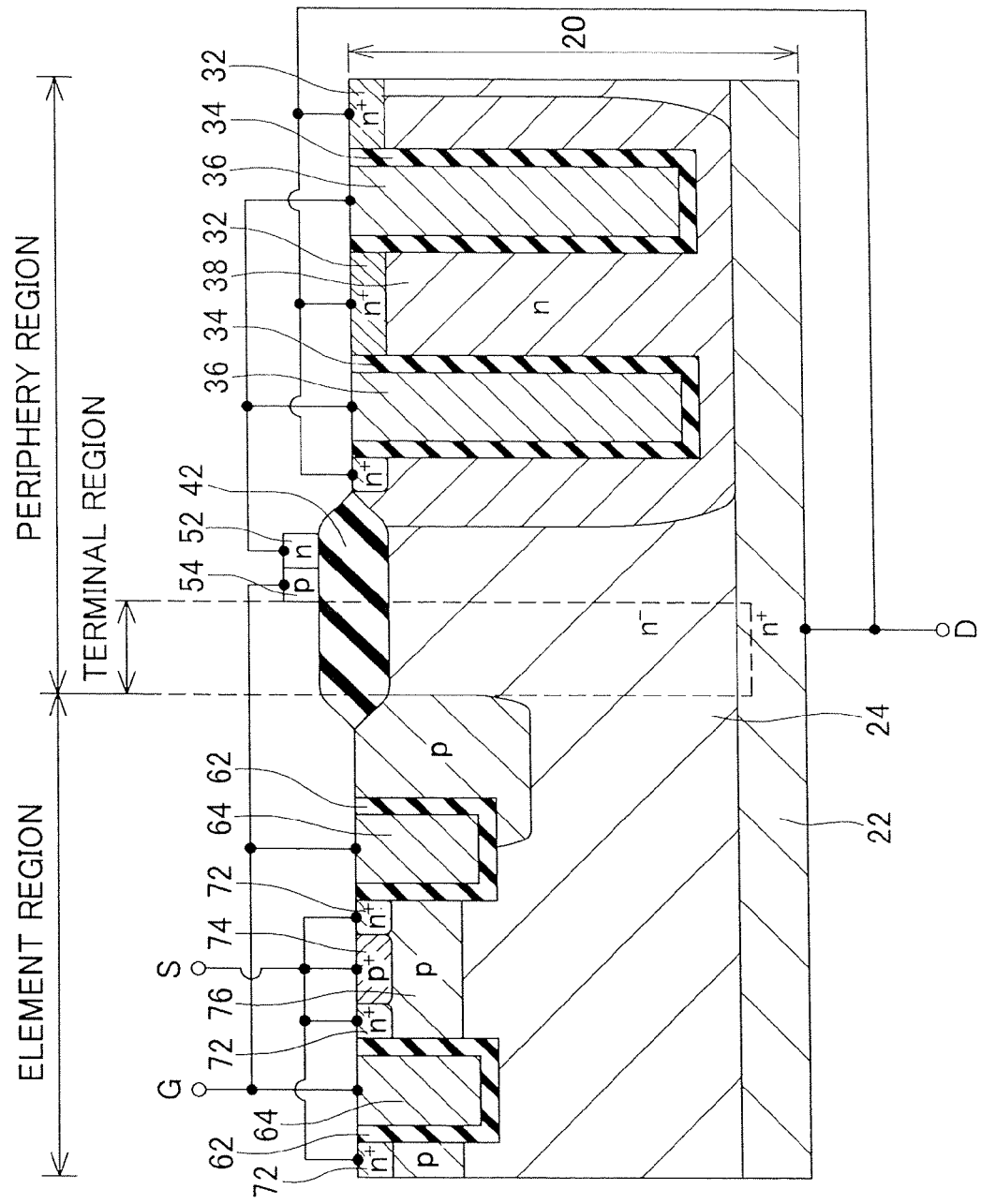
FIG. 13 is a sectional view for indicating a semiconductor substrate where a transistor, a zener diode, and a capacitor of a switching circuit according to one modification of the third embodiment have been formed.
Figure 14:
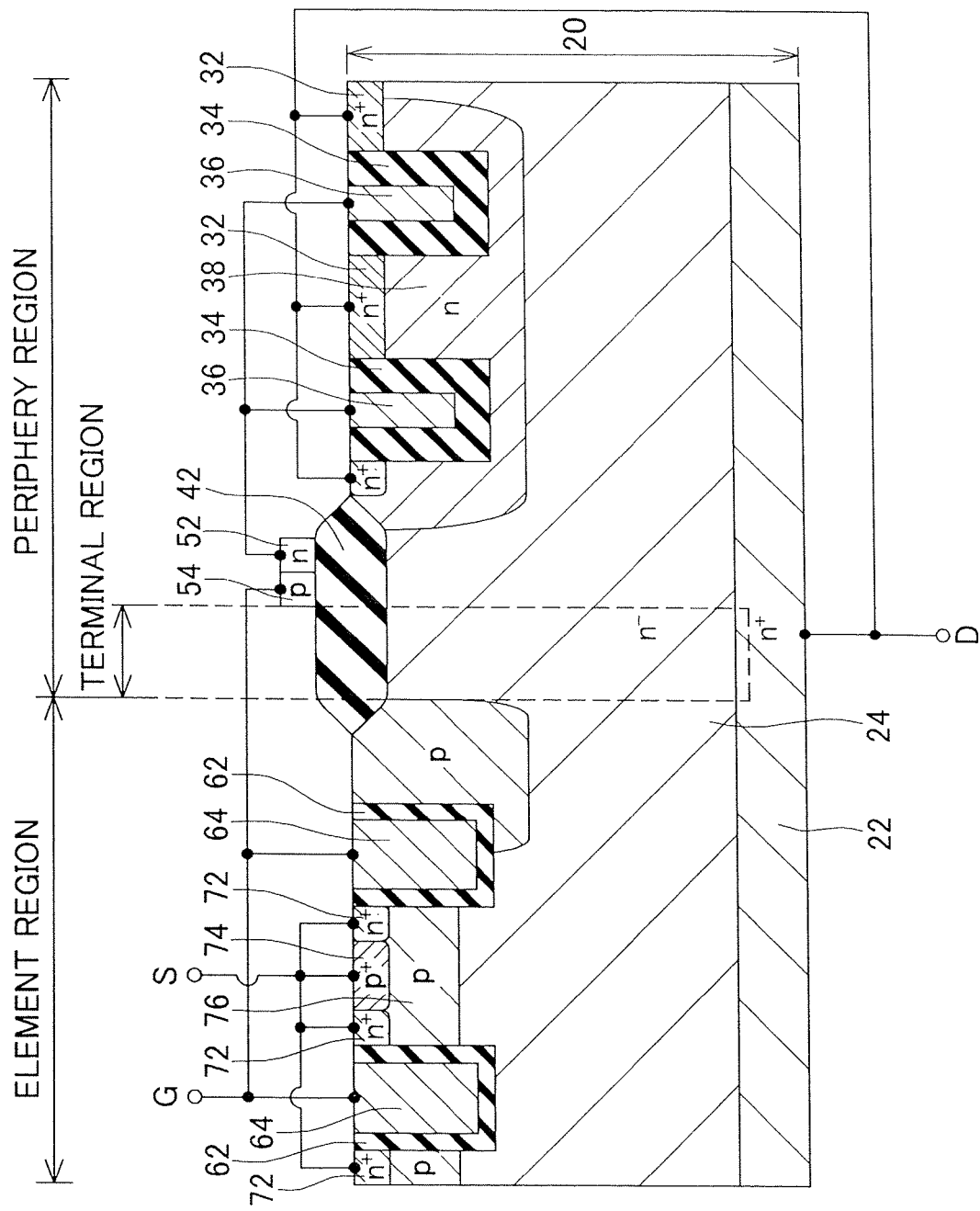
FIG. 14 is a sectional view for indicating a semiconductor substrate where a transistor, a zener diode, and a capacitor of a switching circuit according to another modification of the third embodiment have been formed.

FIG. 13 and FIG. 14 indicate a technical idea for changing a capacitance of the capacitor 7. The capacitance of the capacitor 7 is adjusted based upon a thickness and an area of the coating insulation region 34. The capacitance of the capacitor 7 is inverse proportion to the thickness of the coating insulation region 34, and is direct proportion to the area of the coating insulation region 34.

As indicated in FIG. 13, if the embedded conductive region 36 and the coating insulation region 34 are formed up to a deep position of the semiconductor substrate 20 so as to increase the area of the coating insulation region 34, then the capacitance of the capacitor 7 is increased. On the other hand, as shown in FIG. 14, if the thickness of the coating insulation region 34 is increased, then the capacitance of the capacitor 7 is decreased. As previously explained, the semiconductor modes as to the embedded conductive region 36 and the coating insulation region 34 are contrived, so that the capacitance of the capacitor 7 can be readily adjusted.

Figure 15:
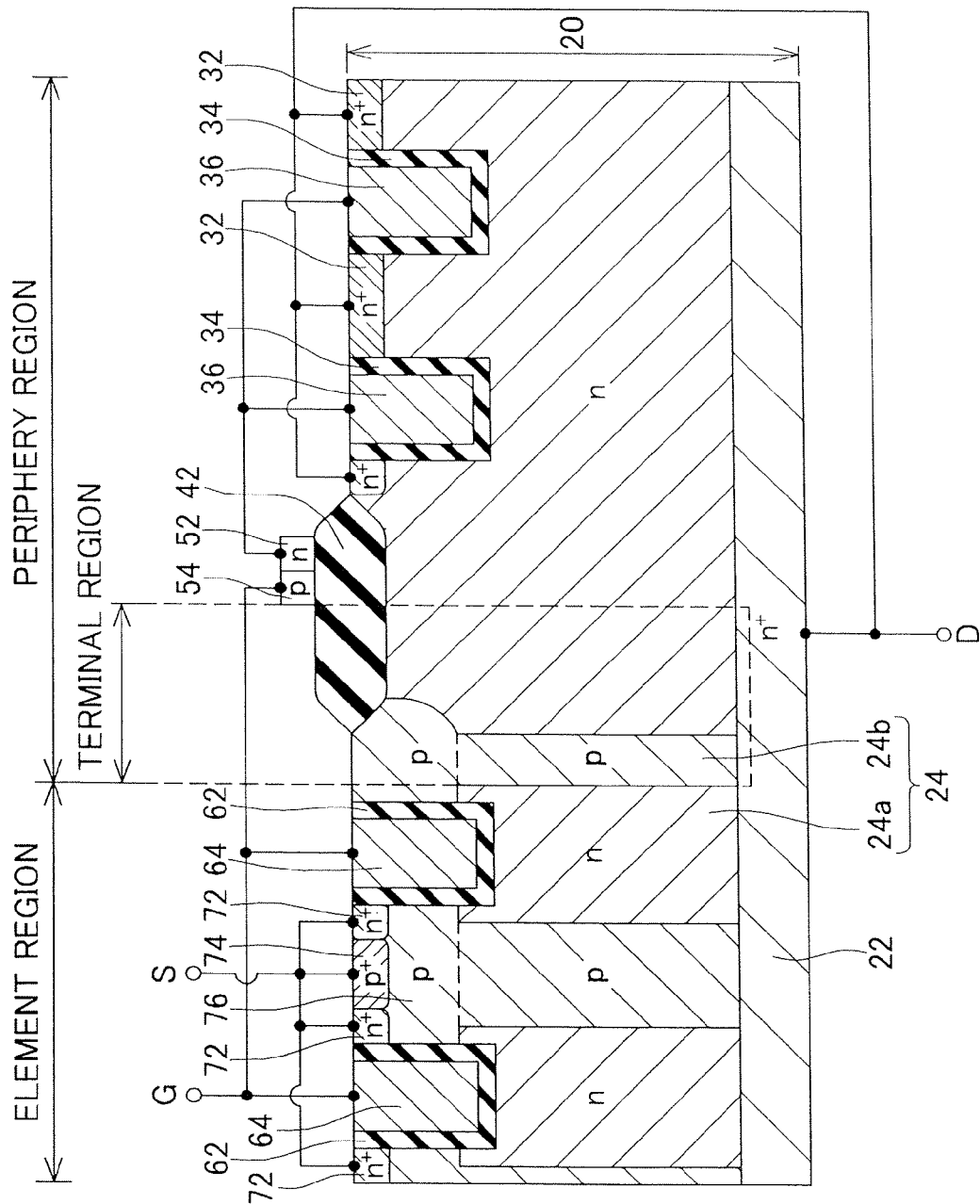
FIG. 15 is a sectional view for indicating a semiconductor substrate where a transistor, a zener diode, and a capacitor of a switching circuit according to another modification of the third embodiment have been formed.

FIG. 15 indicates such a semiconductor structural example that a super junction structure has been formed in the drift region 24 of the element region. The drift region 24 of the super junction structure has been formed by a repetition structure made of an n type column 24a containing an n type impurity, and a p type column 24b containing a p type impurity. The impurity concentration of the p type column 24b is substantially equal to that of the body region 76. In the super junction structure, when the transistor is turned OFF, a depletion layer is extended from the pn junction between the n type column 24a and the p type column 24b, and thus, the drift region 24 can be substantially completely depleted. As a result, if a pitch width between the n type column 24a and the p type column 24b is adjusted, even when the impurity concentration is increased, then the drift region 24 can be substantially perfectly depleted. As a consequence, since the impurity concentration of the n type column 24a and the p type column 24b can be increased, the super junction structure is useful as such a technique capable of solving the trade-off relationship existed between the ON-resistance (otherwise, ON voltage) of the transistor and the withstanding voltage.

Generally speaking, a super junction structure is formed by utilizing the semiconductor substrate 20 which contains an n type impurity in relatively high concentration. Concretely speaking, a plurality of trenches are formed from the front surface of the semiconductor substrate 20 by performing an anisotropic etching process, and then, p type columns 24b are crystal-grown within these trenches. The remaining portions when the plural trenches are formed become n type columns 24a. As a result, such a super junction structure that the n type columns 24a and the p type columns 24b are repeatedly arranged may be manufactured.

In the case where the super junction structure is employed in the drift region 24 of the element region, the semiconductor substrate 20 is employed which contains the n type impurity in relatively high concentration. As a consequence, in the case where the super junction structure is employed in the drift region 24 of the element region, the impurity concentration of the drift region 24 of the periphery region is increased. Accordingly, in this example, even if the n type diffusion semiconductor region 38 is not provided which was formed in the case of FIG. 12, then it is possible to suppress such a phenomenon that the depletion layer is produced at the boundary of the coating insulation region 34.

As previously described, the technique for forming the transistor, the zener diode 9, and the capacitor 7 on the same semiconductor substrate 20 may be applied to various sorts of transistors. Generally speaking, there are many possibilities that a periphery region of a transistor has been provided with the selective oxide film 42. If the zener diode 9 is provided on the front surface of this selective oxide film 42, then the zener diode 9 may be provided above the semiconductor substrate 20 of the periphery region without any limitation to the sort of transistor. Since the space of the surface of the selective oxide film 42 is utilized, the zener diode 9 can be easily formed in the semiconductor substrate 20 in an integral body while increasing of the element area is suppressed. Also, if both the embedded conductive region 36 and the coating insulation region 34 are utilized, then the capacitor 7 may be easily formed within the semiconductor region 20 of the periphery region. Since both the embedded conductive region 36 and the coating insulation region 34 have the trench shapes, the capacitor 7 can be easily formed in the semiconductor substrate 20 in an integral body while increasing of the element area is suppressed.

Figure 16A:
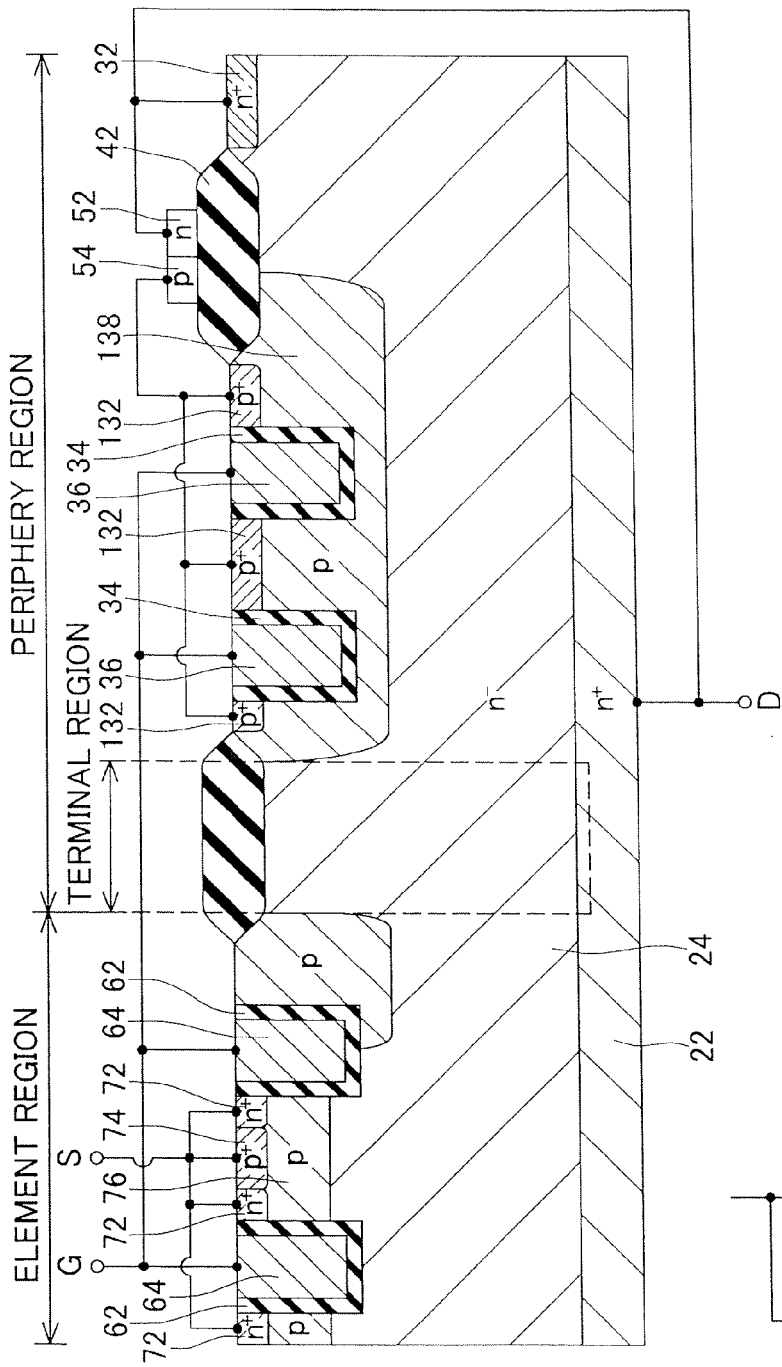
FIG. 16A is a sectional view for indicating a semiconductor substrate where a transistor, a zener diode, and a capacitor of a switching circuit according to a further modification of the third embodiment have been formed.
Figure 16B:
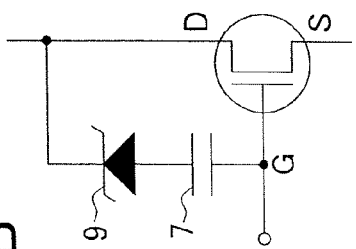
FIG. 16B is a circuit diagram for showing an equivalent circuit of the structure of FIG. 16A.

Semiconductor modes shown in FIG. 16A and FIG. 16B are such an exemplification that the series circuit constructed of the zener diode 9 and the capacitor 7 has been connected between the drain D and the gate G of the transistor, and further, the capacitor 7 has been inserted between the gate G of the transistor and the zener diode 9. FIG. 16A is a sectional view for schematically showing a major portion of the semiconductor substrate 20. FIG. 16B indicates an equivalent circuit having the semiconductor substrate of FIG. 16A.

As represented in FIG. 16A, in this semiconductor mode, a position of the capacitor 7 and a position of the zener diode 9 are located in an opposite arranging sense with those of FIG. 12A to FIG. 15. Also, in the semiconductor mode of FIG. 16A, a p type diffusion semiconductor region 138 and a p$^+$ type contact region 132 have been provided on the front surface of the semiconductor substrate 20 of the periphery region. The p type diffusion semiconductor region 138 surrounds both the embedded conductive region 36 and the coating insulation region 34. The embedded conductive region 36 and the coating insulation region 34 have been isolated from the drift region 24 by the p type diffusion semiconductor region 138. The embedded conductive region 36 and the p type diffusion semiconductor region 138 have been located opposite to each other via the coating insulation region 34. As a consequence, the p type diffusion semiconductor region 138 surrounds both the embedded conductive region 36 and the coating insulation region 34. The capacitor 7 has been constructed of the embedded conductive region 36, the coating insulation region 34, and the p type diffusion semiconductor region 138.

As shown in FIG. 16A, the embedded semiconductor region 36 of the capacitor 7 has been electrically connected to the gate G of the transistor. In other words, one end of the capacitor 7 has been electrically connected to the gate G of the transistor. The p type diffusion semiconductor region 138 has been electrically connected via the contact region 132 to the anode semiconductor region 54 of the zener diode 9. In other words, the other end of the capacitor 7 has been electrically connected to the anode semiconductor region 54 of the zener diode 9. The cathode semiconductor region 52 of the zener diode 9 has been electrically connected to the drain D of the transistor. A switching circuit-purpose chip for embodying an equivalent circuit shown in FIG. 16B has been arranged by electrically connecting these electronic elements. It should also be understood that these electric connections may be constituted by, for example, aluminum wiring lines.

As previously described, if the zener diode 9 and the capacitor 7 are constructed in the integral body on the same semiconductor substrate 20 as the transistor, then the zener diode 9 and the capacitor 7 need not be separately prepared. As a consequence, the switching circuit-purpose chip disclosed in the specification of the present disclosure can be constructed without increasing a total number of these components. If the transistor, the zener diode 9, and the capacitor 7 have been provided on the same semiconductor substrate 20, then the switching circuit can be arranged by employing a small number of the components. Thus, the switching circuit can be furthermore made compact, and can be manufactured with superior practical characteristics.

Fourth Embodiment

Figure 27:
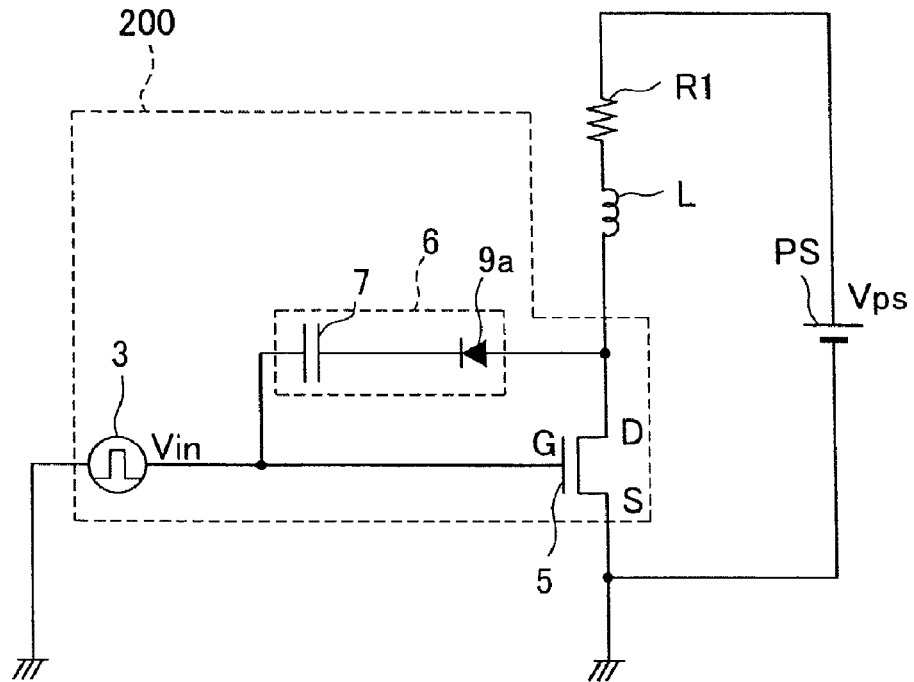
FIG. 27 is a circuit diagram for indicating a switching circuit where only a series circuit is provided.

FIG. 27 shows an example of a switching circuit 200 according to a fourth embodiment of the present disclosure. The switching circuit 200 has been equipped with a transistor 5, a control circuit 3, and a series circuit 6. The transistor 5 is employed by connecting a power supply "PS" and a load R1 in a series connecting manner between a drain electrode "D" and a source electrode "S" of the transistor 5. The control circuit 3 is connected to a gate electrode "G" of the transistor 5. The series circuit 6 is connected between the gate electrode G and the drain electrode D of the transistor 5, and a capacitor 7 is series-connected to a diode 9a. It should be understood that reference numeral "L" indicates a stray inductance. The switching circuit 200 can suppress a surge voltage based upon the below-mentioned operation. It should also be noted that since a phenomenon which should be originally described based upon formulae is explained by using an expression, this expression is not always perfect.

While the control circuit 3 are outputting a voltage for turning OFF the transistor 5, a voltage ($Vps-V_F$) obtained by subtracting a forward direction voltage "$V_F$" of the diode 9a from a power supply voltage "Vps" has being applied to the capacitor 7, and a charged voltage of the capacitor 7 has become ($Vps-V_F$).

Next, when the control circuit 3 outputs a voltage for turning ON the transistor 5, a voltage at the drain electrode D of the transistor 5 is lowered. Since a reverse bias voltage is applied to the diode 9a, the capacitor 7 cannot be discharged, but maintains the charged voltage ($Vps-V_F$) which has been so far charged.

Next, when the control circuit 3 outputs a voltage for turning OFF the transistor 5, the voltage at the drain electrode D of the transistor 5 is increased. Since the stray inductance "L" is present, the voltage of the drain electrode D exceeds the power supply voltage Vps and is further increased. A so-called "surge voltage" is generated.

If the voltage at the drain electrode D of the transistor 5 exceeds a summed voltage between the charged voltage ($Vps-V_F$) of the capacitor 7 and the forward direction voltage $V_F$ of the diode 9a, namely exceeds the power supply voltage Vps, then the forward direction voltage is effected to the diode 9a, and thus, a charging current starts to flow through the capacitor 7. As a result, since a discharging speed of the gate electrode G of the transistor 5 is slowed, a changing speed of a drain current of the transistor 5 is slowed; and a changing speed of a drain current of the transistor 5 is slowed, so that a steep increase of the voltage at the drain electrode D of the transistor 5 can be suppressed, and thus, the surge voltage can be suppressed to a low surge voltage.

It should also be noted that in the above-example, such a series circuit has been exemplified in which the capacitor 7 is arranged on the side of the gate electrode (control electrode), and the diode 9a is arranged on the side of the drain electrode (main electrode on the high voltage side). Alternatively, even if another series circuit in which the diode 9a is arranged on the gate electrode side and the capacitor 7 is arranged on the drain electrode side is employed, the surge voltage may be suppressed to a lower voltage.

A breakdown voltage of a zener diode is fluctuated by approximately ±10% due to manufacturing tolerance, whereas when a voltage at a drain electrode of a transistor exceeds the power supply voltage Vps, a lowering speed of a voltage at a gate electrode of the transistor is slowed in accordance with a technique for utilizing a capacitor, and a lowering speed of a drain current of the transistor is slowed. As a result, a switching circuit which has a fluctuation as to a suppression capability of a surge voltage can be mass-produced.

As previously described, if the capacitor is utilized, then when the voltage at the drain electrode of the transistor exceeds the power supply voltage Vps, the lowering speed of the voltage at the gate electrode of the transistor is slowed and the lowering speed of the drain current of the transistor is slowed. As a result, the suppression capability of the surge voltage becomes stable.

However, in such a case that the capacitor is utilized, the lowering speed of the voltage at the gate electrode is not slowed, but also the lowering speed of the drain current of the transistor is not slowed unless the voltage of the drain electrode exceeds the power supply voltage. As a result, there are some possibilities that the surge voltage can be hardly suppressed.

As a consequence, in accordance with this fourth embodiment, such a switching circuit capable of improving the suppression capability of the surge voltage can be provided by performing the below-mentioned manner. That is, not only the timing for slowing the changing speed of the voltage at the control electrode of the transistor becomes stable, but also the changing speed of the voltage at the control electrode of the transistor is slowed at such a earlier timing than the timing when the voltage at the major electrode of the transistor on the high voltage side exceeds the power supply voltage.

Now, a preferred semiconductor mode of this fourth embodiment will be described. A switching circuit of the fourth embodiment utilizes a field-effect type transistor. The switching circuit of the fourth embodiment uses a MOSFET. Both a surge voltage suppressing circuit and the transistor have been manufactured in the same semiconductor substrate.

Figure 17:
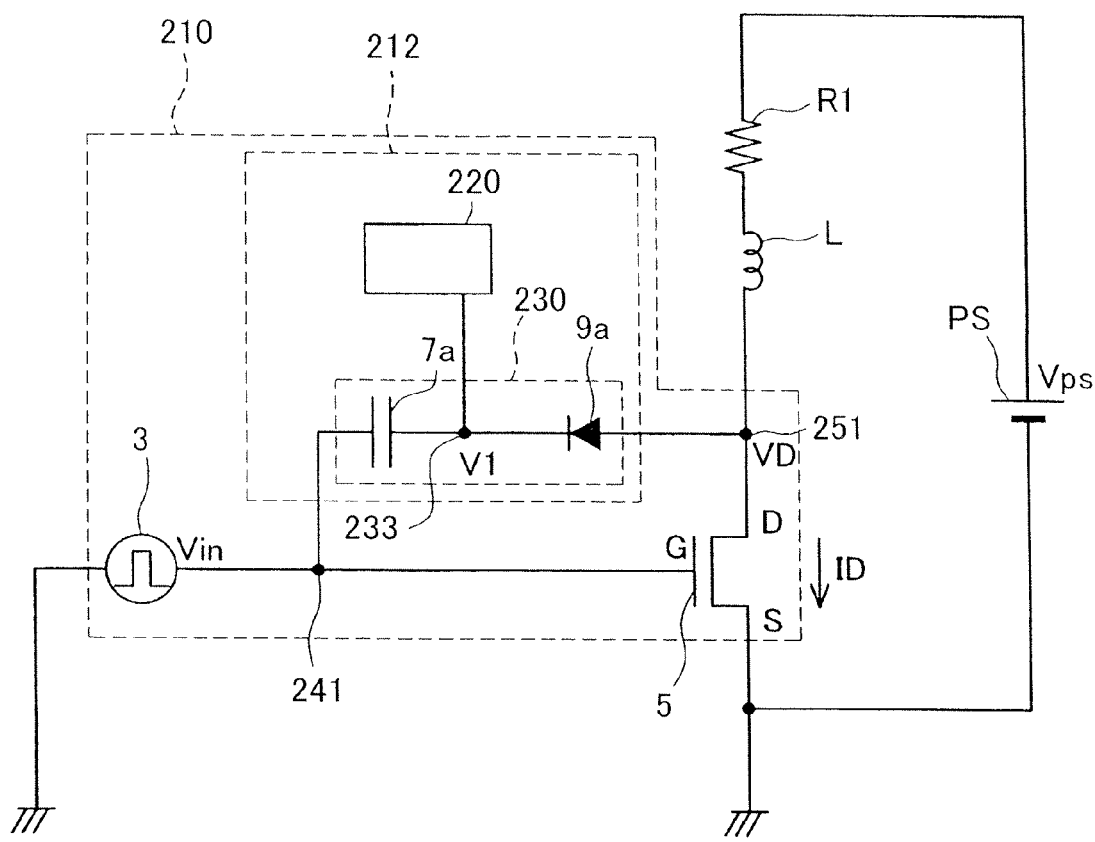
FIG. 17 shows a basic circuit diagram of a switching circuit of a fourth embodiment of the present invention.

FIG. 17 shows a circuit diagram of a switching circuit 210 equipped with a field-effect type transistor (n type MOSFET) 5. The transistor 5 has been employed by series-connecting a power supply PS to a load R1 between a drain electrode D and a source electrode S of this transistor 5. A stray inductance "L" is present in a wiring line between the transistor 5 and the load R1. The switching circuit 210 switches turn-ON/OFF operations of the transistor 5 based upon a driving voltage Vin outputted from the control circuit 3. The diving voltage Vin is inputted to the gate electrode G.

Since the switching circuit 210 switches turn-ON/OFF operations of the transistor 5, the switching circuit 210 switches such a condition that the power supply voltage Vps supplied by the power supply PS is applied to the load R1, and also, such a condition that the power supply voltage Vps supplied by the power supply PS is not applied to the load R1.

It should also be noted that the drain electrode D corresponds to a major electrode on the high voltage side, the source electrode S corresponds to another major electrode on the low voltage side, and the gate electrode G corresponds to the control electrode.

The switching circuit 210 has been equipped with the transistor 5, a control circuit 3, and a surge voltage measure circuit 212. While the control circuit 3 has been connected to the gate electrode G of the transistor 5, the control circuit 3 outputs to the gate electrode G of the transistor 5 such a driving voltage Vin having a rectangular wave in which a voltage for turning ON the transistor 5 and another voltage for turning OFF the transistor 5 alternately appear. The surge voltage measure circuit 212 has been equipped with a series circuit 230 and a voltage adjusting circuit 220. One terminal of the series circuit 230 has been connected to a first junction point 241 between the gate electrode G of the transistor 5 and the control circuit 3. The other terminal of the series circuit 230 has been connected to a second junction point 251 between the drain electrode D of the transistor 5 and the load R1. The series circuit 230 has a first capacitor 7a and a first diode 9a series-connected to the first capacitor 7a. A cathode of the first diode 9a has been connected to the side of the first junction point 241, whereas an anode of the first diode 9a has been connected to the side of the second junction point 251. The voltage adjusting circuit 220 has been connected to a third junction point 233 of a connection line which connects the first capacitor 7a to the first diode 9a. The voltage adjusting circuit 220 lowers a voltage at the third junction point 233 when the transistor 5 is turned ON, as compared with that when the transistor 5 is turned OFF. In other words, the voltage adjusting circuit 220 may alternatively lower a charging voltage of the first capacitor 7a when the transistor 5 is turned ON, as compared with that when the transistor 5 is turned OFF. The surge voltage measure circuit 212 containing the series circuit 230 has been formed in the same semiconductor substrate as that of the transistor 5.

Figure 18A:
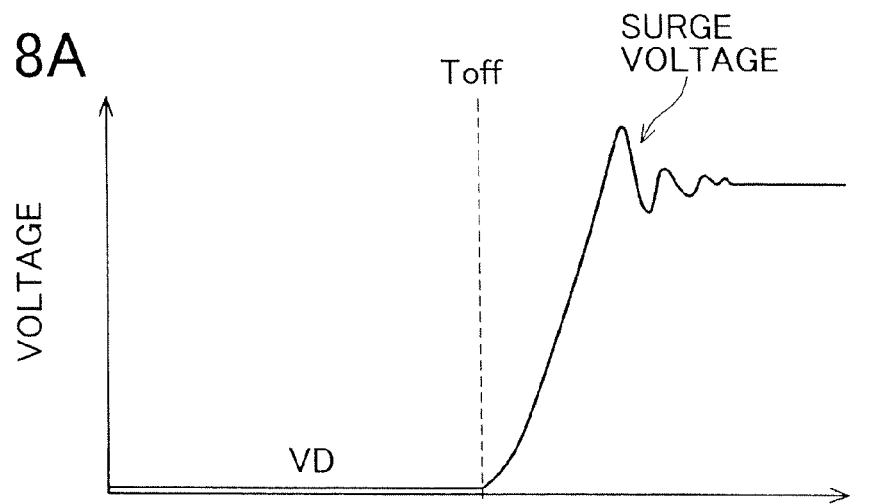
FIG. 18A is a graph for representing a variation of a voltage of a drain electrode of a transistor employed in a switching circuit where a surge voltage measure circuit is not provided.
Figure 18B:
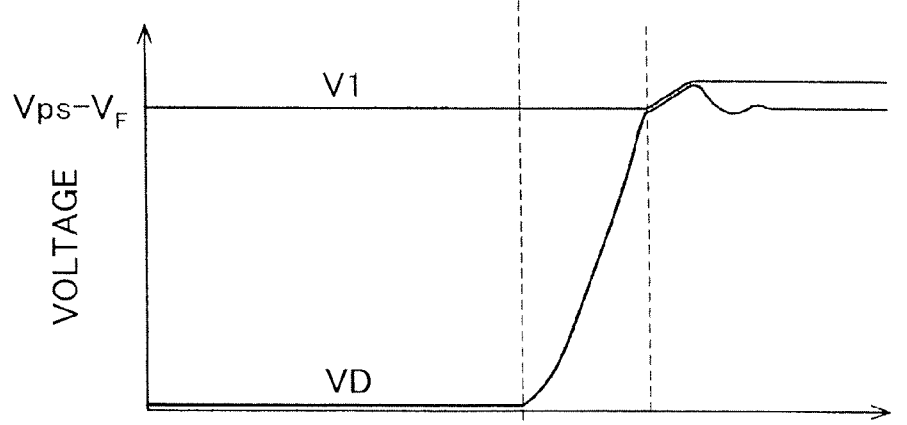
FIG. 18B is a graph for representing a variation of a voltage of a drain electrode of a transistor employed in a switching circuit where only a series-circuit within the surge voltage measure circuit is provided.
Figure 18C:
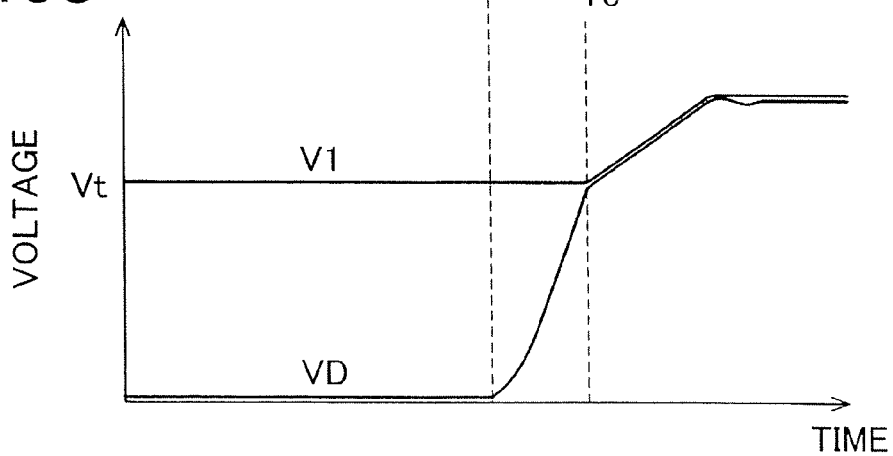
FIG. 18C is a graph for showing a variation of a voltage of a drain electrode of a transistor employed in the switching circuit of the fourth embodiment.

Referring now to FIG. 18A to FIG. 18C, a description is made of operations of the switching circuit 210. FIG. 18A to FIG. 18C show changing patterns of voltages VD at the drain electrode D of the transistor 5, namely represent time elapse variations of the voltage VD in transition time periods during which the transistor 5 is turned OFF. FIG. 18A is a case where the surge voltage measure circuit 212 is not provided, and is a comparison example. FIG. 18B is a case where only the series circuit 230 within the surge voltage measure circuit 212 is provided, and is another comparison example. FIG. 18C is a case of the switching circuit 210 according to this fourth embodiment.

Referring to FIG. 18A, a description is made of operations in such a case where the surge voltage measure circuit 212 is not provided.

In the case that the surge voltage measure circuit 212 is not provided, if the transistor 5 is turned OFF at timing "Toff", then the voltage VD of the drain electrode D is increased. Then, in a final stage of a transition time period for turning OFF the transistor 5, a surge voltage has been generated due to the drain current ID of the transistor 5 and the stray capacitance L.

Next, a description is made of operations in such a case that only the series circuit 230 within the surge voltage measure circuit 212 is provided with reference to FIG. 18B.

Firstly, such a condition that the transistor 5 has been turned OFF and is under stable will now be considered. In the switching circuit of this comparison example, when the transistor 5 has been turned OFF and is under stable condition, a voltage (Vps−$V_F$) is being applied to the first capacitor 7a. This voltage (Vps−$V_F$) is obtained by subtracting a forward direction voltage $V_F$ of the first diode 9a from the power supply voltage Vps. When the transistor 5 has been turned OFF and is under stable condition, the first capacitor 7a has been charged to this voltage (Vps−$V_F$). In other words, a voltage "V1" at the third junction point 233 becomes (Vps−$V_F$).

Next, when the transistor 5 is turned ON, the voltage VD of the drain electrode D is decreased. As a result, since a reverse bias voltage is applied to the first diode 9a, the first diode 9a cannot be discharged, but the charged voltage of the first capacitor 7a is maintained at the previously charged voltage (Vps−$V_F$) while the transistor 5 is turned ON.

Next, when the transistor 5 is turned OFF at timing "Toff", the voltage VD of the drain electrode D is increased. When the voltage VD of the drain electrode D exceeds a total voltage (V1+$V_F$=Vps−$V_F$+$V_F$=Vps), namely the power supply voltage Vps, a forward direction voltage is applied to the first diode 9a (timing "Tb" of FIG. 18B). The total voltage is defined by adding the voltage V1 (Vps−$V_F$) of the third junction point 233 to the forward direction voltage $V_F$ of the first diode 9a. When the forward direction voltage is applied to the first diode 9a at the timing "Tb", a charging current starts to flow through the first capacitor 7a. Thereafter, the lowering speed of the voltage at the gate electrode G of the transistor 5 is slowed, and the lowering speed of the drain current ID of the transistor 5 is lowered. As a result, after the timing "Tb", the steep increase of the drain voltage VD of the drain electrode D is suppressed, and thus, the surge voltage is suppressed to the low surge voltage.

However, if the voltage adjusting circuit 220 is not present, then such a timing is fixed to the timing "Tb" at which the voltage of the drain electrode D becomes equal to the power supply voltage Vps. As a result, there are some cases that the surge voltage cannot be sufficiently suppressed. The above-described timing implies such a timing when the lowering speed of the voltage at the gate electrode G of the transistor 5 is slowed, and the lowering speed of the drain current ID of the transistor 5 is lowed, and also, the lowering speed of the voltage at the drain electrode D of the transistor 5 is slowed.

Next, a description is made of operations when the voltage adjusting circuit 220 has been provided with reference to FIG. 18C.

As explained in FIG. 18B, the timing at which the charge current starts to flow through the first capacitor 7a corresponds to timing at which a forward direction voltage starts to be effected to the first diode 9a. The timing at which the forward direction voltage starts to effect the first diode 9a is such a timing when the voltage VD of the drain electrode D exceeds a total voltage (V1+$V_F$) obtained by adding the voltage V1 of the third junction point 233 and the forward direction voltage $V_F$ of the first diode 9a. As a consequence, if the voltage V1 of the third junction point 233 is adjusted to a low voltage, then the timing at which the forward direction voltage starts to effect the first diode 9a becomes early, and such a condition that the charge current starts to flow through the first capacitor 7a when the voltage VD of the drain electrode D is low can occur.

The voltage adjusting circuit 220 decreases the electron charges charged in the first capacitor 7a while the transistor 5 is turned OFF when the transistor 5 is turned ON so as to decrease the voltage V1 of the third junction point 233 up to a voltage "Vt" (refer to FIG. 18C). This voltage "Vt" may have a predetermined magnitude, or may alternatively have different magnitudes every time the switching operation is repeated. If the voltage V1 of the third junction point 233 when the transistor 5 is turned ON is decreased up to the voltage Vt, as represented in FIG. 18C, the timing "Tc" at which the charge current starts to flow through the first capacitor 7a becomes early. In other words, when the voltage VD of the drain electrode D is low, the charge current starts to flow through the first capacitor 7a; the lowering speed of the voltage at the gate electrode G of the transistor 5 is slowed; the lowering speed of the drain current ID of the transistor 5 is slowed; and the changing sped of the voltage at the drain electrode D is slowed. That is to say, the charging current starts to flow through the first capacitor 7a at such a timing which is sufficiently earlier than the timing when the surge voltage becomes a peak voltage; the lowering speed of the voltage at the gate electrode G of the transistor 5 is slowed; the lowering speed of the drain current ID of the transistor 5 is slowed; and the changing speed of the voltage at the drain electrode D is slowed. As a result, the increase of the surge voltage can be considerably suppressed.

It should also be understood that while the first capacitor 7a has been arranged on the side of the drain electrode D of the transistor 5 and the first diode 9a has been arranged on the side of the gate electrode G of the transistor 5, if the voltage adjusting circuit 220 is additionally provided, then such a phenomenon is obtained. That is to say, the charge current starts to flow through the first capacitor 7a at such a timing which is sufficiently earlier than the timing when the surge voltage becomes a peak voltage; the lowering speed of the voltage at the gate electrode G of the transistor 5 is slowed; and the changing speed of the voltage at the drain electrode D is slowed. As a result, increasing of the surge voltage can be considerably suppressed.

Figure 19:
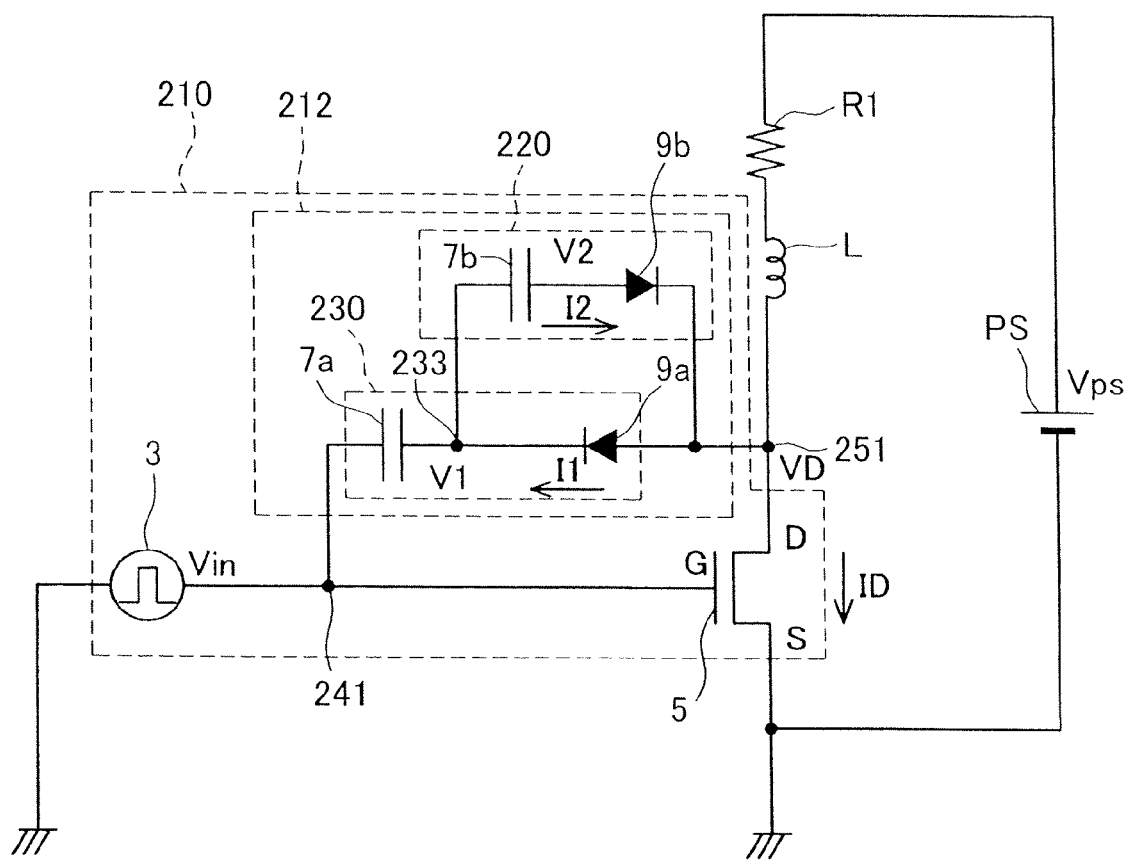
FIG. 19 is a circuit diagram for showing a switching circuit of the fourth embodiment.

FIG. 19 shows a concrete circuit diagram of the voltage adjusting circuit 220.

The voltage adjusting circuit 220 has been connected between the third junction point 233 and the anode of the first diode 9a, while the third junction point 233 connects the first capacitor 7a to the first diode 9a. The voltage adjusting circuit 220 has been equipped with such a circuit that a second capacitor 7b has been series-connected to the second diode 9b. A cathode of the second diode 9b has been connected to the anode side of the first diode 9a, and an anode of the second diode 9b has been connected to the side of the third junction point 233.

Figure 20A:
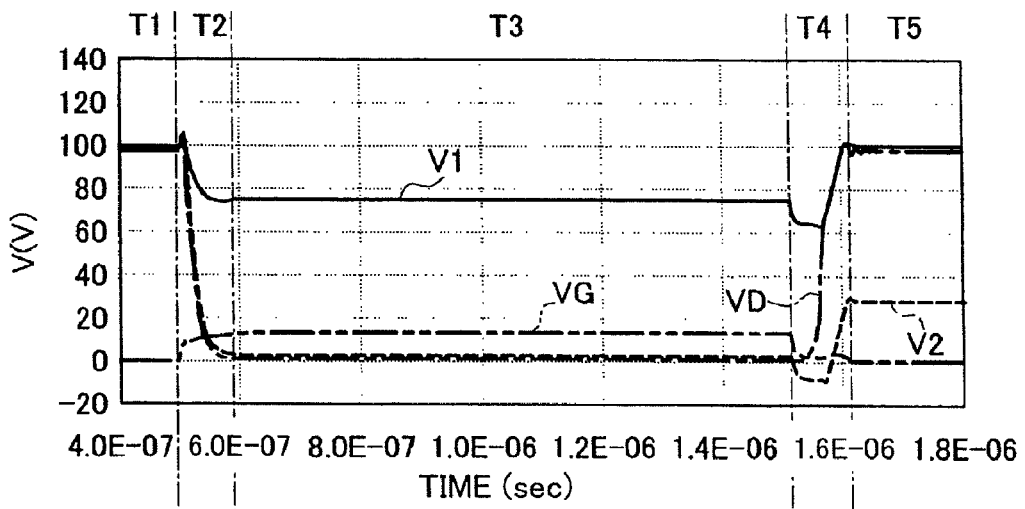
FIG. 20A is a graph for indicating time elapse changes in a voltage VG of a gate electrode of the transistor, a voltage VD of the drain electrode D, and voltages V1 and V2 in the switching circuit of the fourth embodiment.
Figure 20B:
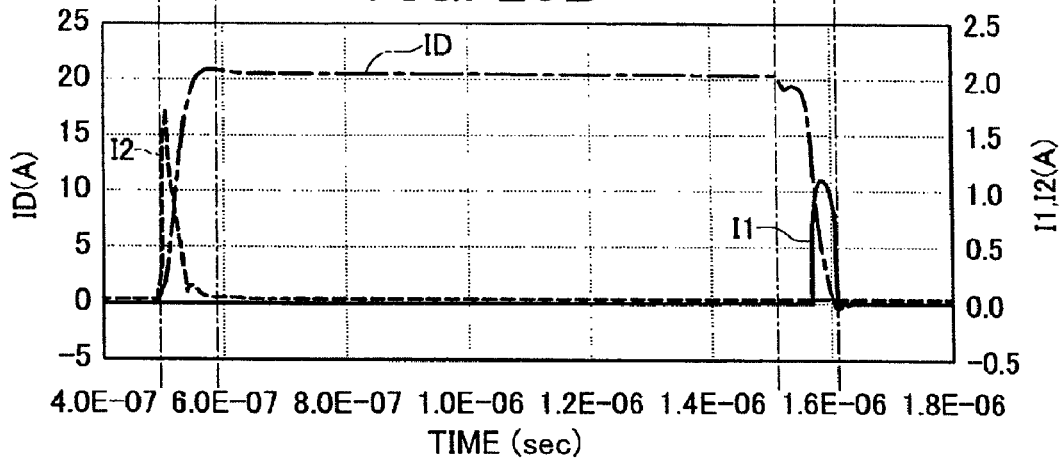
FIG. 20B is a graph for showing time elapse changes in a drain current ID of the transistor, and currents I1 and I2 in the switching circuit of the fourth embodiment.

FIG. 20A to FIG. 20B show simulation results in the case that the transistor 5 is driven by employing the switching circuit 210 of FIG. 19. FIG. 20A shows time elapse changes as to a voltage VG at the gate electrode G of the transistor 5, a voltage VD at the drain electrode D thereof, and voltages V1, V2. It should be understood that the voltage V1 is a voltage at the third junction point 233, and the voltage V2 corresponds to a voltage at a connection line between the second diode 9b and the second capacitor 7b. FIG. 20B represents time elapse changes as to a drain current ID of the transistor 5, and currents I1 and I2. The current I1 is a current flowing through the first diode 9a, whereas the current I2 is a current flowing through the second diode 9b. FIG. 20A to FIG. 20B indicate the simulation results obtained when an electrostatic capacitance C1 of the first capacitor 7a is 1 nF; an electrostatic capacitance C2 of the second capacitor 7b is 0.5 nF; the power supply voltage $V_{PS}$ is 100 V; and the forward direction voltage $V_F$ for the first diode 9a and the second diode 9b is 0.8 V.

Firstly, such a time period "T1" during which the transistor 5 has been turned OFF and is under stable will now be considered. In the switching circuit 210, when the transistor 5 has been turned OFF and is under stable condition, a voltage (Vps−$V_F$) is applied to the first capacitor 7a and the second capacitor 7b. This voltage (Vps−$V_F$) is obtained by subtracting a forward direction voltage $V_F$ of the first diode 9a from the power supply voltage Vps. A charge voltage of the first capacitor 7a when the transistor 5 has been turned OFF is equal to (Vps−$V_F$), and the voltage V1 at the third junction point 233 becomes (Vps−$V_F$). It should also be understood that the voltage V2 between the second capacitor 7b and the second diode 9b becomes also (Vps−$V_F$). In other words, the second capacitor 7b is not charged. As shown in FIG. 20A to FIG. 20B, both the voltage V1 and the voltage V2 of the time period T1 are approximately 100 V.

Next, a time period "T2" during which the transistor 5 is turned ON will now be considered. In the time period T2, firstly, the voltage VG of the gate electrode G of the transistor 5 is increased. Both voltage V1 and the voltage V2 are increased in conjunction with increasing of the gate voltage VG. When the voltage VG of the gate electrode G exceeds a threshold value, the drain current Id flows between the source electrode S and the drain electrode D of the transistor 5, so that the transistor 5 is turned ON. When the transistor 5 is turned ON, the voltage VD at the drain electrode D is decreased. When the voltage VD of the drain electrode D is decreased, a reverse bias voltage is applied to the first diode 9a, so that the first diode 9a is cut off. On the other hand, a forward direction voltage is applied to the second diode 9b. When a difference between the voltage V2 and the voltage VD of the drain electrode D exceeds the forward direction voltage $V_F$ of the second diode 9b, the second diode 9b becomes conductive.

Referring now to FIG. 19, a phenomenon occurred at this time will be described in more detail. When the transistor 5 is under OFF state, the first capacitor 7a present between the third junction point 233 and the first junction point 241 has been charged. The third junction point 233 corresponds to the high voltage side, whereas the first junction point 241 corresponds to the low voltage side. At this time, the potential V1 at the third junction point 233 is equal to the potential V2 at the connection line between the second capacitor 7b and the second diode 9b, and the charge voltage of the second capacitor 7b is equal to zero. Next, when the transistor 5 is turned ON, as previously described, the second diode 9b becomes conductive, and a portion of the electrons which have been charged in the first capacitor 7a is moved to the second capacitor 7b so as to charge the second capacitor 7b. At this time, since the transistor 5 is under ON state, the second junction point 251 is the lower voltage side with respect to the third junction point 233. As a consequence, when the transistor 5 is turned ON, it is possible to evaluate that a parallel circuit constituted of the first capacitor 7a and the second capacitor 7b is arranged. In other words, an electrostatic capacitance between the first junction point 241 and the second junction point 251 becomes a series electrostatic capacitance made of the first capacitance 7a and the second capacitance 7b. As a result, the voltage V1 of the third junction point 233 is decreased. In other words, a portion of the electrons charged in the first capacitor 7a moves to the second capacitor 7b. As a result, the voltage V1 of the third junction 233 is decreased. As indicated in FIG. 20B, in a transition time period during which the transistor 5 is turned, the current I2 flows through the first capacitor 7a, the second capacitor 7b, the second diode 9b, and the second junction point 251, so that the voltage V1 of the third junction point 233 is decreased. It can be understood that the decreasing amount of the voltage V1 at the third junction point 233 can be adjusted by adjusting a ratio of the electrostatic capacitance of the first capacitor 7a to that of the second capacitor 7b.

In a time period "T3" during which the transistor 5 has been completely turned ON, both the first diode 9a and the second diode 9b are turned OFF, so that both the voltage V1 and the voltage V2 are maintained.

Next, a description is made of a time period "T4" during which the transistor 5 is turned OFF. When the transistor 5 is turned OFF, the voltage VD of the drain electrode D is increased. If the voltage VD of the drain electrode D exceeds a total voltage $(V1+V_F=Vt+V_F)$ calculated by adding the charge voltage V1 charged in the first capacitor 7a to the forward direction voltage $V_F$ of the first diode 9a, then the first diode 9a becomes conductive. When the first diode 9a becomes conductive, the current I1 starts to flow through the first capacitor 7a; the lowering speed of the voltage at the gate electrode G of the transistor 5 is slowed; and the lowering speed of the drain current ID of the transistor 5 is slowed. As a consequence, thereafter, the steep increase of the voltage VD of the drain electrode D can be suppressed, so that the surge voltage can be suppressed to a low surge voltage.

Since these operations are repeatedly carried out, the switching circuit 210 can drive the transistor 5 while suppressing the surge voltage.

Figure 21:
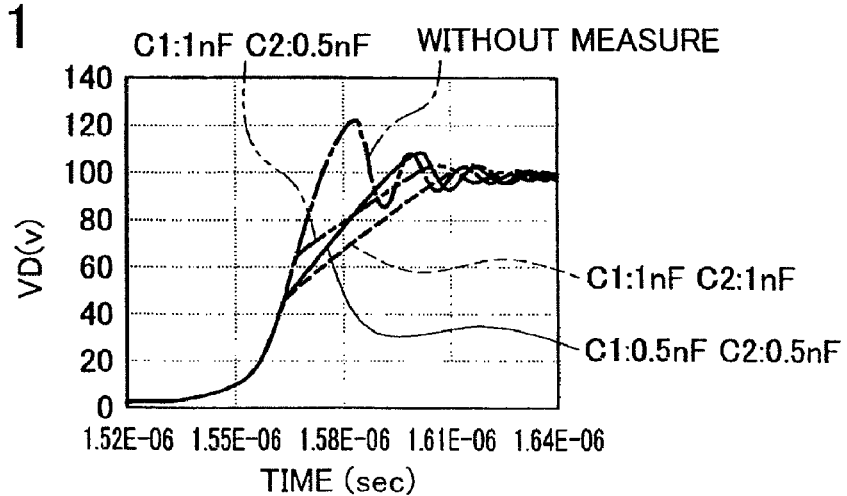
FIG. 21 is a graph for showing a variation of a voltage of the drain electrode in a transition period when the transistor is turned OFF.

FIG. 21 shows a variation as to the voltage VD of the drain electrode D of the transistor 5 in the transition time period during which the transistor 5 is turned OFF. In this drawing, a variation result obtained when the electrostatic capacitance C1 of the first capacitor 7a and the electrostatic capacitance C2 of the second capacitor 7b are changed is further indicated in combination with the above-described variation. It should also be noted that indication "WITHOUT MEASURE" implies a variation result obtained when the surge voltage measure circuit 212 is not provided.

As represented in FIG. 21, when one case where the electrostatic capacitance C1 of the first capacitor 7a is 1 nF is compared with another case where the electrostatic capacitance C1 thereof is 0.5 nF, it can be seen that inclinations of the voltages VD of the drain electrode D are different from each other. The magnitude of the electrostatic capacitance C1 of the first capacitance 7a determines the inclination of the voltage VD of the drain electrode D.

As shown in FIG. 21, when one case where a ratio of the electrostatic capacitance of the first capacitor 7a to the electrostatic capacitance of the second capacitor 7b is 1:1 is compared with another case where a ratio thereof is 1:0.5, timing at which the voltages VD of the drain electrode D start to be inclined is different from each other. The ratio of the electrostatic capacitance of the first capacitor 7a to that of the second capacitor 7b determines the timing when the voltage VD of the drain electrode D starts to be inclined.

Figure 22:
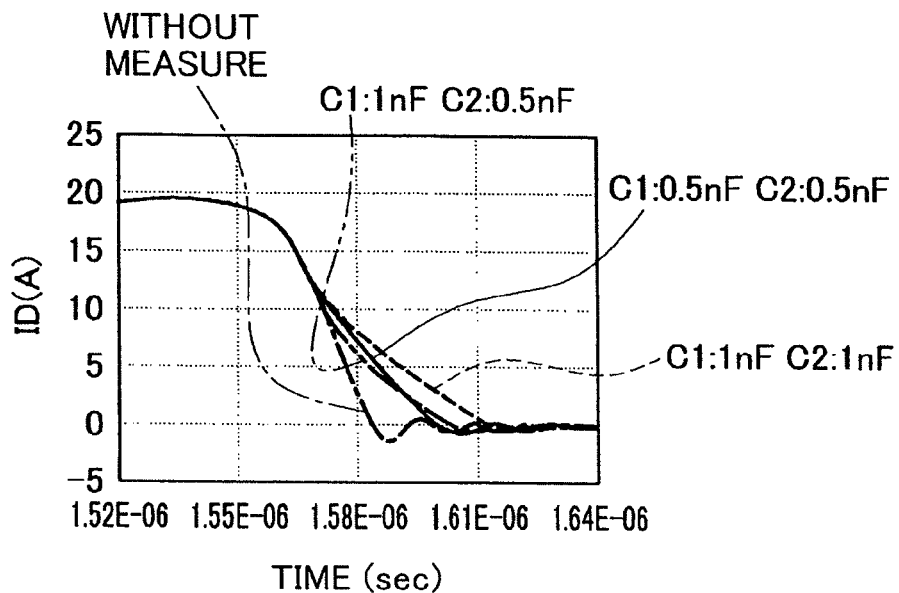
FIG. 22 is a graph for showing a variation of a drain current in the transition period when the transistor is turned OFF.

FIG. 22 shows a variation as to the drain current ID of the transistor 5 in the transition time period during which the transistor 5 is turned OFF.

As represented in FIG. 22, when one case where the electrostatic capacitance C1 of the first capacitor 7a is 1 nF is compared with another case where the electrostatic capacitance C1 thereof is 0.5 nF, it can be seen that inclinations of the drain current ID of the transistor 5 are different from each other. The magnitude of the electrostatic capacitance C1 of the first capacitance 7a determines the inclination of the drain current ID of the transistor 5.

As shown in FIG. 22, when one case where a ratio of the electrostatic capacitance of the first capacitor 7a to the electrostatic capacitance of the second capacitor 7b is 1:1 is compared with another case where a ratio thereof is 1:0.5, timing at which the drain currents ID of the transistor 5 start to be inclined differ from each other. The ratio of the electrostatic capacitance of the first capacitor 7a to that of the second capacitor 7b determines the timing when the drain current ID of the transistor 5 starts to be inclined.

As can be understood from the results of FIG. 21 and FIG. 22, since the electrostatic capacitances of the first capacitor 7a and the second capacitor 7b are adjusted, the characteristics of the transition time periods during which the transistor 5 is turned OFF can be improved.

In particular, as represented in FIG. 21, the switching circuit 210 of the fourth embodiment can steeply vary the voltage VD of the drain electrode D in the beginning stage of the transition time period during which the transistor 5 is turned OFF, and can gently vary the voltage VD of the drain electrode D in the final stage of the transition time period. As a consequence, since the voltage VD of the drain electrode D is steeply varied in the beginning stage of the transition time period, increasing of the turn-OFF loss can be suppressed, whereas since the voltage VD of the drain electrode D is gently varied in the final stage of the transition time period, increasing of the surge voltage can be suppressed.

Figure 23:
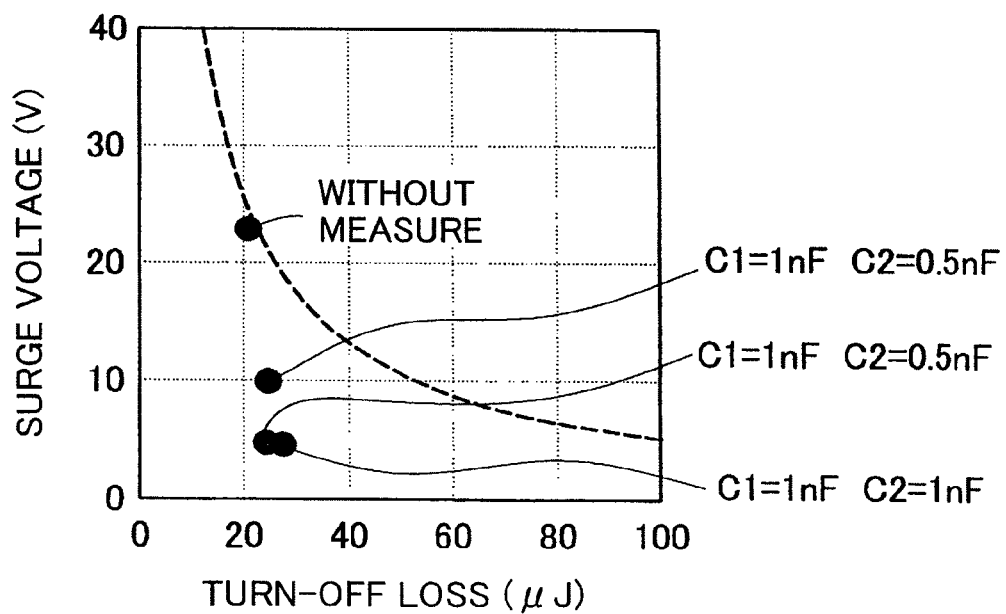
FIG. 23 is a graph for indicating a relationship between a turn-OFF loss and a surge voltage of the switching circuit of the fourth embodiment.

FIG. 23 shows a trade-off curve between a turn-OFF loss and a surge voltage, which is present in the case that the transistor 5 is driven. A broken line of this drawing indicates a trade-off curve in case of "WITHOUT MEASURE."

As apparent from FIG. 23, the switching circuit 210 of the fourth embodiment can reduce the surge voltage while the turn-OFF loss is not substantially increased. The switching circuit 210 of this fourth embodiment can overcome the trade-OFF relationship existed between the turn-OFF loss and the surge voltage.

The below-mentioned comparison examples indicate simulation results obtained in the case where as the electrostatic capacitances of the first capacitance 7a and the second capacitance 7b, extreme electrostatic capacitances are employed. It should be noted that the arrangements of the switching circuits employed in the below-mentioned comparison examples are identical to that of the switching circuit 210 shown in FIG. 19.

Comparison Example 1

Figure 24A:
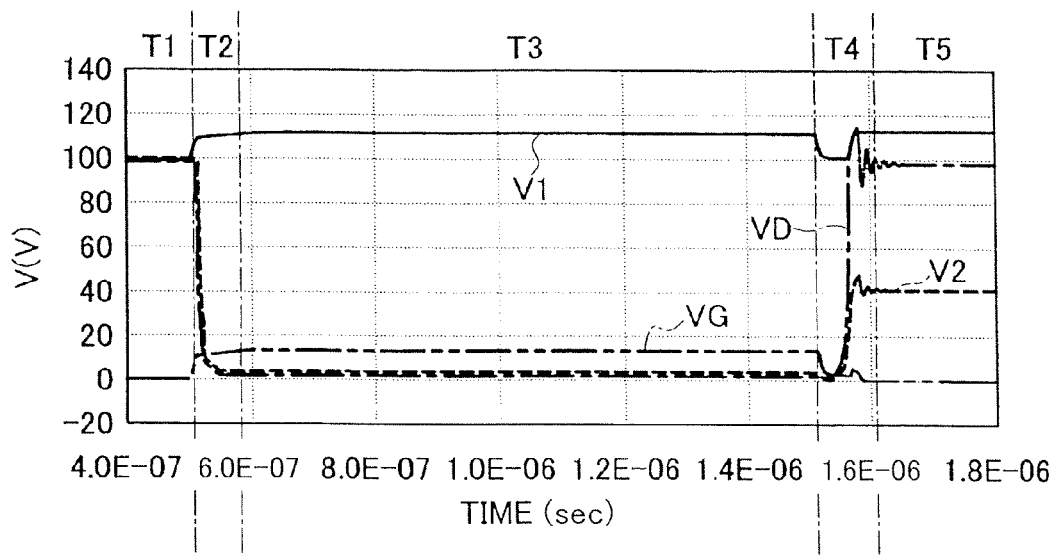
FIG. 24A is a graph for showing time elapse changes in a voltage VG of a gate electrode, a voltage VD of a drain electrode D of a transistor, and voltages V1 and V2 in a switching circuit of a comparison example 1.
Figure 24B:
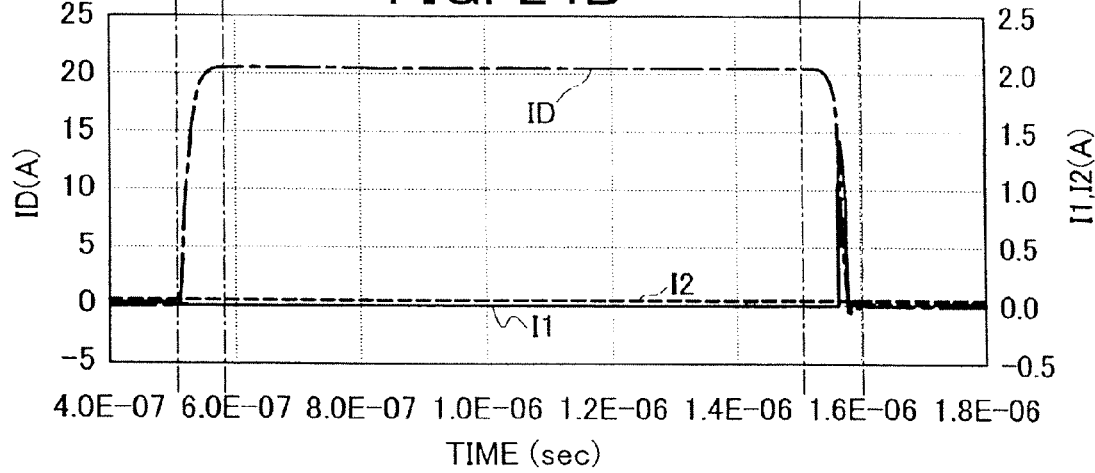
FIG. 24B is a graph for indicating time elapse changes in a drain current ID of a transistor, and currents I1 and I2 in the switching circuit of the comparison example 1.

Results shown in FIG. 24A to FIG. 24B correspond to such a case that the electrostatic capacitance C1 of the first capacitor 7a is 1 nF, and the electrostatic capacitance C2 of the second capacitor 7b is 0.1 pF. The electrostatic capacitance C2 of the second capacitor 7b is extremely small. As a consequence, the comparison example 1 is essentially equivalent to such a case that the second capacitor 7b is not present.

As shown in FIG. 24A to FIG. 24B, in the comparison example 1, the current I2 does not flow in the transition time period during which the transistor 5 is turned ON. As a result, the voltage V1 at the third junction point 233 is not decreased.

Comparison Example 2

Figure 25A:
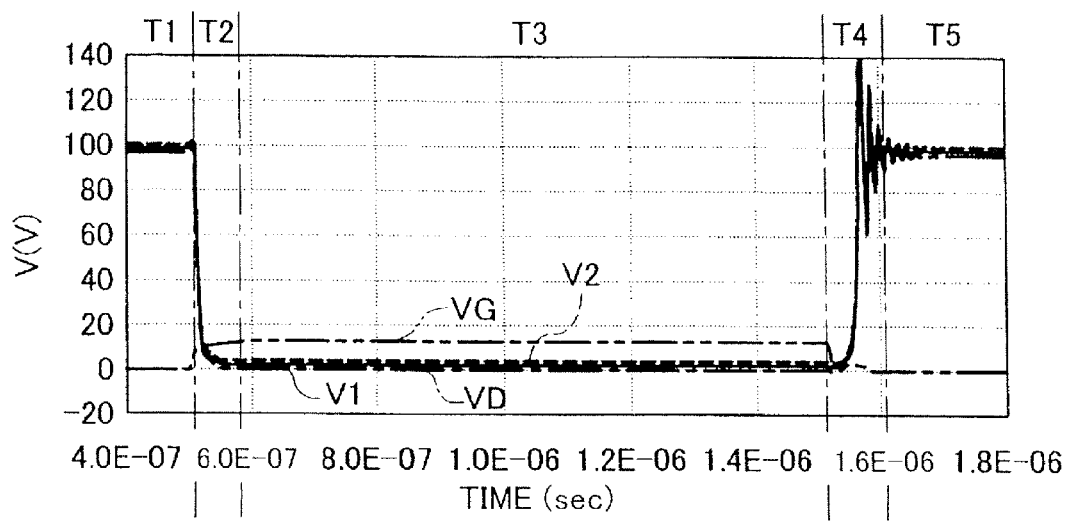
FIG. 25A is a graph for showing time elapse changes in a voltage VG of a gate electrode, a voltage VD of a drain electrode D of a transistor, and voltages V1 and V2 in a switching circuit of a comparison example 2.
Figure 25B:
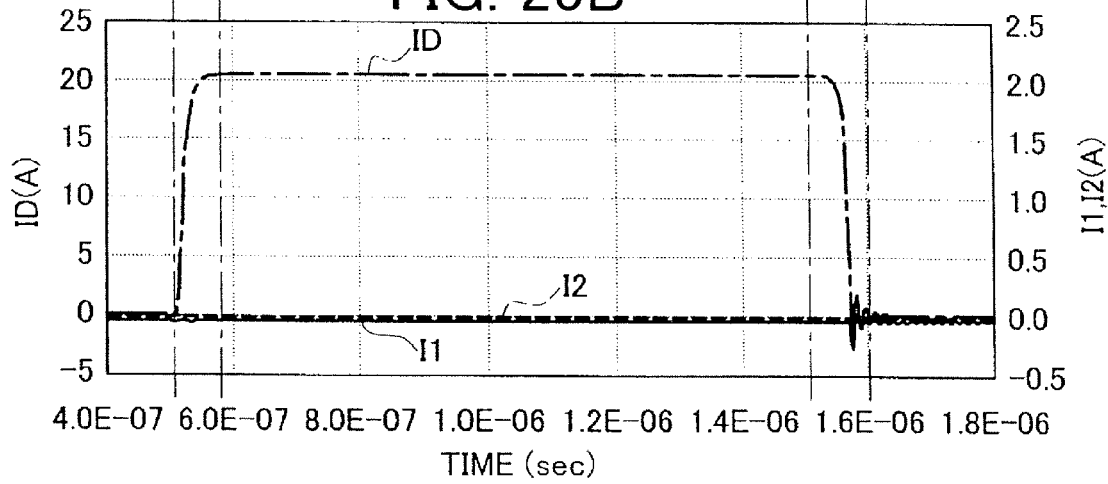
FIG. 25B is a graph for indicating time elapse changes in a drain current ID of a transistor, and currents I1 and I2 in the switching circuit of the comparison example 2.

Results shown in FIG. 25A to FIG. 25B correspond to such a case that the electrostatic capacitance C1 of the first capacitor 7*a* is 0.1 pF, and the electrostatic capacitance C2 of the second capacitor 7*b* is 1 nF. The electrostatic capacitance C1 of the first capacitor 7*a* is extremely small.

As shown in FIG. 25A to FIG. 25B, in the comparison example 2, the current I2 does not flow in the transition time period during which the transistor 5 is turned ON. Furthermore, the current I1 does not flow in the transition time period during which the transistor 5 is turned OFF. As a consequence, the comparison example 2 can be evaluated to be essentially equivalent to such a case that the surge voltage measure circuit 212 is not provided.

Comparison Example 3

Figure 26A:
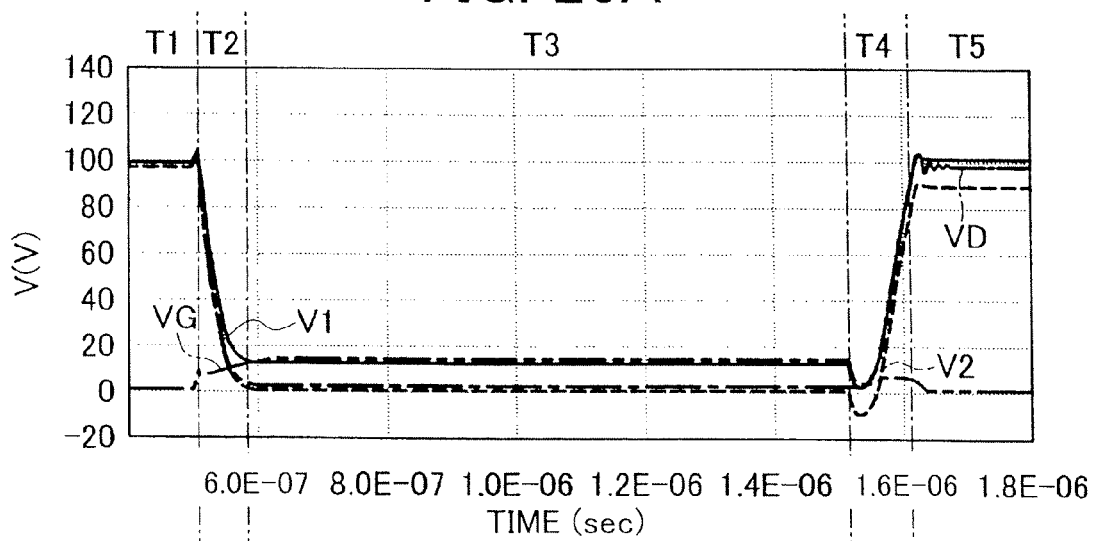
FIG. 26A is a graph for showing time elapse changes in a voltage VG of a gate electrode, a voltage VD of a drain electrode D of a transistor, and voltages V1 and V2 in a switching circuit of a comparison example 3.
Figure 26B:
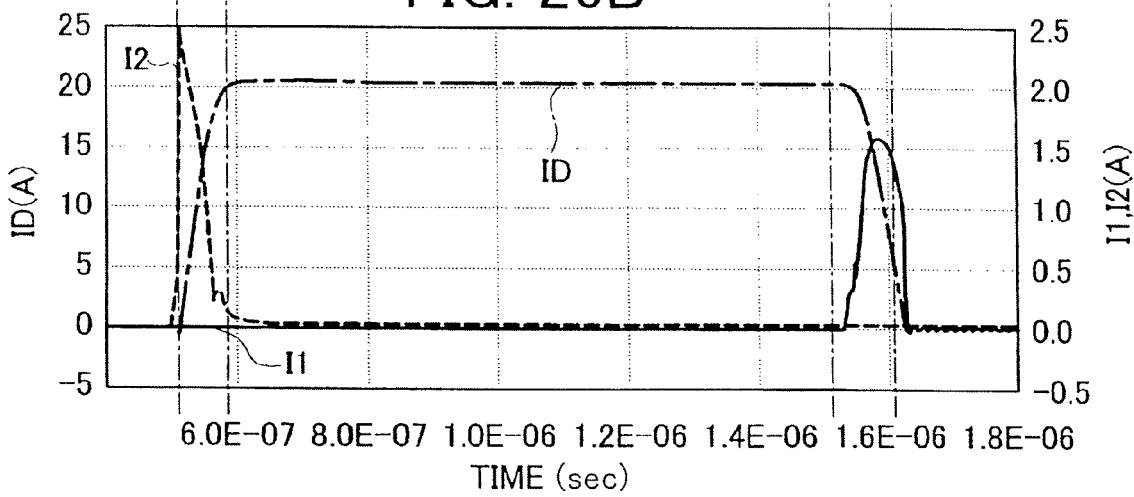
FIG. 26B is a graph for indicating time elapse changes in a drain current ID of a transistor, and currents I1 and I2 in the switching circuit of the comparison example 3.

Results shown in FIG. 26A to FIG. 26B correspond to such a case that the electrostatic capacitance C1 of the first capacitor 7*a* is 1 nF, and the electrostatic capacitance C2 of the second capacitor 7*b* is 10 nF. The electrostatic capacitance C2 of the second capacitor 7*b* is extremely large.

As shown in FIG. 26A to FIG. 26B, in the comparison example 3, the excessive current I2 flows in the transition time period during which the transistor 5 is turned ON. As a result, the voltage V1 at the third junction point 233 is excessively decreased. As a consequence, in the transition time period during which the transistor 5 is turned OFF, the voltage VD at the second junction point is inclined from the beginning stage thereof. In the switching circuit of the comparison example 3, the turn-OFF loss is increased.

As a substitution idea, for instance, in the switching circuit 210 of FIG. 19, the series circuit constructed of the second capacitor 7*b* and the second diode 9*b*, the parallel circuit constructed by the first diode 9*a*, and the first capacitor 7*a* may be alternatively arranged between the first junction point 241 and the second junction point 251 in an opposite positional relationship. Alternatively, the arranging sequence between the second capacitor 7*b* and the second diode 9*b* may be inversed.

Fifth Embodiment

Figure 28:
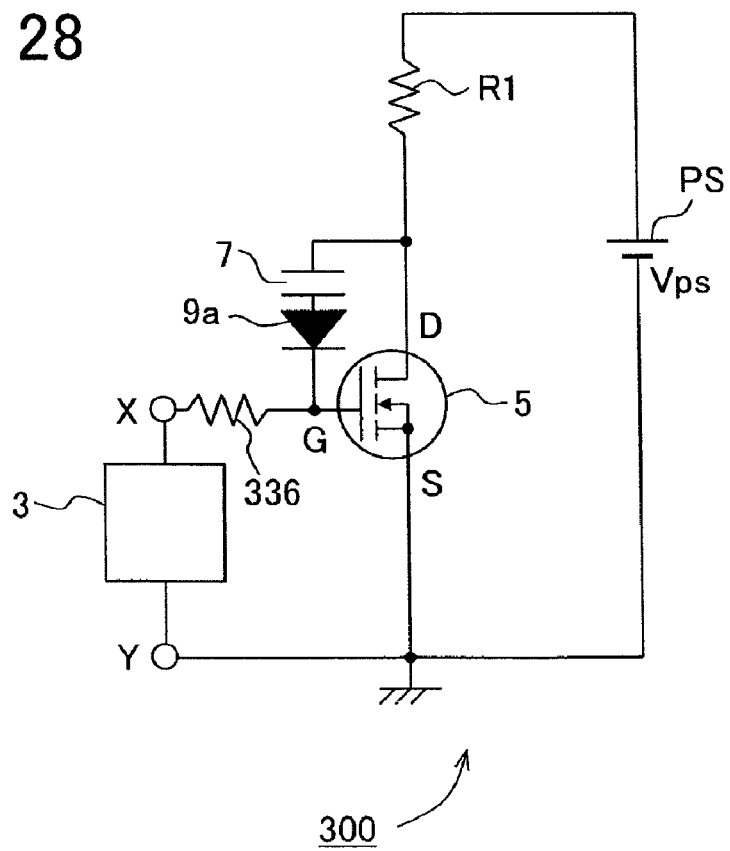
FIG. 28 is a circuit diagram for showing a switching circuit according to a fifth embodiment of the present invention.

As shown in FIG. 28, a switching circuit 300 according to a fifth embodiment of the present disclosure has been arranged by containing a transistor (MOSFET) 5, a load resistor R1, a gate control circuit 3, a gate resistor 336, a power supply PS, a diode 9*a*, and a capacitor 7.

The switching circuit 300 contains a MOSFET 5 corresponding to the switching element. The MOSFET 5 is an N channel type MOSFET. A drain terminal D of the MOSFET 5 is connected via the load resistor R1 to a positive polarity side of a power supply PS. A source terminal S of the MOSFET 5, a negative polarity side of the power supply PS, and a ground terminal Y of the gate control circuit 3 are grounded. A gate terminal G of the MOSFET 5 is connected via a gate resistor 336 to a control voltage output terminal X of the gate control circuit 3.

The switching circuit 300 further contains a surge voltage suppressing circuit corresponding to a series circuit arranged by a diode 9*a* and a capacitor 7. The surge voltage suppressing circuit connects a signal path between the drain and the gate of the MOSFET 5. The drain terminal D of the MOSFET 5 is connected via the capacitance 7 to an anode terminal of the diode 9*a*. The gate terminal G of the MOSFET 5 is connected to a cathode terminal of the diode 9*a*.

The gate control circuit 3 outputs a control voltage (gate voltage) "VG" for turning ON/OFF the MOSFET 5 with respect to the gate terminal G of the MOSFET 5 from the control voltage output terminal X. When the gate voltage VG is lower than a threshold voltage, the MOSFET 5 is under OFF state. When the gate voltage VG is higher than, or equal to the threshold voltage (for instance, 5V to 15V), the MOSFET 5 is under ON state.

In the case that the MOSFET 5 is under OFF state, the drain voltage VD of the drain terminal D is maintained at the power supply voltage Vps. As a result, a forward direction bias is applied to the diode 9*a*, and thus, is brought into a conduction state. As a consequence, a potential difference between the gate terminal G and the drain terminal D of the MOSFET 5 becomes equal to the power supply voltage Vps, and a charge voltage Vc of the capacitor 7 becomes equal to such a voltage calculated by subtracting the forward direction voltage $V_F$ of the diode 9*a* from the power supply voltage Vps. It should also be noted that since the forward direction voltage $V_F$ of the diode 9*a* is sufficiently low (for instance, approximately 0.7 V in silicon diode), as compared with the normal power supply voltage, the charge voltage Vc between the terminals of the capacitor 7 becomes substantially equal to the power supply voltage Vps.

Next, when the MOSFET 5 is brought into an ON state, the drain voltage VD of the drain terminal D is lowered from the power supply voltage Vps up to a voltage "Vds" between the source and the drain (approximately, several V). At this time, the charge voltage Vc of the capacitor 7 is kept at the power supply voltage Vps, and a reverse direction bias is applied to the diode 9*a*, so that the diode 9*a* is brought into a cut off state.

Figure 29:
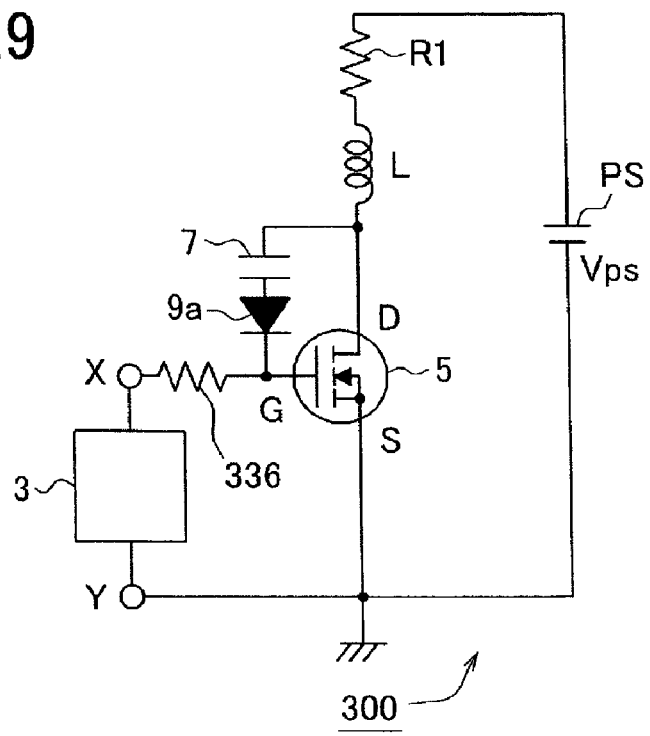
FIG. 29 is a circuit diagram for representing an equivalent circuit of the switching circuit of the fifth embodiment.

Next, if the gate voltage VG is lowered, so that the ON state of the MOSFET 5 is transferred to an OFF state, then the drain voltage VD is increased. As shown in FIG. 29, since a stray inductance "L" is contained in the switching circuit 300, a surge voltage is generated due to this stray inductance "L", so that the drain voltage VD is increased higher than, or equal to the power supply voltage Vps. In connection with the increase of the drain voltage VD, if the voltage Vdg between the gate and the drain becomes higher than, or equal to a summation voltage between the voltage Vc held in the capacitor 7 and the forward direction voltage $V_F$ of the diode 9*a*, then the diode 9*a* is biased along the forward direction to become conductive. Thus, a current flows through the gate resistor 336, so that the voltage at the gate terminal is increased. As a result, the current Id between the source and the drain of the MOSFET 5 is increased, and a lowering speed of the current Id between the source and the drain is slowed, so that the drain voltage VD is lowered.

As previously described, since the increase of the drain voltage VD is negatively fed back to the gate terminal via the series circuit constructed of the diode 9*a* and the capacitor 7, the current Id between the source and the drain of the MOSFET 5 is increased, so that increasing of the drain voltage VD caused by the surge voltage can be suppressed.

It should be noted that the above-described switching circuit 300 may be alternatively applied to an inverter circuit, a DC-to-DC converter circuit, and the like.

A description is made of an embodiment as to the switching circuit 300 equipped with the N channel type MOSFET 5. In this case, a suppression effect of a surge voltage is indicated in such a case that the capacitor 7 is selected to be 1 nF, and also be 10 nF, while the power supply voltage Vps is selected to be 100 V.

In the case that the MOSFET 5 is under OFF state, the diode 9a is brought into a conduction state, so that a potential difference between the gate G and the drain D of the MOSFET 5 becomes equal to the power supply voltage Vps. A voltage Vc obtained by subtracting the forward direction voltage $V_F$ (approximately 0.7 V) of the diode 9a from the power supply voltage Vps (=100 V) is held in the capacitor 7. When the MOSFET 5 becomes an ON state, the drain voltage VD is lowered to several volts, and the capacitor 7 maintains approximately 100 V, and a reverse direction bias is applied to the diode 9a, so that the diode 9a is brought into a cut off state. If the control voltage VG is lowered, so that the ON state of the MOSFET 5 is changed into an OFF state, then the drain voltage VD is increased.

Figure 30:
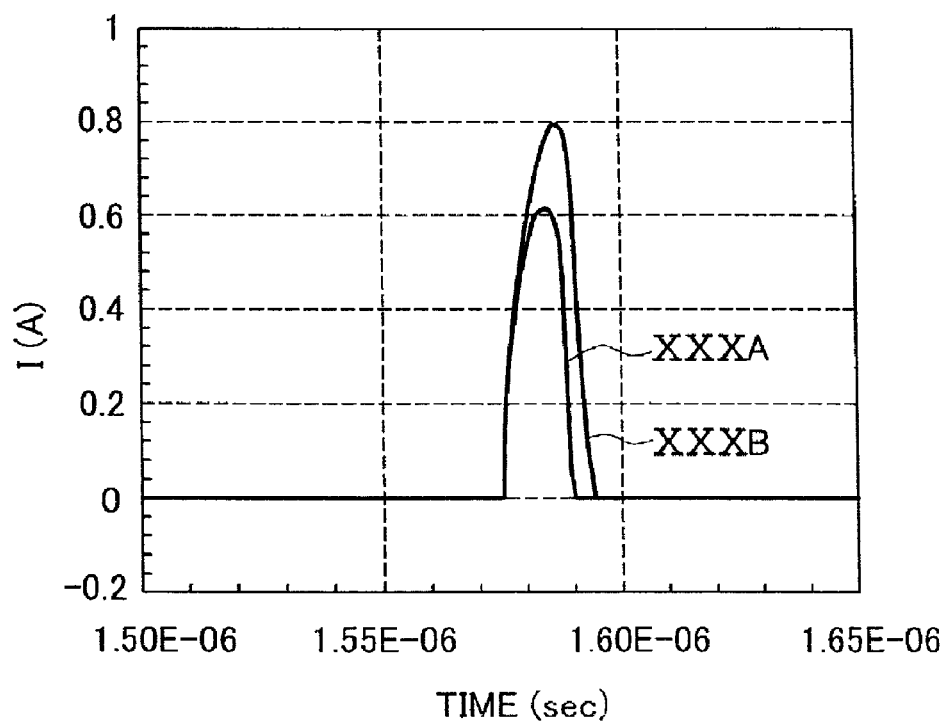
FIG. 30 is a graph for showing a temporal change of a current flowing through a diode when a transistor is turned OFF.
Figure 31:
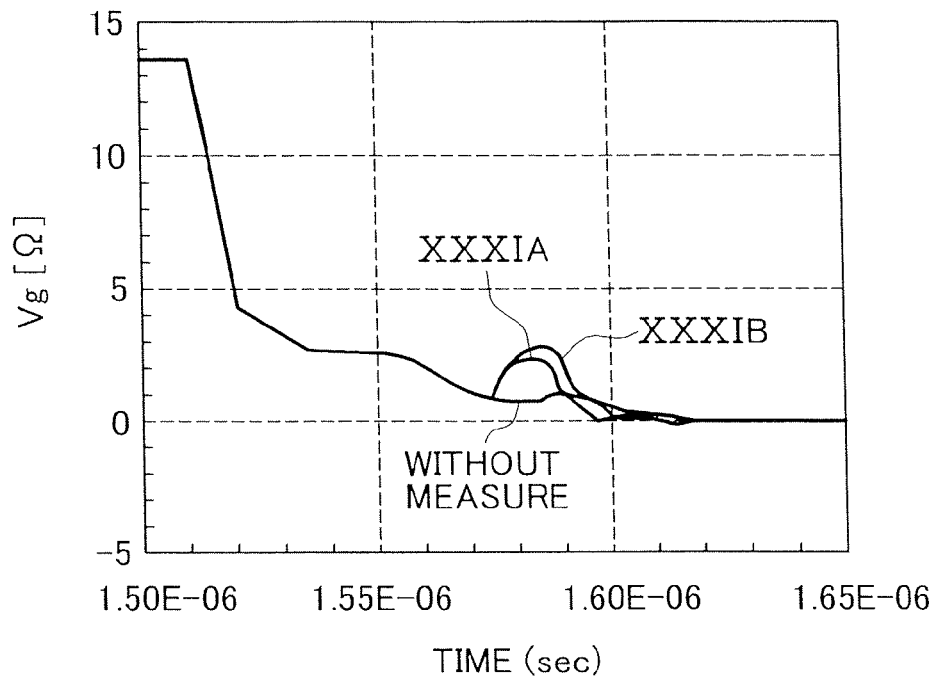
FIG. 31 is a graph for showing a temporal change of a gate voltage when the transistor is turned OFF.

FIG. 30 represents a temporal change of a current flowing through the diode 9a when the MOSFET 5 is brought into the OFF state and a surge voltage is generated at the drain terminal D. Also, FIG. 31 shows a temporal change of the gate voltage VG which is applied to the gate terminal G when the surge voltage is generated at the drain terminal D. Further, a temporal change of the gate voltage in the case where the surge voltage suppressing circuit is not provided is indicated in FIG. 31 as a comparison example.

If a surge voltage is generated during a time period from a time instant of $1.57 \times 10^{-6}$ seconds to a time instant of $1.60 \times 10^{-6}$ seconds, and the voltage Vdg between the gate and the drain of the MOSFET 5 becomes higher than, or equal to a summation voltage between the voltage Vc held in the capacitor 7 and the forward direction voltage $V_F$ of the diode 9a, namely the power supply voltage Vps of 100V, then the diode 9a is biased in the forward direction, so that the diode 9a becomes conductive. As a result, a current flows through the gate resistor 336 and thus the voltage VG of the gate terminal G is increased. At this time, as shown in FIG. 30, a circuit impedance in the case that the capacitance value of the capacitor 7 of the surge voltage suppressing circuit is 10 nF (indicated by line "XXXB") becomes smaller than a circuit impedance in the case that the capacitance value of the capacitor 7 of the surge voltage suppressing circuit is 1 nF (indicated by line "XXXA"), so that a larger current flows. As a result, as represented in FIG. 31, such a gate voltage VG in the case that the capacitance value of the capacitor 7 of the surge voltage suppressing circuit is 10 nF (indicated by line "XXXIB") which is lower than a gate voltage VG in the case that the capacitance value of the capacitor 7 of the surge voltage suppressing circuit is 1 nF (indicated by line "XXXIA") is applied to the gate terminal G of the MOSFET 5. It should also be noted that when the surge voltage suppressing circuit is not provided, no current flows through the gate resistor 336, and thus, the gate voltage VG is not increased.

Figure 32:
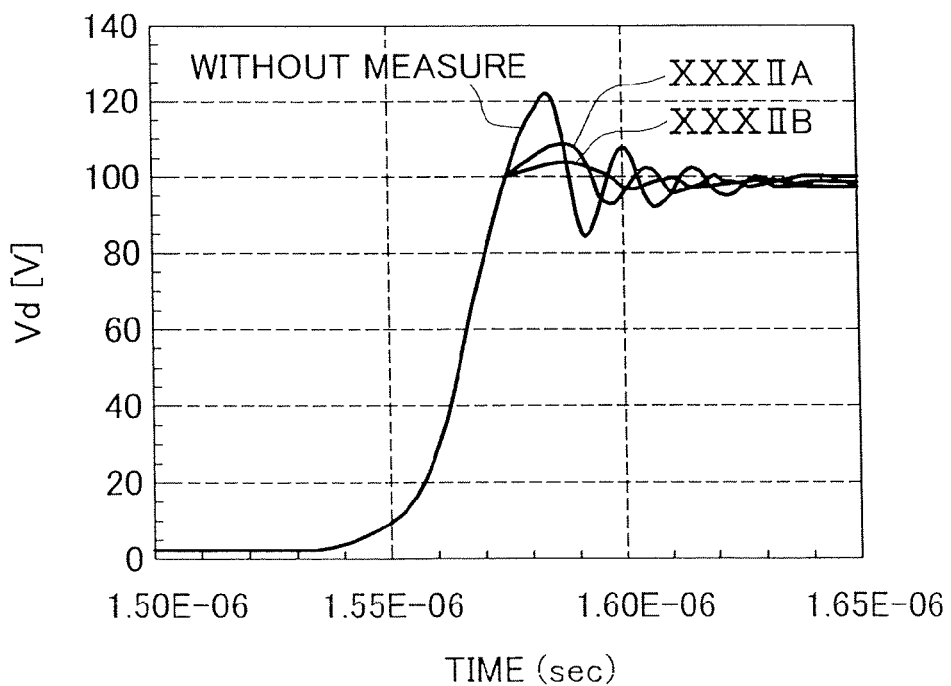
FIG. 32 is a graph for showing a temporal change of a drain voltage when the transistor is turned OFF.

FIG. 32 indicates a temporal change, of the drain voltage VD when the MOSFET 5 is turned OFF. Since the gate voltage VG is increased, if the current Id between the source and the drain of the MOSFET 5 is increased, then the drain voltage VD is decreased, so that the adverse influence of the surge voltage is suppressed. At this time, as shown in FIG. 32, the suppression effect of the surge voltage achieved in the case that the capacitance value of the capacitor 7 of the surge voltage suppressing circuit is 10 nF (indicated by line "XXXIIB") becomes higher than the suppression effect of the surge voltage achieved in the case that the capacitance value of the capacitor 7 of the surge voltage suppressing circuit is 1 nF (indicated by line "XXXIIA").

It should also be understood that when the surge voltage suppressing circuit is not employed, no current flows through the gate resistor 336, and thus, the gate voltage VG is not increased.

Figure 33:
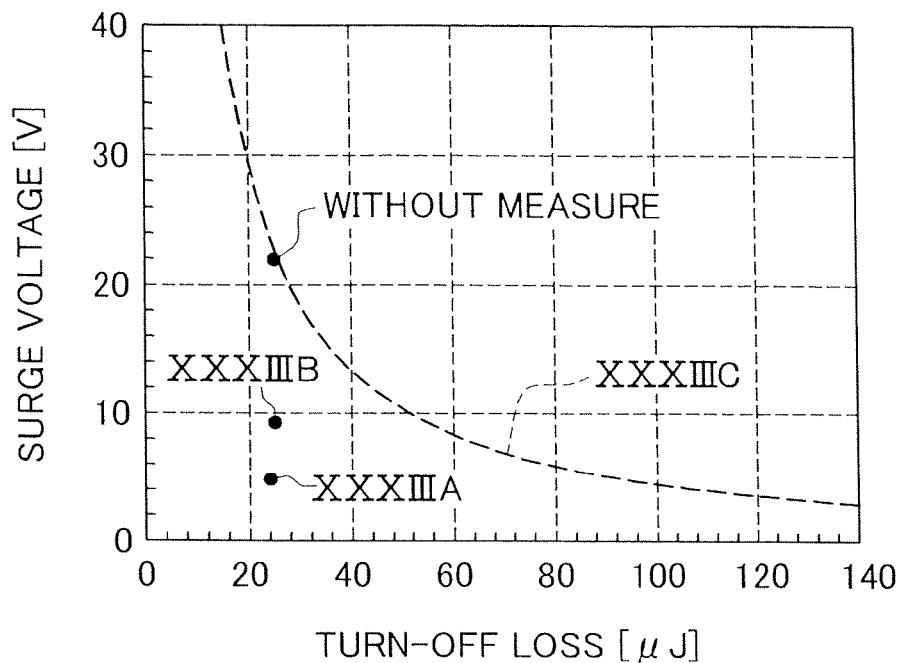
FIG. 33 is a graph for representing a relationship between a turn-OFF loss and a surge voltage.
Figure 34:
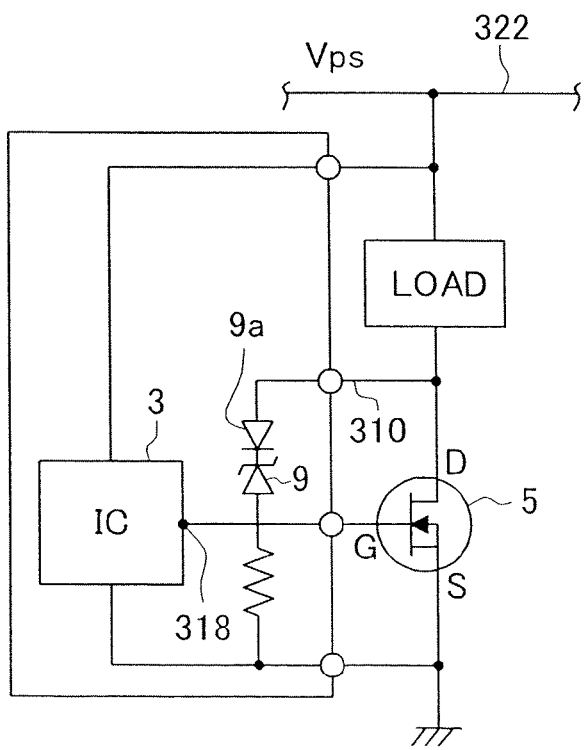
FIG. 34 is the circuit diagram for showing the load driving circuit containing the surge voltage suppressing circuit.
Figure 35:
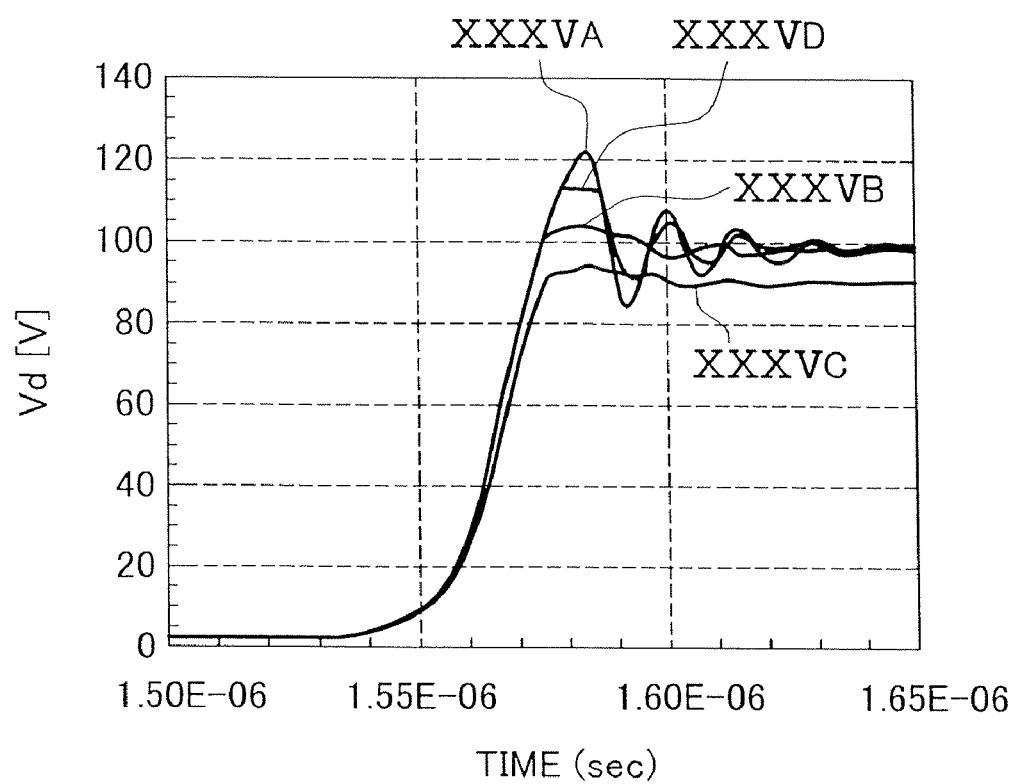
FIG. 35 is the graph for representing the temporal change of the drain voltage when the conventional load driving circuit is turned OFF.

In such a case that a suppressing circuit for a surge voltage is not provided, as represented in FIG. 33, there is a trade-off relationship between a surge voltage and a loss produced when the MOSFET 5 is turned OFF. In this graph, a product made by a drain voltage VD and a drain current Id is integrate for a turn-OFF time period is defined as a loss occurred when the MOSFET 5 is turned OFF. In other words, in order to reduce the loss occurred when the MOSFET 5 is turned OFF, a turn-OFF time must be shortened. However, since the turn-OFF time is shortened, a surge voltage caused by a stray inductance is increased. On the other hand, if the surge voltage suppressing circuit of this fifth embodiment is employed, as indicated in FIG. 33, then the surge voltage can be reduced while the loss occurred when the MOSFET 6 is turned OFF is suppressed to a small loss. At this time, the suppression effect of the surge voltage achieved in the case that the capacitance value of the capacitor 7 of the surge voltage suppressing circuit is 10 nF (indicated by line "XXXIIIB") becomes higher than the suppression effect of the surge voltage achieved in the case that the capacitance value of the capacitor 7 of the surge voltage suppressing circuit is 1 nF (indicated by line "XXXIIIA"). In this case, a dot line "XXXIIIC" indicates a trade-off curve between a surge voltage and a turn-OFF loss of a general-purpose power MOSFET.

As indicated in FIG. 36A to FIG. 45, a portion of the switching circuit 300 may be constituted by forming the MOSFET 5, the diode 9a, and the capacitor 7 on the same semiconductor substrate 20. Any of the examples shown in FIG. 36A to FIG. 45 corresponds to such a semiconductor mode that the MOSFET 5 and the capacitor 7 have been formed in the semiconductor substrate 20, and the diode 9a has been formed on the semiconductor substrate 20. The MOSFET 5, the diode 9a, and the capacitor 7 have been arranged in an integral body by utilizing the semiconductor substrate 20, and have been formed as a single chip. It should also be noted that single crystalline silicon has been employed in the semiconductor substrate 20.

Figure 36A:
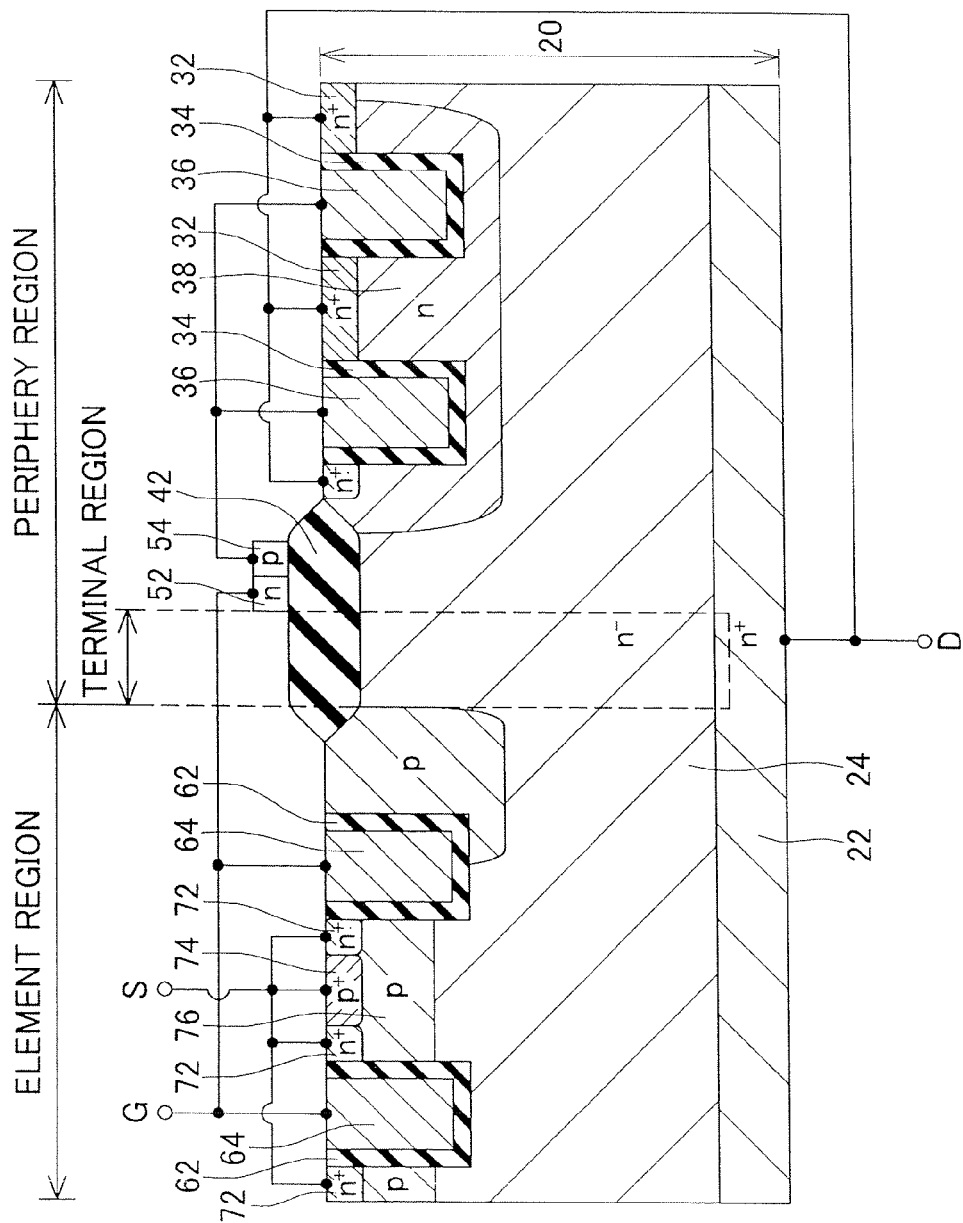
FIG. 36A is a sectional view for showing a major portion of a semiconductor substrate where a transistor, a diode, and a capacitor of the switching circuit according to the fifth embodiment have been formed.
Figure 36B:
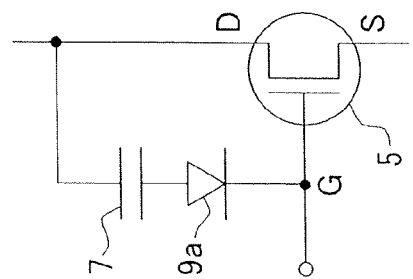
FIG. 36B is a circuit diagram for indicating an equivalent circuit thereof.

The semiconductor mode shown in FIG. 36A to FIG. 36B is such an example that the series circuit made of the diode 9a and the capacitor 7 has been connected between the drain D and the gate G of the MOSFET 5, and the capacitor 7 has been inserted between the drain D of the MOSFET 5 and the diode 9a. FIG. 36A schematically indicates a sectional view of a major portion of the semiconductor substrate 20. FIG. 36B shows an equivalent circuit of this semiconductor structure.

FIG. 36A indicates a vicinity of a boundary between an element region and a periphery region. The element region corresponds to such a region that a semiconductor region group has been formed which is required in order to temporally switch a signal path between the major electrodes (namely, drain D and source S) under conductive state and under non-conductive state. The element region has been arranged at a center side of the semiconductor substrate 20. The periphery region has been arranged in such a manner that a peripheral portion of a central region is surrounded. A terminal region has been formed in the periphery region. The terminal region has been arranged in such a manner that the peripheral portion of the central region is surrounded. The terminal region corresponds to such a region that when the MOSFET 5 is under OFF state, a voltage applied to the MOSFET 5 is loaded along a lateral direction by expanding a depletion layer from the element region toward a side direction. It should be understood that widths of the terminal region along the lateral direction indicated in FIG. 36A is represented in a compression mode for the sake of clear illustrations.

The semiconductor substrate 20 has been provided with an $n^+$ type drain region 22 and an $n^-$ type drift region 24. The $n^+$ type drain region 22 has been formed on a rear surface of the semiconductor substrate 20, whereas the $n^-$ type drift region 24 has been provided on the drain region 22. Both the drain region 22 and the drift region 24 have been continuously provided along the lateral direction from the element region to the periphery region within the semiconductor substrate 20.

A p type body region 76, an $n^+$ type source region 72, and a $p^+$ type body contact region 74 have been provided on a front surface of the semiconductor substrate 20 of the element region. The body region 76 has been continuously provided on the front surface of the semiconductor substrate 20 of the element region along the lateral direction. The source region 72 and the body contact region 74 have been selectively provided on the front surface of the semiconductor substrate 20. The source region 72 has been isolated from the drift region 24 by the body region 76. The body contact region 74 contains higher dopant concentration than that of the body region 76. Both the source region 72 and the body contact region 74 have been electrically connected to the source S provided on the semiconductor substrate 20.

A trench gate electrode 64 and a gate insulating film 62 have been further formed on the front surface of the semiconductor substrate 20 of the element region. The trench electrode 64 has been extended from the front surface of the semiconductor substrate 20 toward the rear surface thereof, and has penetrated through the body region 76 and then has reached the drift region 24. The gate insulating film 62 has covered the trench gate electrode 64 so as to electrically insulate the trench gate electrode 64 from the semiconductor substrate 20. The trench gate electrode 64 is located opposite to the body region 76 via the gate insulating film 62, while the body region 76 has isolated the source region 72 from the drift region 24. Poly crystalline silicon has been employed in the trench gate electrode 64. A silicon oxide has been employed in the gate insulating film 62.

A selective oxide film 42 (one example of insulating film) has been provided on the front surface of the semiconductor substrate 20 of the periphery region. A silicon oxide has been employed in the selective oxide film 42. The selective oxide film 42 can relax an electric field of the front surface of the semiconductor substrate 20 of the terminal region. Generally speaking, there are many possibilities that such structures as, for example, a RESURF layer and a guard ring have been provided within the semiconductor substrate 20 located under the selective oxide film 42. These structures have been provided in order to relax electric field concentration occurred in the peripheral portion of the element region, and thus, so as to improve a withstanding voltage of the MOSFET 5. In FIG. 36A, for the sake of clear illustration, these very fine structures have been omitted.

An n type diffusion semiconductor region 38 and an $n^+$ type surface diffusion semiconductor region 32 have been provided on a front surface of the semiconductor substrate 20 which is located in a further side direction than the terminal region. Both the n type diffusion semiconductor region 38 and the $n^+$ type surface diffusion semiconductor 32 have been provided on at least a portion of the front surface of the semiconductor substrate 20 located in the further side direction than the terminal region. In other words, the n type diffusion semiconductor region 38 and the $n^+$ type surface diffusion semiconductor region 32 need not be provided in such a manner that the peripheral portion of the terminal region is surrounded by these regions 32 and 38.

An embedded conductive region 36 and a coating insulation region 34 have been furthermore provided in a portion of the front surface of the semiconductor substrate 20 which is located in a further side direction than the terminal region. The embedded conductive region 36 has been extended from the front surface of the semiconductor substrate 20 to the rear surface thereof, and then has been stayed within the n type diffusion semiconductor region 38. The coating insulation region 34 has covered the embedded conductive region 36 so as to electrically insulate the embedded conductive region 36 from the semiconductor substrate 20. Poly crystalline silicon has been employed in the embedded conductive region 36. A silicon oxide has been employed in the coating insulation region 34.

The embedded conductive region 36 has been located opposite to the n type diffusion semiconductor region 38 via the coating insulation region 34. As a consequence, the capacitor 7 has been constituted by the embedded conductive region 36, the coating insulation region 34, and the n type diffusion semiconductor region 38. It should also be noted that the n type diffusion semiconductor region 38 has been formed in order to suppress that a depletion layer is produced in a boundary between the coating insulation region 34 and the n type diffusion semiconductor region 38, and thus, so as to stabilize the capacitance of the capacitor 7.

The embedded conductive region 36 has the same depth as that of the trench gate electrode 64 of the element region. The coating insulation region 34 has the same thickness as that of the gate insulating film 62 of the element region. As a consequence, both the embedded conductive region 36 and the coating insulation region 34 can be formed at the same time by utilizing the process for manufacturing the trench gate electrode 64 of the element region and the gate insulating film 62.

The diode 9a has been formed on the front surface of the selective region 42. The diode 9a has been provided with an anode semiconductor region 54 containing a p type dopant, and a cathode semiconductor region 52 containing an n type dopant. While the anode semiconductor region 54 and the cathode semiconductor region 52 have been provided on the front surface of the selective oxide film 42, the anode semiconductor region 54 and the cathode semiconductor region 52 are directly contacted thereto. As materials of the anode semiconductor region 54 and the cathode semiconductor region 52, poly crystalline silicon has been employed.

As represented in FIG. 36, the cathode semiconductor region 52 of the diode 9a has been electrically connected to the trench gate electrode 64 of the MOSFET 5. The anode semiconductor region 54 of the diode 9a has been electrically connected to the embedded conductive region 36 of the capacitor 7. In other words, the anode semiconductor region 54 of the diode 9a has been electrically connected to one end of the capacitor 7. The n type diffusion semiconductor region 38 has been electrically connected via the $n^+$ type surface diffusion semiconductor region 32 to the drain D. Also, the n type diffusion semiconductor region 38 has been electrically connected via the drift region 24 and the drain region 22 to the drain D. As a consequence, the other end of the capacitor 7 has been electrically connected to the drain D of the MOSFET 5. A switching circuit-purpose chip for embodying an equivalent circuit shown in FIG. 36B has been arranged by electrically connecting these electronic elements. It should also be understood that these electric connections may be constituted by, for example, aluminum wiring lines.

As previously described, if the diode 9a and the capacitor 7 are constructed on the same semiconductor substrate 20 as the MOSFET 5, then the diode 9a and the capacitor 7 need not be separately prepared. As a consequence, a semiconductor chip for the switching circuit 300 can be constructed without increasing a total number of these components. If the MOSFET 5, the diode 9a, and the capacitor 7 have been provided on the same semiconductor substrate 20, then the switching circuit 300 can be arranged by employing a small number of the components. Thus, the switching circuit 300 can be furthermore made compact.

Figure 37:
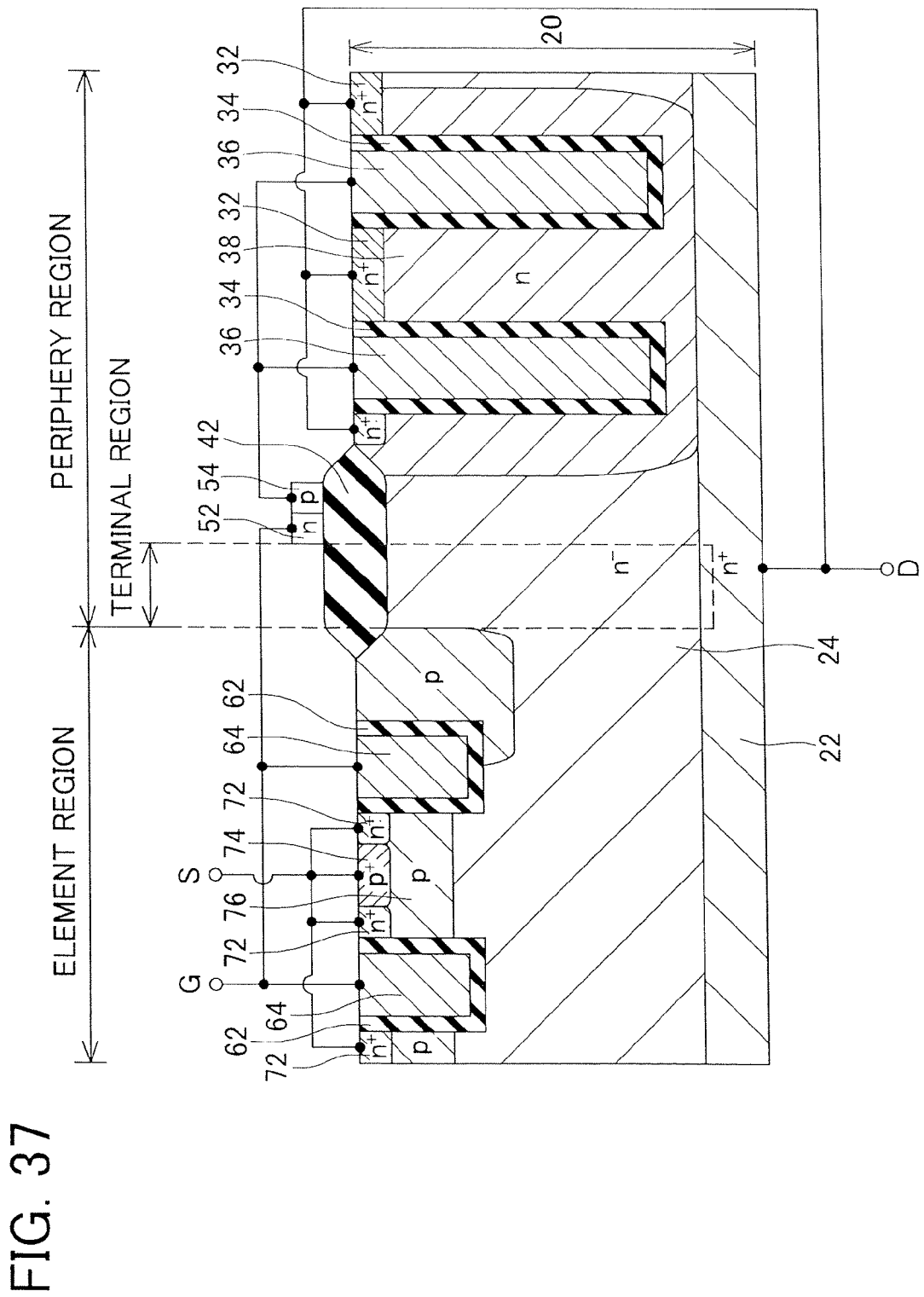
FIG. 37 is a sectional view for showing a major portion of the semiconductor substrate where a transistor, a diode, and a capacitor as to an modification of the switching circuit according to the fifth embodiment have been formed.
Figure 38:
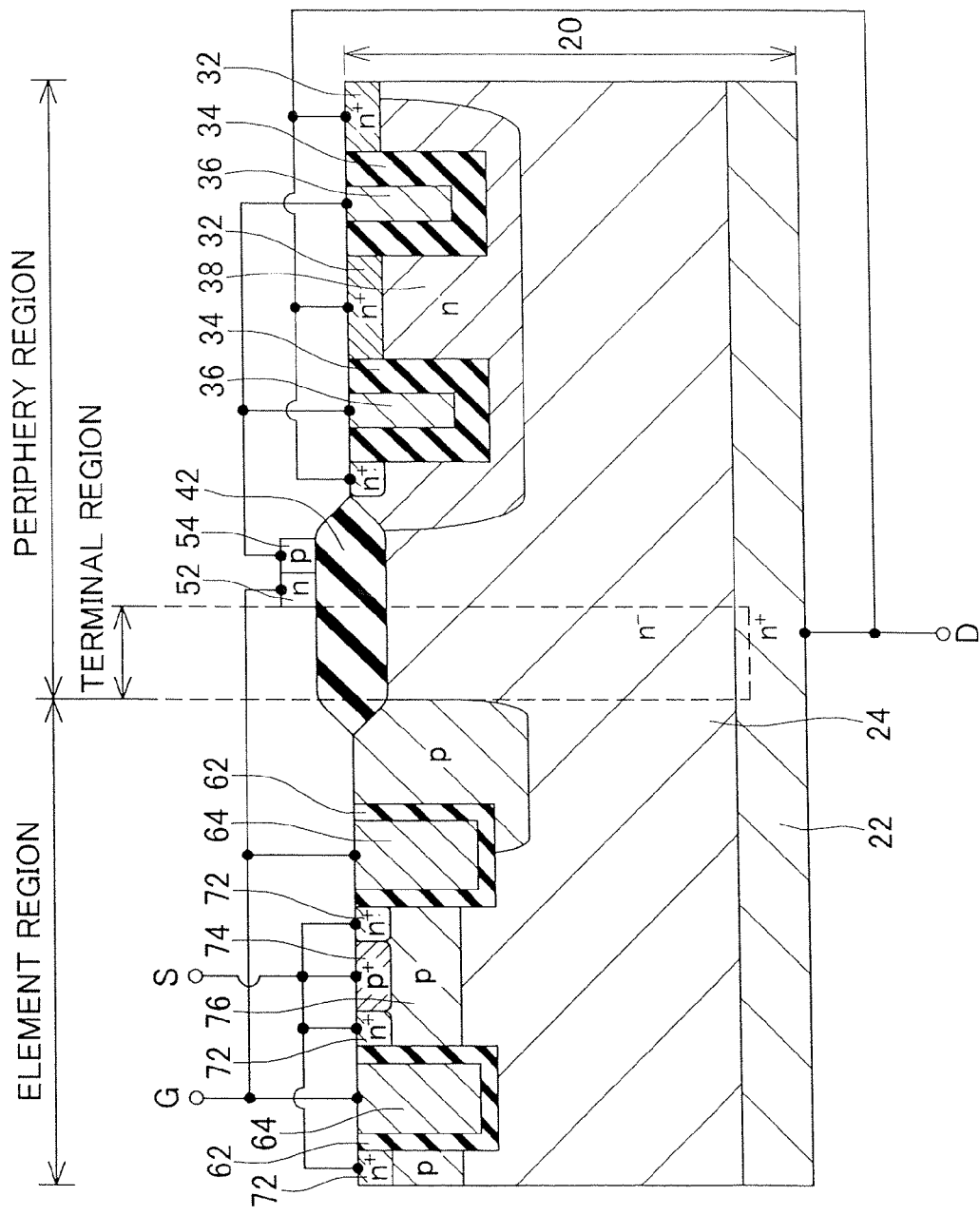
FIG. 38 is a sectional view for showing a major portion of the semiconductor substrate where a transistor, a diode, and a capacitor as to another modification of the switching circuit according to the fifth embodiment have been formed.

FIG. 37 and FIG. 38 indicate a technical idea for changing a capacitance of the capacitor 7. The capacitance of the capacitor 7 is adjusted based upon a thickness and an area of the coating insulation region 34. The capacitance of the capacitor 7 is inverse proportion to the thickness of the coating insulation region 34, and is direct proportion to the area of the coating insulation region 34.

As indicated in FIG. 37, if the embedded conductive region 36 and the coating insulation region 34 are formed up to a deep position of the semiconductor substrate 20 so as to increase the area of the coating insulation region 34, then the capacitance of the capacitor 7 is increased. On the other hand, as shown in FIG. 38, if the thickness of the coating insulation region 34 is increased, then the capacitance of the capacitor 7 can be decreased. As previously explained, the semiconductor modes as to the embedded conductive region 36 and the coating insulation region 34 are contrived, so that the capacitance of the capacitor 7 can be readily adjusted. As apparent from the foregoing description, the thickness of the covering insulator 34 may be made thicker, and further, both the embedded conductive region 36 and the coating insulation region 34 may be alternatively extended up to a deeper position of the semiconductor substrate 20.

Figure 39:
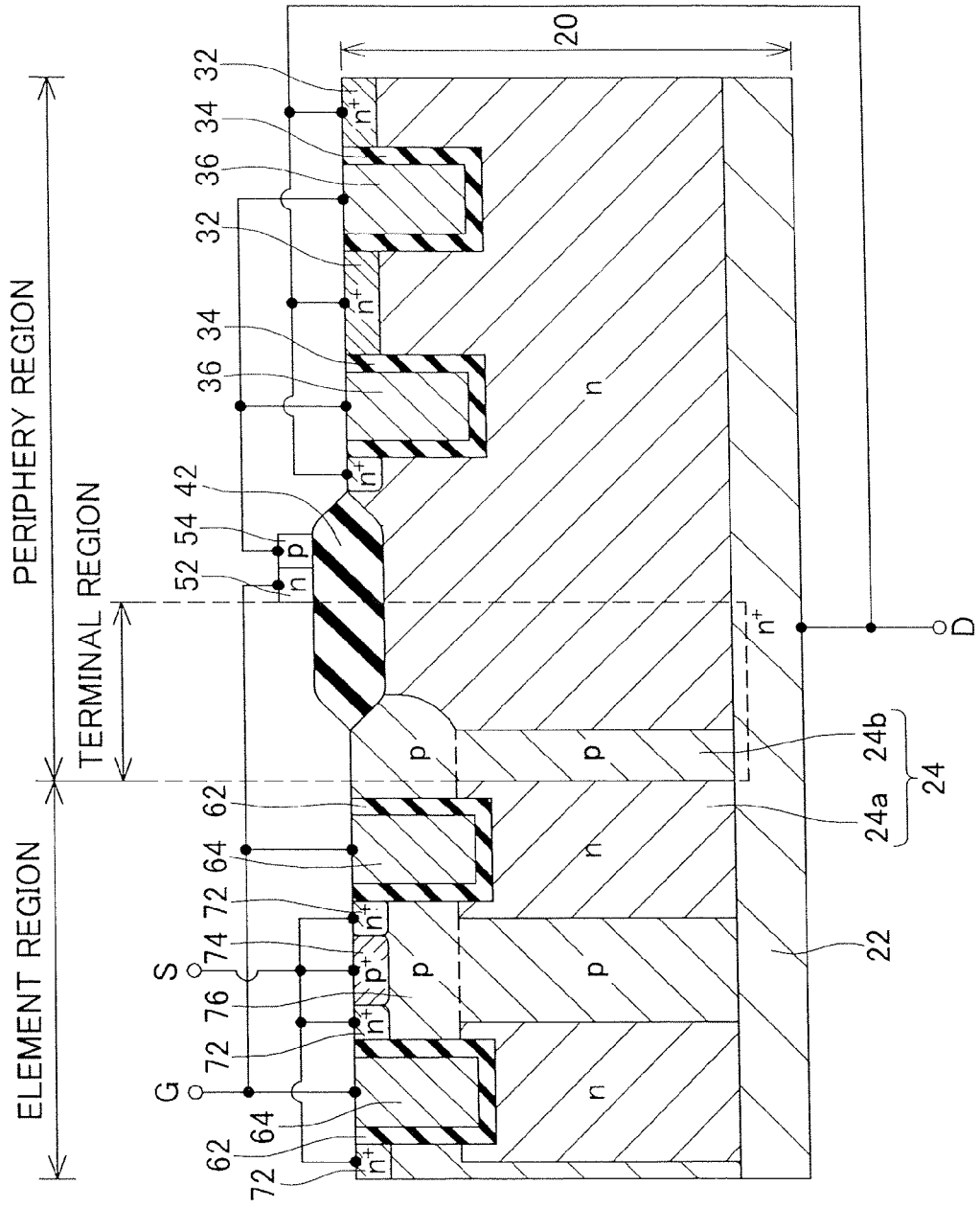
FIG. 39 is a sectional view for showing a major portion of the semiconductor substrate where a transistor, a diode, and a capacitor as to another modification of the switching circuit according to the fifth embodiment have been formed.

FIG. 39 indicates such a semiconductor structural example that a super junction structure has been formed in the drift region 24 of the element region. The drift region 24 of the super junction structure has been formed by a repetition structure made of an n type column 24a containing an n type dopant, and a p type column 24b containing a p type dopant. The impurity concentration of the p type column 24b is substantially equal to that of the body region 76. In the super junction structure, when the MOSFET 5 is turned OFF, a depletion layer is expanded from the pn junction between the n type column 24a and the p type column 24b, and thus, the drift region 24 can be substantially completely depleted. As a result, if a pitch width between the n type column 24a and the p type column 24b is adjusted, even when the impurity concentration is increased, then the drift region 24 can be substantially perfectly depleted. As a consequence, since the impurity concentration of the n type column 24a and the p type column 24b can be increased, the super junction structure is useful as such a technique capable of solving the trade-off relationship existed between the ON-resistance (otherwise, ON voltage) of the MOSFET 5 and the withstanding voltage.

Generally speaking, a super junction structure is formed by utilizing the semiconductor substrate 20 which contains an n type dopant in relatively high concentration. Concretely speaking, a plurality of trenches are formed from the front surface of the semiconductor substrate 20 by performing an anisotropic etching process, and then, p type columns 24b are crystal-grown within these trenches. The remaining portions when the plural trenches are formed become n type columns 24a. As a result, such a super junction structure that the n type columns 24a and the p type columns 24b are repeatedly arranged may be manufactured.

In the case where the super junction structure is employed in the drift region 24 of the element region, the semiconductor substrate 20 is employed which contains the n type dopant in relatively high concentration. As a consequence, in the case where the super junction structure is employed in the drift region 24 of the element region, the impurity concentration of the drift region 24 of the periphery region is increased. Accordingly, in this example, even if the n type diffusion semiconductor region 38 is not provided which was formed in the case of FIG. 36, then it is possible to suppress such a phenomenon that the depletion layer is produced at the boundary of the coating insulation region 34.

As previously described, the technique for forming the MOSFET 5, the diode 9a, and the capacitor 7 on the same semiconductor substrate 20 may be applied to various sorts of transistors. Generally speaking, there are many possibilities that a periphery region of a transistor has been provided with the selective oxide film 42. If the diode 9a is provided on the front surface of this selective oxide film 42, then the diode 9a may be provided above the semiconductor substrate 20 of the periphery region without any limitation to the sort of transistor. Since the space of the surface of the selective oxide film 42 is utilized, the diode 9a can be easily formed in the semiconductor substrate 20 in an integral body while increasing of the element area is suppressed. Also, if both the embedded conductive region 36 and the coating insulation region 34 are utilized, then the capacitor 7 may be easily formed within the semiconductor region 20 of the periphery region. Since both the embedded conductive region 36 and the coating insulation region 34 have the trench shapes, the capacitor 7 can be easily formed in the semiconductor substrate 20 in an integral body while increasing of the element area is suppressed.

Figure 40:
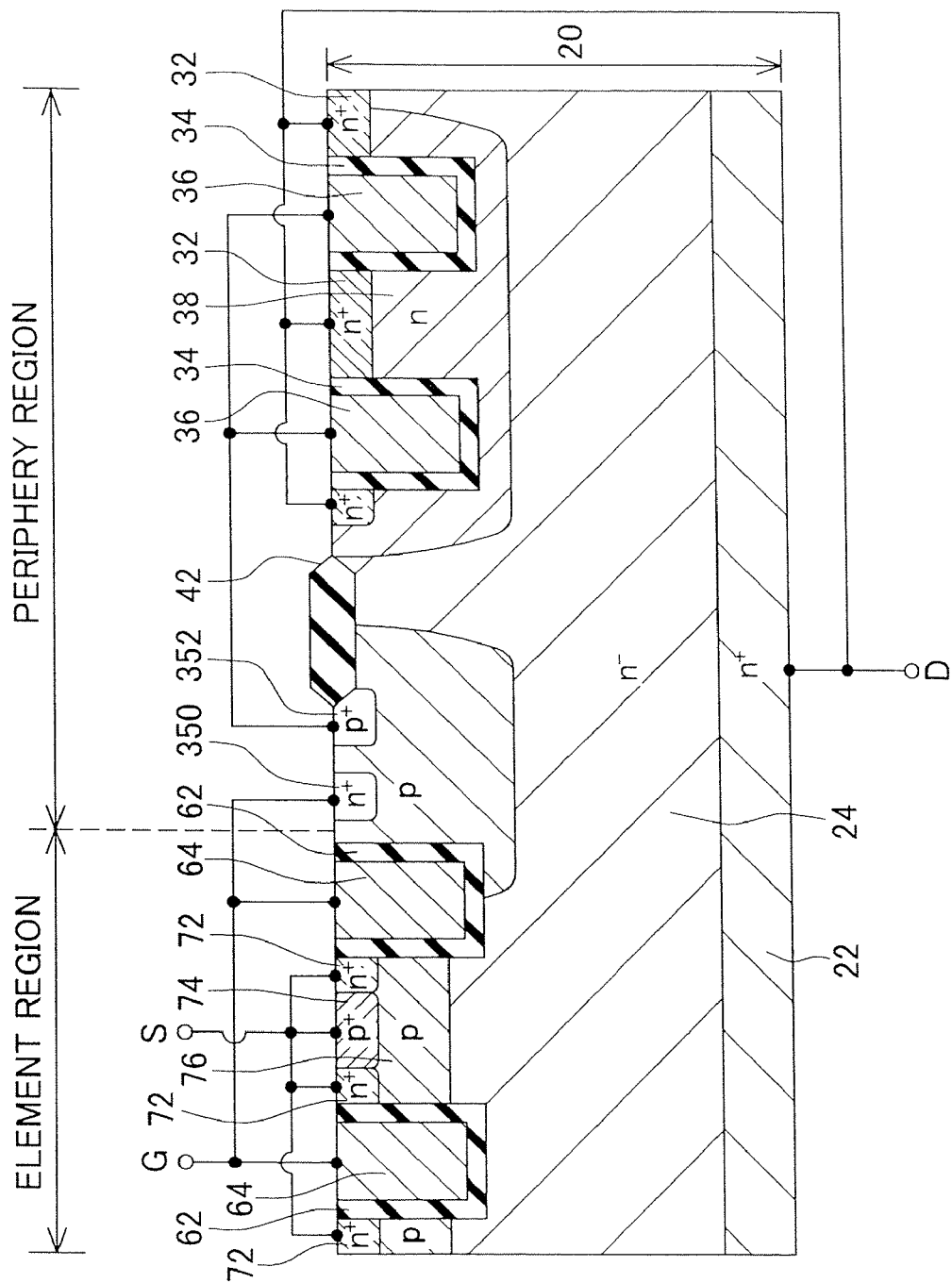
FIG. 40 is a sectional view for showing a major portion of the semiconductor substrate where a transistor, a diode, and a capacitor as to another modification of the switching circuit according to the fifth embodiment have been formed.

FIG. 40 is an example in which the diode 9a is not provided on the front surface of the selective oxide film 42, but is formed to be embedded in the semiconductor substrate 20. In this example, the diode 9a has been arranged by arranging both an $n^+$ type cathode semiconductor region 350 containing an n type dopant and a $p^+$ type anode semiconductor region 352 containing a p type dopant on the front surface of the p type body region 76 which is elongated along the side direction of the MOSFET 5. The $n^+$ type cathode semiconductor region 350 and the $p^+$ type anode semiconductor region 352 may be formed by diffusing the n type dopant and the p type dopant on the front surface of the semiconductor substrate 20 respectively by executing a thermal diffusion method, and the like. As a consequence, the $n^+$ type cathode semiconductor region 350 and the $p^+$ type anode semiconductor region 352 may be made of single crystalline silicon layers.

As shown in FIG. 40, the $n^+$ type cathode semiconductor region 350 of the diode 9a has been electrically connected to the trench gate electrode 64 of the MOSFET 5. The $p^+$ type anode semiconductor region 352 of the diode 9a has been electrically connected to the embedded conductive region 36 of the capacitor 7. In other words, the $p^+$ type anode semiconductor region 352 of the diode 9a has been electrically connected to one end of the capacitor 7. It should also be understood that these electric connections may be constituted by, for example, aluminum wiring lines.

A selective oxide film 42 (one example of insulating film) has been provided on the front surface of the semiconductor substrate 20 along the side direction of the $p^+$ type anode semiconductor region 352. A silicon oxide has been employed in the selective oxide film 42. The selective oxide film 42 can relax an electric field of the front surface of the semiconductor substrate 20. Generally speaking, there are many possibilities that such structures as, for example, a RESURF layer and a guard ring have been provided within the semiconductor substrate 20 located under the selective oxide film 42. In FIG. 40, for the sake of clear illustration, these very fine structures have been omitted.

Figure 41:
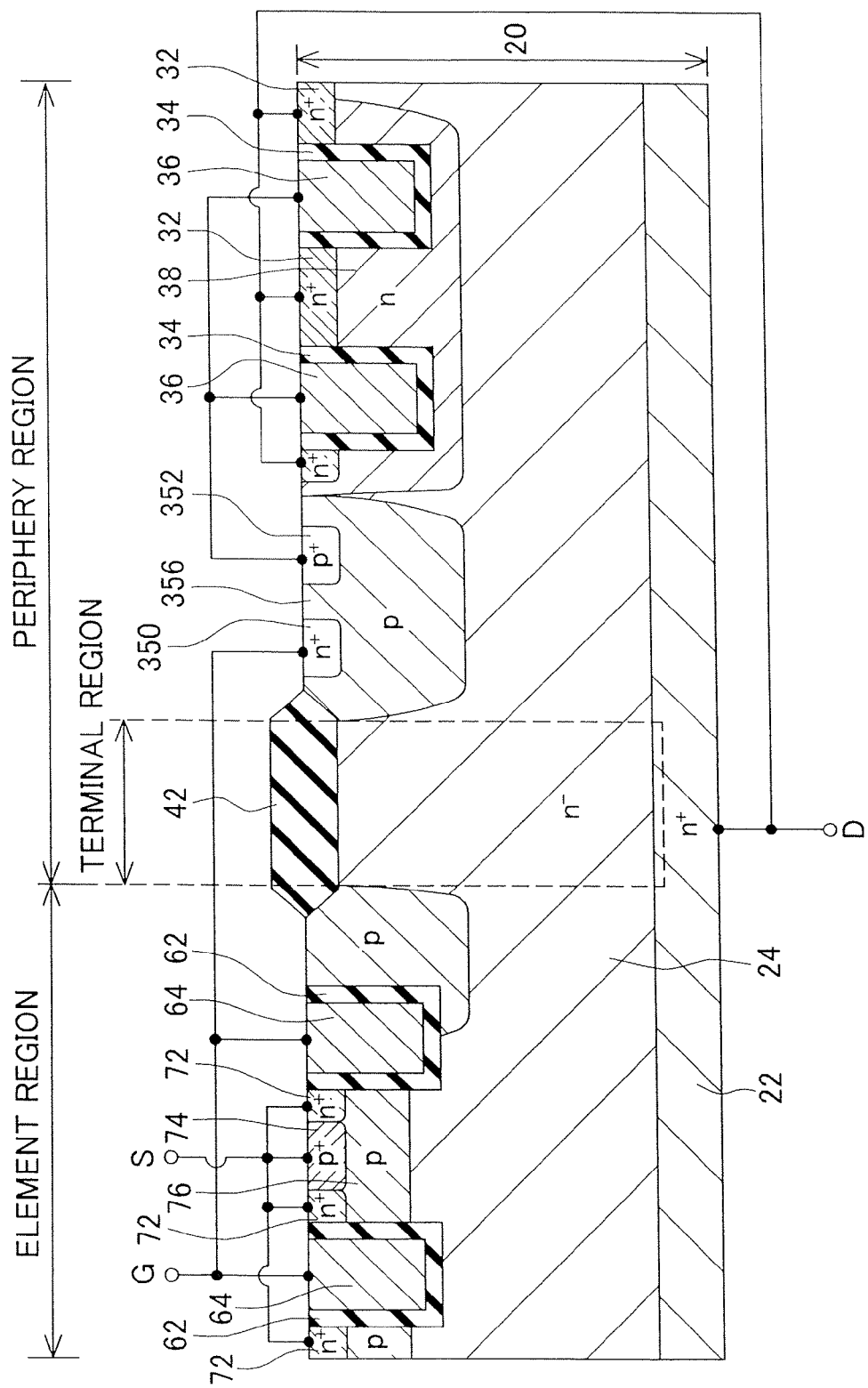
FIG. 41 is a sectional view for showing a major portion of the semiconductor substrate where a transistor, a diode, and a capacitor as to another modification of the switching circuit according to the fifth embodiment have been formed.

FIG. 41 shows such an example that the position for the embedded region of the diode 9a and the position for the element separation region by the selective oxide film 42 shown in FIG. 40 are replaced with each other. In this example, the selective oxide film 42 has been formed on the front surface of the semiconductor substrate 20 along the side direction of the element region of the MOSFET 5. A p type well region 356 formed by diffusing a p type dopant by performing a thermal diffusion method, and the like has been provided in a further side direction of this selective oxide film 42. The diode 9a has been arranged by arranging both an $n^+$ type cathode semiconductor region 350 containing an n type dopant and a $p^+$ type anode semiconductor region 352 containing a p type dopant on the front surface of this p type well region 356. The $n^+$ type cathode semiconductor region 350 and the $p^+$ type anode semiconductor region 352 may be formed by diffusing the n type dopant and the p type dopant on the front surface of the semiconductor substrate 20 respectively by executing a thermal diffusion method, and the like.

Also, similar to FIG. 40, the $n^+$ type cathode semiconductor region 350 of the diode 9a has been electrically connected to the trench gate electrode 64 of the MOSFET 5. The $p^+$ type anode semiconductor region 352 of the diode 9a has been electrically connected to the embedded conductive region 36 of the capacitor 7. In other words, the $p^+$ type anode semiconductor region 352 of the diode 9a has been electrically connected to one end of the capacitor 7.

Figure 42A:
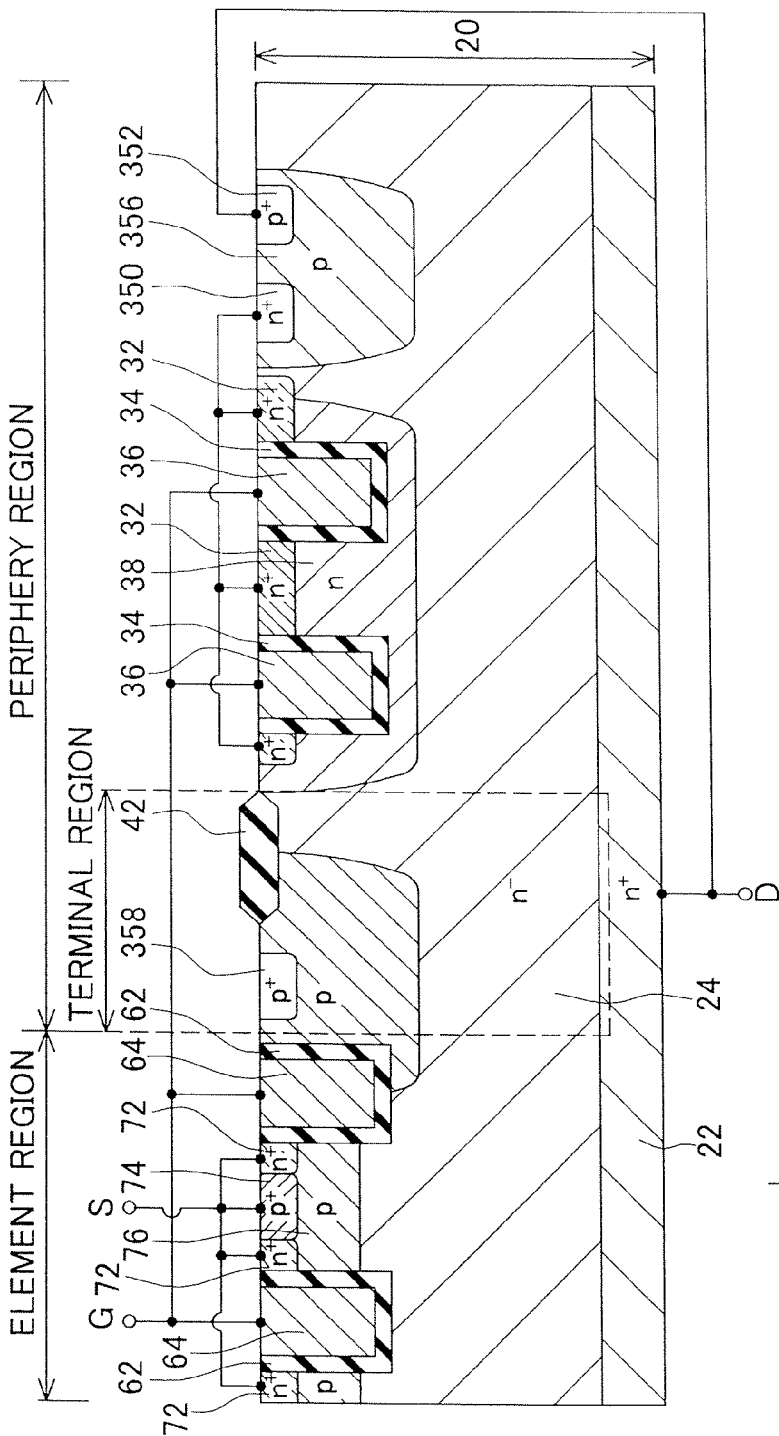
FIG. 42A is a sectional view for showing a major portion of a semiconductor substrate where a transistor, a diode, and a capacitor as to one modification of the switching circuit according to the fifth embodiment have been formed.
Figure 42B:
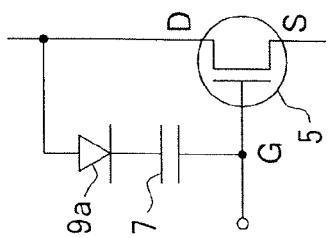
FIG. 42B is a circuit diagram for indicating an equivalent circuit thereof.

FIG. 42A to FIG. 42B indicate such a structural example that the position of the diode 9a and the position of the capacitor 7 shown in FIG. 40 are replaced with each other. In this example, the selective oxide film 42 has been provided on the surface of the semiconductor substrate 20 along the side direction of the element region of the MOSFET 5. Alternatively, a potential control layer 358 containing a p type dopant may be provided on the front surface of the body region 76 along the side direction of the element region of the MOSFET 5.

A capacitor 7 made of the embedded conductive region 36, the diffusion semiconductor region 38, and the coating insulation region 34 has been formed on the front surface of the semiconductor substrate 20 along the side direction of the selective oxide film 42. The capacitor 7 may be manufactured in a similar manner to other examples subsequent to FIG. 36.

Also, a p type well region 356 formed by diffusing a p type dopant by performing a thermal diffusion method, and the like has been provided on the front surface of the semiconductor substrate 20 along a further side of the capacitor 7. A diode 9a has been arranged by arranging both an $n^+$ type cathode semiconductor region 350 containing an n type dopant and a $p^+$ type cathode semiconductor region 352 containing a p type dopant on the front surface of this p type well region 356. The $n^+$ type cathode semiconductor region 350 and the $p^+$ type anode semiconductor region 352 may be formed by diffusing the n type dopant and the p type dopant on the front surface of the semiconductor substrate 20 respectively by executing a thermal diffusion method, and the like.

In the structure of FIG. 42A, the trench gate electrode 64 of the MOSFET 5 has been electrically connected to the embedded conductive region 36 of the capacitor 7. The cathode semiconductor region 350 of the diode 9a has been electrically connected to the surface diffusion semiconductor region 32 of the capacitor 7. The anode semiconductor region 352 of the diode 9a has been electrically connected to the drain D. In other words, a structural mode shown in FIG. 42B is such an arrangement that the capacitor 9a and the capacitor 7 are replaced with each other in the equivalent circuit of FIG. 36B. That is to say, as indicated in FIG. 42B, this structural mode may be expressed by such an equivalent circuit that the anode of the diode 9a is connected to the drain D of the MOSFET 5, and the gate of the MOSFET 5 is connected via the capacitor 7 to the cathode of the diode 9a.

Figure 43:
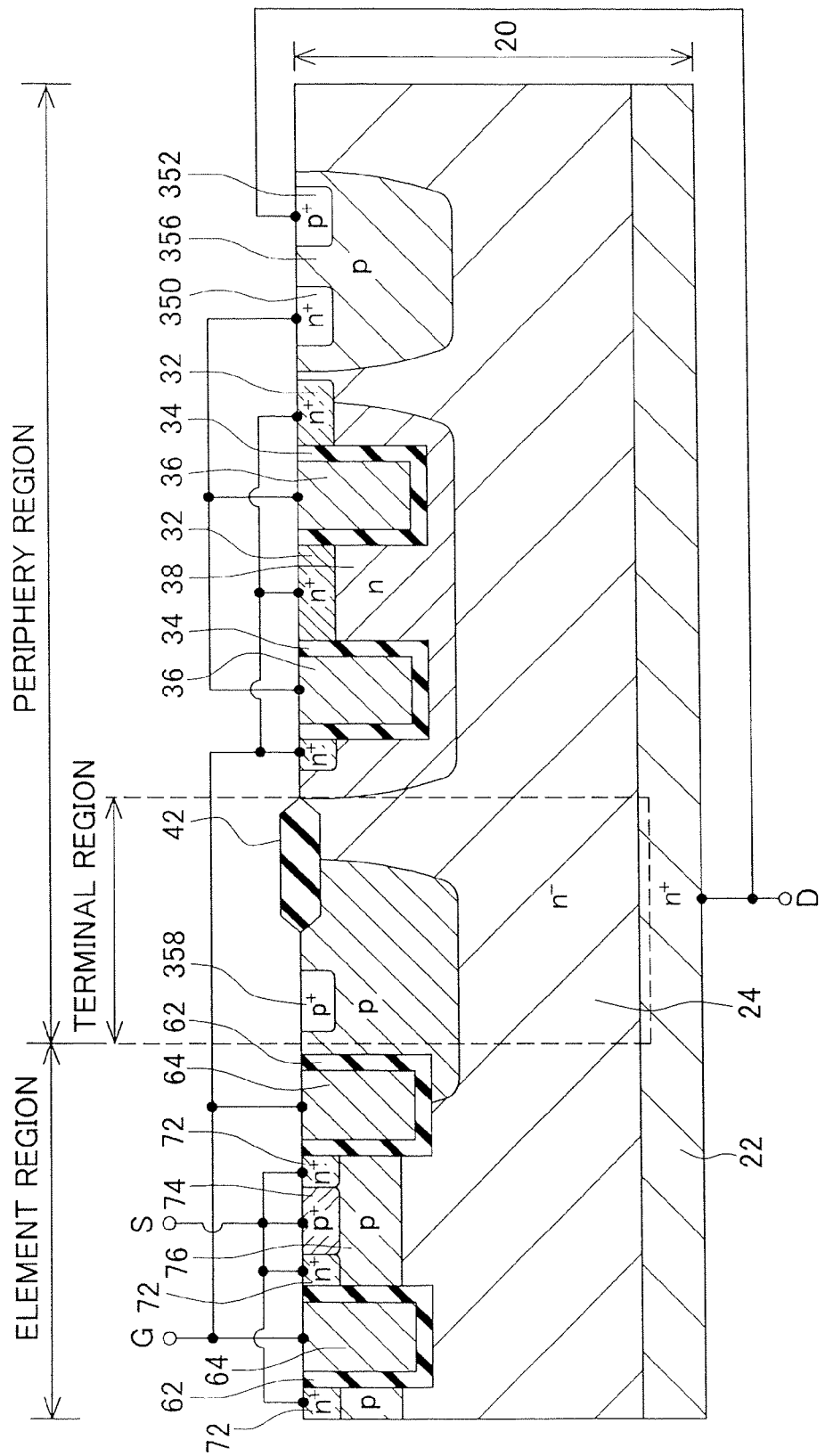
FIG. 43 is a sectional view for showing a major portion of the semiconductor substrate where a transistor, a diode, and a capacitor as to another modification of the switching circuit according to the fifth embodiment have been formed.

FIG. 43 represents a structural mode in which the connection between the trench gate electrode 64 of the MOSFET 5 and the embedded conductive region 36 of the capacitor 7, and the connection between the cathode semiconductor region 350 of the diode 9a and the surface diffusion semiconductor region 32 of the capacitor 7 are replaced with each other, which are employed in FIG. 42. That is to say, the trench gate electrode 64 of the MOSFET 5 has been electrically connected to the surface diffusion semiconductor region 32 of the capacitor 7. The cathode semiconductor region 350 of the diode 9a has been electrically connected to the embedded conductive region 36 of the capacitor 7. The anode semiconductor region 352 of the diode 9a has been electrically connected to the drain D. Also, the structural mode shown in FIG. 43 is similarly expressed by the equivalent circuit indicated in FIG. 42B.

It should be understood that also other arrangements may be alternatively realized by replacing the connections among the embedded conductive region 36 and the surface diffusion semiconductor region 32 of the capacitor 7, and other structural portions. The connections may be alternatively changed due to conditions as to wiring patterns formed on the surface of the semiconductor substrate 20.

Figure 44:
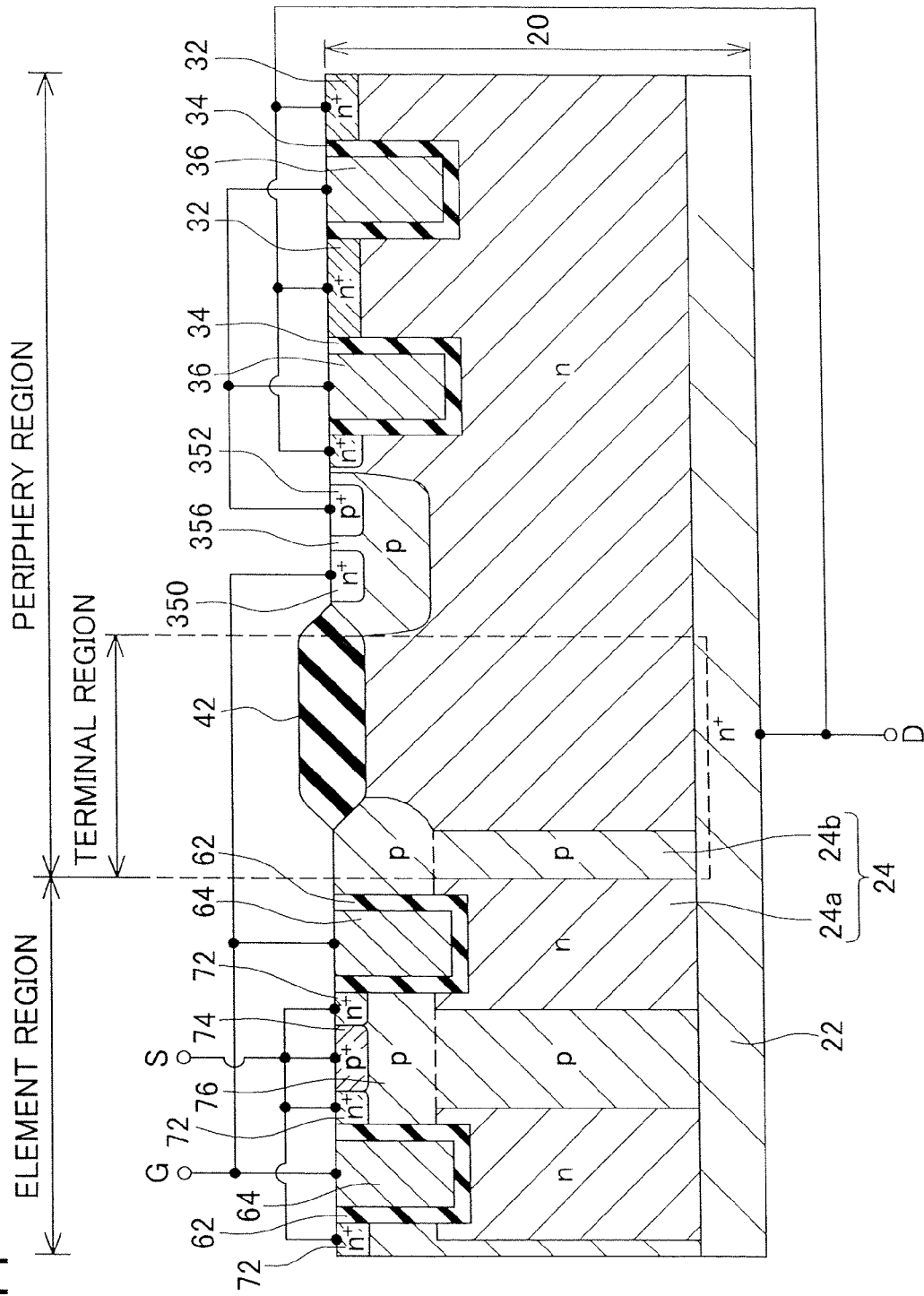
FIG. 44 is a sectional view for showing a major portion of the semiconductor substrate where a transistor, a diode, and a capacitor as to another modification of the switching circuit according to the fifth embodiment have been formed.
Figure 45:
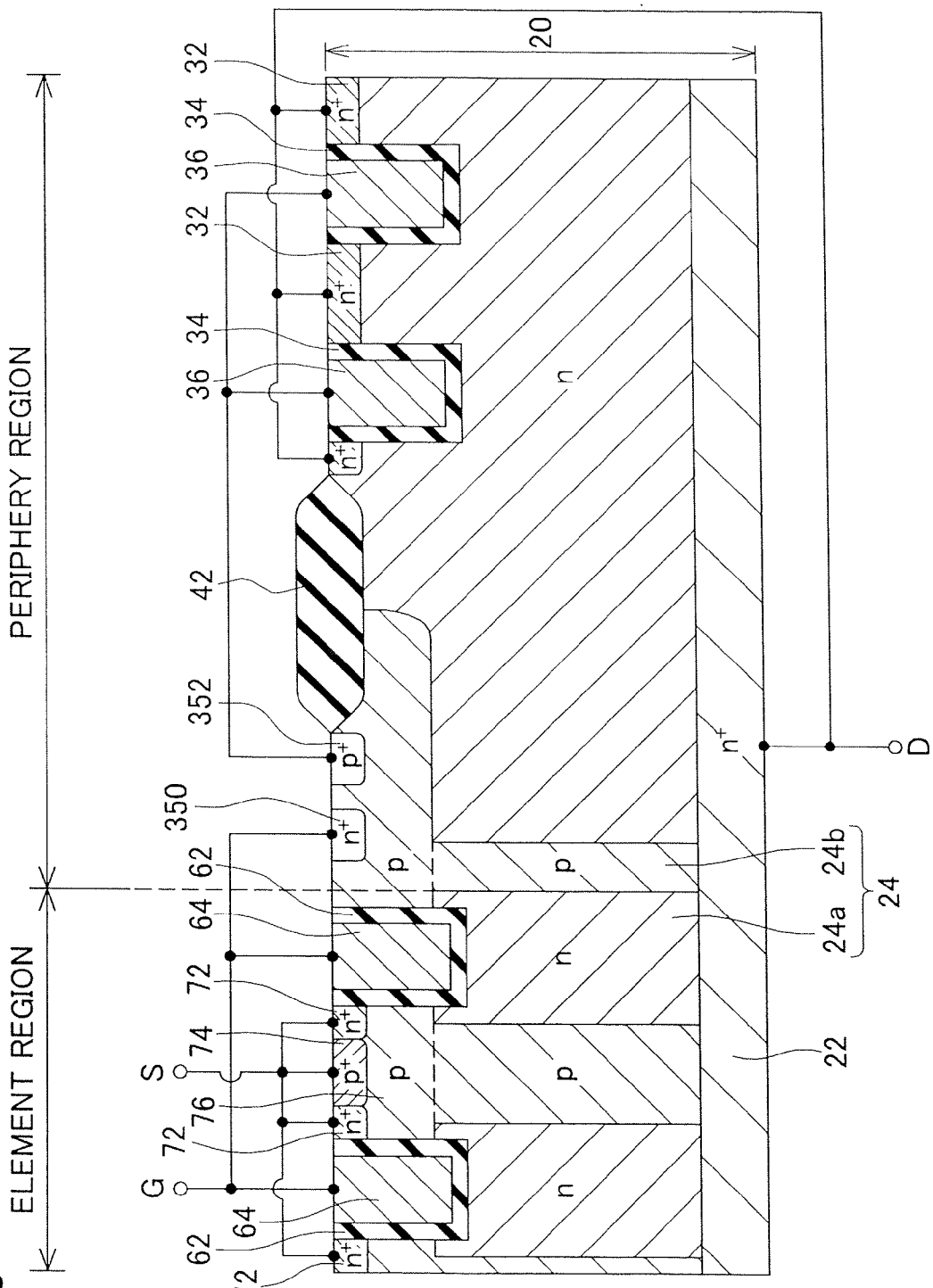
FIG. 45 is a sectional view for showing a major portion of the semiconductor substrate where a transistor, a diode, and a capacitor as to another modification of the switching circuit according to the fifth embodiment have been formed.

FIG. 44 indicates an example in which a super junction structure has been applied to the drift region 24 of the element region in FIG. 41. Also, FIG. 45 indicates an example in which a super junction structure has been applied to the drift region 24 of the element region in FIG. 40. As shown in FIG. 39, the drift region 24 of the super junction structure has been formed by a repetition structure made of an n type column 24a containing an n type dopant, and a p type column 24b containing a p type dopant. The drift region 24 having the super junction structure may be formed in a similar manner to that of FIG. 39. Since the drift region 24 is formed as the super junction structure, the impurity concentration of the n type column 24a and the p type column 24b can be increased, so that the super junction structure is useful as such a technique capable of overcoming the trade-off relationship existed between the ON-resistance (otherwise, ON voltage) of the MOSFET 5 and the withstanding voltage.

As shown in FIG. 40 to FIG. 45, even when such a structure that the diode 9a is embedded in the semiconductor substrate 20 is employed, the diode 9a may be formed in the same semiconductor substrate 20 as the capacitor 7, or the MOSFET 5. As a result, the diode 9a and the capacitor 7 need not be separately prepared. As a consequence, the semiconductor chip for the switching circuit 300 may be constructed without increasing the total number of structural components. Moreover, if the diode 9a, the capacitor 7, and the MOSFET 5 are manufactured in the same semiconductor substrate 20, then the switching circuit 300 may be constructed by employing a smaller number of these structural components, and thus, may be made compact.

When the diode 9a is formed on the selective oxide film 42, an area efficiency used on the surface of the semiconductor substrate 20 may be increased, whereas when the diode 9a is embedded, the diode 9a can be formed by single crystalline silicon, so that the rectification characteristic may become superior.

Although the transistor has been described as the MOSFET in the above-explained concrete example, even if the above-described MOSFET is replaced by a bipolar transistor, or an IGBT, then similar operations and effects may be achieved. In this alternative case, when the transistor is replaced by the bipolar transistor, the transistor is arranged in such a manner that the gate G is replaced by a base "B", the drain D is replaced by a collector "C", and the source S is replaced by an emitter "E."

Sixth Embodiment

Preferred features of a driving circuit according to a sixth embodiment of the present disclosure will now be described. The driving circuit of this sixth embodiment drives a field-effect type transistor. A variable resistor has been formed in the same semiconductor substrate as that of a transistor. The variable resistor is a pinch resistor. The pinch resistor has a structure in which a p type semiconductor region is sandwiched by an n type semiconductor region. When a DC voltage which is applied to the transistor is applied to the n type semiconductor region, the p type semiconductor region is essentially completely depleted. The variable resistor is an MOS (Metal Oxide Semiconductor) type resistor. The MOS type resistor has a stacked structure constructed of a conductor region, an insulator region, and a p type semiconductor region. When the DC voltage which is applied to the transistor is applied to the n type semiconductor region, the p type semiconductor region is essentially completely depleted.

Figure 46:
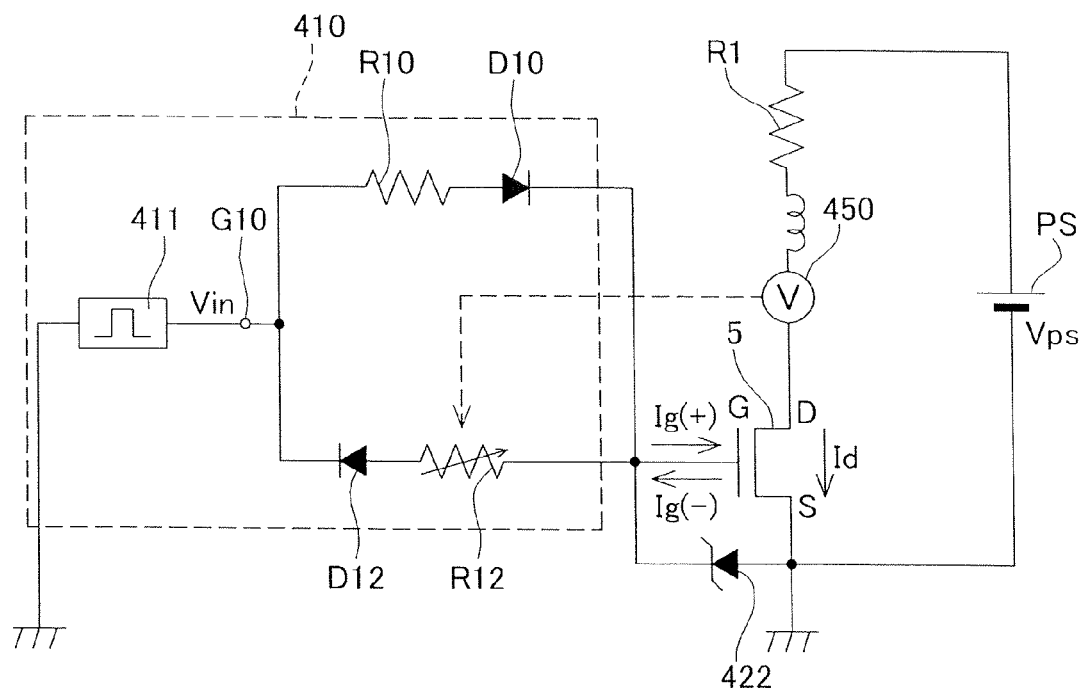
FIG. 46 is a circuit diagram for showing a basic arrangement of a driving circuit according to a sixth embodiment of the present invention.
Figure 47A:
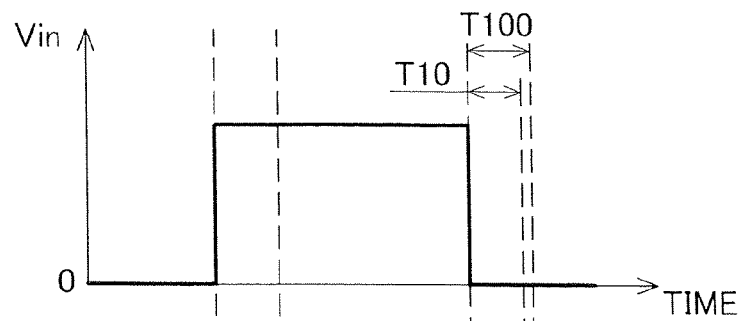
FIG. 47A to FIG. 47E are graphs for indicating operation waveform diagrams of the driving circuit of the sixth embodiment.
Figure 47B:
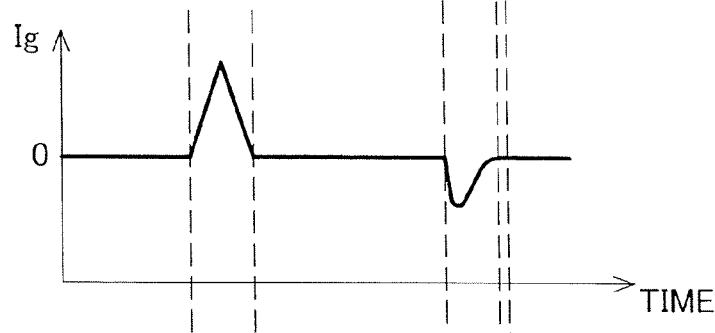
Figure 47C:
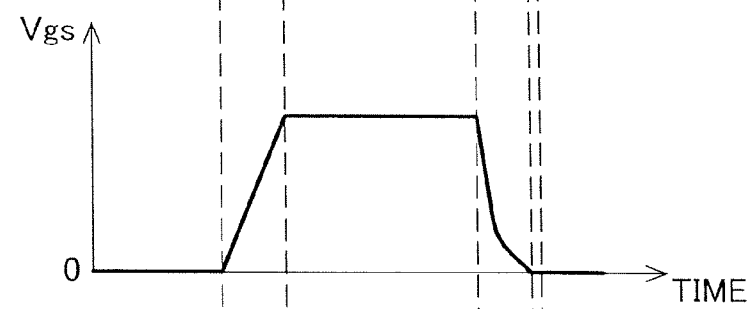
Figure 47D:
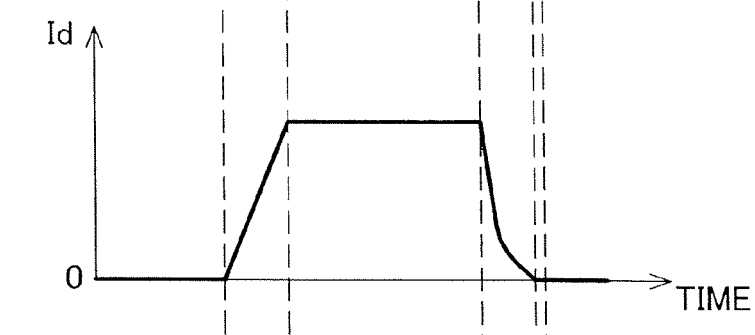
Figure 47E:

FIG. 46 shows a circuit diagram of a driving circuit 410 for driving a field-effect type transistor (n type MOSFET) 5. The transistor 5 has been connected between a load R1 and the ground. A stray inductance of a wiring line has been connected between the transistor 5 and the load R1. The driving circuit 410 applies a driving voltage "Vin" having a rectangular waveform to a gate electrode G of the transistor 5, and switches turning-ON/OFF operations of the transistor 5 based upon this driving voltage "Vin." The driving circuit 410 switches the turning-ON/OFF operations of the transistor 5 so as to switch such conditions that a DC voltage Vps of a voltage supply source PS is applied, and is not applied to the load R1. A protection-purpose zener diode 422 has been connected between a source electrode "S" and the gate electrode "G" of the transistor 5 in order to avoid that a voltage higher than, or equal to a predetermined voltage is not applied to the gate electrode G.

The driving circuit 410 has been equipped with a driving voltage generating circuit 411, a fixed resistor R10, a first diode D10, a second diode D12, and a variable resistor R12. The second diode D12 may be alternatively deleted, if necessary. The fixed resistor R10, the first diode D10, the variable resistor R12, and the protection-purpose zener diode 422 have been formed on the same semiconductor substrate as that of the transistor 5. A concrete semiconductor mode will be described in the below-mentioned embodiment.

A series circuit constructed of the fixed resistor R10 and the first diode D10 has been connected between the gate electrode G and a gate terminal G10. Another series circuit constructed of the variable resistor R12 and the second diode D12 has been connected between the gate electrode G and the gate terminal G10. The driving voltage generating circuit 411 has been electrically connected to the gate terminal G10. In other words, both the series circuit constructed of the fixed resistor R10 and the first diode D10 and another series circuit constructed of the variable resistor R12 and the second diode D12 have constituted a parallel circuit between the driving voltage generating circuit 411 and the transistor 5. An anode of the first diode D10 has been connected via the fixed resistor R10 to the gate terminal G10, and a cathode of the first diode D10 has been connected to the gate electrode G of the transistor 5. An anode of the second diode D12 has been connected via the variable resistor R12 to the gate electrode G of the transistor 5, and a cathode of the second diode D12 has been connected to the gate terminal G10.

A resistance value of the variable resistor R12 is adjusted based upon a source-to-drain voltage "Vds" of the transistor 5 which is measured by a drain voltage detecting means 450. The resistance value of the variable resistor R12 is adjusted to become small when the source-to-drain voltage Vds of the transistor 5 is low. The resistance value of the variable resistor R12 is adjusted to become large when the source-to-drain voltage Vds of the transistor 5 is high.

FIG. 47A to FIG. 47E show operating waveform diagrams of the transistor 5.

Firstly, a description is made of a transition time period during which the transistor 5 is turned ON. Since the second diode D12 has been provided along a reverse direction, the driving voltage Vin is supplied to a wiring line on the side of the fixed resistor R10. When a signal level of the driving voltage Vin is changed from a low level to a high level, the driving voltage Vin is converted into a positive gate current "Ig(+)" at the fixed resistor R10, and then, the positive gate current "Ig(+)" is supplied to the gate electrode G of the transistor 5. When the positive gate current "Ig(+)" is supplied to the gate electrode G of the transistor 5, electron charges are stored in the gate electrode G. When the electron charges are stored in the gate electrode G, a gate-to-source voltage "Vgs" of the transistor 5 is increased. When the gate-to-source voltage "Vgs" of the transistor 5 is increased, a drain current "Id" starts to flow from the drain electrode D of the transistor 5 toward the source electrode S, so that the drain-to-source voltage Vds is decreased. The state of the transistor 5 is transferred from the OFF state to the ON state by performing these operation steps.

Next, a description is made of a transition time period "T10" during which the transistor 5 is turned ON. When the signal level of the driving voltage Vin becomes a low level from the high level, the electron charges which have been stored in the gate electrode G are discharged. Since the first diode D10 has been provided along the reverse direction, a negative gate current "Ig(−)" produced in connection with the discharge of the electron charges flows toward the wiring line on the side of the variable resistor R12. In the beginning stage of the transition time period T10 during which the transistor 5 is turned OFF, since the drain-to-source voltage Vds is low, the resistance value of the variable resistor R12 has been adjusted to the small value. As a result, the negative gate current Ig(−) can be steeply varied in the beginning stage of the transition time period T10 during which the transistor 5 is turned OFF. Accordingly, the electron charges which have been stored in the gate electrode G of the transistor 5 can be quickly discharged in the beginning stage of the transition time period T10 as to the turn-OFF of the transistor 5. As a result, such a time required for turning OFF the transistor 5 in the beginning stage of the transition time period T10 can be shortened. In some cases, as shown in FIG. 47A to FIG. 47E, the time for the transition time period T10 required for turning OFF the transistor 5 can be shortened, as compared with the transition time period T100 of the conventional driving circuit.

When the operation is advanced to the final stage of the transition time period T10 for turning OFF the transistor 5, the drain-to-source voltage Vds is increased. The resistance value of the variable resistor R12 is largely adjusted in connection with the increase of the source-to-drain voltage Vds. As a result, the negative gate current Ig(−) can be gently varied in the final stage of the transition time period T10 during which the transistor 5 is turned OFF. Accordingly, the electron charges which have been stored in the gate electrode G of the transistor 5 can be slowly discharged in the final stage of the transition time period T10 as to the turn-OFF of the transistor 5. As a result, the drain current Id of the transistor 5 gently flows, so that increasing of the surge voltage can be suppressed.

In accordance with the driving circuit 410, in the transition time period T10 during which the transistor 5 is turned OFF, a trade-off relationship existed between the surge voltage and the turn-OFF loss can be overcome.

Next, arrangements of concrete circuits will now be shown. It should be noted that the same reference numerals will be employed for denoting the same, or similar structural elements, and therefore, explanations thereof are omitted.

Figure 48:
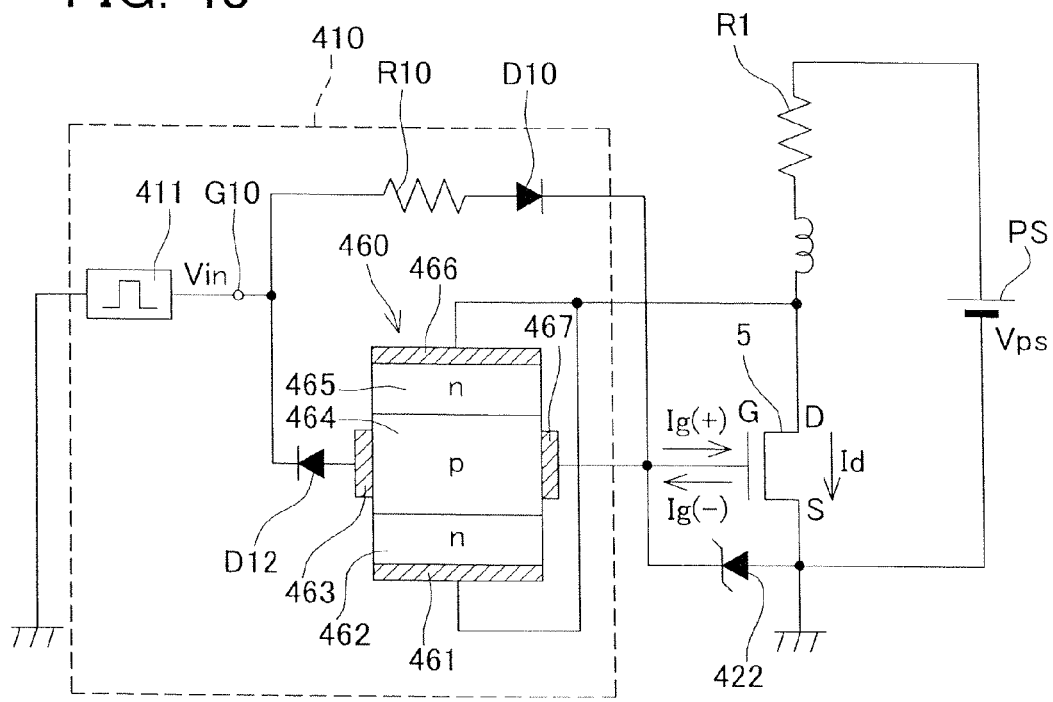
FIG. 48 is a circuit diagram for showing a concrete arrangement of the driving circuit according to the sixth embodiment of the present invention.

FIG. 48 indicates such an example that both the variable resistor R12 and the drain voltage detecting means 450 shown in FIG. 46 are realized by the pinch resistor 460. The pinch resistor 460 has been equipped with an n type first semiconductor region 462 of poly crystalline silicon containing an n type impurity, a p type semiconductor region 464 of poly crystalline silicon containing a p type impurity, and an n type second semiconductor region 465 of poly crystalline silicon containing an n type impurity. The n type first semiconductor region 462 and the n type second semiconductor region 465 have been isolated from each other by the p type semiconductor region 464. The n type first semiconductor region 462 has been electrically connected via a first electrode 461 to the drain electrode D of the transistor 5. The n type second semiconductor region 465 has been electrically connected via a second electrode 466 to the drain electrode D of the e transistor 5. One end of the p type semiconductor region 464 has been electrically connected via a third electrode 467 to the gate electrode G of the transistor 5. The other end of the p type semiconductor region 464 has been electrically connected via a fourth electrode 463 to the gate terminal G10.

Figure 49A:
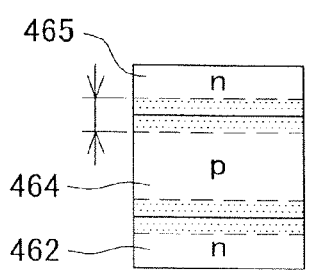
FIG. 49A to FIG. 49C are sectional views for indicating conditions of depletion layers which are expanded/compressed in a pinch resistor of the sixth embodiment.
Figure 49B:
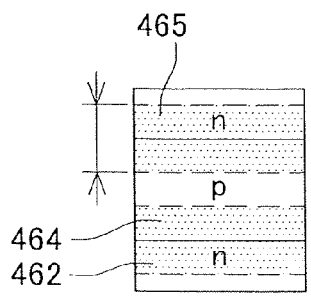
Figure 49C:
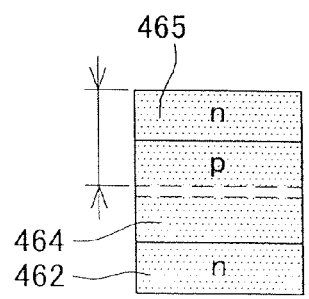

Referring now to FIG. 49A to FIG. 49C, such a technical idea that a depletion layer formed in the pinch resistor 460 is expanded/compressed will be described. It should also be understood that as to impurity concentration and a width of each of the semiconductor regions which constitute the pinch resistor 460, these semiconductor regions have been formed in such a manner that the respective semiconductor regions are substantially completely depleted when a voltage corresponding to the DC voltage Vps of the voltage supply source PS is applied between the first electrode 461 and the second electrode 466. Otherwise, as will be described later, when a zener diode Dz has been provided between the pinch resistor 460 and the drain electrode D of the transistor 5, as to impurity concentration and a width of each of the semiconductor regions which constitute the pinch resistor 460, these semiconductor regions have been formed in such a manner that the respective semiconductor regions are substantially completely depleted so as to obtain a desirable resistance value when a voltage obtained by subtracting a breakdown voltage of the zener diode Dz from the DC voltage Vps of the voltage supply source PS is applied between the first electrode 461 and the second electrode 466.

In the case that the source-to-drain voltage Vds is 0 V, a depletion layer has been formed based upon a diffusion potential difference between the p type semiconductor region 464 and the n type semiconductor regions 462 and 466. A width of this depletion layer is kept wide, and a width of a current path of the p type semiconductor region 464 is kept wide.

In the case that the source-to-drain voltage Vds is 20 V, a pn junction between the p type semiconductor region 464 and the n type semiconductor regions 462 and 466 is reverse-biased, so that the depletion layer is expanded in the p type semiconductor region 464. As a result, the width of the current path of the p type semiconductor region 464 becomes narrows.

In the case that the source-to-drain voltage Vds is 75 V, the pn junction between the p type semiconductor region 464 and the n type semiconductor regions 462 and 466 is further reverse-biased, so that the depletion layer is further expanded in the p type semiconductor region 464. As a result, the width of the current path of the p type semiconductor region 464 becomes narrows, and the p type semiconductor region 464 becomes a high resistance.

Figure 50:
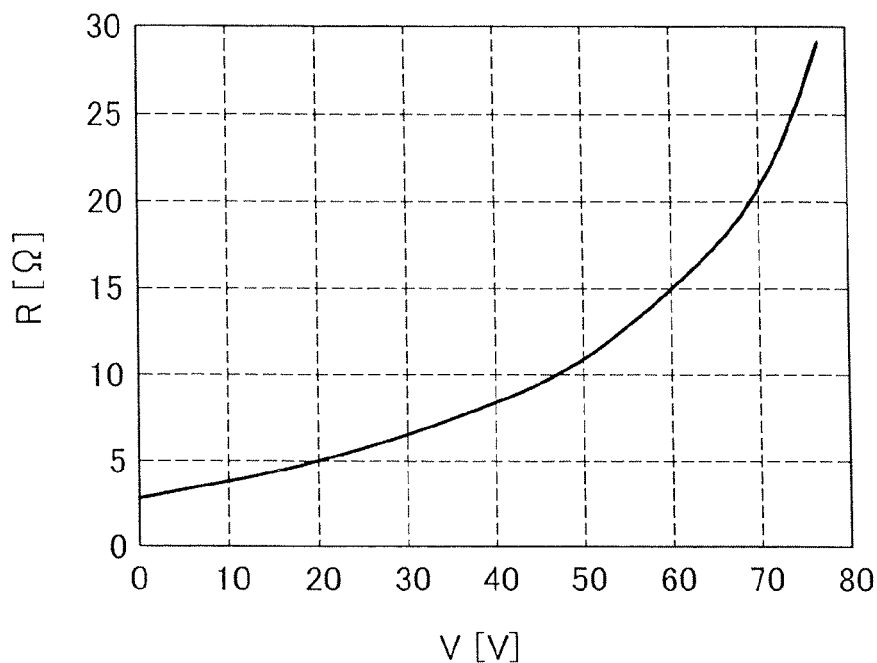
FIG. 50 is a graph for showing a relationship between a resistance value of the pinch resistor and a voltage applied to the pinch resistor of the sixth embodiment.

FIG. 50 represents a relationship between a voltage V and a resistance value R of the pinch resistor 460, while the voltage V is applied between the first electrode 461 and the second electrode 466 of the pinch resistor 460. As shown in FIG. 50, the resistance value R of the pinch resistor 460 is continuously increased in response to the voltage V to be applied.

As a result, the resistance value R of the pinch resistor 460 is adjusted to be small when the source-to-drain voltage Vds is low, whereas the resistance value R of the pinch resistor 460 is adjusted to be large when the source-to-drain voltage Vds is high.

Figure 51:
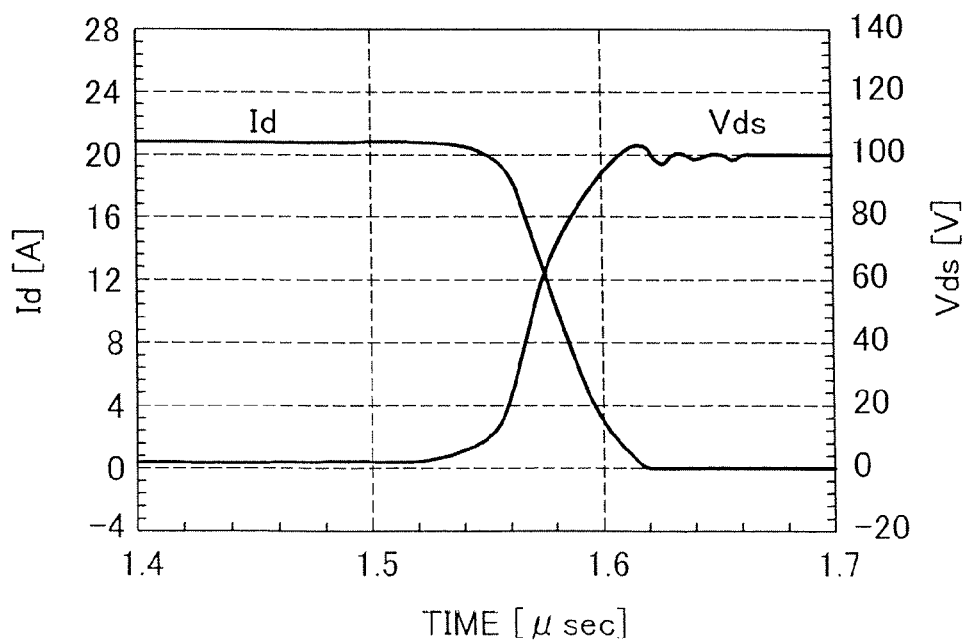
FIG. 51 is a graph for showing a simulation result of the driving circuit of the sixth embodiment.
Figure 52:
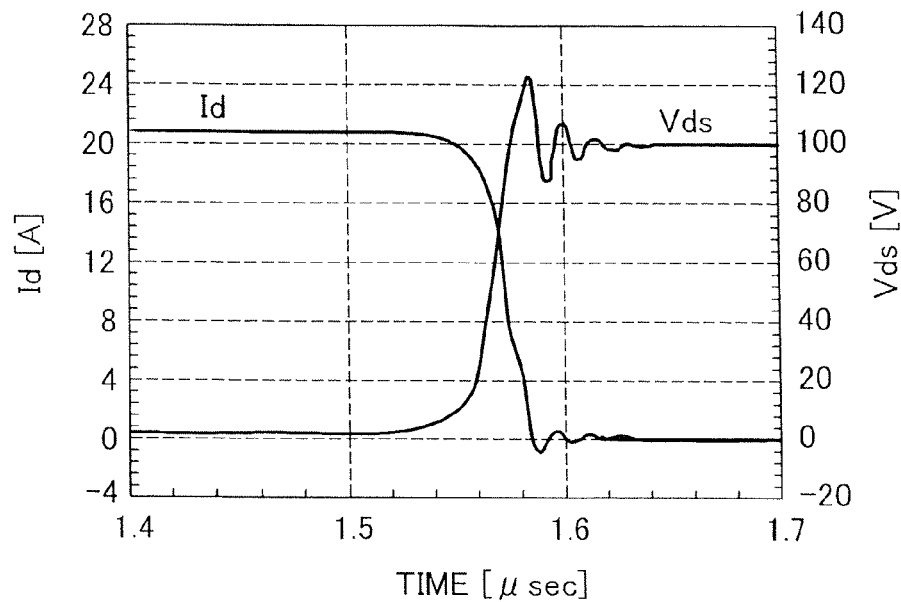
FIG. 52 is a graph for showing a simulation result of a driving circuit of a comparison example.

FIG. 51 shows a simulation result of the driving circuit 410 with employment of the pinch resistor 460 having the above-described characteristic. It should also be noted that the resistance value of the fixed resistor R10 was set to 3Ω. Also, in FIG. 52, a simulation result obtained in such a case that the pinch resistor 460 is not provided is represented as a comparison example.

As shown in FIG. 51, in the driving circuit 410 with employment of the pinch resistor 460, it could be confirmed that the surge voltage is conspicuously suppressed.

Figure 53:
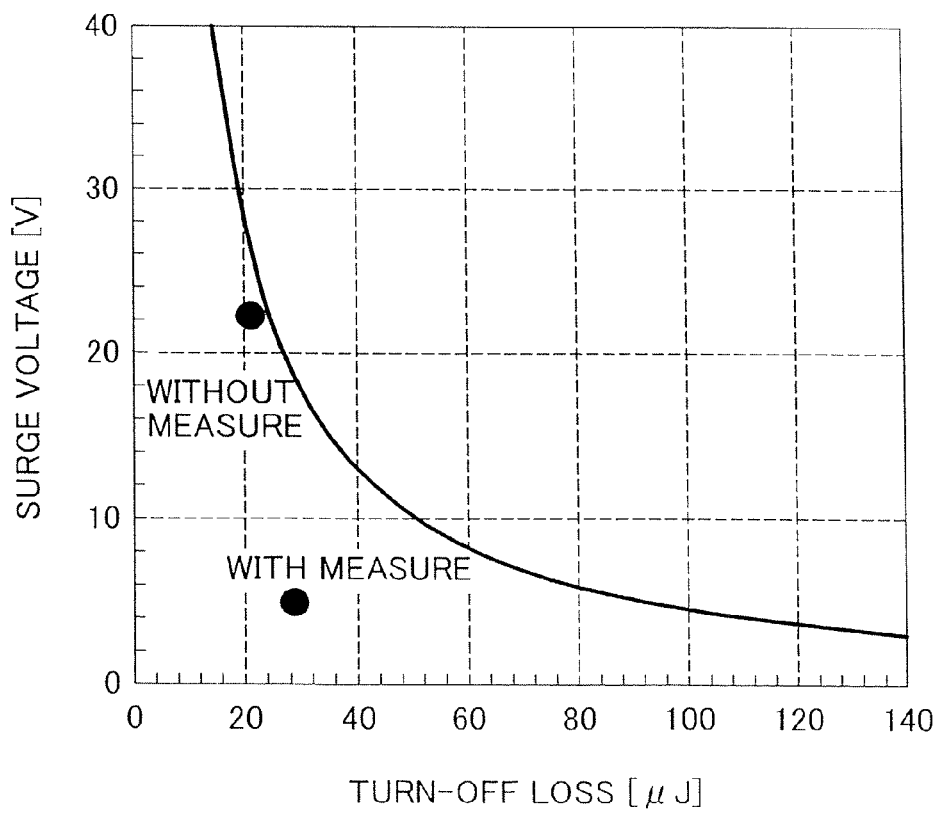
FIG. 53 is a graph for indicating a relationship between a surge voltage and a turn-OFF loss of a driving circuit according to a sixth embodiment of the present invention.

FIG. 53 shows a trade-off curve existed between a surge voltage and a turn-OFF loss.

An indication "WITHOUT MEASURE" indicates a result of such a driving circuit that the pinch resistor 460 is not provided. Another indication "WITH MEASURE" shows a result of the driving circuit 410 where the pinch resistor 460 is employed.

In the case of "WITH MEASURE", the surge voltage is conspicuously reduced without substantially increasing the turn-OFF loss, as compared with in the case of "WITHOUT MEASURE." The result of "WITH MEASURE" can be evaluated as follows: That is, a large improvement can be largely achieved based upon the trade-off curve.

Figure 54:
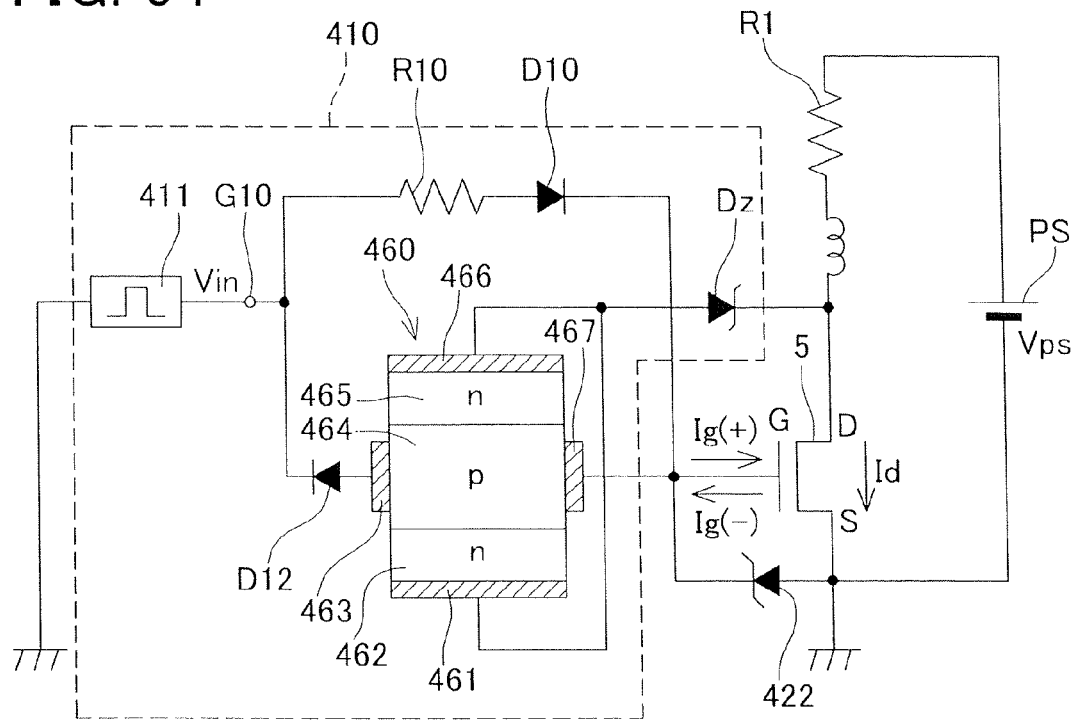
FIG. 54 is a circuit diagram for indicating a concrete arrangement of one modification as to the driving circuit of the sixth embodiment.

FIG. 54 shows an example as to a modification of the driving circuit 410. This driving circuit 410 is featured by that a zener diode Dz has been provided between the electrodes 461 and 466 of the pinch resistor 460, and the drain electrode D of the transistor 5. An anode of the zener diode Dz has been connected to the side of the electrodes 461 and 466 of the pinch resistor 460, and a cathode thereof has been connected to the side of the drain electrode D of the transistor 5.

If the zener diode Dz is provided, then the source-to-drain voltage Vds of the transistor 5 is not applied to the n type semiconductor regions 462 and 465 of the pinch resistor 460 until the zener diode Dz breaks down. Accordingly, until the zener diode Dz breaks down, the current path of the pinch resistor 460 is kept wide. As a result, in the beginning stage of the transition time period during which the transistor 5 is turned OFF, the resistance value of the pinch resistor 460 can be kept small, and the negative gate current Ig(−) can be steeply varied. As a consequence, the drain current Id of the transistor 5 can be steeply varied, so that a time required for turning OFF the transistor 5 can be furthermore shortened.

Alternatively, a plurality of zener diodes Dz may be employed in a series connection manner. The voltage applied between the n type semiconductor regions 462 and 465 can be adjusted to a low voltage by connecting the plurality of zener diodes Dz in the series connection manner. If the voltage applied between the n type semiconductor regions 462 and 465 is adjusted to the low voltage, then the impurity concentration of the p type semiconductor region 464 can be made low, and/or the width of the p type semiconductor region 464 interposed between the n type semiconductor regions 462 and 465 can be made narrow. Accordingly, the variation of the width of the depletion layer when the voltage is applied between the n type semiconductor regions 462 and 465 is increased, and thus, the resistance value of the p type semiconductor region 464 is largely changed. As a result, the below-mentioned superior effect can be achieved. That is, the resistance value of the pinch resistor 460 is kept small in the beginning stage of the transition period during which the transistor 5 is turned OFF, whereas the resistance value of the pinch resistor 460 is kept large in the final stage of the transition period during which the transistor 5 is turned OFF.

Seventh Embodiment

Figure 55:
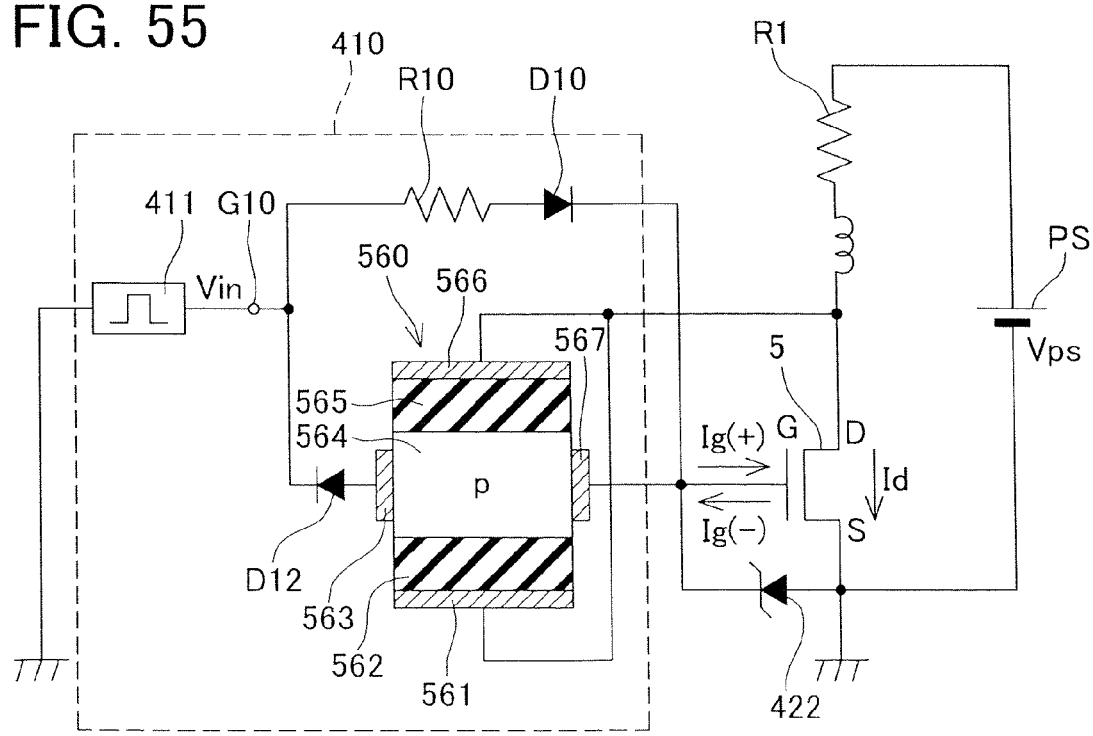
FIG. 55 is a circuit diagram for indicating a concrete arrangement of another modification as to a driving circuit of a seventh embodiment of the present invention.

FIG. 55 shows a circuit diagram of a driving circuit 410 according to a seventh embodiment of the present disclosure. This driving circuit 410 is featured by employing an MOS type resistor 560 having an MOS structure.

The MOS type resistor 560 has been equipped with a first insulator region 562 made of a silicon oxide, a p type semiconductor region 564 made of single crystalline silicon containing a p type impurity, and a second insulator region 565 made of a silicon oxide. The first insulator region 562 and the second insulator region 565 have been isolated from each other by the p type semiconductor region 564. The first electrode 561 has been located opposite to the p type semiconductor region 564 via the first insulator region 562. The second electrode 566 has been located opposite to the p type semiconductor region 564 via the second insulator region 565. Both the first electrode 561 and the second electrode 566 have been electrically connected to the drain electrode D of the transistor 5. One end of the p type semiconductor region 564 has been electrically connected via a third electrode 567 to the gate electrode G of the transistor 5. The other end of the p type semiconductor region 564 has been electrically connected via a fourth electrode 563 to the gate terminal G10.

In the MOS type resistor 560, a width of a depletion layer which is expanded/compressed within the p type semiconductor region 464 can be adjusted due to an electric field effect.

Figure 56:
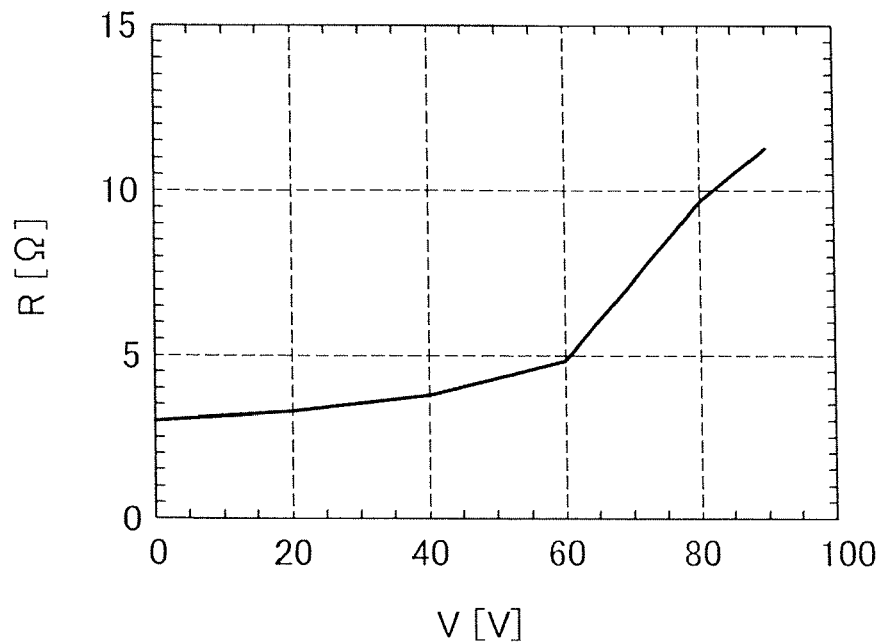
FIG. 56 is a graph for showing a relationship between a resistance value of a pinch resistor and a voltage applied to the pinch resistor as to a modification of the seventh embodiment.

FIG. 56 represents a relationship between a voltage V and a resistance value R of the MOS type resistor 560, while the voltage V is applied between the first electrode 561 and the second electrode 566 of the MOS type resistor 560. As shown in FIG. 56, the resistance value R of the MOS type resistor 560 is substantially continuously increased in response to the voltage V to be applied.

As a result, the resistance value R of the MOS type resistor 560 is adjusted to be small when the source-to-drain voltage Vds is low, whereas the resistance value R of the MOS type resistor 560 is adjusted to be large when the source-to-drain voltage Vds is high.

Figure 57:
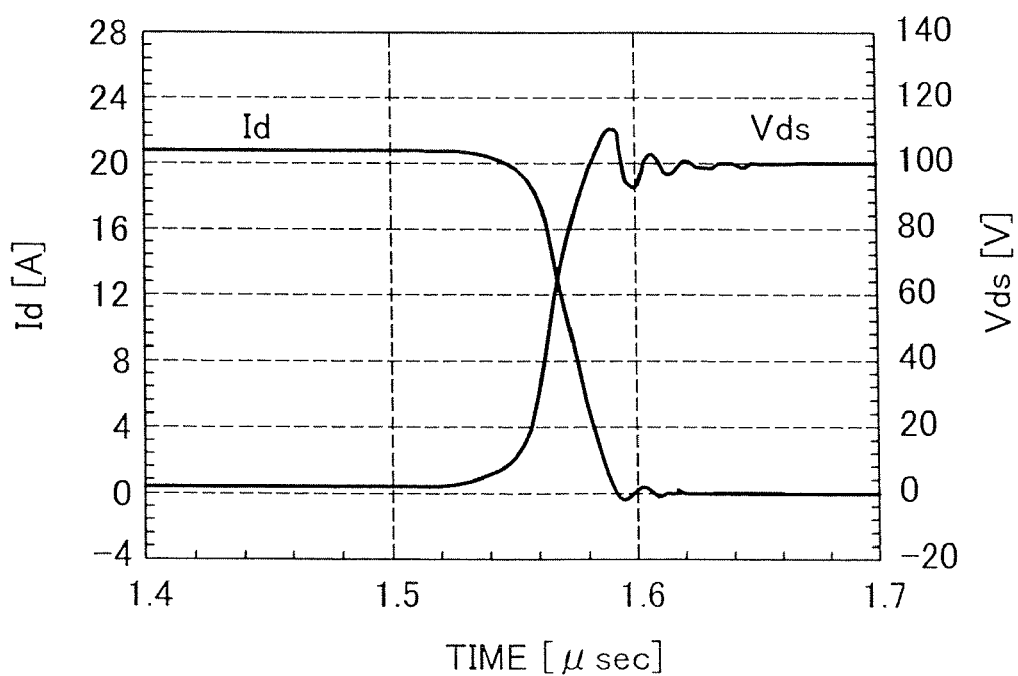
FIG. 57 is a graph for showing a simulation result of a driving circuit of a modification of the seventh embodiment.

FIG. 57 shows a simulation result of the driving circuit 410 with employment of the MOS type resistor 560 having the above-described characteristic. It should also be noted that the resistance value of the fixed resistor R10 was set to 3Ω. Also, in FIG. 52, a simulation result obtained in such a case that the MOS type resistor 560 is not provided is represented as a comparison example.

As shown in FIG. 57, in the driving circuit 410 with employment of the MOS type resistor 560, it could be confirmed that the surge voltage is conspicuously suppressed.

Figure 58:
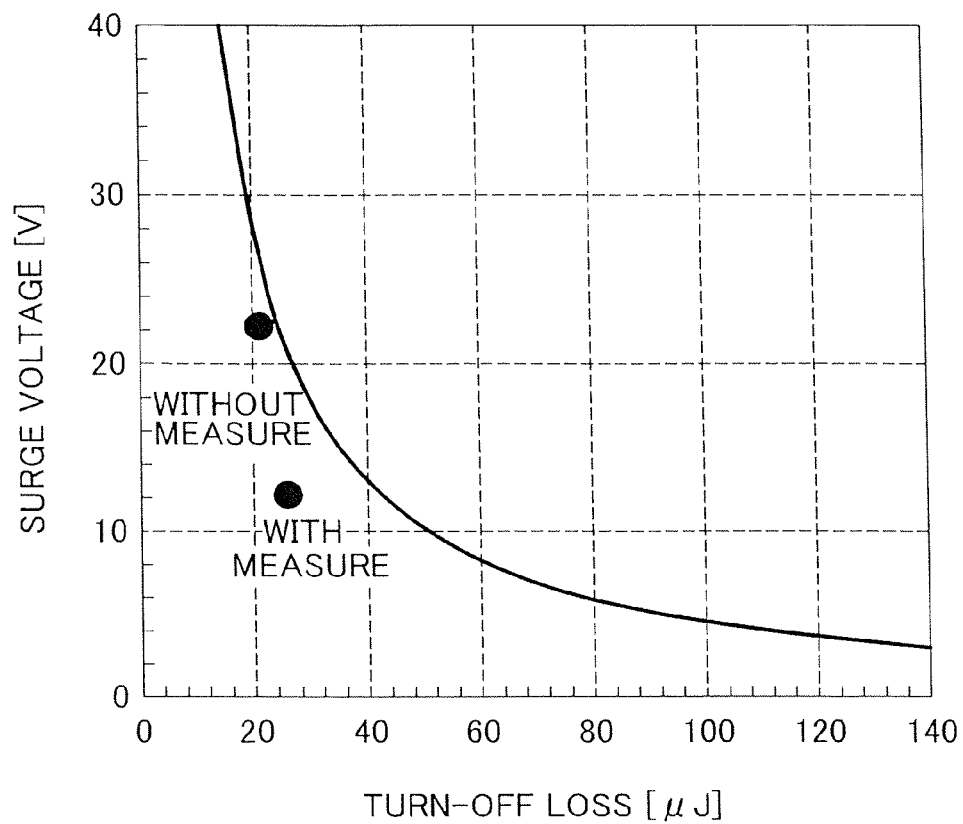
FIG. 58 is a graph for indicating a relationship between a surge voltage and a turn-OFF loss of a driving circuit according to a modification of the seventh embodiment of the present invention.

FIG. 58 shows a trade-off curve existed between a surge voltage and a turn-OFF loss.

An indication "WITHOUT MEASURE" indicates a result of such a driving circuit that the MOS type resistor 560 is not provided. Another indication "WITH MEASURE" shows a result of the driving circuit 410 where the MOS type resistor 560 is employed.

In the case of "WITH MEASURE", the surge voltage is conspicuously reduced without substantially increasing the turn-OFF loss, as compared with in the case of "WITHOUT MEASURE." The result of "WITH MEASURE" can be evaluated as follows: That is, a large improvement in the surge voltage reduction can be largely achieved from the trade-off curve.

Eighth Embodiment

FIG. 59 to FIG. 62 indicate such an example that the following circuit elements of the driving circuit 410 of FIG. 54, namely, the pinch resistor 460, the zener diode Dz, the diode D10, the fixed resistor R10, and the protection-purpose zener diode 422 have been provided in the same semiconductor substrate 20 is that of the transistor 5, according to an eighth embodiment of the present disclosure. Any of these circuit elements have been formed on the semiconductor substrate 20. The transistor 5 and these circuit elements have been formed in an integral form by utilizing the semiconductor substrate 20, and have been arranged by a single chip.

It should be understood that in this eighth embodiment, the second diode D12 within the driving circuit 410 shown in FIG. 54 has been deleted. If the second diode D12 has been deleted, then such an effect can be achieved. That is, the positive gate current Ig(+) is gently varied in the beginning stage of the turn-ON operation, whereas the positive gate current Ig(+) is steeply varied in the final stage of the turn-ON operation.

Figure 59:
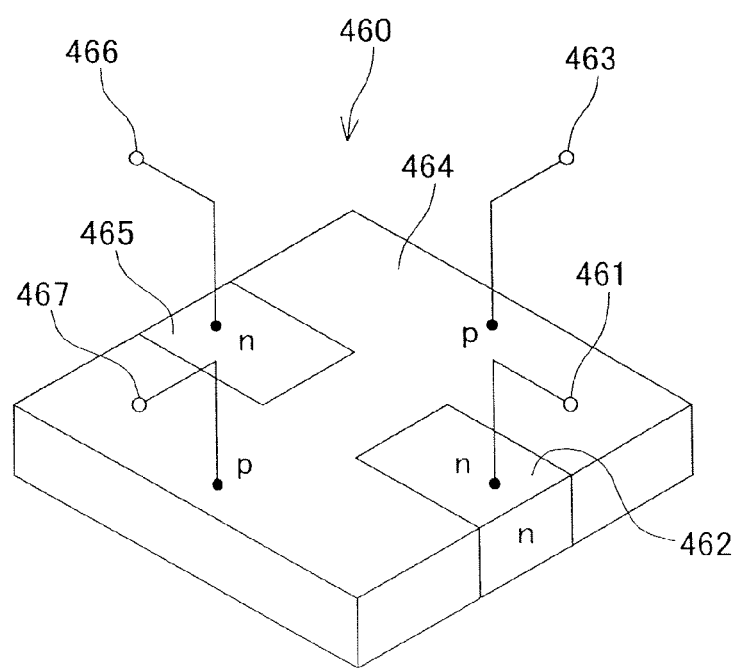
FIG. 59 is a perspective view for indicating a pinch resistor of an eighth embodiment of the present invention.

FIG. 59 is a perspective view for indicating a major portion of the pinch resistor 460 formed on the semiconductor substrate 20. It should also be noted that reference numerals shown in FIG. 59 correspond to reference numerals applied to the respective structural elements of the pinch resistor 460 shown in FIG. 54. As will be described later, the pinch resistor 460 has been provided via an oxide film on the semiconductor substrate 20. As a material of the pinch resistor 460, poly crystalline silicon has been employed. Phosphorus has been conducted to both the n type first semiconductor region 462 and the n type second semiconductor region 465, whereas boron has been conducted to the p type semiconductor region 464.

Figure 60:
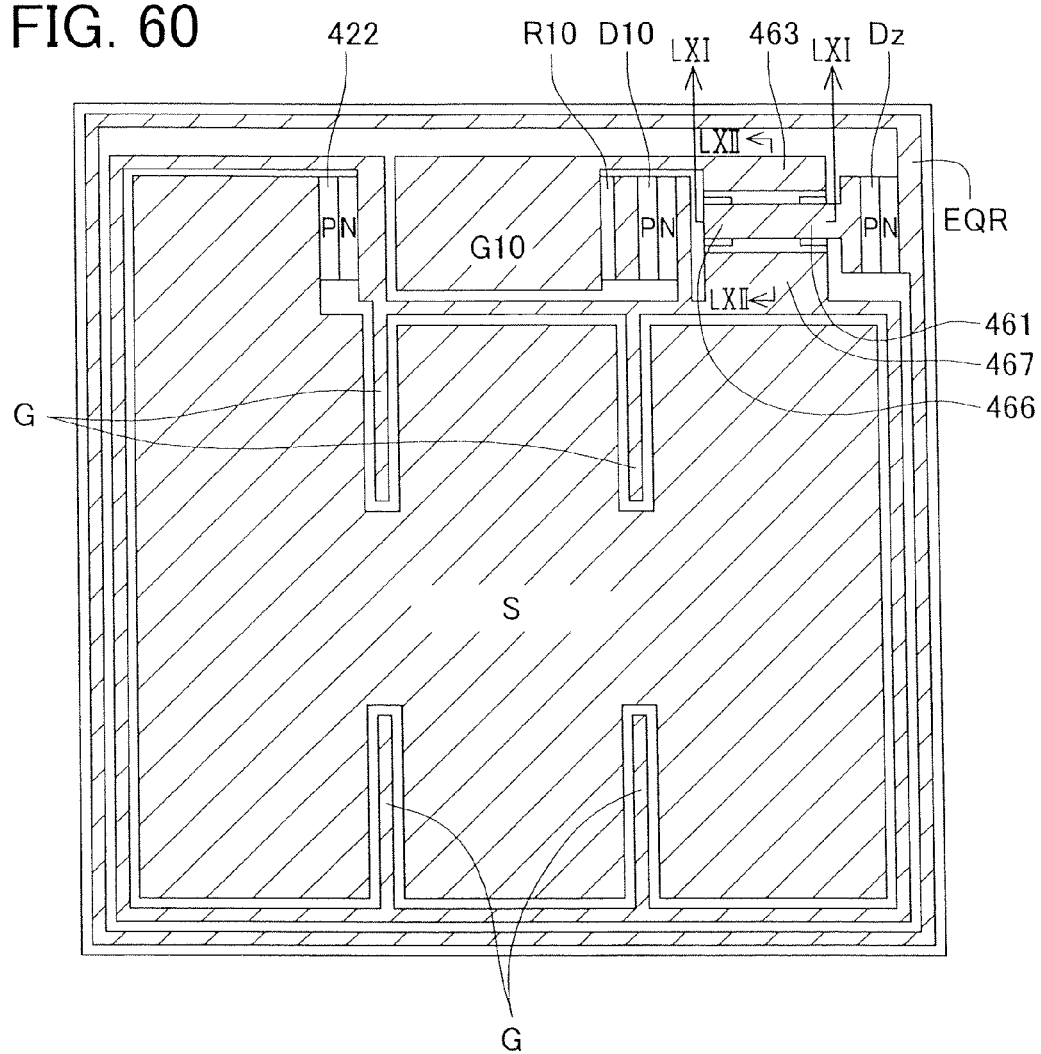
FIG. 60 is a plan view for representing a surface layout of a semiconductor substrate according to the eighth embodiment.

FIG. 60 indicates a surface layout of a semiconductor substrate 20 in which the transistor 5 and the circuit elements such as the pinch resistor 460 have been formed in an integral body. A portion indicated by a broken line implies such a portion that an aluminum wiring line has been formed. Referring now to the circuit diagram shown in FIG. 54, the surface layout of FIG. 60 will be described.

A source electrode S of the transistor 5 has been arranged on a major portion of a front surface of the semiconductor substrate 20. Semiconductor regions which are required for the transistor 5 have been formed in the semiconductor substrate 20 under the source electrode S. A gate electrode G under such a condition that this gate electrode G is electrically insulated from the source electrode S has been elongated from a circumference portion of the source electrode S toward an inside thereof. The source electrode S and the gate electrode G of the transistor 5 have been connected to each other via the protection-purpose zener diode 422 at an upper left corner portion. As the material of the protection-purpose zener diode 422, poly crystalline silicon has been employed. The protection-purpose zener diode 422 has been provided via an oxide film on the semiconductor substrate 20.

Figure 61:
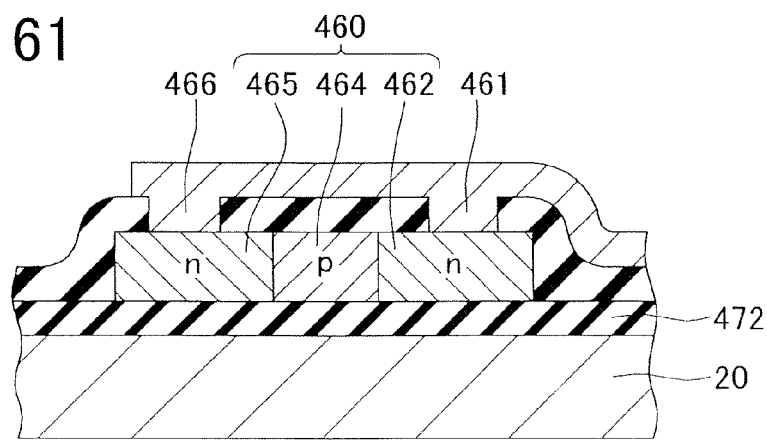
FIG. 61 is a sectional view for showing the semiconductor substrate of the eighth embodiment, taken along a line LXI-LXI of FIG. 60.
Figure 62:
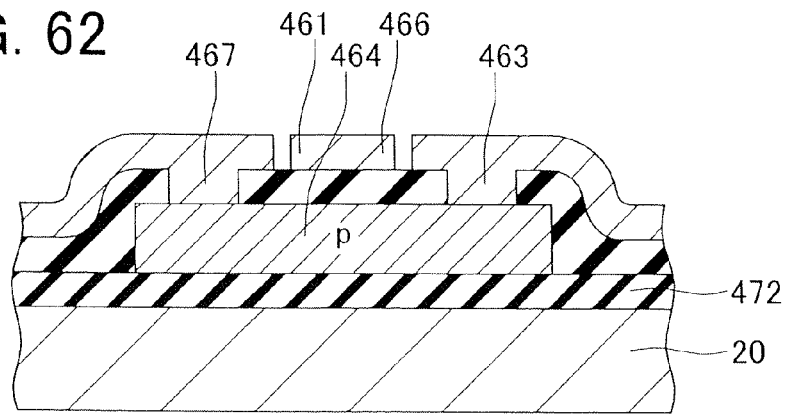
FIG. 62 is a sectional view for showing the semiconductor substrate of the eighth embodiment, taken along a line LXII-LXII of FIG. 60.

The zener diode Dz, the pinch resistor 460, and the diode D10, and also, the fixed resistor R10 have been arranged at an upper right corner portion of the surface layout. FIG. 61 is a longitudinal sectional view corresponding to a line "LXI-LXI" of FIG. 60. FIG. 62 is a longitudinal sectional view corresponding to a line "LXII-LXII" of FIG. 60.

As indicated in FIG. 61, a pinch-off resistor 460 has been provided via an oxide film 472 on the semiconductor substrate 20. While an aluminum wiring line is extended above the pinch-off resistor 460, this aluminum wiring line has been electrically connected to both an n type first semiconductor region 462 and an n type second semiconductor region 465 of the pinch-off resistor 460. This aluminum wiring line has been electrically insulated from the p type semiconductor region 464 of the pinch-off resistor 460. A portion to which the aluminum wiring line and the n type first semiconductor region 462 are connected is referred to as a first electrode 461 which corresponds to the first electrode 461 shown in FIG. 54. A portion to which the aluminum wiring line and the n type second semiconductor region 465 are connected is referred to as a second electrode 466 which corresponds to the second electrode 466 shown in FIG. 54. As shown in FIG. 60, one end of the aluminum line has been electrically connected to the cathode of the zener diode Dz. The anode of the zener diode Dz has been connected to an equi-potential ring electrode (EQR) which is provided around the semiconductor substrate 20 in a circular manner. The equi-potential ring electrode (EQR) has been electrically connected to the drain electrode D of the transistor 5. As a consequence, the anode of the zener diode Dz has been electrically connected via the equi-potential ring electrode (EQR) to the drain electrode D of the transistor 5.

As indicated in FIG. 62, the p type semiconductor region 464 of the pinch-off resistor 460 has been electrically connected to two sets of aluminum wiring lines at both terminals thereof. As represented in FIG. 60, one aluminum wiring line has been extended from the gate terminal G10. This aluminum wiring line has been electrically connected via a third electrode 63 to one end of the p type semiconductor region 464. As represented in FIG. 60, the other aluminum wiring line has been elongated from the gate electrode G of the transistor 5. This aluminum wiring line has been electrically connected via a fourth electrode 67 to the other end of the p type semiconductor region 464. The third electrode 63 and the fourth electrode 67 correspond to the third electrode 63 and the fourth electrode 67 of FIG. 54.

As shown in FIG. 60, a series circuit constructed of the diode D10 and the fixed resistor R10 has been connected between the gate electrode G and the gate terminal G10. As a material for the diode D10 and the fixed resistor R10, poly crystalline silicon has been employed. The resistance value of the fixed resistor R10 is adjusted based upon concentration of a conducted impurity.

Since the above-described arrangement is employed, such circuit elements as the pinch resistor 460, the zener diode Dz, the diode D10, the fixed resistor R10, and the protection-purpose zener diode 422 can be manufactured in one integral body on the same semiconductor substrate as that of the transistor 5. Since such an arrangement is employed, the above-described respective circuit elements need not be separately prepared. As a consequence, the switching circuit-purpose chip disclosed in the specification of the present disclosure can be constructed without increasing a total number of these components. If the transistor and the above-described circuit elements are provided on the same semiconductor substrate, then the switching circuit can be arranged by employing a small number of the components. Thus, the switching circuit can be furthermore made compact, and can be manufactured with superior practical characteristics.

Ninth Embodiment

Figure 63:
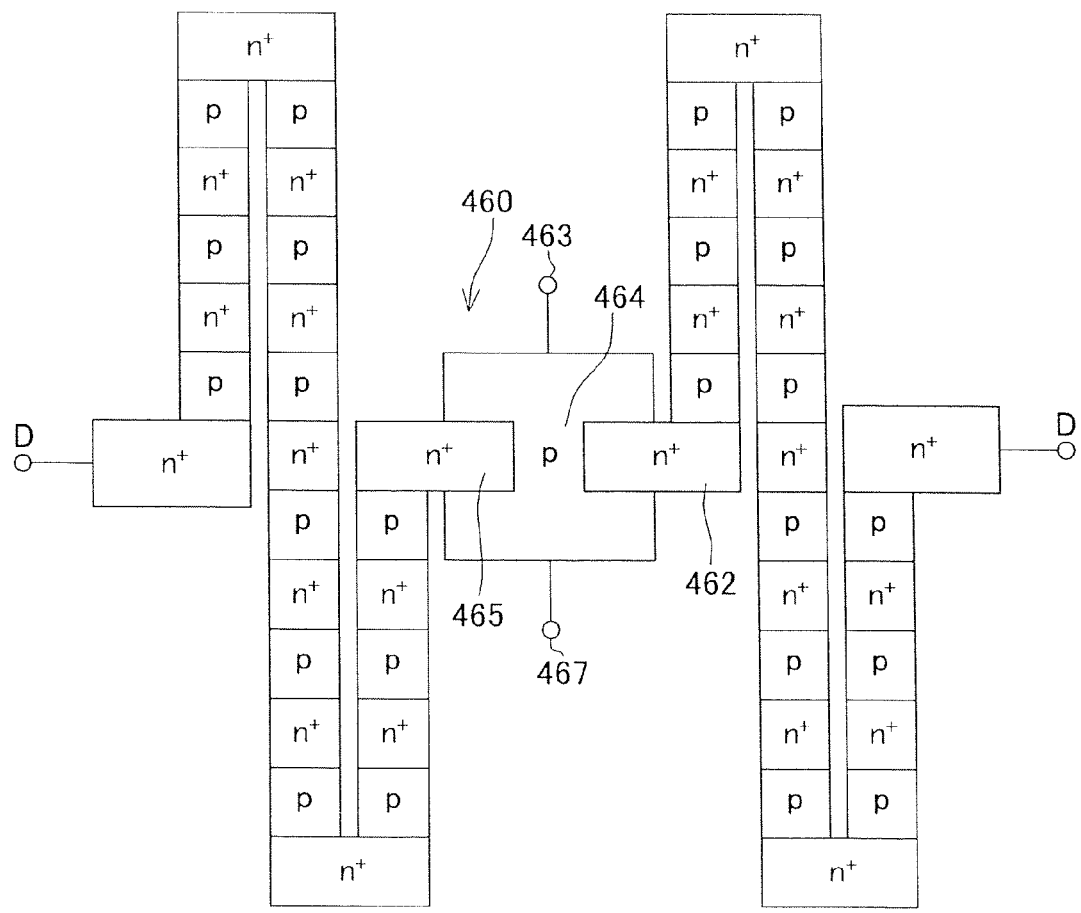
FIG. 63 is a plan view for representing a n example of a zener diode according to a ninth embodiment of the present invention.
Figure 64:
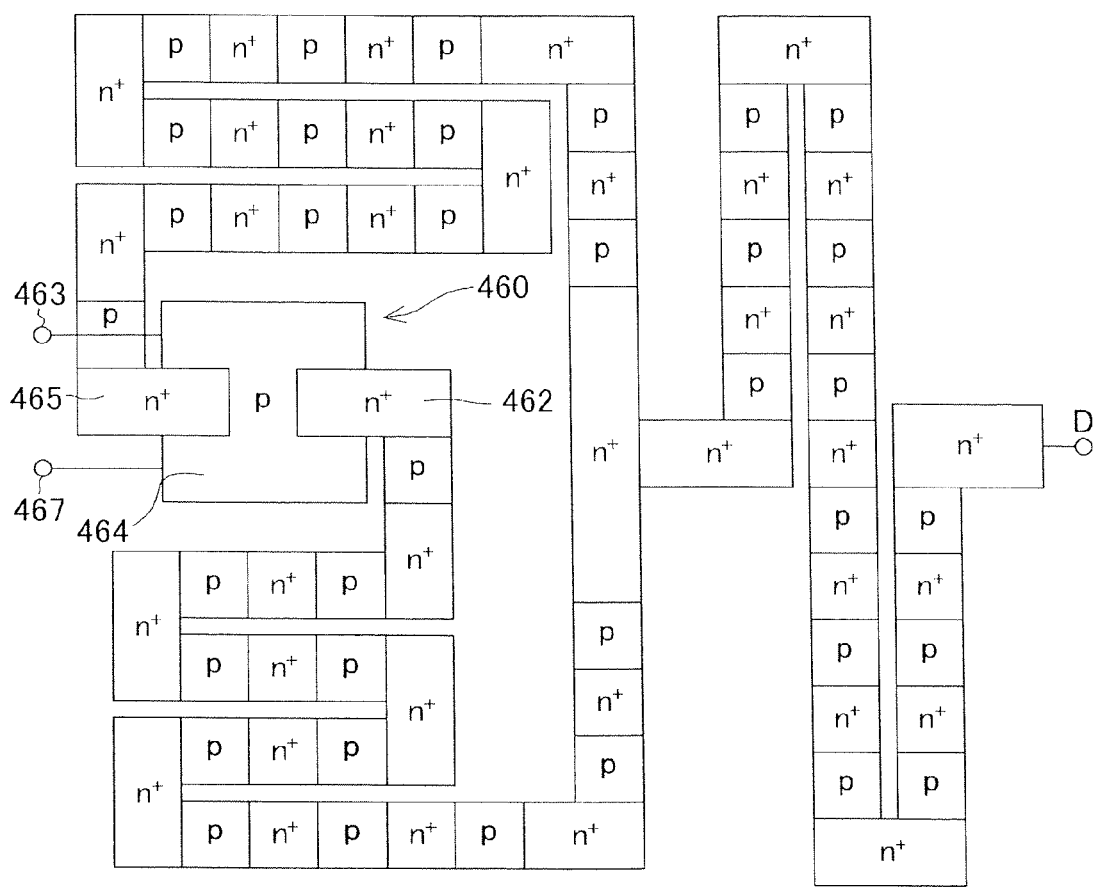
FIG. 64 is a plan view for representing another example of the zener diode according to the ninth embodiment of the present invention.
Figure 65A:
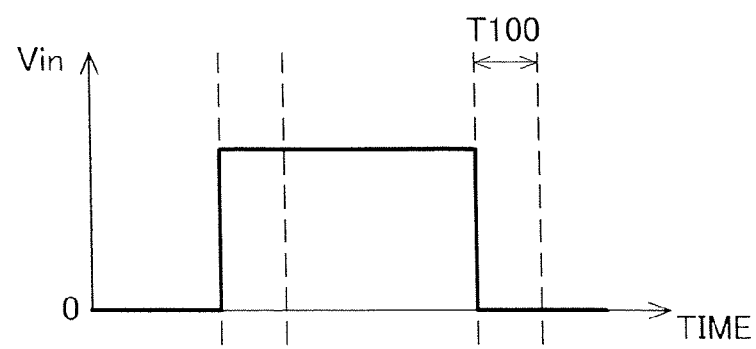
FIG. 65A to FIG. 65E are the graphs for representing operation waveform diagrams of the conventional driving circuit.
Figure 65B:
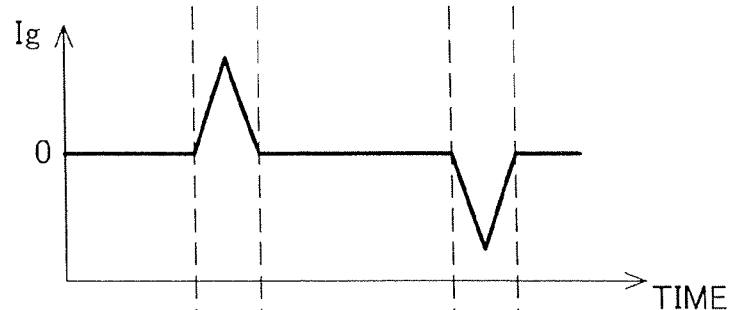
Figure 65C:
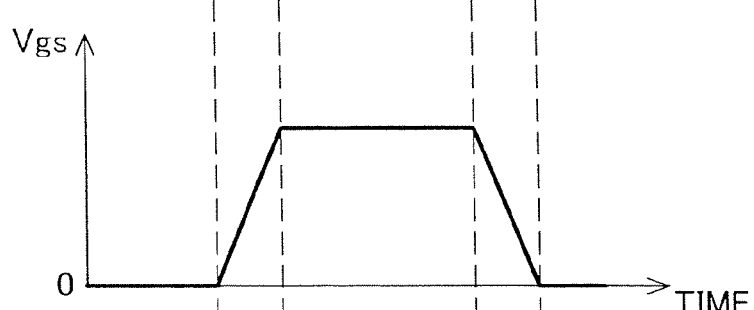
Figure 65D:
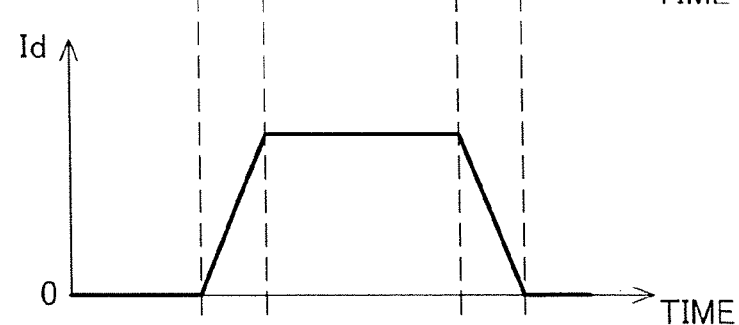
Figure 65E:
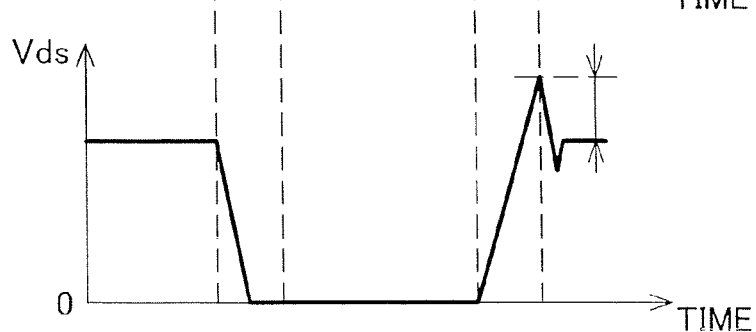

FIG. 63 and FIG. 64 indicate an example of zener diodes Dz which have been connected between the drain electrode D of the transistor 5 and the pinch resistor 460, according to a ninth embodiment of the present disclosure.

In the example shown in FIG. 63, a plurality of zener diodes Dz have been connected between an n type first semiconductor region 462 of the pinch resistor 460 and the drain electrode D of the transistor 5. Furthermore, a plurality of zener diodes Dz have also been connected between an n type second semiconductor region 465 of the pinch resistor 460 and the drain D of the transistor 5. In other words, a parallel circuit between the plurality of zener diodes Dz and the plurality of zener diodes Dz has been connected between the drain electrode D of the transistor 5 and the pinch resistor 460. In this example, a total number of the above-described zener diodes Dz connected between the n type first semiconductor region 462 and the drain electrode D is equal to that of the zener diodes Dz connected between the n type second semiconductor region 465 and the drain electrode D. Alternatively, as shown in FIG. 64, a series circuit constructed of the zener diodes Dz may be combined between the drain electrode D and any one of the n type first conductor region 462 and the n type second conductor region 465.

If a plurality of zener diodes Dz are provided, then a voltage applied between the n type semiconductor regions 462 and 465 can be adjusted to a lower voltage. In other words, the voltage applied between the n type semiconductor regions 462 and 465 is adjusted to be such a voltage which is obtained by subtracting a total value of breakdown voltages as to the plural zener diodes Dz from the source-to-drain voltage Vds of the transistor 5. As a consequence, the voltage applied between the n type semiconductor regions 462 and 465 can be adjusted in response to a total number of zener diodes Dz. If the voltage applied between the n type semiconductor regions 462 and 465 is adjusted to the low voltage, then the impurity concentration of the p type semiconductor region 464 can be made low, and/or the width of the p type semiconductor region 464 interposed between the n type semiconductor regions 462 and 465 can be made narrow. Accordingly, the variation of the width of the depletion layer when the voltage is applied between the n type semiconductor regions 462 and 465 is increased, and thus, the resistance value of the p type semiconductor region 464 is largely changed. As a result, the below-mentioned superior effect can be achieved. That is, the resistance value of the pinch resistor 460 is kept small in the beginning stage of the transition period during which the transistor 5 is turned OFF, whereas the resistance value of the pinch resistor 460 is kept large in the final stage of the transition period during which the transistor 5 is turned OFF.

Tenth Embodiment

A description is made of preferred features of a driving circuit according to a tenth embodiment of the present disclosure. The driving circuit of this tenth embodiment drives a field-effect type transistor. An adjusting-purpose transistor is a p type MOSFET. In this case, a resistor whose resistance value is larger than an ON resistance of the p type MOSFET has been provided between a source electrode and a gate electrode of the p type MOSFET. Furthermore, the source electrode of the p type MOSFET has been connected to the gate electrode of the transistor; a drain electrode of the p type MOSFET has been grounded; and the gate electrode of the p type MOSFET has been connected to a driving voltage generating circuit. An adjusting-purpose transistor is an n type MOSFET. In this case, a resistor whose resistance value is larger than an ON resistance of the n type MOSFET has been provided between a source electrode and a gate electrode of the n type MOSFET. Furthermore, the source electrode and the gate electrode of the n type MOSFET have been connected to the gate electrode of the transistor; and the source electrode of the n type MOSFET has been connected to a driving voltage generating circuit.

Figure 66:
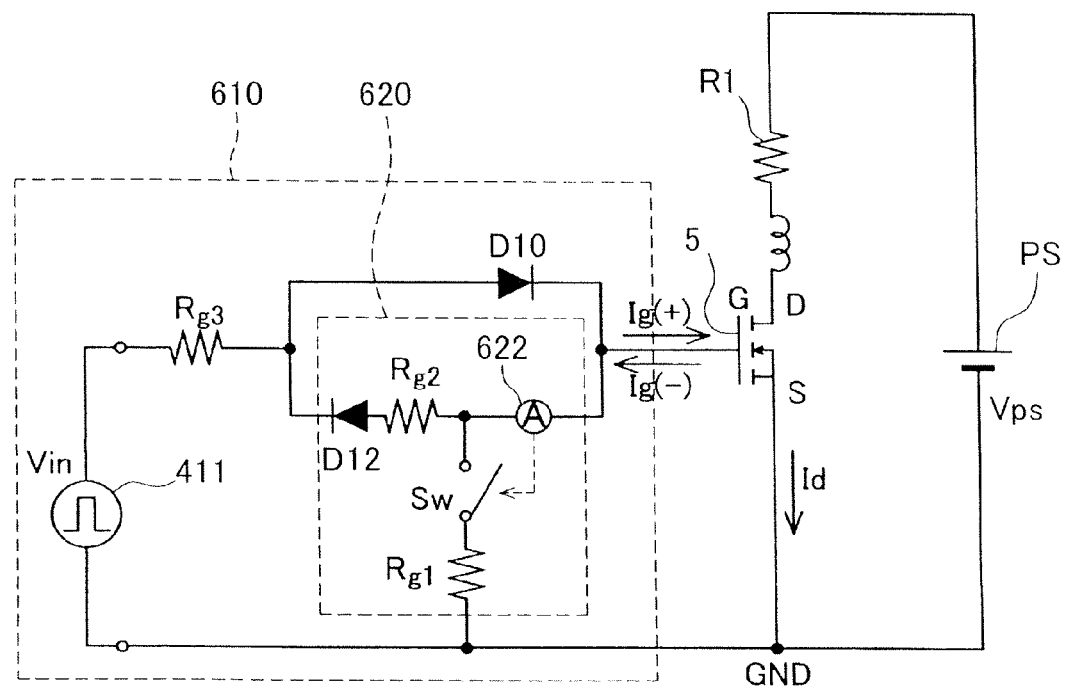
FIG. 66 is a circuit diagram for showing an arrangement of a driving circuit according to a tenth embodiment of the present invention.
Figure 67A:
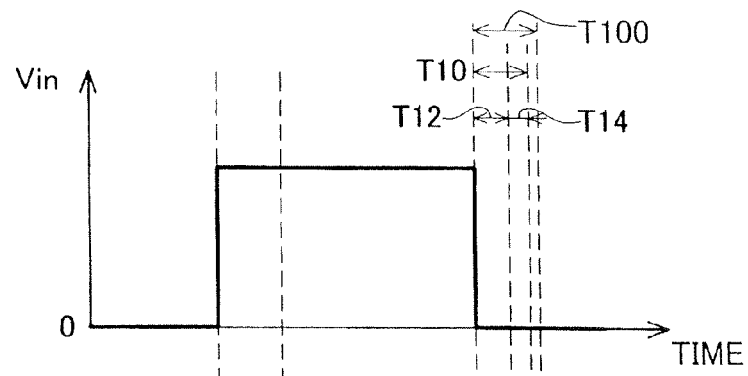
FIG. 67A to FIG. 67E are graphs for showing operation waveform diagrams of a transistor employed in the tenth embodiment.
Figure 67B:
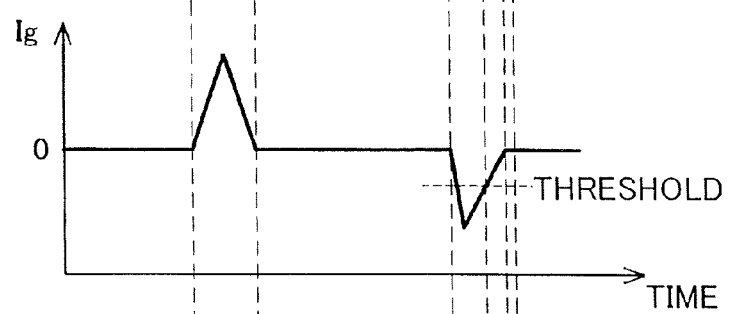
Figure 67C:
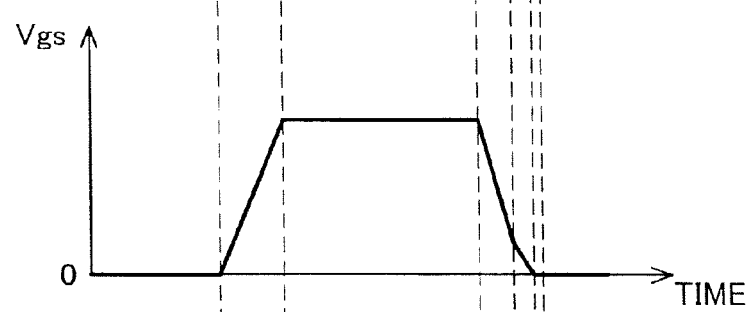
Figure 67D:
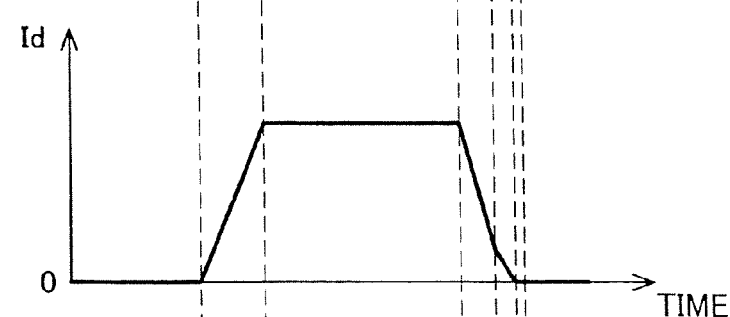
Figure 67E:
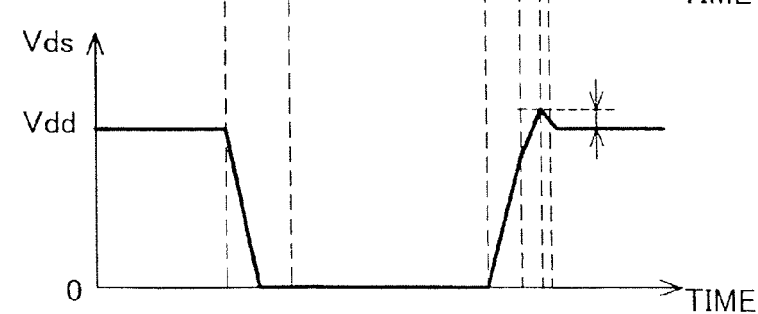

FIG. 66 is a circuit diagram for showing a driving circuit 610 which is employed so as to drive a field-effect type transistor 5. The FET type transistor 5 has been connected between a load R1 and the ground (GND). A stray inductance of a wiring line and the like has been connected between the transistor 5 and the load R1. The driving circuit 610 applies a driving voltage "Vin" having a rectangular waveform to a gate electrode G of the transistor 5, and switches turning-ON/OFF operations of the transistor 5 based upon this driving voltage "Vin." The driving circuit 610 switches the turning-ON/OFF operations of the transistor 5 so as to switch such conditions that a DC voltage Vps of a voltage supply source PS is applied, and is not applied to the load R1.

The driving circuit 610 has been equipped with a driving voltage generating circuit 411, a third resistor Rg3 (one example of fixed resistor), a first diode D10, and an adjusting circuit 620. The driving voltage generating circuit 411 has been electrically connected via the third resistor Rg3 and the first diode D10 to the gate electrode G of the transistor 5. An anode of the first diode D10 has been connected to the side of the driving voltage generating circuit 411, and a cathode thereof has been connected to the side of the gate electrode G of the transistor 5. Both the first diode D10 and the adjusting circuit 620 have constituted a parallel circuit between the driving voltage generating circuit 411 and the transistor 5. The adjusting circuit 620 has been provided with a gate current adjusting circuit 622, a switch means SW, a first resistor Rg1, a second resistor Rg2, and a second diode D12. A resistance value of the first resistor Rg1 is smaller than a resistance value of the second resistor Rg2. An anode of the second diode D12 has been connected to the side of the gate electrode G of the transistor 5, and a cathode thereof has been connected to the side of the driving voltage generating circuit 411.

The gate current adjusting circuit 622 detects a negative gate current "Ig(−)" when electron charges stored in the gate electrode G of the transistor 5 are discharged, and switches open/close operations of the switch means SW based upon a current value of the detected negative gate current Ig(−).

When an absolute value of the current value of the negative gate current Ig(−) is large, the gate current adjusting circuit 622 closes the switch means SW. When an absolute value of the current value of the negative gate current Ig(−) is small, the gate current adjusting circuit 622 opens the switch means SW.

FIG. 67A to FIG. 67E show operating waveform diagrams of the transistor 5.

Firstly, a description is made of a transition time period during which the transistor 5 is turned ON. When a signal level of the driving voltage Vin is changed from a low level to a high level, the driving voltage Vin is converted into a positive gate current "Ig(+)" by the third register Rg3. The positive gate current "Ig(+)" is supplied via the first diode D10 to the gate electrode G of the transistor 5, since the second diode D12 has been provided in a reverse direction. When the positive gate current "Ig(+)" is supplied to the gate electrode G of the transistor 5, electron charges are stored in the gate electrode G. When the electron charges are stored in the gate electrode G, a gate-to-source voltage "Vgs" of the transistor 5 is increased. When the gate-to-source voltage "Vgs" of the transistor 5 is increased, a drain current "Id" starts to flow from the drain electrode D of the transistor 5 toward the source electrode S, so that the drain-to-source voltage Vds is decreased. The state of the transistor 5 is transferred from the OFF state to the ON state by performing these operation steps.

Next, a description is made of a transition time period "T10" during which the transistor 5 is turned ON. When the signal level of the driving voltage Vin becomes a low level from the high level, the electron charges which have been stored in the gate electrode G are discharged. Since the first diode D10 has been provided, a negative gate current "Ig(−)" produced in connection with the discharge of the electron charges flows toward the gate current adjusting circuit 622. An absolute value of the current value of the negative gate current "Ig(−)" is gradually increased in a beginning stage T12 of the transition time period T10 during which the transistor 5 is turned OFF. The gate current adjusting circuit 622 detects the absolute value of the current value of the negative gate current "Ig(−)", and if this detected absolute value exceeds a predetermined threshold value (namely, if current value becomes lower than threshold value), then the gate current adjusting circuit 622 closes the switch means SW. As a consequence, the negative gate current Ig(−) flows through the first resistor Rg1 having the small resistance value to the ground GND. When the switch means SW is closed, in the beginning stage T12 of the transition time period T10 during which the transistor 5 is turned OFF, the negative gate current "Ig(−)" may behave in such a manner that the absolute value of this current value is rapidly increased. As a consequence, the adjusting circuit 620 is operated in such a manner that the electron charges are quickly discharged from the gate electrode G of the transistor 5 in the beginning stage T12 of the transition time period T10 during which the transistor 5 is turned OFF. As a result, such a time required for turning OFF the transistor 5 in the beginning stage T12 of the transition time period T10 can be shortened. In some cases, as shown in FIG. 67A to FIG. 67E, the time for the transition time period T10 required to turn OFF the transistor 5 can be shortened, as compared with the transition time period T100 of the conventional driving circuit.

It should also be understood that until the absolute value of the current value of the negative gate current Ig(−) exceeds a predetermined threshold value, the switch means SW has been opened, so that the resistance value of the gate resistor is large and the electron charges are slowly discharged. However, this time period is extremely short, and therefore, does not essentially prolong the time required for turning OFF the transistor 5.

When the operation is advanced to a final stage T14 of the transition time period T10 for turning OFF the transistor 5, the current value of the negative gate current Ig(−) is gradually decreased. The gate current adjusting circuit 622 detects the absolute value of the current value of the negative gate current "Ig(−)", and if this detected absolute value becomes lower than a predetermined threshold value (namely, if current value becomes higher than threshold value), then the gate current adjusting circuit 622 opens the switch means SW. As a consequence, the negative gate current Ig(−) flows through the second resistor Rg2 having the large resistance value, the third resistor Rg3, and the driving voltage generating circuit 411 to the ground GND. When the switch means SW is opened, in the final stage T14 of the transition time period T10 during which the transistor 5 is turned OFF, the negative gate current "Ig(−)" may behave in such a manner that the absolute value of this current value is decreased. As a consequence, in the final stage T14 of the transition time period T10 of turning off, the adjusting circuit 620 is operated in such a manner that the electron charges are slowly discharged from the gate electrode G of the transistor 5. As a result, the drain current Id of the transistor 5 gently flows, so that increasing of the surge voltage can be suppressed.

In accordance with the driving circuit 610, in the transition time period T10 during which the transistor 5 is turned OFF, a trade-off relationship existed between the surge voltage and the turn-OFF loss can be overcome.

Also, the driving circuit 610 of this tenth embodiment has such a feature that the gate current Ig is monitored. Generally speaking, there are many possibilities that a plurality of loads have been connected between the voltage supply source PS and the transistor 5. As a result, if a large current flows through a certain load among these plural loads, then the DC voltage Vps of the voltage supply source PS is lowered. More specifically, in the automobile field, since batteries do not contain sufficiently large current capacities, the DC voltage Vps of the voltage supply source PS may be easily varied.

For example, the following technical solution may be conceived. That is, a drain voltage of the transistor 5 is monitored so as to adjust the gate resistor thereof. However, in the case where the drain voltage of the transistor 5 is monitored, the DC voltage Vps of the voltage supply source PS is varied, so that the drain voltage of the transistor 5 is similarly varied. As a result, final stage timing of a transition time period during which a transistor is turned OFF cannot be correctly grasped.

On the other hand, in such a case where the gate current Ig is monitored by the driving circuit 610 of the tenth embodiment, even when the DC voltage Vps of the voltage supply source PS is varied, the gate current Ig is not adversely influenced by this voltage variation. As a result, the final stage timing of the transition time period during which the transistor is turned OFF can be correctly grasped.

Figure 68:
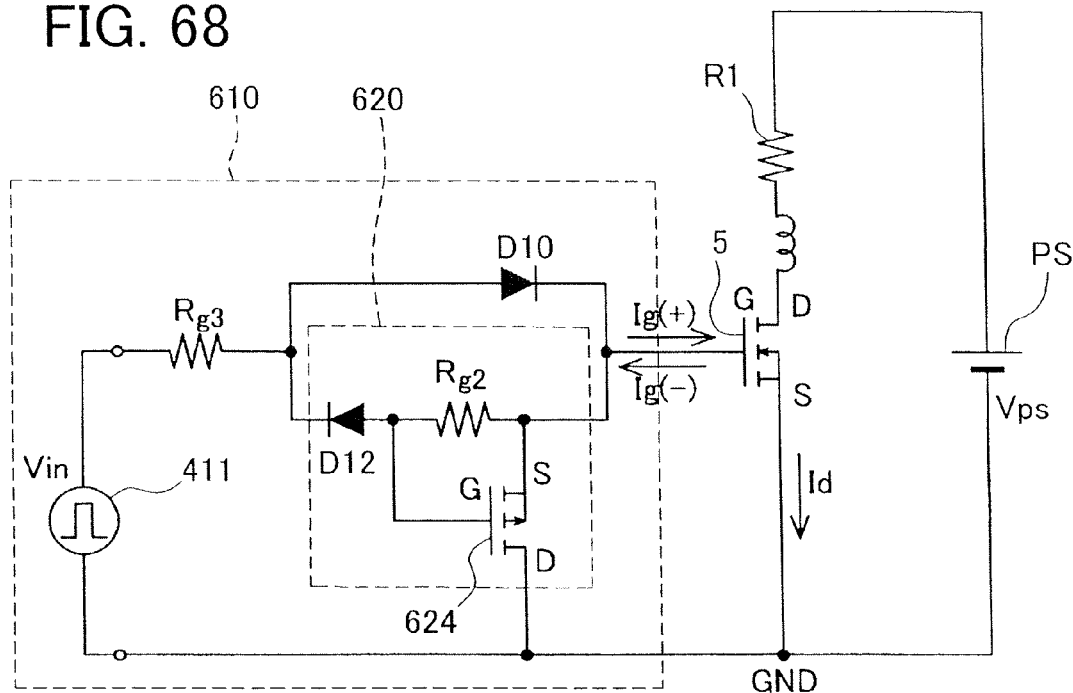
FIG. 68 is a circuit diagram for indicating an arrangement of a driving circuit with employment of a p-MOSFET.

FIG. 68 shows an example in which the gate current adjusting circuit 622, the switch means SW, and the first resistor Rg1 shown in FIG. 66 have been realized by a p type MOSFET (Metal Oxide Semiconductor Field-Effect Transistor) 624. Both a threshold voltage and a switching operation of the p type MOSFET 624 are equivalent to the gate current adjusting circuit 622 and the switch means SW shown in FIG. 66. An ON resistance of the p type MOSFET 624 is equivalent to the first resistor Rg1.

The second resistor Rg2 have been provided between a gate electrode G and a source electrode S (one example of input electrode) of the p type MOSFET 624. As a consequence, the p type MOSFET 624 is turned ON/OFF in response to a voltage difference produced between both terminals of the second resistor Rg2. Further, one terminal of the second resistor Rg2 has been connected to the gate electrode G of the transistor 5, and the other terminal thereof has been connected via the third resistor Rg3, and the driving voltage generating circuit 411 to the ground GND. The drain electrode D of the p type MOSFET 624 has been connected to the ground GND.

In accordance with the above-described driving circuit 610, within the transition time period during which the transistor 5 is turned OFF, in the beginning stage where the absolute value of the current value of the negative gate current Ig(−) becomes large, the p type MOSFET 624 is turned ON in response to the voltage difference produced between both the terminals of the second resistor Rg2. When the p type MOSFET 624 is turned ON, the negative gate current Ig(−) passes from the source electrode S of the p type MOSFET 624 through the drain electrode D to the ground GND. Since the ON resistance of the p type MOSFET 624 is small, the electron charges which have been stored in the gate electrode G of the transistor 5 can be quickly discharged. As a result, a time required for turning OFF the transistor 5 can be shortened.

On the other hand, in the final stage where the absolute value of the current value of the negative gate current Ig(−) becomes small, the voltage difference produced between both the terminals of the second resistor Rg2 becomes low, so that the p type MOSFET 624 is turned OFF. When the p type MOSFET 624 is turned OFF, the negative gate current Ig(−) flows through the second resistor Rg2, the third resistor Rg3, and the driving voltage generating circuit 411 to the ground GND. Since the resistance value of the second resistor Rg2 is large, the electron charges which have been stored in the gate electrode G of the transistor 5 can be slowly discharged. As a result, increasing of the surge voltage can be suppressed.

Figure 69:
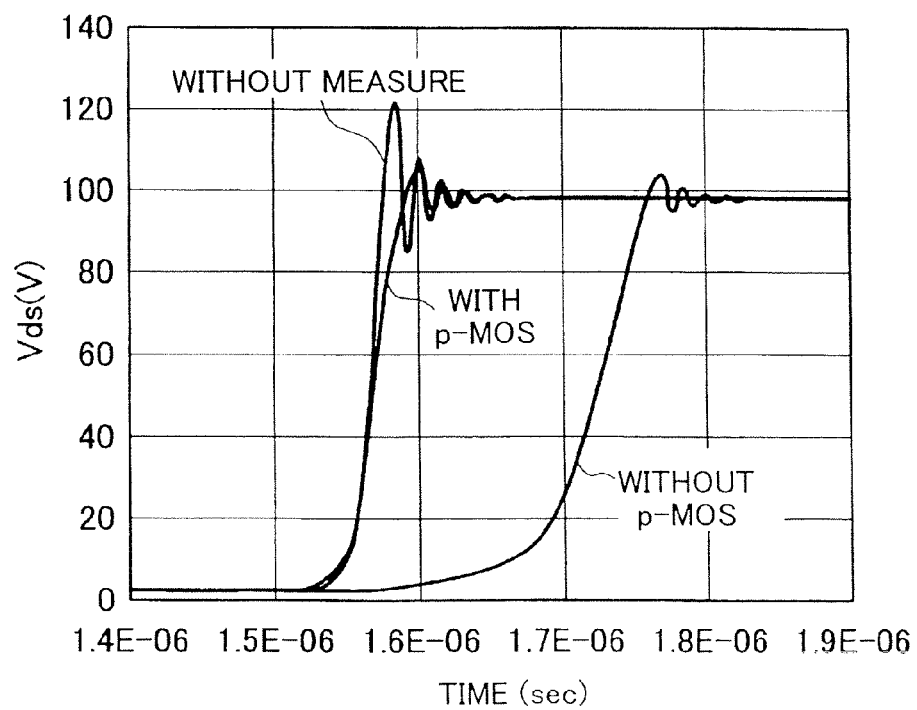
FIG. 69 is a graph for indicating a variation of a drain-to-source voltage of a transistor which is driven by the driving circuit using the p-MOSFET.

FIG. 69 represents a variation of a source-to-drain voltage Vds in the transition time period during which the transistor 5 is turned OFF. An indication "WITH P-MOS" indicates a result obtained of the driving circuit 610 shown in FIG. 68. An indication "WITHOUT MEASURE" indicates a result obtained when only the first resistor Rg1 of FIG. 66 is provided. An indication "WITHOUT P-MOS" shows a result when only the second resistor Rg2 of FIG. 68 is provided. It should also be noted that the resistance value of the first resistor Rg1 is 0.1Ω; the resistance value of the second resistor Rg2 is 30Ω; and the resistance value of the third resistor Rg3 is 3Ω. Also, a threshold voltage Vth of the p type MOSFET 624 is −2.7 V.

As shown in FIG. 69, in the case of "WITHOUT MEASURE", a speed for discharging the electron charges is high, and a high surge voltage is generated. On the other hand, in case of "WITH P-MOS" and "WITHOUT P-MOS", the speed for discharging the electron charges is suppressed to low speed, and increasing of the surge voltage is suppressed. However, in case of "WITHOUT P-MOS", the time required to turn OFF the transistor is prolonged, and the turn-OFF loss is increased.

Figure 70:
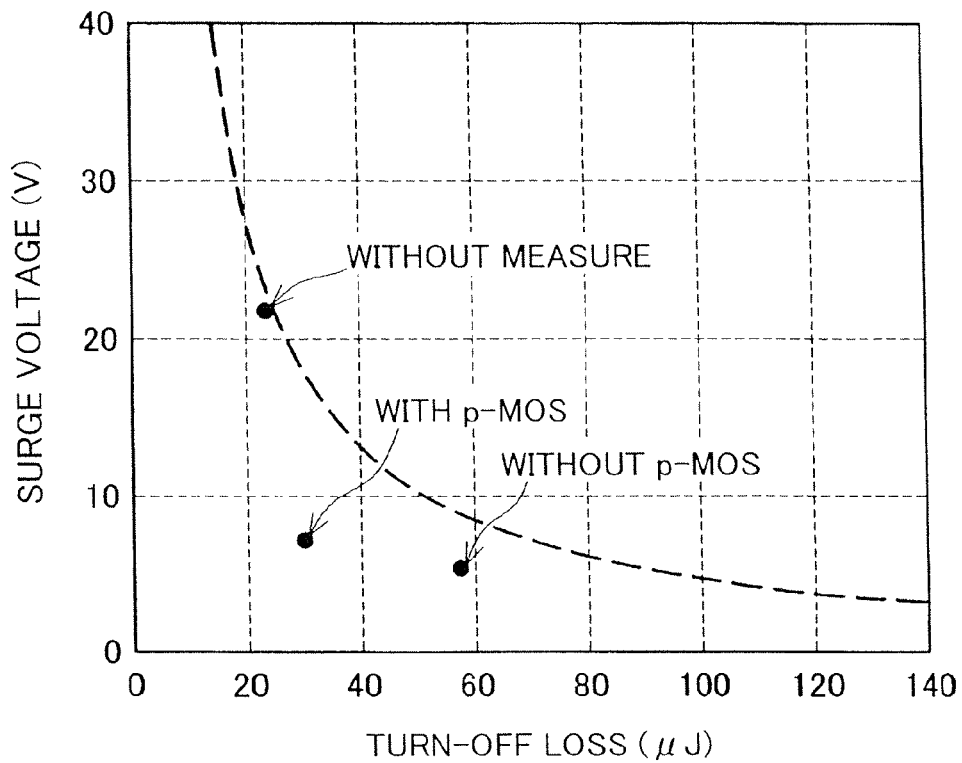
FIG. 70 is a graph for representing a relationship between a surge voltage and a turn-OFF loss of a transistor which is driven by the driving circuit using the p-MOSFET.

FIG. 70 shows a relationship between a surge voltage and a turn-OFF loss.

In case of "WITHOUT P-MOS", although the surge voltage is suppressed, as compared with "WITHOUT MEASURE", the time required for turning OFF the transistor 5 becomes long, and the turn-OFF loss is increased. It is not possible to evaluate from the trade-off curve that a result of "WITHOUT P-MOS" is largely improved.

On the other hand, in case of "WITH P-MOS", while the turn-OFF loss is not substantially increased, the surge voltage is conspicuously reduced, as compared with such a case of "WITHOUT MEASURE." It is possible to evaluate from the trade-off curve that a result of "WITH P-MOS" is largely improved.

Figure 71:
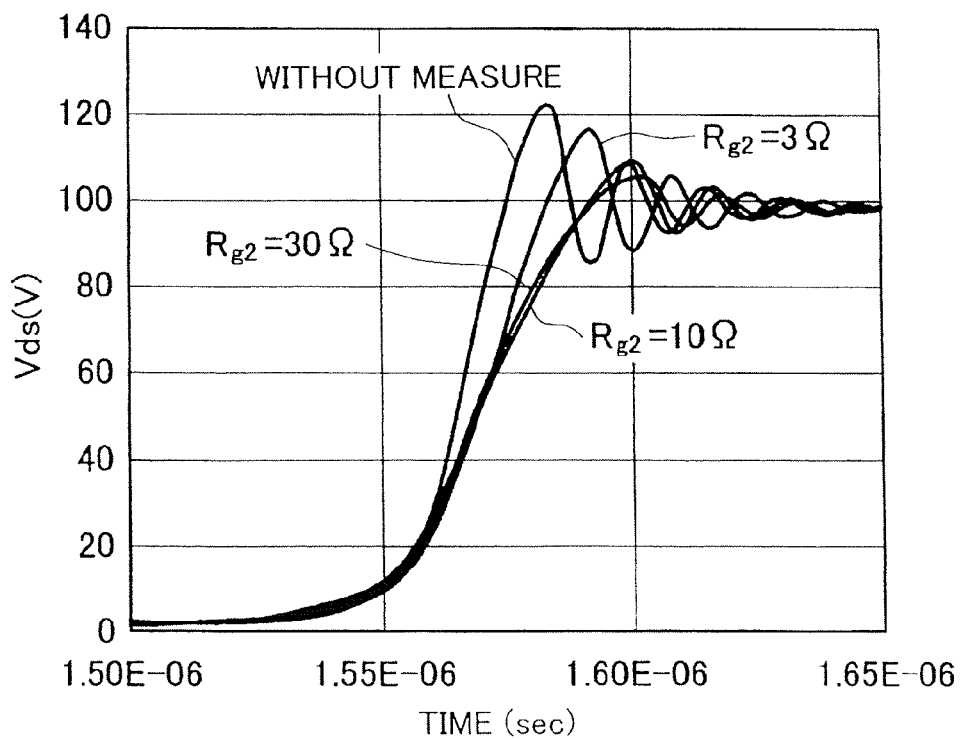
FIG. 71 is a graph for indicating a variation of a drain-to-source voltage of a transistor when a resistance value of a second resistor is changed in the driving circuit using the p-MOSFET.

FIG. 71 shows a variation of the source-to-drain voltage Vds when the resistance value of the second resistor Rg2 is changed to 3Ω, 10Ω, and 30Ω.

The larger the resistance value of the second resistor Rg2 is increased, the larger the speed for discharging the electron charges in the final stage of the transition time period is suppressed, so that increasing of the surge voltage can be suppressed.

Figure 72:
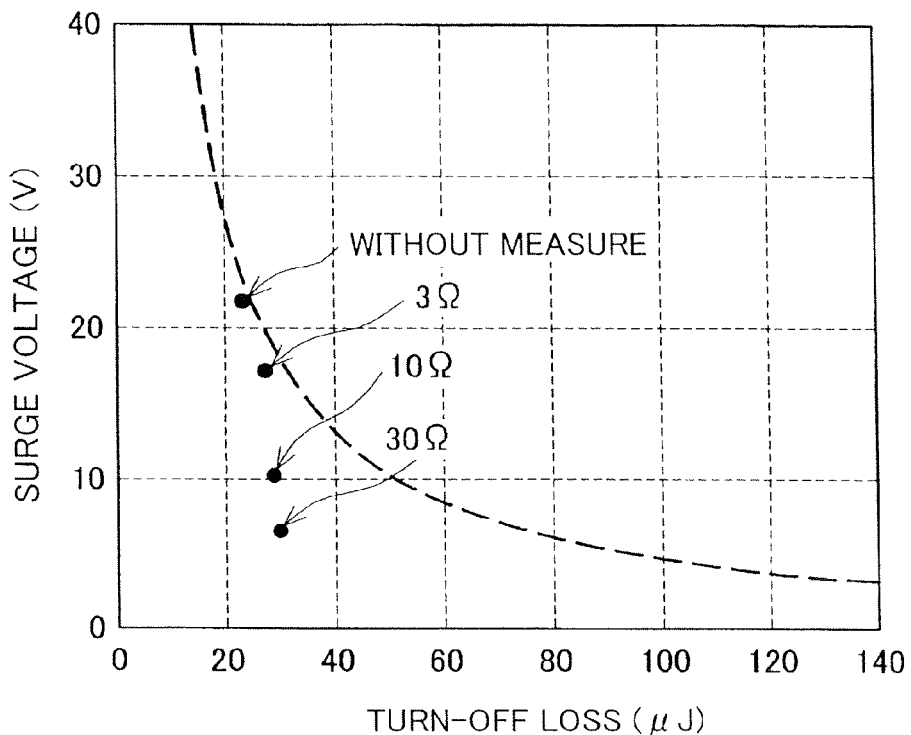
FIG. 72 is a graph for representing a relationship between a surge voltage and a turn-OFF loss of a transistor when the resistance value of the second resistor is changed in the driving circuit using the p-MOSFET.

FIG. 72 shows a relationship between a surge voltage and a turn-OFF loss when the resistance value of the second resistor Rg2 is changed to 3Ω, 10Ω, and 30 Ω.

The larger the resistance value of the second resistor Rg2 is increased, the larger the trade-off relationship between the turn-OFF loss and the surge voltage can be overcome.

Figure 73:
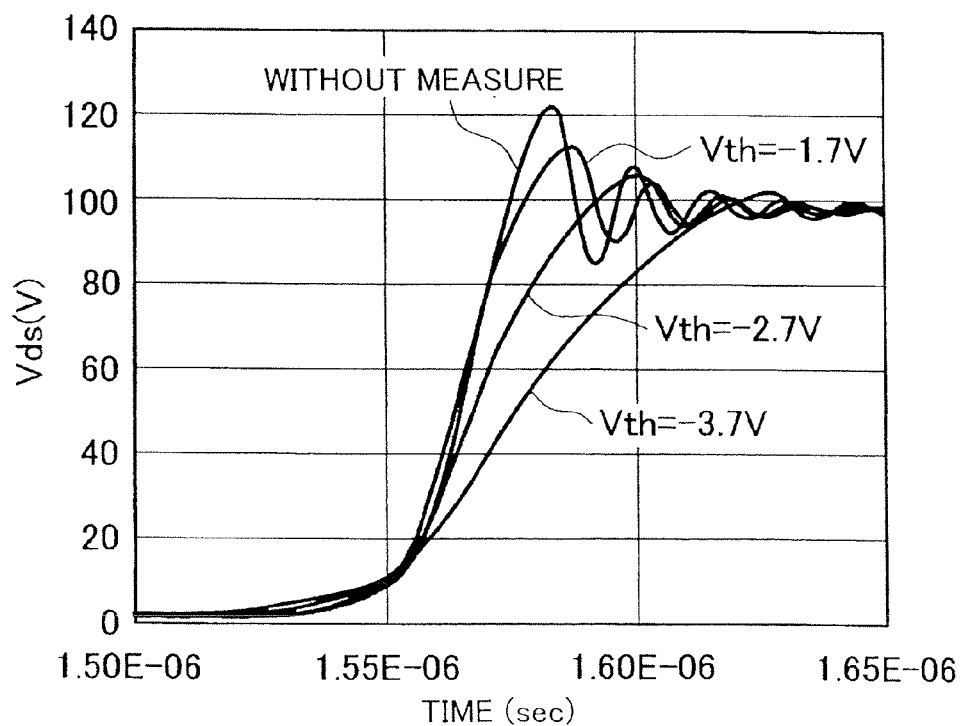
FIG. 73 is a graph for indicating a variation of a drain-to-source voltage of a transistor when a threshold value of the p-MOSFET is changed in the driving circuit using the p-MOSFET.

FIG. 73 indicates a variation of the source-to-drain voltage Vds when the threshold voltage Vth of the p type MOSFET 624 is changed to −1.7 V, −2.7 V, and −3.7 V.

The smaller the absolute value of the threshold voltage Vth of the p type MOSFET 624 is decreased, the longer discharging of the electron charges via the p type MOSFET 624 is maintained. As a result, the time required for turning OFF the transistor 5 can be shortened. Furthermore, the electron charges are discharged via the second resistor Rg2 in the final stage of the transition time period for turning OFF the transistor 5, so that increasing of the surge voltage can be suppressed.

Figure 74:
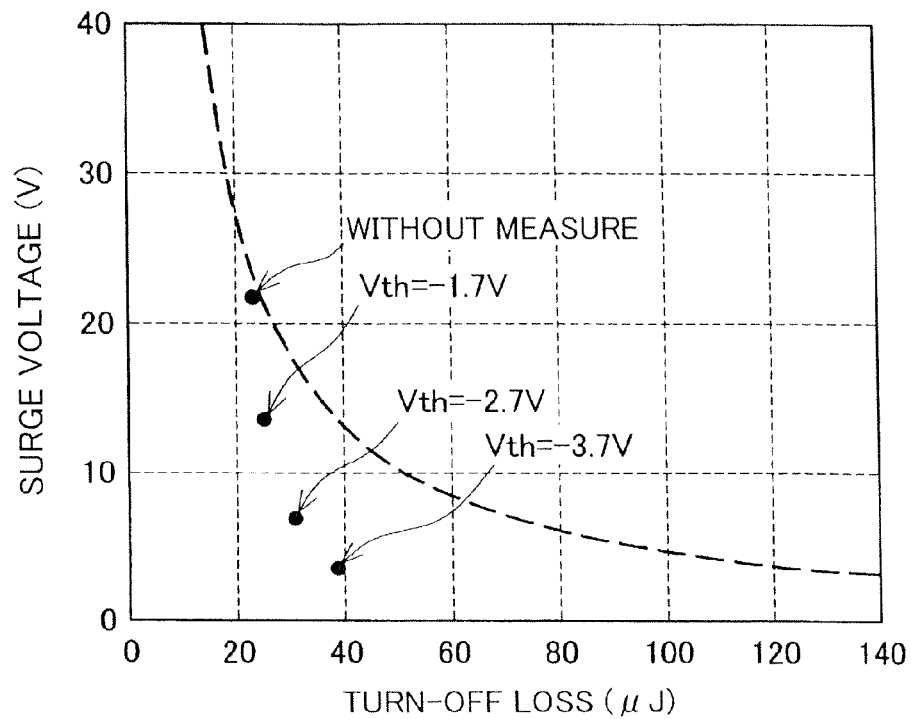
FIG. 74 is a graph for representing a relationship between a surge voltage and a turn-OFF loss of a transistor when the threshold value of the p-MOSFET is changed in the driving circuit using the p-MOSFET.

FIG. 74 indicates a relationship between a surge voltage and a turn-OFF loss when the threshold voltage Vth of the p type MOSFET 624 is changed to −1.7 V, −2.7 V, and −3.7 V.

In the case that the threshold voltage Vth of the p type MOSFET 624 is adjusted, even if any of these threshold voltages Vth is employed, then the trade-off relationship existed between the surge voltage and the turn-OFF loss can be overcome.

Figure 75:
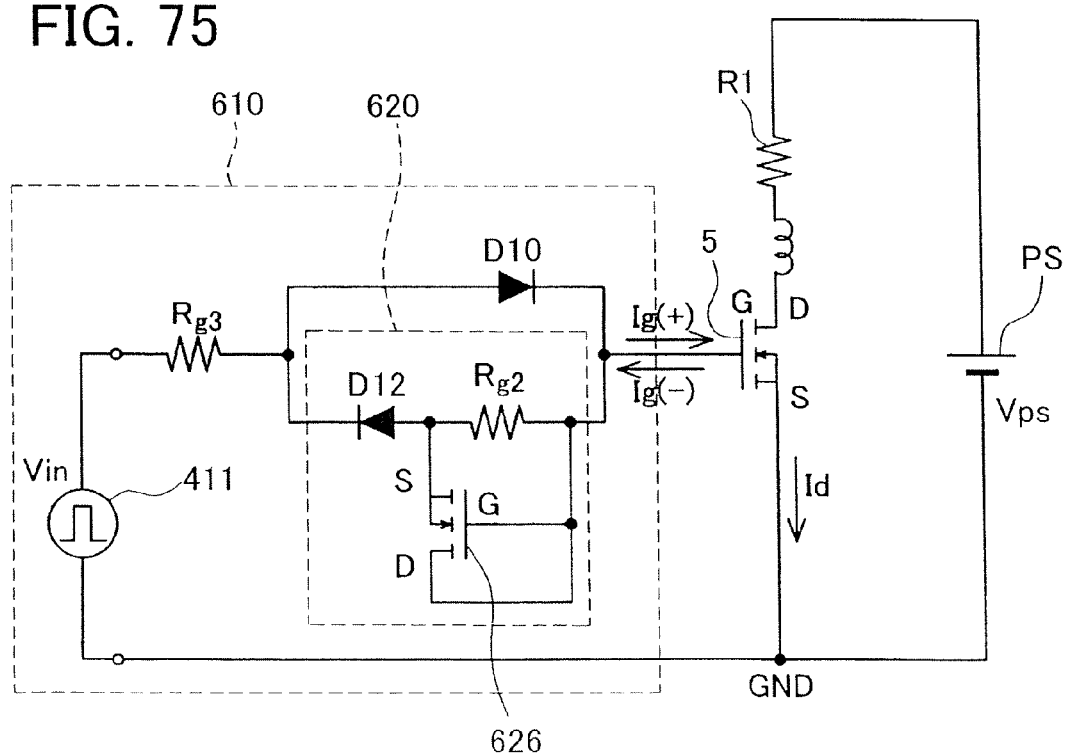
FIG. 75 is a circuit diagram for showing an arrangement of a driving circuit with employment of an n-MOSFET.

FIG. 75 shows an example in which the gate current adjusting circuit 622, the switch means SW, and the first resistor Rg1 shown in FIG. 66 have been realized by an n type MOSFET 626. Both a threshold voltage and a switching operation of the n type MOSFET 626 are equivalent to the gate current adjusting circuit 622 and the switch means SW shown in FIG. 66. An ON resistance of the n type MOSFET 626 is equivalent to the first resistor Rg1.

The second resistor Rg2 have been provided between a gate electrode G and a source electrode S (one example of input electrode) of the n type MOSFET 626. As a consequence, the n type MOSFET 626 is turned ON/OFF in response to a voltage difference produced between both terminals of the second resistor Rg2. Further, one terminal of the second resistor Rg2 has been connected to the gate electrode G of the transistor 5, and the other terminal thereof has been connected via the second diode D12, the third resistor Rg3, and the driving voltage generating circuit 411 to the ground GND. The drain electrode D and the gate electrode G of the n type MOSFET 626 has been connected between one terminal of the second resistor Rg2 and the gate electrode G of the transistor 5. The second diode D12 has been provided between the driving voltage generating circuit 411 and the source electrode S of the n-MOSFET 626.

In accordance with the above-described driving circuit 610, within the transition time period during which the transistor 5 is turned OFF, in the beginning stage where the absolute value of the current value of the negative gate current Ig(−) becomes large, the n type MOSFET 626 is turned ON in response to the voltage difference produced between both the terminals of the second resistor Rg2. When the n type MOSFET 626 is turned ON, the negative gate current Ig(−) passes from the drain electrode D of the n type MOSFET 626 through the source electrode S, and furthermore, flows through the second diode D12, the third resistor Rg3 and the driving voltage generating circuit 411 to the ground GND. In other words, the negative gate current Ig(−) flows by bypassing the second resistor Rg2. Since the ON resistance of the n type MOSFET 626 is small, the electron charges which have been stored in the gate electrode G of the transistor 5 can be quickly discharged. As a result, a time required for turning OFF the transistor 5 can be shortened.

On the other hand, in the beginning stage where the absolute value of the current value of the negative gate current Ig(−) becomes small, the voltage difference produced between both the terminals of the second resistor Rg2 becomes low, so that the n type MOSFET 626 is turned OFF. When the n type MOSFET 625 is turned OFF, the negative gate current Ig(−) flows through the second resistor Rg2, and further flows through the second diode D12, the third resistor Rg3, and the driving voltage generating circuit 411 to the ground GND. Since the resistance value of the second resistor Rg2 is large, the electron charges which have been stored in the gate electrode G of the transistor 5 can be slowly discharged. As a result, increasing of the surge voltage can be suppressed.

Figure 76:
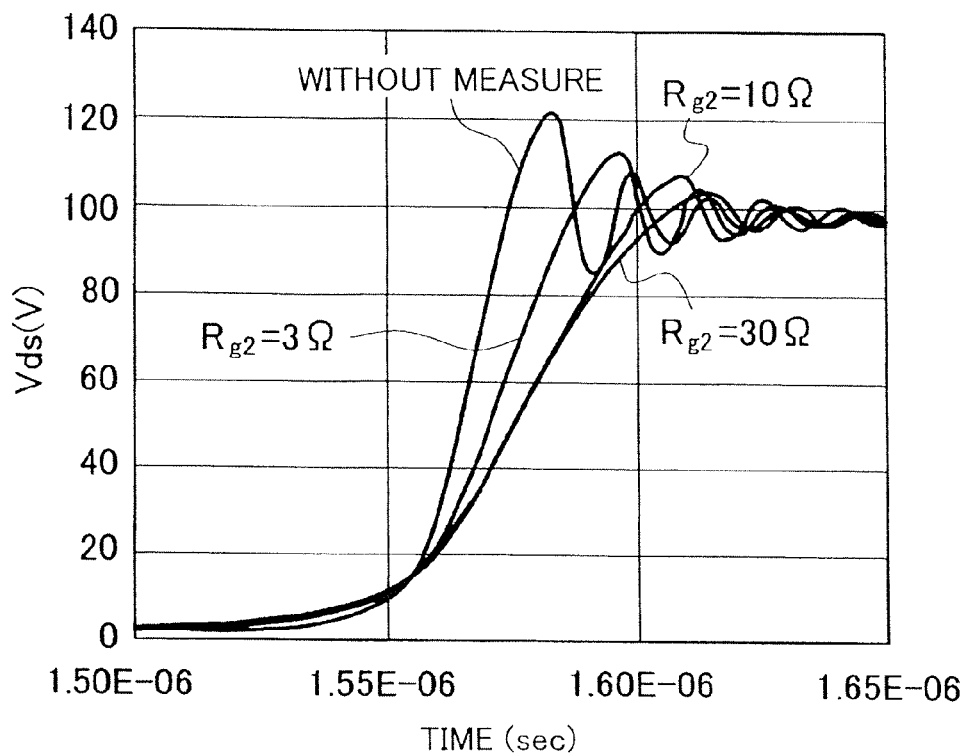
FIG. 76 is a graph for indicating a variation of a drain-to-source voltage of a transistor when a resistance value of a second resistor is changed in the driving circuit using the n-MOSFET.

FIG. 76 shows a variation of the source-to-drain voltage Vds when the resistance value of the second resistor Rg2 is changed to 3Ω, 10Ω, and 30Ω. In this case, a threshold voltage Vth of the n type MOSFET 626 is 1.1 V.

The larger the resistance value of the second resistor Rg2 is increased, the larger the speed for discharging the electron charges in the final stage of the transition time period is suppressed, so that increasing of the surge voltage can be suppressed.

Figure 77:
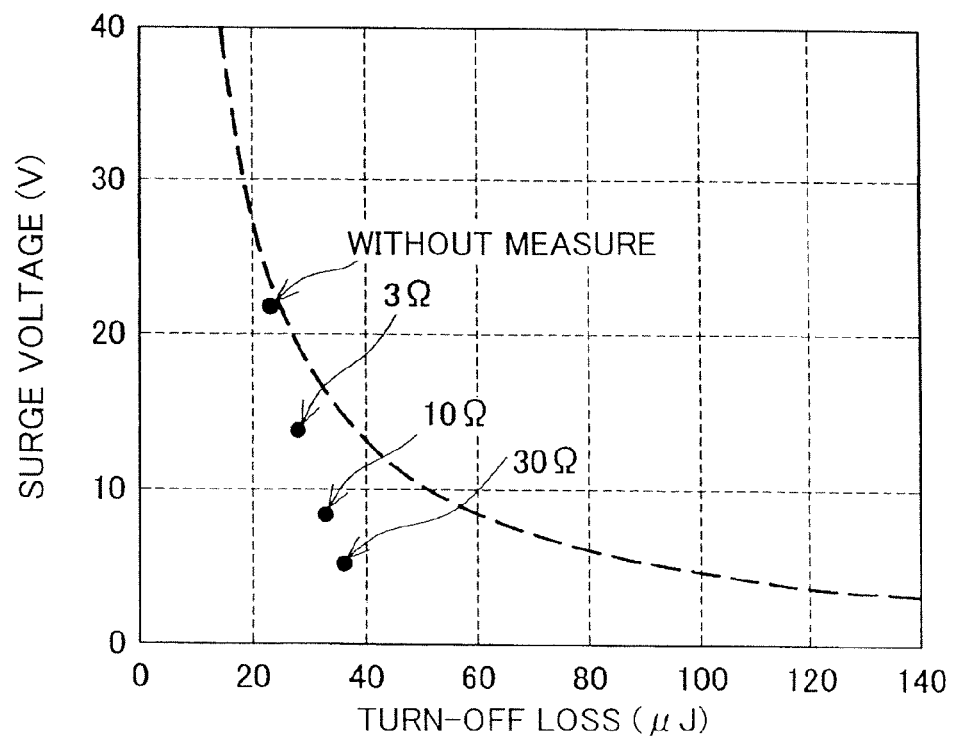
FIG. 77 is a graph for representing a relationship between a surge voltage and a turn-OFF loss of a transistor when the resistance value of the second resistor is changed in the driving circuit using the n-MOSFET.

FIG. 77 shows a relationship between a surge voltage and a turn-OFF loss when the resistance value of the second resistor Rg2 is changed to 3Ω, 10Ω, and 30 Ω.

The larger the resistance value of the second resistor Rg2 is increased, the trade-off relationship existed between the surge voltage and the turn-OFF loss can be overcome.

Figure 78:
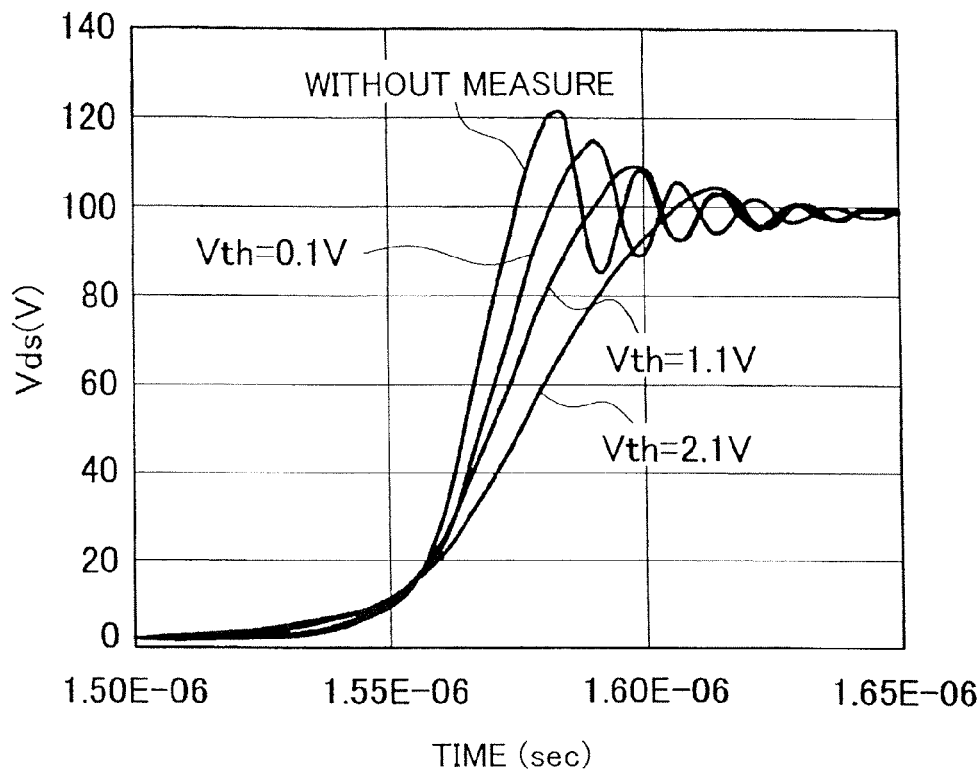
FIG. 78 is a graph for indicating a variation of a drain-to-source voltage of a transistor when a threshold value of the n-MOSFET is changed in the driving circuit using the n-MOSFET.

FIG. 78 shows a variation of the source-to-drain voltage Vds when the threshold voltage Vth of the n type MOSFET 626 is changed to 0.1 V, 1.1 V, and 2.1 V.

The lower the threshold voltage Vth of the n type MOSFET 626 becomes, discharging of the electron charges via the n type MOSFET 626 is maintained for a long time, so that the time required for turning OFF the transistor 5 is shortened. Moreover, in the final stage of the transition time period for turning OFF the transistor 5, the electron charges are discharged via the second resistor Rg2. As a result, increasing of the surge voltage can be suppressed.

Figure 79:
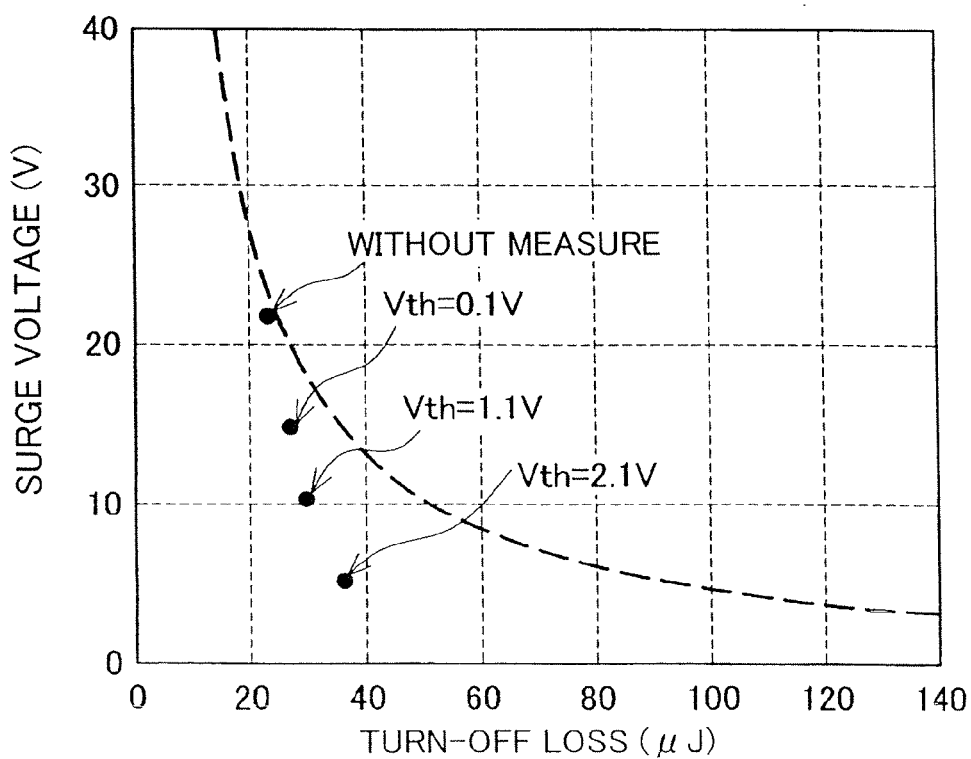
FIG. 79 is a graph for representing a relationship between a surge voltage and a turn-OFF loss of a transistor when the threshold value of the n-MOSFET is changed in the driving circuit using the n-MOSFET.

FIG. 79 shows a relationship between a surge voltage and a turn-OFF loss when the threshold voltage Vth of the n type MOSFET 626 is changed to 0.1 V, 1.1 V, and 2.1 V.

In such a case that the threshold voltage Vth of the n type MOSFET 626 is adjusted, even if any of these threshold voltages Vth is employed, then the trade-off relationship existed between the surge voltage and the turn-OFF loss can be overcome.

The above-disclosed inventive ideas of the present disclosure cover the below-mentioned various modification modes.

In accordance with a first modification mode of the present disclosed ideas, a switching circuit is arranged by a transistor having a first electrode, a second electrode, and a control electrode; a zener diode; and a capacitor. Since a switching voltage of the transistor is switched, a junction between the first electrode and the second electrode can be temporally switched between a conduction state and a non-conduction state. The zener diode has been series-connected to the capacitor between the first electrode and the control electrode of the transistor. The first electrode is either a drain or a collector.

Concretely speaking, a cathode side of the zener diode is connected to the drain (or collector), and an anode side of the zener diode is connected to the control electrode. In this case, the capacitor may be alternatively inserted between the zener diode and the drain (or collector), or the capacitor may be alternatively inserted between the zener diode and the control electrode.

In the above-described switching circuit, the zener diode has been inserted between the drain (or collector) and the control electrode. As a consequence, just after the transistor is turned OFF, while a voltage between the drain (or collector) and the control electrode is lower than a zener voltage (namely, breakdown voltage) of the zener diode, this condition is nearly equal to such a condition that the series circuit constructed of the zener diode and the capacitor is not present. As a result, a capacitance between the drain (or collector) and the control electrode is maintained under small capacitance condition; and both a current flowing between the drain and the source (or collector and emitter) of the transistor, and a voltage between them are rapidly changed, so that a switching loss can be suppressed to a small loss.

A voltage between the drain and the source (or collector and emitter) is increased after the transistor has been turned OFF, and in conjunction with this voltage increase, a voltage between the drain (or collector) and the control electrode is also increased. When the voltage between the drain (or collector) and the control electrode exceeds the zener voltage of the zener diode, the drain (or collector) is connected via the capacitor to the control electrode, so that a capacitance between be drain (or collector) and the control electrode is increased. As a consequence, thereafter, both a current flowing between the drain and the source (or collector and emitter) and a voltage between them are slowly changed. As a consequence, a surge voltage can be suppressed to a low voltage.

Accordingly, in accordance with the above-described switching circuit, both the switching loss and the surge voltage can be suppressed to the lower values.

Also, an internal structure of the transistor need not be improved, or the internal structure thereof may be suppressed at such a degree that the internal structure is improved (if necessary, manner capable of improving internal structure of transistor may be alternatively combined with above-described switching circuit). As a result, a transistor having a low ON resistance (ON voltage) may be employed. Also, since the above-described switching circuit may be realized by merely adding the zener diode and the capacitor, this switching circuit may be arranged by employing a small number of circuit elements. Both the zener diode and the capacitor may be readily manufactured at the same time in a semiconductor substrate used to form a transistor when the transistor is manufactured. If the transistor, the zener diode, and the capacitor are constituted in an internal body in the same semiconductor substrate, then a total number of the circuit elements of the switching circuit is not increased.

Alternatively, as an alternative idea, the above-described transistor may be realized by either a MOSFET or an IGBT. In this case, the transistor may be realized as a unipolar transistor, or a bipolar transistor.

Alternatively, as an alternative idea, when the transistor is under OFF state, a predetermined voltage is applied between the first electrode and a second electrode, and the zener diode may have a zener voltage higher than the predetermine voltage by approximately 0.5 to 1.0 times. In this case, the expression "OFF state" implies such a time period that a current change and a voltage change occurred after the transistor turned OFF have been converged. In the case that the above-described condition can be satisfied, both the switching loss and the surge voltage can be suppressed under better balancing condition.

As an alternative idea, a transistor, a zener diode, and a capacitor may be alternatively arranged on the same semiconductor substrate. In this alternative case, the expression "circuit elements have been provided in the same semiconductor substrate" involves such a case that when the respective circuit elements have been formed within the semiconductor substrate, either a portion or all of these circuit elements have been manufactured on the semiconductor substrate. In other words, the expression "circuit elements have been provided in same semiconductor substrate" implies such a condition that the circuit elements as to the transistor, the zener diode, and the capacitor have been constructed in one integral body by utilizing the semiconductor substrate. In this case, a total number of the circuit components which constitute the switching circuit is not increased. Also, the transistor, the zener diode, and the capacitor may be easily formed in the semiconductor substrate by utilizing a semiconductor manufacturing technique. The transistor, the zener diode, and the capacitor may be formed in the same semiconductor substrate without any forcible manner. Also, the switching circuit can be made compact and can be practically utilized under better condition. Furthermore, the zener diode may be alternatively provided via an insulating film on the semiconductor substrate. The zener diode has a p conductive type anode semiconductor region and an n conductive type cathode semiconductor region, while the cathode semiconductor region is contacted to the anode semiconductor region. It should be understood that both the anode semiconductor region and the cathode semiconductor region may be made of poly crystalline silicon.

As an alternative idea, the capacitor may alternatively has an embedded conductive region and a coating insulation region. The embedded conductive region has been elongated from a first plane of a semiconductor substrate to a second plane thereof. The coating insulation region coats the embedded insulation region in such a manner that the embedded conductive region is electrically insulated from the semiconductor substrate. In this case, the coating insulation region may function as a dielectric material which constitutes the capacitor.

As an alternative idea, the zener diode may alternatively has a p conductive type anode semiconductor region and an n conductive type cathode semiconductor region. The anode semiconductor region has been provided via an insulating film on the semiconductor substrate. The cathode semiconductor region has been provided via the insulating film on the semiconductor substrate, and is contacted to the anode semiconductor region. The capacitor has the embedded conductive region and the coating insulation region. The embedded conductive region has been elongated from the first plane to the second plane of the semiconductor substrate. The coating insulation region has coated the embedded conductive region in such a manner that the embedded conductive region is electrically insulated from the semiconductor substrate. The anode semiconductor region has been electrically connected to the control electrode of the transistor. The cathode semiconductor region has been electrically connected to the embedded conductive region. The embedded conductive region has been electrically insulated from the first electrode of the transistor by the coating insulation region. Furthermore, the capacitor may alternatively and further have a diffusion semiconductor region arranged within the semiconductor substrate. The coating insulation region has been sandwiched between the embedded conductive region and the diffusion semiconductor region. The diffusion semiconductor region has been electrically connected to the first electrode of the transistor. The second electrode of the transistor corresponds to either a source or an emitter.

As an alternative idea, the zener diode may alternatively has a p conductive type anode semiconductor region and an n conductive type cathode semiconductor region. The anode semiconductor region has been provided via an insulating film on the semiconductor substrate. The cathode semiconductor region has been provided via the insulating film on the semiconductor substrate, and is contacted to the anode semiconductor region. The capacitor has the embedded conductive region and the coating insulation region. The embedded conductive region has been elongated from the first plane to the second plane of the semiconductor substrate. The coating insulation region has coated the embedded conductive region in such a manner that the embedded conductive region is electrically insulated from the semiconductor substrate. The embedded conductive region has been electrically connected to the control electrode of the transistor. The anode semiconductor region has been electrically insulated from the embedded conductive region by the coating insulation region. The cathode semiconductor region has been electrically connected to the first electrode of the transistor. Moreover, the capacitor may alternatively and further have a diffusion semiconductor region arranged within the semiconductor substrate. The coating insulation region has been sandwiched between the embedded conductive region and the diffusion semiconductor region. The diffusion semiconductor region has been electrically connected to the anode conductor region. The second electrode of the transistor corresponds to either a source or an emitter.

In accordance with a second modification mode of the present disclosed ideas, a switching circuit is arranged by a transistor having a first electrode, a second electrode, and a control electrode; a zener diode; and a capacitor. Since a switching voltage of the transistor is switched, a junction between the first electrode and the second electrode can be temporally switched between a condition state and a non-conduction state. The zener diode has been series-connected to the capacitor between the first electrode and the second electrode of the transistor. The first electrode is either a drain or a collector. The second electrode is either a source of an emitter.

Concretely speaking, a cathode of the zener diode is connected to the drain (or collector), and an anode of the zener diode is connected to the source (or emitter). In this case, the capacitor may be alternatively inserted between the zener diode and the drain (or collector), or the capacitor may be alternatively inserted between the zener diode and the source (or emitter).

Also, in this case, while the zener diode does not break down, both a current flowing between the drain and the source (or collector and emitter) of the transistor, and a voltage between them are rapidly changed, so that a switching loss can be suppressed to a small loss. Thereafter, since the zener diode breaks down, both a current flowing between the drain and the source (or collector and emitter) and a voltage between them are slowly changed. As a consequence, a surge voltage can be suppressed to a low surge voltage.

Both the switching loss and the surge voltage can be suppressed to the low values even by the switching circuit of the above-described case. Even by this switching circuit, the ON resistance can be suppressed to the low value, the switching loss can be suppressed to the small value, and the surge voltage can be suppressed to the low voltage. Moreover, the switching circuit may be arranged by employing a small number of circuit elements. If the transistor, the zener diode, and the capacitor are constituted in an integral body in the same semiconductor substrate, then a total number of the circuit elements of the switching circuit is not increased.

As an alternative idea, the transistor, the zener diode, and the capacitor may be alternatively arranged in the same semiconductor substrate. In addition, the capacitor may alternatively have an embedded conductive region and a coating insulation region. The embedded conductive region has been elongated from a first plane of a semiconductor substrate to a second plane thereof. The coating insulation region coats the embedded insulation region in such a manner that the embedded conductive region is electrically insulated from the semiconductor substrate. It should also be noted that the zener diode may be alternatively formed via an insulating film on the semiconductor substrate. Also, the zener diode may alternatively have a p conductive type anode semiconductor region and an n conductive type cathode semiconductor region. The cathodes semiconductor region has been contacted to the anode semiconductor region. The cathode semiconductor region has been electrically connected to the first electrode of the transistor. In addition, the capacitor has a diffusion semiconductor region arranged within the semiconductor substrate. The coating insulation region has been sandwiched between the embedded conductive region and the diffusion semiconductor region. The diffusion semiconductor region has been electrically connected to the anode semiconductor region. The embedded conductive region has been electrically connected to the second electrode of the transistor.

In accordance with a third modification mode of the present disclosed ideas, a switching circuit is arranged by a transistor, a control circuit, a series circuit, and a voltage adjusting circuit. The transistor has a high voltage-sided major electrode, a low voltage-sided major electrode, and a control electrode. In the control circuit, both a power supply and a load are series-connected between the high voltage-sided major electrode and the low voltage-sided major electrode, and the control circuit outputs a voltage for turning ON/OFF the transistor. While the control circuit is connected to the control electrode of the transistor, the series circuit has a first capacitor and a first diode. While the series circuit is connected between the control electrode of the transistor and the high voltage-sided major electrode, the first capacitor has been series-connected to the first diode; a cathode of the first diode h as been connected to the control electrode side; and an anode of the first diode has been connected to the high voltage-sided major electrode. Then, the voltage adjusting circuit has been connected to a junction portion between the first capacitor and the first diode. The voltage adjusting circuit adjusts a voltage of the junction portion.

It should be noted that in the series circuit constructed of the first capacitor and the first diode, the first capacitor may be arranged on the control electrode side of the transistor, and the first diode may be arranged on the major electrode side of the high voltage side of the transistor. Alternatively, the above-described positional relationship may be reversed.

In the above-described switching circuit, when the transistor is turned OFF, if a forward direction voltage starts to flow through the first diode, then a charging current starts to flow into the first capacitor. Thereafter, a changing speed of the voltage at the control electrode of the transistor is slowed; a changing speed of the main current of the transistor is slowed; and a voltage changing speed of the major electrode of the high voltage side of the transistor is slowed, so that a surge voltage appeared at the major electrode of the high voltage side of the transistor can be suppressed to the low surge voltage.

If the voltage adjusting circuit is not provided, then such a timing when the forward direction voltage starts to effect the first diode is fixed to another timing when the voltage at the major electrode of the high voltage side of the transistor is increased up to the power supply voltage.

To the contrary, if the voltage adjusting circuit is additionally provided, then the forward direction voltage can be commenced to effect the first diode at such a timing which is earlier than the timing when the voltage at the major electrode of the high voltage side of the transistor is increased up to the power supply voltage; the changing speed of the voltage at the control electrode of the transistor can be slowed at the earlier timing; the changing speed of the main current of the transistor can be slowed at the earlier timing; and the voltage changing speed of the major electrode of the high voltage side of the transistor can be slowed at the earlier timing. As a result, the surge voltage appeared on the major electrode of the high voltage side of the transistor can be suppressed to the low surge voltage.

If required, the forward direction voltage may be commenced to effect the first diode at such a timing when the voltage at the major electrode of the high voltage side of the transistor is increased higher than, or equal to the power supply voltage; the changing speed of the voltage at the control electrode of the transistor may be slowed at the slower timing; the changing speed of the main current of the transistor may be slowed at the slower timing; and the voltage changing speed of the major electrode of the high voltage side of the transistor may be slowed at the slower timing. In this case, the switching loss of the transistor can be reduced.

As previously described, since the voltage adjusting circuit is utilized, such a timing can be adjusted which slows the changing speed of the voltage generated at the control electrode of the transistor when the transistor is turned OFF. If this timing is adjusted to become earlier by the voltage adjusting circuit, then the surge voltage can be suppressed to the low surge voltage.

In a beginning stage during which the transistor is turned OFF, a changing speed of a voltage generated at the control electrode of the transistor is increased so as to suppress a turn-OFF loss (since voltage between major electrodes of transistor is low in beginning stage, there is no opportunity that surge voltage becomes excessively high, so that changing speed of voltage at control electrode can be increased) whereas in a final stage (namely, time period during which voltage between major electrodes of transistor has been increased, and thus, surge voltage can become excessively high) during which the transistor is turned OFF, the changing speed of the voltage generated at the control electrode of the transistor is slowed, so that the surge voltage can be suppressed to the low surge voltage.

Generally speaking, there is a trade-off relationship between a turn-OFF loss and a surge voltage. If the turn-OFF loss is suppressed, then the surge voltage becomes excessively high, whereas if the surge voltage is suppressed, then the turn-OFF loss becomes excessively large. In the above-described circuit, while the transistor is turned OFF, the changing speed of the voltage generated at the control electrode of the transistor is slowed. As a result, both the turn-OFF loss and the surge voltage can be suppressed.

Alternatively, as an alternative idea, in such a case that the transistor is turned ON, the first capacitor may have an ON-state charging voltage. Alternatively, in such a case that the transistor is turned OFF, the first capacitor many have an OFF-state charging voltage, and the voltage adjusting circuit adjusts the ON-state charging voltage to become lower than the OFF-state charging voltage. In accordance with the above-described modification mode, the forward direction voltage may be commenced to effect the first diode at such a timing which is earlier than the timing when the voltage at the major electrode of the high voltage side of the transistor is increased up to the power supply voltage; the changing speed of the voltage at the control electrode of the transistor may be slowed at the earlier timing; the changing speed of the main current of the transistor may be slowed at the earlier timing; and the voltage changing speed of the major electrode of the high voltage side of the transistor may be slowed at the earlier. As a result, the surge voltage appeared on the major electrode of the high voltage side of the transistor may be suppressed to the low surge voltage.

Alternatively, as an alternative idea, in the case that the voltage at the high voltage-sided major electrode of the transistor is lowered, the first capacitor may have a first charging voltage. Also, in the case that the voltage at the high voltage-sided major electrode of the transistor is equal to the power supply voltage, the first capacitor may have a second charging voltage, and the voltage adjusting circuit adjusts the first charging voltage to become lower than the second charging voltage. Even in accordance with this modification mode, the forward direction voltage may be commenced to effect the first diode at such a timing which is earlier than the timing when the voltage at the major electrode of the high voltage side of the transistor is increased up to the power supply voltage; the changing speed of the voltage at the control electrode of the transistor may be slowed at the earlier timing; the changing speed of the main current of the transistor may be slowed at the earlier timing; and the voltage changing speed of the major electrode of the high voltage side of the transistor may be slowed at the earlier timing. As a result, the surge voltage appeared on the major electrode of the high voltage side of the transistor can be suppressed to the low surge voltage.

Alternatively, as an alternative idea, the voltage adjusting circuit may contain a second capacitor and a second diode. Both the second capacitor and the second diode have been series-connected between the junction portion of the first capacitor and the first diode, and the anode of the first diode. A cathode of the second diode has been connected to the anode side of the first diode. An anode of the second diode has been connected to the junction portion side. In other words, both the second capacitor and the second diode have provided a signal path for bypassing the first diode. In this voltage adjusting circuit, when the transistor is advanced to the ON state and thus the voltage at the major electrode of the high voltage side of the transistor is decreased, a forward direction voltage is effected to the second diode. As a result, a portion of the electron charges which have been charged to the first capacitor is moved in such a manner that the second capacitor is charged, so that the voltage at the connection line for connecting the first capacitor to the first diode is lowered. The voltage at the connection line becomes a high voltage when the transistor is turned OFF, and becomes a low voltage when the transistor is turned ON. In this case, the forward direction voltage may be commenced to effect the first diode at such a timing which is earlier than the timing when the voltage at the major electrode of the high voltage side of the transistor is increased up to the power supply voltage; the changing speed of the voltage at the control electrode of the transistor may be slowed at the earlier timing; the changing speed of the main current of the transistor may be slowed at the earlier timing; and the voltage changing speed of the major electrode of the high voltage side of the transistor may be slowed at the earlier timing. As a result, the surge voltage appeared on the major electrode of the high voltage side of the transistor may be suppressed to the low surge voltage.

In addition, the second capacitor may alternatively have an electrostatic capacity smaller than, or equal to the electrostatic capacity of the first capacitor. If the electrostatic capacity of the second capacitor becomes excessively large, then an amount of electron charges stored in the first capacitor becomes excessively small, so that a charging voltage of the first capacitor becomes excessively low. If the charging voltage of the first capacitor becomes excessively low, then a forward direction voltage starts to effect the first diode from the beginning stage of the transition time period during which the transistor is turned OFF, so that a turn-OFF loss is increased. If the electrostatic capacity of the second capacitor is set to be smaller than, or equal to the electrostatic capacity of the first capacitor, then it is possible to suppress that the charging voltage of the first capacitor becomes low. As a result, while increasing of the turn-OFF loss is suppressed, the surge voltage can be suppressed.

In accordance with a fourth modification mode of the present disclosed ideas, a switching circuit is arranged by a transistor, a capacitor, and a diode having an anode terminal and a cathode terminal. While the transistor has a control electrode, a first electrode, and a second electrode, the transistor controls a first electrode current flowing through the first electrode based upon a signal entered to the control electrode. The first electrode of the transistor is connected via the capacitor to the anode terminal of the diode. The control electrode of the transistor has been connected to the cathode terminal of the diode. The control electrode is either a gate or a base. The first electrode is either a drain or a collector.

In accordance with the above-described circuit, in the switching circuit containing the transistor, the surge voltage can be suppressed in a correct and stable manner.

Alternatively, as an alternative idea, in the case that a voltage at the first electrode is 0 V, a capacitance between the control electrode and the first electrode is defined as a "control-to-first electrode capacitance", and the capacitance may alternatively have such a capacitance which is larger than the control-to-first electrode capacitance by 0.01 time to 100 times.

Alternatively, as an alternative idea, the diode may have a p conductivity type anode semiconductor region and an n conductivity type cathode semiconductor region. Both the anode semiconductor region and the cathode semiconductor region have been embedded in a front surface of a semiconductor substrate.

Alternatively, as an alternative idea, the diode may have a p conductivity type anode semiconductor region and an n conductivity type cathode semiconductor region. The anode semiconductor region has been provided via an insulating film on the semiconductor substrate. While the cathode semiconductor region has been provided via an insulating film on the semiconductor substrate, this cathode semiconductor region has been contacted to the anode semiconductor region. The capacitor has an embedded conductive region and a coating insulation region. The embedded conductive region is elongated from a first plane to a second plane of the semiconductor substrate. The coating insulation region has coated the embedded conductive region in such a manner that the embedded conductive region is electrically insulated from the semiconductor substrate. The cathode semiconductor region has been electrically connected to the control electrode of the transistor. The anode semiconductor region has been connected to the embedded conductive region. The embedded conductive region has been electrically insulated via the coating insulation region from the first electrode of the transistor.

Alternatively, as an alternative idea, the diode may have a p well region, an anode semiconductor region, and a cathode semiconductor region. The p well region is expanded from the first plane to the second plane of the semiconductor substrate, and has a p conductivity type. The anode semiconductor region is arranged on a surface layer of the p well region of the semiconductor substrate, and has the p conductivity type. The cathode semiconductor region is arranged on the surface layer of the p well region of the semiconductor substrate, and has the n conductivity type. The capacitor has an embedded conductive region and a coating insulation region. The embedded conductive region is elongated from the first plane to the second plane of the semiconductor substrate. The coating insulation region has coated the embedded conductive region in such a manner that the embedded conductive region is electrically insulated from the semiconductor substrate. The cathode semiconductor region has been electrically connected to the control electrode of the transistor. The anode semiconductor region has been connected to the embedded conductive region. The embedded conductive region has been electrically insulated via the coating insulation region from the first electrode of the transistor.

In accordance with a fifth modification mode of the present disclosed ideas, a switching circuit is arranged by a transistor, a capacitor, and a diode having an anode terminal and a cathode terminal. While the transistor has a control electrode, a first electrode, and a second electrode, the transistor controls a first electrode current flowing through the first electrode based upon a signal entered to the control electrode. The first electrode of the transistor is connected to the anode terminal of the diode. The control electrode of the transistor has been connected via the capacitor to the cathode terminal of the diode. The control electrode is either a gate or a base. The first electrode is either a drain or a collector.

In accordance with the above-described circuit, in the switching circuit containing the transistor, the surge voltage can be suppressed in a correct and stable manner.

Alternatively, as an alternative idea, the diode may have a p well region, an anode semiconductor region, and a cathode semiconductor region. The p well region is expanded from a first plane to a second plane of a semiconductor substrate, and has a p conductivity type. The anode semiconductor region is arranged on a surface layer of the p well region of the semiconductor substrate, and has the p conductivity type. The cathode semiconductor region is arranged on the surface layer of the p well region of the semiconductor substrate, and has the n conductivity type. The capacitor has an embedded conductive region and a coating insulation region. The embedded conductive region is elongated from the first plane to the second plane of the semiconductor substrate. The coating insulation region has coated the embedded conductive region in such a manner that the embedded conductive region is electrically insulated from the semiconductor substrate. The embedded conductive region has been electrically connected to the control electrode of the transistor. The cathode semiconductor region has been electrically insulated via the coating insulation region from the embedded conductive region. The anode semiconductor region has been electrically connected to the first electrode of the transistor.

Alternatively, as an alternative idea, the diode may have a p well region, an anode semiconductor region, and a cathode semiconductor region. The p well region is expanded from the first plane to the second plane of the semiconductor substrate, and has a p conductivity type. The anode semiconductor region is arranged on a surface layer of the p well region of the semiconductor substrate, and has the p conductivity type. The cathode semiconductor region is arranged on the surface layer of the p well region of the semiconductor substrate, and has the n conductivity type. The capacitor has an embedded conductive region and a coating insulation region. The embedded conductive region is elongated from the first plane to the second plane of the semiconductor substrate. The coating insulation region has coated the embedded conductive region in such a manner that the embedded conductive region is electrically insulated from the semiconductor substrate. The region has been electrically connected to the control electrode of the transistor. The cathode semiconductor region has been electrically insulated via the coating insulation region from the control electrode of the transistor. The cathode semiconductor region has been electrically connected to the embedded conductive region. The anode semiconductor region has been electrically connected to the first electrode of the transistor.

In accordance with a sixth modification mode of the present disclosed ideas, a driving circuit for driving a transistor is arranged by a variable resistor. The transistor has a control electrode, a first electrode, and a second electrode. The variable resistor has been electrically connected to the control electrode of the transistor. The variable resistor has a depletion layer which is expanded/compressed in response to a voltage between the first electrode and the second electrode of the transistor. The depletion layer can control a width of a current path of the variable resistor.

The above-described driving circuit does not utilize ON/OFF operations of a semiconductor switching element. The driving circuit utilizes the depletion layer which is expanded/compressed in response to a voltage between the major electrodes of the transistor so as to adjust the width of the current path of the movable resistor. When the depletion layer is expanded so that the width of the current path of the variable resistor becomes narrow, the resistance value of the variable resistor is adjusted to be large. When the depletion layer is compressed so that the width of the current path of the variable resistor becomes wide, the resistance value of the variable resistor is adjusted to be small. The depletion layer is expanded/compressed in response to the voltage between the major electrodes of the transistor, and this event is continuous with respect to increase/decrease of the voltage between the major electrodes of the transistor. A circuit used to correctly set a threshold value is not required, which is however required for ON/OFF operations of a semiconductor switching element. As a consequence, the arrangement of the above-described driving circuit is made simple.

The above-descried driving circuit utilizes the depletion layer which is expanded/compressed in response to the voltage between the major electrodes of the transistor so as to adjust the width of the current path of the variable resistor. Also, the arrangement of the driving circuit can be made simple, and therefore, manufacturing cost thereof can be suppressed to low cost.

Alternatively, as an alternative idea, the variable resistor may have a variable resistance value. In the case that the voltage between the first electrode and the second electrode of the transistor is low, the variable resistance value is adjusted to be small, whereas in the case that the voltage between the first electrode and the second electrode of the transistor is high, the variable resistance value is adjusted to be large. In accordance with this modification mode, in a beginning stage of a transition time period during which the transistor is turned OFF, a resistance value of a gate resistor is adjusted to be small, whereas in a final stage of the transition time period, the resistance value of the gate resistor is adjust to be large. As a consequence, in the beginning stage of the transition time period for turning OFF the transistor, the resistance value of the gate resistor can be adjusted to be small, so that the gate current can be steeply varied. As a result, the drain current of the transistor is steeply varied, so that the time required for turning OFF the transistor can be shorted. Furthermore, in the final stage of the transition time period for turning OFF the transistor, the resistance value of the gate resistor can be adjusted to be large, so that the gate current can be gently varied. As a result, the drain current of the transistor is gently varied, so that the increasing of the surge voltage can be suppressed. In accordance with the driving circuit of this modification mode, the characteristic as to the transition time period for turning OFF the transistor can be improved.

Alternatively, as an alternative case, the variable resistor may have a p type semiconductor region, and one pair of n type semiconductor regions. One pair of the n type semiconductor region is contacted to the p type semiconductor region, and sandwich this p type semiconductor region. The p type semiconductor region has electrically connected to the control electrode of the transistor. One pair of the n type semiconductor regions have been electrically connected to the first electrode of the transistor. In this variable resistor, the p type semiconductor region corresponds to a current path. If the voltage between the major electrodes of the transistor becomes high, then a pn junction between the p type semiconductor region and the n type semiconductor regions is reverse-biased, so that the depletion layer is expanded to the p type semiconductor region. As a consequence, when the voltage between the major electrodes of the transistor becomes high, the width of the current path is adjusted to become wide. On the other hand, if the voltage between the major electrodes of the transistor becomes low, the depletion layer which has been expanded to the p type semiconductor region is compressed. As a consequence, when the voltage between the major electrodes of the transistor becomes low, the width of the current path is adjusted to become wide. Accordingly, the characteristic as to the transition time period for turning OFF the transistor can be improved.

Alternatively, as an alternative idea, the driving circuit may furthermore contain a zener diode. The zener diode has been arranged between one pair of the n type semiconductor regions and the first electrode of the transistor. If the zener diode is employed, then the voltage between the major electrodes of the transistor is not applied to the n type semiconductor regions of the variable resistor until the zener diode breaks down. As a consequence, until the zener diode breaks down, the width of the current path of the variable resistor is kept wide. As a result, in the beginning stage of the transition time period during which the transistor is turned OFF, while the resistance value of the variable resistor is kept small, the gate current can be steeply varied. As a result, the drain current of the transistor can be steeply varied, so that the time required to turn OFF the transistor can be furthermore shortened. It should also be noted that a plurality of zener diodes may be alternatively series-connected to each other. Since the plurality of zener diodes are employed, the voltage to be applied to the n type semiconductor regions may be adjusted.

Alternatively, as an alternative idea, the driving circuit may further have a first diode, a second diode, a first resistor, and a driving voltage generating circuit. The variable resistor has been electrically connected via the second diode to the driving voltage generating circuit. The driving voltage generating circuit has been further and electrically connected via the first resistor and the first diode to the control electrode of the transistor.

Alternatively, as an alternative case, the variable resistor may have a p type semiconductor region, one pair of insulation regions, and one pair of conductive regions. One pair of the conductive regions is contacted to the p type semiconductor region, and sandwich this p type semiconductor region. One-paired conductive regions are located to the p type semiconductor region via one-paired insulation regions. The p type semiconductor region has been electrically connected to the control electrode of the transistor. One pair of the conductive regions have been electrically connected to the first electrode of the transistor. In this case, the p type semiconductor region has been electrically connected to the gate electrode of the transistor. The conductive region has been electrically connected to the output electrode of the transistor. The p type semiconductor region, the insulation regions, and the conductive regions constitute an MIS (Metal Insulator Semiconductor) structure. In the variable resistor, the p type semiconductor region is a current path. When the voltage between the major electrode of the transistor becomes high, the depletion layer is expanded to the p type semiconductor region due to the electric field effect of the MIS structure. As a consequence, when the voltage between the major electrodes of the transistor becomes high, the width of the current path is adjusted to become narrow. On the other hand, if the voltage between the major electrodes of the transistor becomes low, then the depletion layer which has been expanded to the p type semiconductor region is compressed. As a consequence, when the voltage between the major electrodes of the transistor becomes low, the width of the current path is adjusted to become wide. In the driving circuit containing the above-described variable resistor, the characteristic as to the transition time period during which the transistor is turned OFF can be improved.

Alternatively, as an alternative idea, both the transistor and the variable resistor may be formed in the same semiconductor substrate. If the transistor and the variable resistor have been formed in the same semiconductor substrate, then the transistor and the variable resistor need not be prepared as separate circuit components. If the transistor and the variable resistor have been formed in the same semiconductor substrate, then the driving circuit may be arranged by employing a small number of circuit components, and furthermore, the driving circuit may be made compact with practical better utilization.

Alternatively, as an alternative case, the variable resistor may have a p type semiconductor region, and one pair of n type semiconductor regions. One pair of the n type semiconductor regions are contacted to the p type semiconductor region, and sandwich this p type semiconductor region. The p type semiconductor region has electrically connected to the control electrode of the transistor. The p type semiconductor region has been arranged via the insulating film on the semiconductor substrate. One pair of the n type semiconductor regions have been electrically connected to the first electrode of the transistor. One pair of n type semiconductor regions have been arranged via the insulating film on the semiconductor substrate.

Alternatively, as an alternative idea, both the p type semiconductor region and one pair of the n type semiconductor regions may be made of poly crystalline silicon. If poly crystalline silicon is employed, then both the p type semiconductor region and the n type semiconductor region may be alternatively and readily formed on the semiconductor substrate by utilizing a manufacturing process of a semiconductor device.

In accordance with a seventh modification mode of the present disclosed ideas, a driving circuit for driving a transistor is arranged by an adjusting circuit. The transistor has a control electrode, an input electrode, and an output electrode. The adjusting circuit adjusts a resistance value of the control electrode of the transistor based upon a control current flowing through the control electrode of the transistor.

The Inventors of the present disclosure have paid their attentions to gate currents of the transistor. In a transition time period for turning ON the transistor and another transition time period for turning OFF the transistor, magnitudes of gate currents of this transistor are changed in a time elapse manner. As a consequence, if a magnitude of a gate current value of the transistor is employed as a parameter, then a condition under which the transistor is operated can be monitored. If the magnitude of the gate current value of the transistor is employed as the parameter, then a resistance value of a gate resistor can be adjusted while the adjustment of the gate resistance value is turned to the operation of the transistor.

In other words, the above-described driving circuit is featured by employing such an adjusting circuit capable of adjusting the resistance value of the gate resistor of the transistor based upon the current value of the gate current of the transistor. Also, the driving circuit adjusts the resistance value of the gate resistor of the transistor based upon the gate current which is capable of reflecting operation states of the transistor under better condition. As a result, the driving circuit can adjust the resistance value of the gate resistor while being turned to the operations of the transistor.

Alternatively, as an alternative idea, the adjusting circuit may adjust a resistance value of the control electrode of the transistor based upon a preset threshold value of a control current.

In the above-described adjusting circuit, a predetermined current value of the gate current has been set as the threshold value. The adjusting circuit adjusts the resistance value of the gate resistor based upon this threshold value. As a consequence, a driving circuit containing the above-explained adjusting circuit can drive the transistor by correctly discriminating a beginning stage of a transition time period for turning OFF the transistor from a final stage thereof.

Alternatively, as an alternative idea, the adjusting circuit may adjust a resistance value of the control electrode of the transistor based upon a control current when electron charges are discharged which have been stored in the control electrode of the transistor. A driving circuit containing this adjusting circuit drives a field-effect type transistor. In accordance with the adjusting circuit, while being turned to such an operation when the transistor is turned OFF, the resistance value of the gate resistor of the transistor can be adjusted. The characteristic when the transistor is turned OFF can be improved.

Alternatively, as an alternative idea, the driving circuit may further contain a driving voltage generating circuit. The driving voltage generating circuit has been electrically connected via a fixed resistor and a diode to the control electrode of the transistor. The diode has an anode and a cathode. The anode has been connected via the fixed resistor to the driving voltage generating circuit. The cathode has been connected to the control electrode of the transistor. An ON-voltage signal generated from the driving voltage generating circuit is converted into a gate current by the fixed resistor, and electron charges are supplied to the gate electrode of the transistor. As a result, the driving circuit transfers the operation state of the transistor to an ON state. Furthermore, when the ON state of the transistor is transferred to an OFF state, the electron charges which have been stored in the gate electrode of the transistor can flow as a negative gate current to the adjusting circuit, since a signal path flowing through the fixed resistor is cut off by the diode. The adjusting circuit can adjust the resistance value of the gate resistor of the transistor based upon this negative gate current.

Alternatively, as an alternative idea, the diode, the adjusting circuit, and the transistor may be arranged within the same semiconductor substrate.

Alternatively, as an alternative idea, when an absolute value of a control current is large, the adjusting circuit may decrease the resistance value of the control electrode, whereas when an absolute value of a control current is small, the adjusting circuit may increase the resistance value of the control electrode. If this adjusting circuit is provide, then within the transition time period during which the transistor is turned OFF, in the beginning stage where the absolute value of the gate current value becomes large, the adjusting circuit can decrease the gate resistor so that the electron charges can be quickly discharged. On the other hands, in the final stage where the absolute value of the gate current value becomes small, the adjusting circuit can increase the gate resistor so that the electron charges can be gently discharged. As a consequence, in the above-described driving circuit, in the beginning stage of the transition time period for turning OFF the transistor, the drain current flowing through the transistor is steeply varied, so that the time required for turning OFF the transistor can be shortened. Moreover, in the final stage of the transition time period for turning OFF the transistor, the drain current flowing through the transistor is gently varied, so that increasing of the surge voltage can be suppressed. According to the above-described driving circuit, the trade-off relationship between the surge voltage and the turn-off loss can be overcome.

Alternatively, as an alternative case, the adjusting circuit may contain an adjusting-purpose transistor and a resistor. The resistor has a larger resistance value than an ON resistance of the adjusting-purpose transistor. The adjusting-purpose transistor has a control electrode, an input electrode, and an output electrode. The resistor has been arranged between the control electrode and the input electrode of the adjusting-purpose transistor. The resistor has been connected to the control electrode of the transistor. The adjusting-purpose transistor is turned ON/OFF in response to a voltage difference generated between both terminals of the resistor. When an absolute value of a control current of the transistor is large, the adjusting-purpose transistor is turned ON, so that the control current of the transistor passes through the adjusting-purpose transistor. When an absolute value of a control current of the transistor is small, the adjusting-purpose transistor is turned OFF, so that the control current of the transistor passes through the resistor. In accordance with the above-described driving circuit, within the transition time period for turning OFF the transistor, in the beginning stage where the absolute value of the gate current value becomes large, the adjusting-purpose transistor is turned ON based upon the voltage difference generated between the both terminals of the resistor, so that the gate current flows through the adjusting-purpose transistor. Since the ON resistance of the adjusting-purpose transistor is small, the electron charges which have been stored in the gate electrode of the transistor can be quickly discharged. On the other hand, in the final stage where the absolute value of the gate current value becomes small, since the voltage difference generated between the both terminals of the resistor become low, the adjusting-purpose transistor is turned OFF, so that the gate current flows through the resistor. Since the resistance value of the resistor is large, the electron charges which have been stored in the gate electrode of the transistor can be gently discharged. As a result, in accordance with the above-described driving circuit, the trade-off relationship between the surge voltage and the turn-OFF loss can be overcome.

Alternatively, as another alternative idea, the adjusting-purpose transistor may be an p type field-effect transistor. The input electrode of the adjusting-purpose transistor has been connected between the resistor and the control electrode of the transistor. The output electrode of the adjusting-purpose transistor has been grounded.

Alternatively, as further alternative idea, the adjusting-purpose transistor may be a n type field-effect transistor. Both the control electrode and the output electrode of the adjusting-purpose transistor have been connected between the resistor and the control electrode of the transistor.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A driving circuit for driving a transistor comprising:
   a variable resistor, wherein
   the transistor includes a control electrode, a first electrode and a second electrode,
   the variable resistor is coupled with the control electrode of the transistor,
   the variable resistor includes a depletion layer, which is expandable in accordance with a voltage between the first electrode and the second electrode of the transistor,
   the depletion layer is capable of controlling a current path of the variable,
   the variable resistor has a variable resistance,
   the variable resistance is controlled to decrease when the voltage between the first electrode and the second electrode of the transistor is decreased,
   the variable resistance is controlled to increase when the voltage between the first electrode and the second electrode of the transistor is increased,
   the variable resistor further includes a P conductive type semiconductor region and a pair of N conductive type semiconductor regions,
   the pair of N conductive type semiconductor regions contacts and sandwiches the P conductive type semiconductor region,
   the P conductive type semiconductor region is electrically coupled with the control electrode of the transistor, and
   the pair of N conductive type semiconductor regions is electrically coupled with the first electrode of the transistor.

2. The driving circuit according to claim 1, further comprising:
   a zener diode, wherein
   the zener diode is disposed between the pair of N conductive type semiconductor regions and the first electrode of the transistor.

3. The driving circuit according to claim 1, further comprising:
   a first diode and a second diode;
   a first resistor; and a driving voltage generation circuit, wherein
the variable resistor is electrically coupled with the driving voltage generation circuit through the second diode therebetween, and
the driving voltage generation circuit is electrically coupled with the control electrode of the transistor through the first resistor and the first diode therebetween.

4. A driving circuit for driving a transistor comprising:
a variable resistor, wherein
the transistor includes a control electrode, a first electrode and a second electrode,
the variable resistor is coupled with the control electrode of the transistor,
the variable resistor includes a depletion layer, which is expandable in accordance with a voltage between the first electrode and the second electrode of the transistor,
the depletion layer is capable of controlling a current path of the variable,
the variable resistor has a variable resistance,
the variable resistance is controlled to decrease when the voltage between the first electrode and the second electrode of the transistor is decreased,
the variable resistance is controlled to increase when the voltage between the first electrode and the second electrode of the transistor is increased,
the variable resistor further includes a P conductive type semiconductor region, a pair of insulation regions and a pair of conductive regions,
the pair of insulation regions contacts and sandwiches the P conductive type semiconductor region,
the pair of conductive regions faces the P conductive type semiconductor region through the pair of insulation regions therebetween,
the P conductive type semiconductor region is electrically coupled with the control electrode of the transistor, and
the pair of conductive regions is electrically coupled with the first electrode of the transistor.

5. The driving circuit according to claim 4, further comprising:
a zener diode, wherein
the zener diode is disposed between the pair of conductive regions and the first electrode of the transistor.

6. The driving circuit according to claim 4, further comprising:
a first diode and a second diode;
a first resistor; and
a driving voltage generation circuit, wherein
the variable resistor is electrically coupled with the driving voltage generation circuit through the second diode therebetween, and
the driving voltage generation circuit is electrically coupled with the control electrode of the transistor through the first resistor and the first diode therebetween.

7. A driving circuit for driving a transistor comprising:
a variable resistor, wherein
the transistor includes a control electrode, a first electrode and a second electrode,
the variable resistor is coupled with the control electrode of the transistor,
the variable resistor includes a depletion layer, which is expandable in accordance with a voltage between the first electrode and the second electrode of the transistor,
the depletion layer is capable of controlling a current path of the variable resistor,
the transistor and the variable resistor are disposed on the same semiconductor substrate,
the variable resistor further includes a P conductive type semiconductor region and a pair of N conductive type semiconductor regions,
the pair of N conductive type semiconductor regions contacts and sandwiches the P conductive type semiconductor region,
the P conductive type semiconductor region is electrically coupled with the control electrode of the transistor,
the P conductive type semiconductor region is disposed on the semiconductor substrate through an insulation film therebetween,
the pair of N conductive type semiconductor regions is electrically coupled with the first electrode of the transistor, and
the pair of N conductive type semiconductor regions is disposed on the semiconductor substrate through the insulation film therebetween.

8. The driving circuit according to claim 7, wherein
the P conductive type semiconductor region and the pair of N conductive type semiconductor regions are made of poly crystalline silicon.

9. The driving circuit according to claim 7, further comprising:
a zener diode, wherein
the zener diode is disposed between the pair of N conductive type semiconductor regions and the first electrode of the transistor.

* * * * *